(12) United States Patent
Adachi et al.

(10) Patent No.: US 7,141,475 B2
(45) Date of Patent: *Nov. 28, 2006

(54) NON-VOLATILE SEMICONDUCTOR MEMORY AND METHOD OF MAKING SAME, AND SEMICONDUCTOR DEVICE AND METHOD OF MAKING DEVICE

(75) Inventors: Tetsuo Adachi, Ome (JP); Masataka Kato, Koganei (JP); Toshiaki Nishimoto, Higashimurayama (JP); Nozomu Matsuzaki, Kokubunji (JP); Takashi Kobayashi, Tokorozawa (JP); Yoshimi Sudou, Akiruno (JP); Toshiyuki Mine, Fussa (JP)

(73) Assignee: Renesas Technology Corp., Tokyo (JP)

( * ) Notice: Subject to any disclaimer, the term of this patent is extended or adjusted under 35 U.S.C. 154(b) by 78 days.

This patent is subject to a terminal disclaimer.

(21) Appl. No.: 10/954,102

(22) Filed: Sep. 30, 2004

(65) Prior Publication Data

US 2005/0090058 A1  Apr. 28, 2005

Related U.S. Application Data

(60) Division of application No. 10/851,350, filed on May 24, 2004, which is a continuation of application No. 10/374,433, filed on Feb. 27, 2003, now abandoned, which is a continuation of application No. 10/173,158, filed on Jun. 18, 2002, now abandoned, which is a continuation of application No. 10/011,731, filed on Dec. 11, 2001, now Pat. No. 6,444,554, which is a continuation of application No. 09/402,078, filed as application No. PCT/JP98/00710 on Feb. 20, 1998, now Pat. No. 6,461,916.

(30) Foreign Application Priority Data

Mar. 28, 1997  (JP) .................................. 9-77175
Jul. 8, 1997  (JP) .................................. 9-182102

(51) Int. Cl.
*H01L 21/8247* (2006.01)
(52) U.S. Cl. .............................. 438/258; 257/E21.179
(58) Field of Classification Search ........ 438/257–267; 257/E21.179

See application file for complete search history.

(56) References Cited

U.S. PATENT DOCUMENTS 4,651,406 A * 3/1987 Shimizu et al. ............. 438/275
5,032,881 A   7/1991 Sardo et al.

(Continued)

FOREIGN PATENT DOCUMENTS

JP  62-52971  3/1987

OTHER PUBLICATIONS

Japanese Official Action, for Application No. 3005-329722, dated Feb. 16, 2006.

*Primary Examiner*—Richard A. Booth
(74) *Attorney, Agent, or Firm*—Antonelli, Terry, Stout and Kraus, LLP.

(57) ABSTRACT

A semiconductor device, which ensures device reliability especially in fine regions and enables great capacitance and high-speed operations, has memory cells including, in a first region of a main surface of a semiconductor substrate, a gate insulating film, a floating gate electrode, an interlayer insulating film, a control gate electrode, and source and drain regions of the second conduction type arranged in a matrix, with a shallow isolation structure for isolating the memory cells. When using a shallow structure buried with an insulating film for element isolation, the isolation withstand voltage in fine regions can be prevented from lowering and the variation in threshold level of selective transistors can be reduced. When the memory cells in a memory mat are divided by means of selective transistors, the disturb resistance of the memory cells can be improved.

9 Claims, 83 Drawing Sheets

U.S. PATENT DOCUMENTS

| | | |
|---|---|---|
| 5,282,160 A | 1/1994 | Yamagata |
| 5,306,940 A | 4/1994 | Yamazaki |
| 5,316,965 A | 5/1994 | Philipossian et al. |
| 5,427,966 A | 6/1995 | Komori et al. |
| 5,559,048 A | 9/1996 | Inoue |
| 5,658,813 A * | 8/1997 | Enomoto .................... 438/258 |
| 5,666,311 A | 9/1997 | Mori |
| 5,740,105 A | 4/1998 | Gill |
| 5,756,385 A * | 5/1998 | Yuan et al. ................. 438/258 |
| 5,773,861 A | 6/1998 | Chen et al. |
| 5,889,698 A | 3/1999 | Miwa et al. |
| 5,946,548 A | 8/1999 | Hashimoto et al. |
| 5,949,101 A | 9/1999 | Aritome |
| 5,994,756 A | 11/1999 | Umezawa et al. |
| 6,168,994 B1 | 1/2001 | Ikeda |
| 6,211,021 B1 | 4/2001 | Wang et al. |
| 6,287,939 B1 | 9/2001 | Huang et al. |
| 2001/0002714 A1 | 6/2001 | Doan |

FOREIGN PATENT DOCUMENTS

| | | |
|---|---|---|
| JP | 01-173651 | 7/1989 |
| JP | 2-25069 | 1/1990 |
| JP | 2-72672 | 3/1990 |
| JP | 4-229655 | 8/1992 |
| JP | 05-47918 | 2/1993 |
| JP | 7-142618 | 6/1995 |
| JP | 7-147389 | 6/1995 |
| JP | 7-201189 | 8/1995 |
| JP | 7-302853 | 11/1995 |
| JP | 08-017948 | 1/1996 |
| JP | 8-17948 | 1/1996 |
| JP | 8-51108 | 2/1996 |
| JP | 8-97171 | 4/1996 |
| JP | 8-107158 | 4/1996 |
| JP | 8-125148 | 5/1996 |
| JP | 8-148658 | 6/1996 |
| JP | 8-172174 | 7/1996 |
| JP | 08-213572 | 8/1996 |
| JP | 08-298314 | 11/1996 |
| JP | 09-008156 | 1/1997 |
| JP | 98-00710 | 10/1998 |
| WO | WO 96/24138 | 8/1996 |

OTHER PUBLICATIONS

K. Shimizu, et al., "A Novel High-Density $5F^2$ NAND STI Cell Technology Suitable for 256Mbit and 1Gbit Flash Memories", IEDM 1997, Microelectronics Engineering Laboratory, pp. 271-274.

K. Kim, et al., A Novel Dual String *NOR* (DuSNOR) Memory Cell Technology Scalable to the 256 Mbit and 1 Gbit Flash Memories, IEDM 1995, pp. 263-266.

S. Aritome, et al. A 0.67 $um^2$ Self-Aligned Shallow Trench Isolation Cell (SA-STI CELL) For 3V-only 256 Mbit NAND EEPROMs, ULSI Research Laboratories, IEEE 1994, pp. 3.6.1-3.6.4.

Japanese Official Action, for Application No. 2005-329722, Jun. 6, 2006.

\* cited by examiner

FIG. 51

| | SELECT WORD | NON-SELECT WORD |
|---|---|---|
| READ | 2.4–4.0V (VRW); 1.0V (VRD), Vss; Vss<br>READ WORD DISTURB | Vss; 1.0V (VRD), Vss; Vss<br>READ DRAIN DISTURB |
| ERASE | −16V (VEW); 2.0V, 2.0V; 2.0V (VEC) | Vss; 2.0V, 2.0V; 2.0V (VEC)<br>ERASE WELL DISTURB |
| WRITE — WRITE DATA | 14.9–17.0V (VWW); Vss, OPEN; Vss | 4.5V (VWU); Vss, Vss; Vss<br>WRITE DRAIN DISTURB |
| WRITE — NON-WRITE DATA | 14.9–17.0V (VWW); 6.5V (VWD), OPEN; Vss<br>WRITE WORD DISTURB | 4.5V (VWU); 6.5V (VWD), Vss; Vss<br>WRITE DRAIN DISTURB 2 |

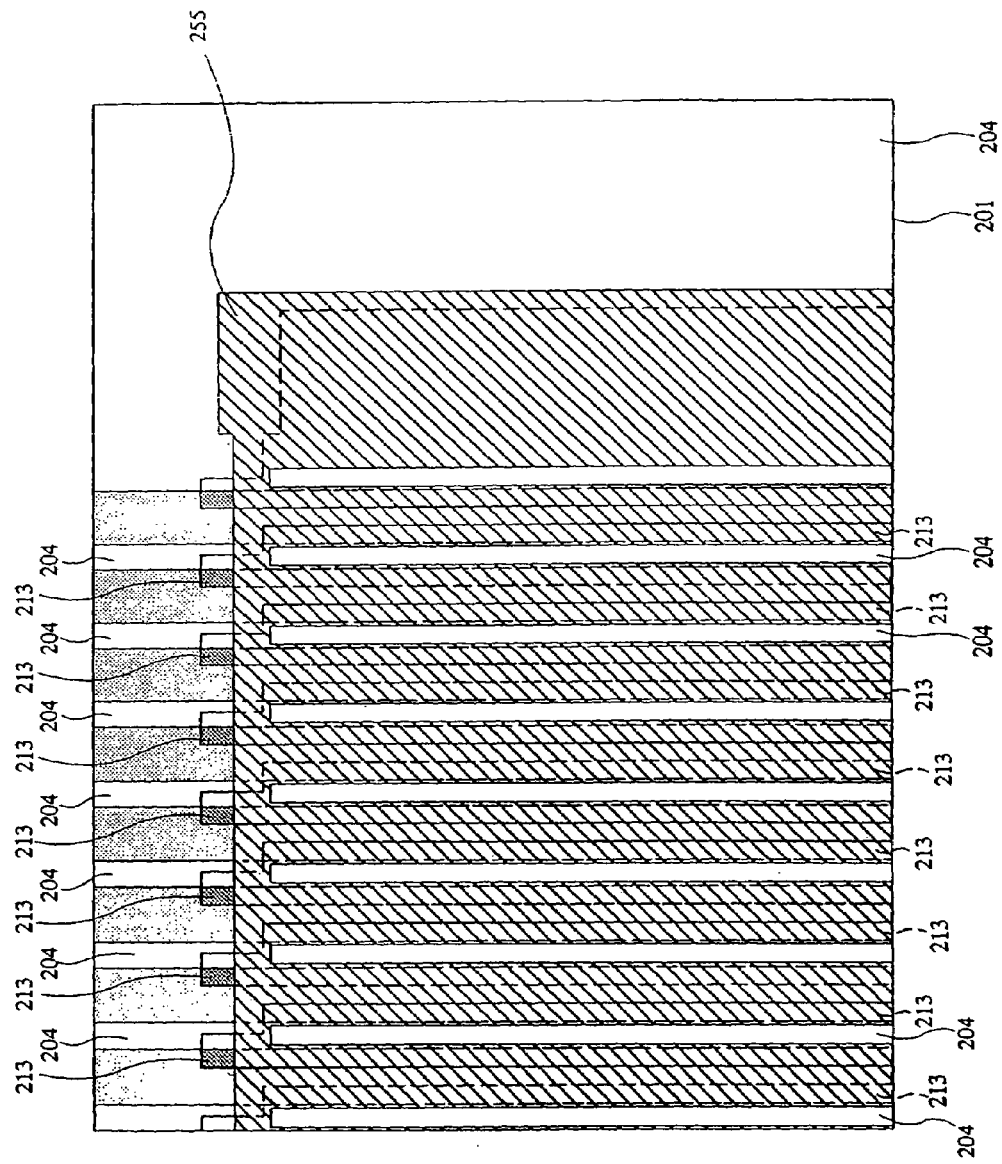

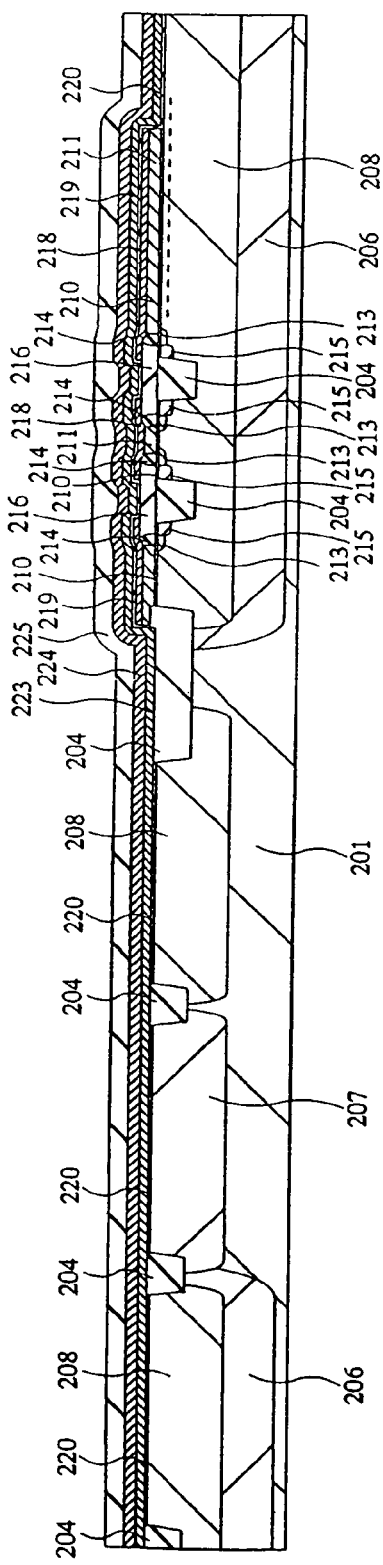
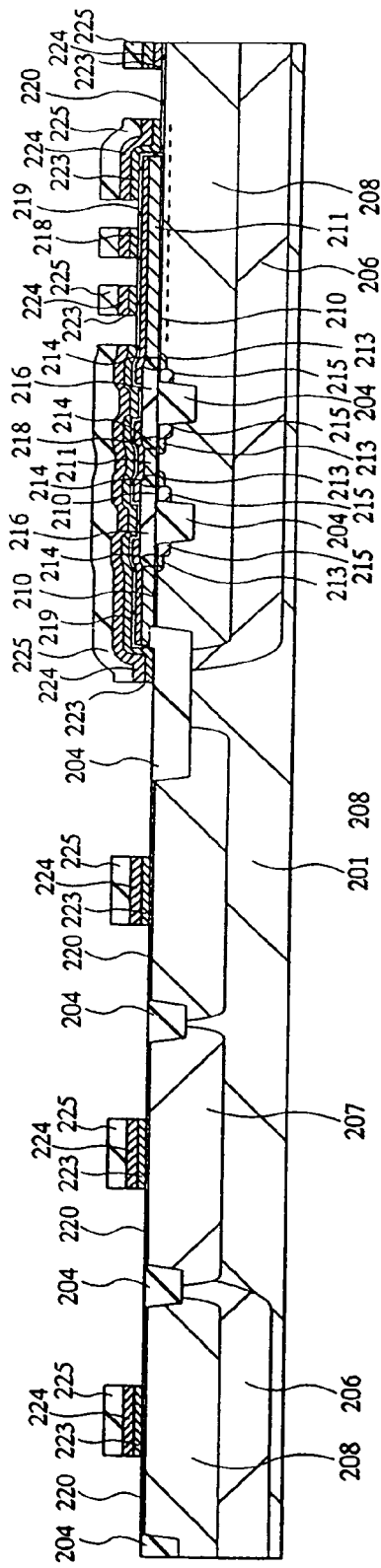

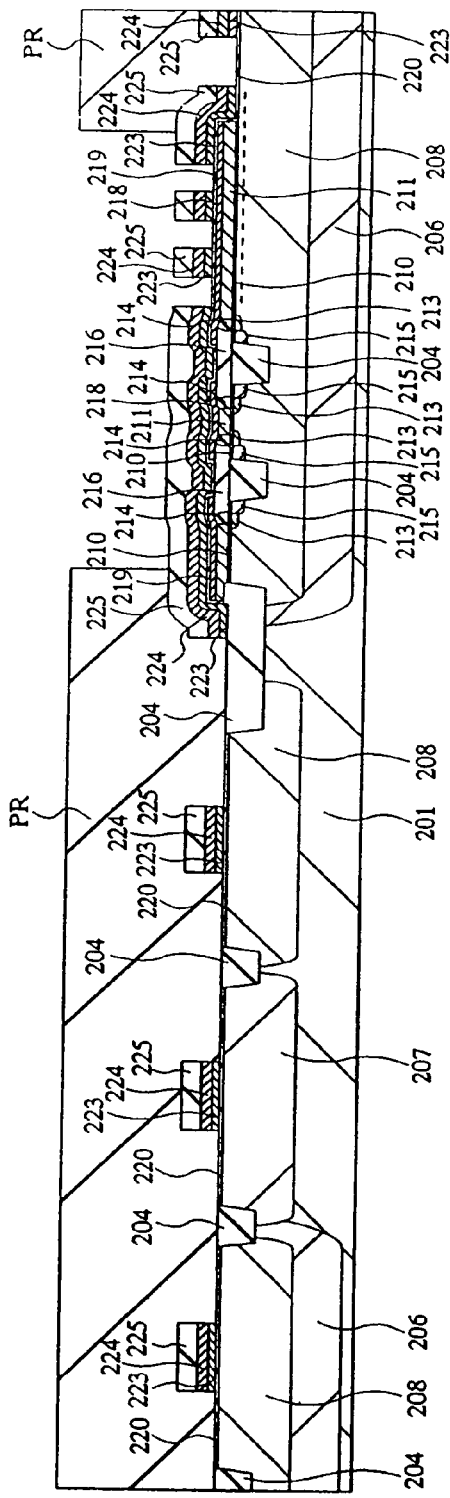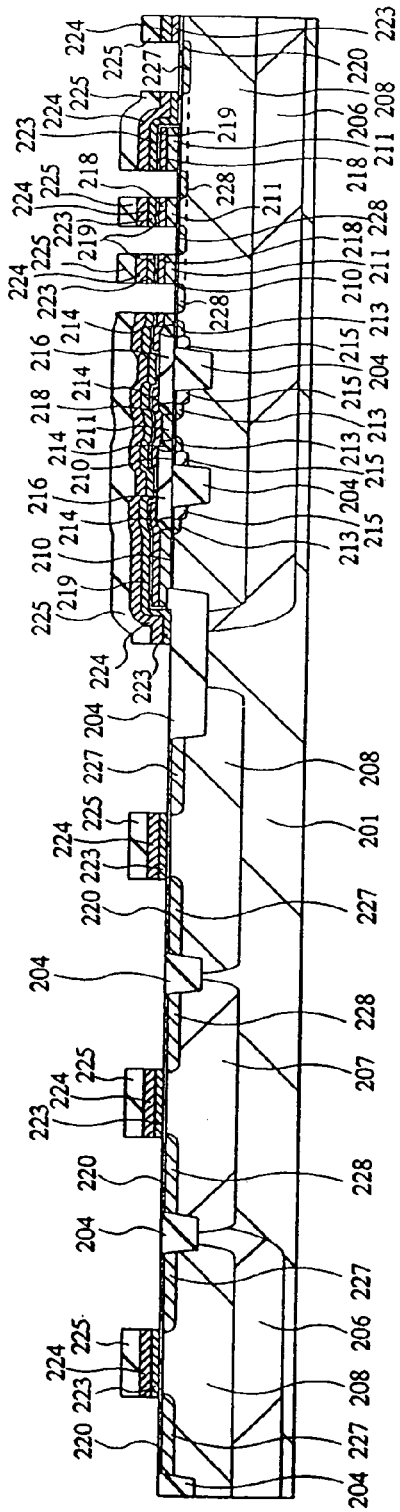

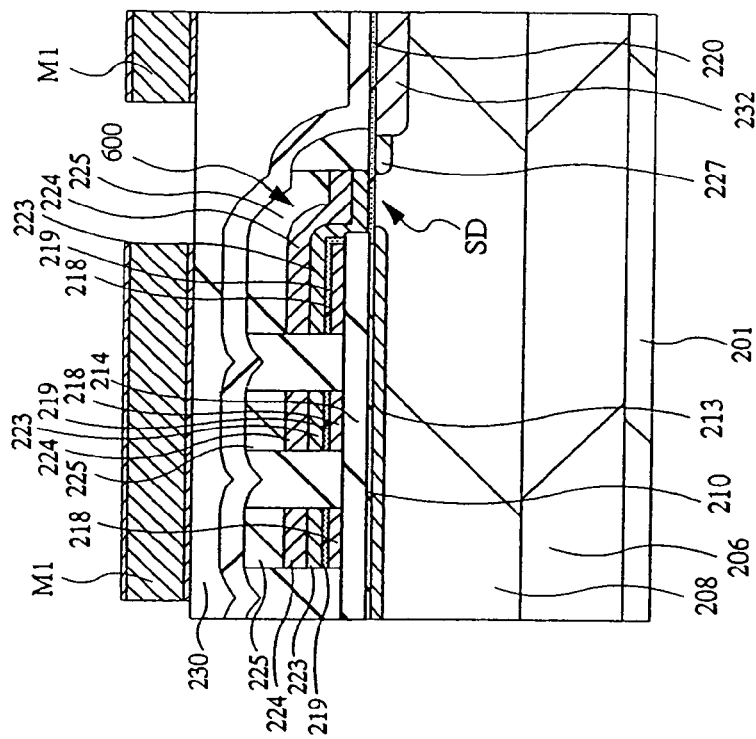
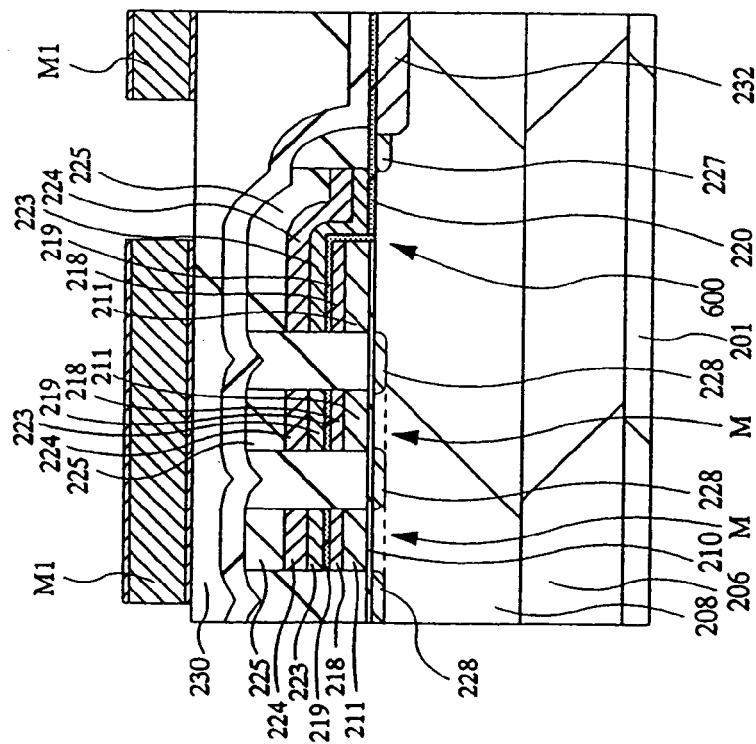

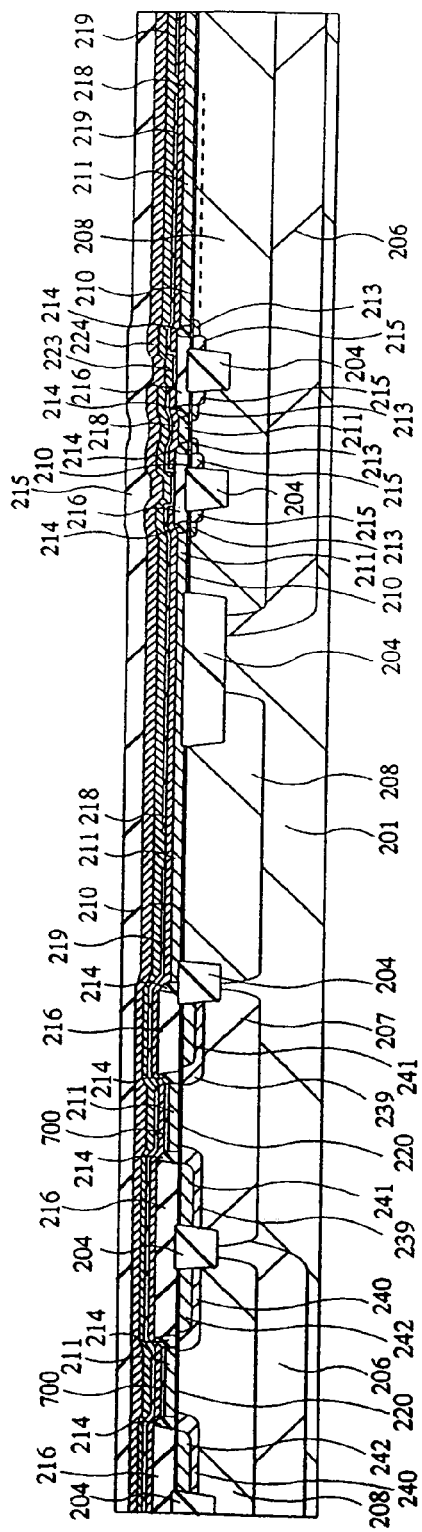
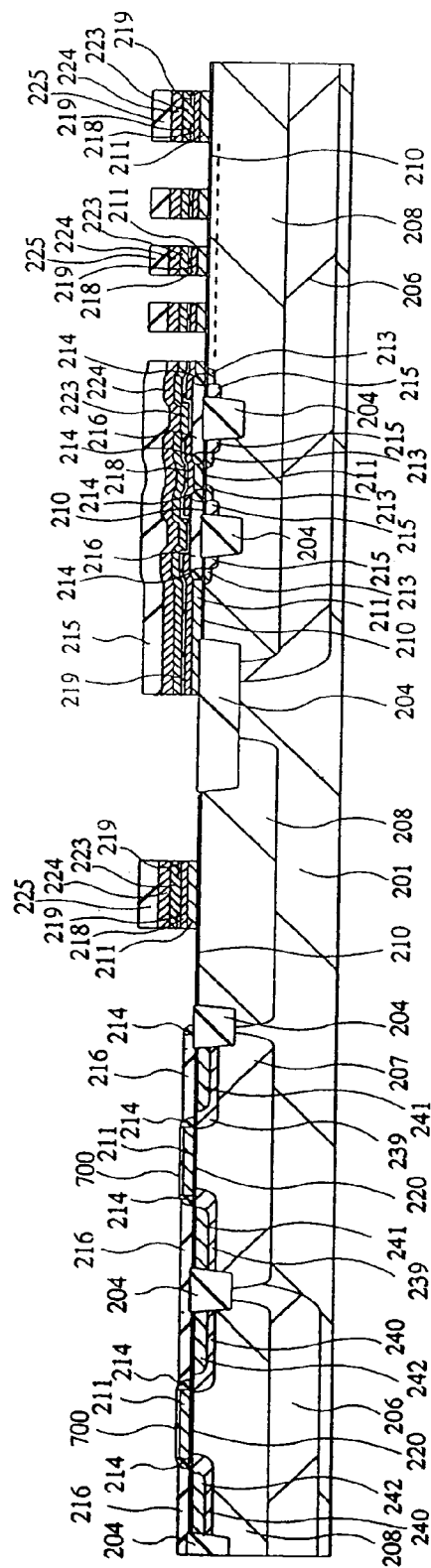

NON-VOLATILE SEMICONDUCTOR MEMORY AND METHOD OF MAKING SAME, AND SEMICONDUCTOR DEVICE AND METHOD OF MAKING DEVICE

This application is a Divisional application of application Ser. No. 10/851,350, filed May 24, 2004, which is a Continuation application of application Ser. No. 10/374,433, filed Feb. 27, 2003 now abandoned, which is a Continuation application of application Ser. No. 10/173,158, filed Jun. 18, 2002, now abandoned, which is a Continuation application of application Ser. No. 10/011,731, filed Dec. 11, 2001, now U.S. Pat. No. 6,444,554, issued Sep. 3, 2002, which is a Continuation application of application Ser. No. 09/402,078, filed Feb. 7, 2000, now U.S. Pat. No. 6,461,916, issued Oct. 8, 2002, the entire disclosure of Ser. No. 09/402,078 being incorporated herein by reference. Ser. No. 09/402,078 is a National Stage application filed under 35 USC § 371 of International (PCT) Patent Application No. PCT/JP98/00710, filed Feb. 20, 1998.

TECHNICAL FIELD

This invention relates to a semiconductor device and also to a method for fabricating that semiconductor device; and, more particularly, the invention relates to a technique which is effective when applied to fineness and mass storage of a non-volatile semiconductor memory.

BACKGROUND OF THE INVENTION

There is an electrically rewritable non-volatile semiconductor storage known as a so-called AND-type flash memory, which is sot out, for example, in Japanese Laid-open Patent Application No. Hei 07-273231. In that publication, the following fabrication method is described as a technique for improving the degree of integration of transistors called memory cells, existing in a chip.

More particularly, a three-layered built-up film, consisting of a gate oxide film, a first polysilicon layer and a silicon nitride film, is deposited on a semiconductor substrate made of single crystal silicon, and this is followed by patterning the built-up film in the form of stripes. Next, n-type impurity ions are implanted into the semiconductor substrate at portions which have not been covered with the patterned built-up film to form column lines of an n-type impurity semiconductor region in the surface of the semiconductor substrate. Thereafter, after deposition of an oxide film by CVD (Chemical Vapor Deposition), the silicon oxide film formed by the CVD method is etched by anisotropic dry etching to form a side wall spacer on the side walls of the first polysilicon layer and silicon nitride film. Using the first polysilicon layer and the side wall spacers as a mask, grooves are formed in the semiconductor substrate by anisotropic dry etching. In this manner, the n-type impurity semiconductor region is isolated, thereby forming column lines and source lines, respectively. Next, after formation of a silicon oxide film on the surface of the grooves, a second polysilicon layer is attached (deposited) over the entire surface of the semiconductor substrate, and this is followed by etching back the second polysilicon layer by isotropic dry etching until the silicon nitride film is exposed. The surface of the etched-back second polysilicon layer is oxidized to form an element isolation region made of the polysilicon covered with the silicon oxide film. Subsequently, the silicon nitrides film is removed, and a third polysilicon layer is further attached and subjected to patterning so as to protect the first polysilicon layer therewith, thereby forming floating gates in parallel with the column lines. Thereafter, an interlayer insulating film and a fourth polysilicon layer are attached, and this is followed by patterning to form column lines made of the fourth polysilicon layer and disposed so as to be vertical to the column lines. Eventually, the first and third polysilicon layers are mutually isolated from each other to form floating gates.

In the AND-type flash memory formed in this way, electrons are stored in the floating gate to constitute a semiconductor device having a non-volatile memory function. Especially, the n-type impurity semiconductor region, which is formed with the first polysilicon layer at opposite sides thereof, serves as a source or drain region. In the method set out above, the processing of the first polysilicon layer and the formation of the element isolation region are performed by use of a one-layer mask pattern, so that no alignment allowance for the gate and the element isolation region is necessary, thereby enabling one to reduce a cell area.

In Japanese-Laid-open Patent Application No. Hei 06-77437, there is described a technique concerning a working system of a non-volatile semiconductor memory. In the non-volatile semiconductor memory set forth in that publication, when electrons are released from a floating gate to write data in a memory cell, a negative voltage is applied to a control gate electrode, while a positive voltage or zero voltage is applied to a drain terminal, thereby describing a technique for selective writing of the data.

Moreover, in Japanese Laid-open Patent Application No. Hei 08-107158, there is described a technique concerning high-speed reading and writing of a non-volatile semiconductor memory. The non-volatile semiconductor memory set out in that publication is fabricated by forming an element isolation region according to the LOCOS (Local Oxidation of Silicon) method by forming a first floating gate electrode (lower layer), and source and drain regions, covering the first floating gate electrode with an interlayer insulating film, removing the insulating film by an etching-back method or the CMP (Chemical Mechanical Polishing) method, and forming a second floating gate electrode (upper layer) on the first floating gate electrode.

In Japanese Laid-open Patent-Application No. Hei 08-148658, there is described a technique concerning a fabrication method suited for a high degree of integration of a non-volatile semiconductor memory. The non-volatile semiconductor memory set out in that publication is fabricated by patterning a polysilicon layer for floating gates, and forming a polysilicon layer for use as gate electrodes of a peripheral circuit and an insulating film so as to permit them to run on the patterned layer.

SUMMARY OF THE INVENTION

However, we have found that the above-stated techniques present the following problems.

1. In the operation of electron withdrawal using the drain terminal, it is necessary to overlap the drain region and the floating gate. Accordingly, the gate length of the memory cell could not be shortened, making it difficult to achieve an intended cell fineness.
2. As a procedure for establishing isolation of memory cells, thermal oxidation is used, so that an excess thermal treating step was added after the formation of a gate oxide film, which made it difficult to ensure the reliability of the gate oxide film. Moreover, it was also difficult to suppress the elongation of the impurity semiconductor region caused during the thermal treating step.

3. A grooved structure is used as a method of forming an isolation region of the memory cells. The polysilicon layer is used as a burying material, so that a difficulty arose concerning the high withstand voltage isolation between the cells.

4. In non-volatile semiconductor memories, such as the AND-type memory flash memories proposed in the above-described techniques, no method of forming memory cells and MOS transistors serving as peripheral circuits and arranged on the same semiconductor substrate is disclosed at all. The fineness of memory cells proceeds through the development of processing techniques. However, a high voltage is used for write and erase operations, and thus, transistors for peripheral circuits are required to have such a specification as to withstand high voltages. For instance, in the fabrication method wherein an impurity semiconductor region of an MOS (Metal-Oxide-Semiconductor) transistor of a peripheral circuit is formed after formation of memory cells, it is difficult to form, on the same substrate, memory cells which should be a shallow junction impurity semiconductor region and the MOS transistor of the peripheral circuit which should have a deep junction structure. More particularly, the impurity semiconductor region of the memory cell should have a shallow junction so as to prevent punch through. On the other hand, the impurity semiconductor region of the high withstand voltage MOS transistor existing in a peripheral circuit permits field relaxation at the junction portion through an annealing step in order to ensure a high withstand voltage. After the formation of the memory cells, if a transistor of the peripheral circuit is formed, an additional annealing step is added to formation of the memory cells. As a result, the punch through resistance is lowered, making it impossible to assure the operation of the transistor having a short gate length.

5. In non-volatile semiconductor memories, such as AND-type flash memories, an MOS transistor for memory cell selection is arranged in a memory mat, but its formation method is not described. On the other hand, with regard to write and erase voltages, the use of a low voltage accompanied by fineness is not available, but operations at a high voltage are required. Accordingly, for the isolation between memory cells and selective transistor units, it is necessary to ensure the isolation withstand voltage.

6. In non-volatile semiconductor memories, including AND-type flash memories, an interlayer insulating film and a control gate electrode material are deposited on the floating gate electrode, and this is followed by processing of a word line electrode (control gate electrode) by photolithography and an etching process. When an electrode pattern is transferred to a photoresist, a halation phenomenon takes place due to the step with the underlying floating gate electrode, thereby causing the pattern form of the photoresist to be partially deformed. According to the fabrication methods of the afore-discussed applications (Japanese Laid-open Patent Nos. Hei 08-107158 and Hei 08-148658), it is possible to some extent to suppress such halation. However, the impartment of a high withstand voltage to the element isolation region is difficult when using these fabrication methods.

An object of the invention is to provide non-volatile semiconductor memory having a structure which is suited for a high degree of integration and its fabrication technique.

Another object of the invention is to increase a memory capacity of a non-volatile semiconductor memory.

A further object of the invention is to provide an operation system of a transistor which enables one to make the gate length of a memory cell as short as possible.

Still another object of the invention is to provide a technique for ensuring reliability of a gate insulating film and for suppressing elongation of an impurity semiconductor region without need of a thermal treatment for the formation of element isolation regions at high temperatures.

Yet another object of the invention is to provide a technique for realizing a high withstand voltage of element isolation regions.

Still another object of the invention is to provide a technique not only of ensuring a high withstand voltage of element isolation regions, but also of realizing a high degree of integration.

Yet another object of the invention is to provide a non-volatile semiconductor memory having a structure which permits high withstand voltage MOS transistors and fine memory cells to be arranged within the same chip and is able to realize the junction of impurity semiconductor regions required for individual transistors and also its fabrication method.

Still a further object of the invention is to provide a technique for reducing, in size, a selective transistor of a memory cell.

Still another object of the invention is to provide a technique for suppressing the halation of exposure light when control gate electrodes of memory cells are patterned.

In the Technical Digest, pp. 61 to 64 of IEDM, 1994, there is described a technique for isolating semiconductor non-volatile elements therebetween by use of grooves formed in a silicon substrate. In accordance with this technique, mention is made, as a filling material for filling the grooves between the elements, of a deposited silicon oxide film ("LP-CVD film" in this literature). The semiconductor non-volatile element consists of a first gate electrode surrounded by an insulating film and a second gate electrode positioned just thereabove.

As stated in the literature, the second gate electrode has to be formed while reflecting the step formed with the first gate electrode. More particularly, processing should be performed while taking into account the difference in height between the upper portion of the first electrode and that electrode. This step may invite a failure in dissolution of photolithography when the second gate electrode is processed, or short-circuiting of adjacent patterns owing to a dry etching failure. Studies has been made in order to reduce the step to an extent as small as possible. Although it appears that planarization between the elements can be realized according to the method described in the literature, the lines of juncture do not completely disappear, since an ordinary deposited oxide film is used for filling in between the elements. The juncture lines are liable to be opened when washed or dry-etched, and once a reduced difference in height appears again, a dry etching failure tends to occur.

To avoid such a phenomenon there is a method using a filling material in which no juncture line remains. The most popular fluid silicon oxide film is called boron phosphosilicate glass (hereinafter abbreviated as BPSG), which contains very high concentrations of boron and phosphorus. When thermally treated at approximately 850° C., BPSG has the property of exhibiting high fluidity. This is one of the materials which is suitable for reducing a difference in height of a fine width. However, the solubility in hydrofluoric acid, which is used in a cleaning step that is essential for the manufacture of semiconductor devices, is greater by several times than that of a non-doped silicon oxide film. Accordingly, BPSG, which is employed for filling between the elements and planarization undergoes considerable attack during the cleaning process, thereby causing a great difference in height once again.

Still another object of the invention is to provide a techniques for solving the step problem wherein there is used a material having an etching resistance sufficient to permit hydrofluoric acid to be employed in a cleaning step.

The above and other objects, and novel features of the invention will become apparent from the description in the present specification and from the accompanying drawings.

Among the features disclosed in the present application, the outlines of typical ones are briefly described as follows.

In order to achieve the above objects, the structures of non-volatile semiconductor memories and their fabrication methods are disclosed below.

(1) A method of fabricating a semiconductor device according to the invention comprises the steps of (a) depositing a first conductive film on a memory cell-forming region and a peripheral circuit region of a semiconductor substrate, (b) etching the first conductive film of the memory cell-forming region to form a first conductor pattern, (c) polishing an insulating film deposited on the first conductor pattern and the peripheral circuit-forming region to form a first insulating film on a non-patterned portion of the first conductor patterns, (d) after the step (c), forming a second conductor pattern on the first insulating film and the first conductor pattern; and (e) subjecting the first conductor pattern and the second conductor pattern to patterning to form a floating gate electrode of memory cells.

It will be noted that the surface position of the first insulating film beneath the second conductor pattern is so arranged as to be higher than that of the first conductor pattern.

A method of fabricating a semiconductor device according to the invention comprises the steps of etching a first conductive film formed on a semiconductor substrate to form a first conductor pattern, (b) polishing an insulating film deposited on the first conductor pattern to form a first insulating film on non-patterned portions of the first conductor patterns, (c) after the step (b) forming a second conductor pattern on the first insulating film and the first conductor pattern, and (d) patterning the first conductor pattern and the second conductor pattern to form a floating gate electrode of memory cells wherein the surface position of the first insulating film beneath the second conductor pattern is so arranged as to be higher than the surface position of the first conductor pattern.

It will be noted that the first conductor pattern is formed by depositing a second insulating film on the first conductor and etching the second insulating film and the first conductive film, and the step of forming the first insulating film includes, after polishing of the insulating film, etching the insulating film to the second insulating film.

Moreover, the second insulating film is deposited on the first conductive film, and the second insulating film and the first conductive film are both etched to form the first conductor pattern. In the step of forming the first insulating film, the insulating film is polished to the second insulating film. It is to be noted that the second insulating film of this case can serve as a stopper layer when polished.

In addition, the method further comprises, prior to the step of forming the first insulating film, the steps of forming side wall spacers at the side walls of the first conductor pattern, and etching the substrate to self-alignedly form a groove relative to the side wall spacers (2) The semiconductor device of the invention has first MISFET's which constitute memory cells. The first MISFET's include a first floating gate electrode formed on a main surface of a semiconductor substrate through a gate insulating film, a second floating gate electrode formed on and electrically connected to the first floating gate electrode, a control gate electrode formed on the second floating gate electrode through an interlayer insulating-film, and a pair of semiconductor regions formed within the semiconductor substrate and serving as source/drain regions, wherein the first MISFET's are isolated, with a first isolation region, from adjacent first MISFET's adjoining along a first direction, the insulating film is so formed that it has a thickness greater than that of the first floating gate electrode on the first isolation region, the second floating gate electrode is formed to extend on the insulating film, and the surface position of the insulating film is higher than that of the first floating gate electrode.

Further, the semiconductor device of the invention is one which has first MISFET's and second MISFET's. The first MISFET constituting a memory cell includes a floating gate electrode formed on a main surface of a semiconductor substrate through a gate insulating film, a control gate electrode formed on the floating gate electrode through an interlayer insulating film, and the second MISFET includes a gate electrode formed on the main surface of the semiconductor substrate through a gate insulating film. The first MISFET's are arranged in the form of an array, and the first MISFET's are isolated from adjacent first MISFET's by means of a first isolation region along a first direction, and the surface position of an insulating film formed on the first isolation region is substantially uniform between the first MISFET's arranged in the form of an array and is higher than the surface position of an insulating film formed on a second isolation region.

It will be noted that in the above semiconductor device, the insulating film is buried between the side wall spacers formed on the side walls of the first floating gate, and a semiconductor region is formed below the side wall spacers.

In the semiconductor device, the first isolation region has such a structure that the insulating film is buried in the groove of the semiconductor substrate, which is formed self-alignedly to the side wall spacers formed on the side surfaces of the first floating electrodes.

Moreover, in the semiconductor device, one of the paired semiconductor regions serving as the source/drain regions of the second MISFET is electrically connected to the semiconductor region of the first MISFET, and the second MISFET's are isolated from each other by means of a second isolation region, and the first and second isolation regions have such a structure that an insulating film is buried in grooves of the semiconductor substrate which are formed self-alignedly to the side wall spacers formed on the side surfaces of the first floating gate electrode and the gate electrode of the second MISFET.

In the semiconductor device, the gate electrode of the second MISFET is made of materials which constitute, at least, the first floating gate electrode, second floating electrode and control gate electrode, and the second floating electrode and the control gate electrode are electrically connected. In this connection, the second floating gate electrode and the control gate electrode may be connected via an opening formed in the interlayer insulating film.

Furthermore, the semiconductor device of the invention is one which has first MISFET's constituting memory cells and second MISFET's. The first MISFET constituting a memory cell includes a first floating electrode formed on a main surface of a semiconductor substrate through a gate insulating film, a second floating gate electrode formed on and electrically connected to the first gate electrode, a control gate electrode formed on the second floating gate electrode through an interlayer insulating film, and a pair of semiconductor regions formed within the semiconductor regions formed within the semiconductor substrate and serving as source•drain regions, and the first MISFET is isolated, with a first isolation region, from an adjacent first MISFET adjoining along a first direction. The second MISFET has a first gate region made of materials which constitute the gate insulating film, the first floating gate electrode, the second floating gate electrode, the interlayer insulating film and the control gate electrode, and a second gate region made of materials which constitute the interlayer insulating film and the control gate electrode, both disposed along the direction of the gate length. The semiconductor region, which acts as one of the source/drain regions of the second MISFET, is electrically (connected) to one semiconductor region of the first MISFET and is arranged to extend to the lower portion of the first gate region. The channel region of the second MISFET is formed within the substrate at the lower portion of the second gate region and is formed between the semiconductor regions serving as the source/drain regions of the second MISFET. In this case, the control gate electrode of the first MISFET is formed integrally with a word line formed to extend in the first direction, and the one of semiconductor regions of the second MISFET is formed integrally with one of semiconductor regions of a first MISFET provided adjacently to a second direction which is, vertical to the first direction, and the other semiconductor region of the second MISFET may be electrically connected to a data line.

Further, the semiconductor device of the invention is one which has first MISFET's constituting memory cells. The first MIFET includes a first floating gate electrode formed on a main surface of a semiconductor substrate via a gate insulating film, a control gate electrode formed on the upper portion of the first floating gate electrode via an interlayer insulating film, and a pair of semiconductor regions formed within the semiconductor substrate and serving as source/drain regions. The channel region of the first MISFET is arranged between the paired semiconductor regions within the substrate, and the paired semiconductor regions of the first MISFET are arranged to have a symmetric structure. In this arrangement, information is written and erased by charging and discharging electrons between the entire surface of the channel region and the first floating gate electrode by tunneling through the gate insulating film.

In the semiconductor device, for the erase operation wherein electrons are discharged from the first and second floating gate electrodes to the substrate by tunneling through the gate insulating film, a first voltage is applied to the control gate electrode, and the semiconductor region of the first MISFET is set at the same potential as the semiconductor substrate portion beneath the first floating gate electrode and is set at a voltage lower than a first voltage.

Moreover, for the write operation in the semiconductor device wherein electrons are discharged from the substrate to the first floating gate electrode by tunneling through the gate insulating film, a second voltage of a polarity different from that of the first voltage is applied to the control gate electrode, and the semiconductor region of a selected first MISFET is set at the same potential as the semiconductor substrate portion beneath the first floating gate electrode, thereby reversing the channel region. At the same time, a third voltage having the same polarity as the second voltage is applied to the semiconductor region of a non-selected first MISFET so that the voltage between the channel region and the control gate electrode is rendered lower than a potential between the channel region of the selected first MISFET and the control gate electrode. It should be noted that when the control gate voltage added as the second voltage has three or more voltage levels and the change of a threshold value of the first MISFET logically corresponds to individual voltage levels on the basis of the difference in charge quantity injected into the floating gate electrode corresponding to the voltage level, information of two bits or more can be memorized in one memory cell. Further, for the writing of information in a memory cell, the information can be written while successively shifting from a writing operation at the highest second voltage to writing operations at lower second voltages.

For the read out of information from a memory cell, the information can be read out while successively shifting from detection of a threshold value corresponding to the quantity of charges injected at the lowest second voltage to detection of threshold values corresponding to the quantities of charges injected at higher second voltages.

In the above semiconductor device, the channel region of the first MISFET may be arranged between the paired semiconductor regions in the second direction vertical to the first direction.

The channel region of the first MISFET may be arranged between the paired semiconductor regions in the first direction.

Moreover, in the semiconductor device, the paired semiconductor regions of the first MISFET may be arranged to have a symmetrical structure.

(3) A method of fabricating a semiconductor device according to the invention which comprises a word line formed to extend in a first direction, a local data line and a local source line made of a semiconductor region formed to extend in a second direction with a semiconductor substrate, and first MISFET's and second MISFET's, the first MISFET's, which constitute memory cells, including a first floating gate electrode formed on a main surface of the semiconductor substrate through a gate insulating film, a second floating gate electrode formed on and electrically connected to the first floating gate electrode, a control gate electrode formed on the second floating electrode through an interlayer insulating film, and a pair of semiconductor regions formed within the substrate and serving as source/drain regions, the second MISFET's including a gate electrode formed on the main surface of the semiconductor substrate through a gate insulating film and semiconductor regions formed within the semiconductor substrate, serving as source/drain regions and electrically connected to one of the semiconductor regions of the first MISFET's wherein first MISFET's are isolated such that first MISFET's adjoining in a first direction are subjected to isolation with a first isolation region and second MISFET's are subjected to isolation with a second isolation region. The method comprises the steps of (a) successively depositing a gate insulating film, a first conductive film and a first insulating film on a semiconductor substrate and patterning the first insulating film and the first conductive film in a striped column pattern, (b) forming a side wall spacer on side walls of the column pattern, (c) etching the semiconductor substrate self-alignedly to the side wall spacers to form a groove in the semiconductor substrate, (d) depositing a second insulating film on the semiconductor substrate including the inside of the groove and removing the second insulating film to the level of the first insulating film for planarization thereby forming first and second isolation regions, (e) after the step (d), removing the first insulating film to expose the surface of the first conductive film, (f) forming a second conductive film in contact with the surface of the first conductive film to cover the first conductive film in a direction of extension of the column pattern, and (g) successively depositing an interlayer insulating film and a third conductive film on the second conductive film and patterning the third conductive film, the interlayer insulating film and the first and second conductive films in a direction vertical to the extending direction of the column pattern.

The method of fabricating a semiconductor device according to the invention is used to fabricate a semiconductor device including a first floating gate electrode formed on a main surface of a semiconductor substrate through a gate insulating film, a second floating gate electrode formed on and electrically connected to the first floating gate electrode, a control gate electrode formed on the second floating gate electrode through an interlayer insulating film, and a pair of semiconductor regions formed within the semiconductor substrate and serving as source/drain regions. The method comprises (a) successively depositing a gate insulating film, a first conductive film and a first insulating film on a semiconductor substrate and patterning the first insulating film and the first conductive film in a striped column pattern, (b) forming a side wall spacer on side walls of the column pattern, (c) after the step (b), depositing a third insulating film on the semiconductor substrate, (d) removing the third insulating film to the first insulating film for planarization, (e) removing the first insulating film to expose the surface of the first conductive film and forming a second conductive film in contact with the surface of the first conductive film to cover the first conductive film in a direction of extension of the column pattern, and (f) successively depositing an interlayer insulating film and a third conductive film on the second conductive film and patterning the third conductive film, the interlayer insulating, film and the first and second conductive films in a direction vertical to the extending direction of the column pattern.

Further, the method for fabricating a semiconductor device according to the invention comprises the steps of (a) successively depositing a gate insulating film, a first conductive film and a first insulating film on a semiconductor substrate and patterning the first insulating film in a striped column pattern, (b) after the step (a), subjecting the semiconductor substrate to etching self-alignedly to the first insulating film to form a groove in the semiconductor substrate, (c) depositing a second insulating film on the semiconductor substrate including the groove surface and removing the second insulating film to the first insulating film for planarization, (d) removing the first insulating film to expose the surface of the first conductive film and forming a second conductive film in contact with the surface of the first conductive film to cover the first conductive film in a direction of extension of the column pattern, and (e) successively depositing an interlayer insulating film and a third conductive film on the second conductive film and patterning the third conductive film, the interlayer insulating film and the first and second conductive films in a direction vertical to the extending direction of the column pattern.

In the above fabrication method, the first floating gate electrode is constituted of the first conductive film, the second floating gate electrode is constituted of the second conductive film, and the gate control electrode is constituted of the third conductive film, and after the patterning of the third conductive film, and after of semiconductor regions serving as source/drain regions can be formed.

The surface position of the third insulating film beneath the second conductive film may be formed at a level which is the same as or higher than the surface position of the first conductive film.

In the step (d) polishing of the third insulating film ensures planarization.

Moreover, the first insulating film can be used as a stopper layer. In the step (d), after planarization by polishing of the third insulating film, the third insulating film can be removed by etching to the first insulating film.

The patterning of the striped column pattern in the step (a) is performed with respect to a memory cell forming region in such a way that other regions have the first conductive film and the first insulating film left thereon.

Moreover, a third MISFET is formed wherein semiconductor regions serving as source/drain regions of the third MISFET are formed prior to the formation of a semiconductor region.

The method further comprises the step of forming a first layer wire, and the first layer wire in a memory cell-forming region is provided in the form of lattices, and an interlayer insulating film between the first-layer wire and a second-layer wire formed thereon is planarized by the CMP method.

Further, the method of fabricating a semiconductor device according to the invention comprises the steps of (a) depositing a first conductive film on a first MISFET-forming region and a second MISFET-forming region of a semiconductor substrate, (b) etching the first conductive film in the first MISFET-forming region to form a first conductive pattern, (c) polishing an insulating film deposited on the first conductor pattern and the first conductive film of the second MISFET-forming region to form a first insulating film between the first conductor patterns, and (d) after the step (c), removing the first conductive film of the second MISFET-forming region.

The above fabrication method may further comprise, after the step (d), the step of forming a gate insulating film and a gate electrode in the second MISFET region.

The method may further comprise, after the step (c) the step of removing a second conductor pattern on the first insulating film and the first conductor pattern wherein the first conductor pattern and the second conductor pattern constitute a floating gate electrode of a memory cell and the surface position of the first insulating film beneath the first conductor pattern is arranged to be higher than the surface position of the first conductor pattern.

(4) A semiconductor device of the invention is one which has first MISFET's constituting memory cells. The first MISFET includes a first floating gate electrode formed on a main surface of a semiconductors substrate through a gate insulating film, a control gate electrode formed on the upper portion of the first floating gate electrode via an interlayer insulating film, a pair of semiconductor regions formed within the semiconductor substrate and serving as a source•drain region wherein first MISFET's adjoining in a first direction are subjected to isolation with a first isolation region, and the first isolation region has a structure in which an insulating film is buried in grooves of the semiconductor substrate, and wherein the surface position of the insulating film is higher than the main surface of the semiconductor substrate and the channel region of the first MISFET is positioned between the paired semiconductor regions in a second direction vertical to the first direction.

The semiconductor device may be so arranged that a second floating gate electrode is formed on the upper portion of the first floating gate electrode and is electrically connected to the first floating gate electrode, an interlayer insulating film is formed on the second floating gate electrode so that the second floating gate electrode extends over the upper surface of the insulating film, and the upper surface of the insulating film is made higher than the upper surface of the first floating gate electrode.

Moreover, a side wall spacer may be formed on side surfaces of the first floating gate electrodes, under which grooves are formed self-alignedly relative to the side wall spacers.

Alternatively, the groove may be formed self-alignedly relative to the side surfaces of the first floating gate electrode.

When using the above measures, the objects of the invention can be achieved with the following features.

Firstly, write operation to memory cells and erase operations are performed through full charge and discharge of electrons via the gate insulating film provided between the floating gate and the semiconductor substrate, so that a conventional overlapped portion of a floating gate electrode and a drain region becomes unnecessary. This enables one to reduce the area of a memory cell, thus making it possible to achieve a high degree of integration of a non-volatile semiconductor memory.

Secondly, memory cells along the direction of a data line can be divided into blocks by means of selective transistors. At the time of a write operation, selective transistor in a non-selected block are turned off, so that application of an unnecessary data line voltage to memory cells can be inhibited in the non-selected block. Thus, rewrite of unintentional information to non-selected memory cells (disturb phenomenon) can be prevented, thus improving the reliability of the non-volatile semiconductor memory Thirdly, the isolation region for a memory cell and a selective transistor is arranged to have a shallow groove isolation structure, so that excess thermal hysteresis on the gate oxide film can be prevented and the reliability of an oxide film constituting the gate insulating film can be improved. Moreover, the isolation resistance is also improved.

Fourthly, the impurity semiconductor region of MOS transistors in a peripheral circuit is formed prior to the formation of memory cells. Accordingly, the memory cells do not suffer any thermal hysteresis owing to the formation of the memory cells. Accordingly, the memory peripheral MOS transistors. The impurity semiconductor region of the MOS transistors of the peripheral circuit is formed at adequately high temperatures, thereby ensuring the formation of a deep junction, enabling one to obtain a structure suitable for transistor operations at high voltages. On the other hand, the impurity semiconductor region of the memory cell is formed with a shallow junction, thereby making it possible to keep a high resistance to punch through. Such a shallow junction impurity semiconductor region of the memory cell does not subsequently undergo excess thermal hysteresis so that excessive diffusion of an impurity does not take place, and thus, a shallow junction keeps its structure as initially formed.

Fifthly, an underlying layer is flattened prior to the formation of the second floating gate electrode, and the processing precision of the second floating gate electrode and the word line is improved. More particularly, when the second floating gate electrode is patterned, the underlying layer is flattened, so that scattering of exposure light, which reflects the irregularities of the underlying layer, does not take place. This contributes to the improvement in exposure precision, thereby improving the processing precision of the non-volatile semiconductor memory to make a high degree of integration easy.

In this application, in order to solve the above problems, there are disclosed a semiconductor device and a method for making same.

The semiconductor device of the invention comprises a plurality of semiconductor elements formed on the same semiconductor substrate, a fluid silicon oxide film containing phosphorus or boron, which is filled between electrodes of the semiconductor substrate and wherein nitrogen is introduced to the surface of the fluid oxide film.

The electrodes may be provided as a floating gate electrode of a semiconductor non-volatile memory.

The method of fabricating a semiconductor device according to the invention comprises filling a phosphorus or boron-containing fluid silicon oxide film between electrodes of a plurality of semiconductor elements formed on the same semiconductor substrate where the electrodes are made of polysilicon, and subjecting the surface of the fluid oxide film to thermal treatment in an atmosphere of ammonia.

The electrodes may be provided as a floating gate electrode of a semiconductor non-volatile memory.

In the practice of the invention, in order to improve the resistance to liquid cleaning, BSPG is heated in an atmosphere of ammonia. BSPG is nitrided to a depth of approximately 100 nm from the surface. By this measure, the solubility velocity in hydrofluoric acid can be suppressed to a level approximately equal to that of an non-doped silicon oxide film, thus enabling the step between the elements to be flattened.

FIG. 110 shows an effect of improving the solubility velocity of BPSG in hydrofluoric acid (1:100 dilution with water). The etching rate of BPSG, which has been treated at 850° C. in an atmosphere of nitrogen, is approximately at 45 nanometers/minute irrespective of the treating time. On the other hand, where BPSG is subjected to thermal treatment (i.e. nitriding treatment) in an atmosphere of ammonia for 10 minutes or more, its etching rate is reduced to approximately 5 nanometers/minute. An etching rate, in the case where a non-doped oxide film (deposited by a chemical vapor phase growth process) is nitrided is set out, with its value being almost the same as that attained by thermal treatment in an atmosphere of nitrogen. As shown in the figure, the etching rate of a nitrided film of BPSG can be reduced to half of a non-doped, deposited oxide film.

FIG. 111 shows an effect of a treating temperature in the case where it is subjected to thermal treatment in an atmosphere of ammonia for 20 minutes. It has been found that the etching rate is almost the same as that of a non-doped, deposited oxide film for a treatment at 750° C. and can be reduced to a lower level for 800° C. or higher.

From these experiments, it will be seen that the etching rate of BPSG, which has been nitrided at a temperature of 750° C. or more, with 1:100 dilution of hydrofluoric acid, can be suppressed to a level lower than that of a non-doped, deposited oxide film, i.e. to a level approximately of 5 nanometers/minute. This value is sufficient to keep a flat step between elements.

The effects attained by typical ones among the features disclosed hereinafter will be described below in a brief summary.

(1) Since a shallow groove structure using a buried insulating film is used to effect isolation between memory cells and selective transistors, a lowering of the isolation withstand voltage in the fine region is presented, and a variation in threshold value of the selective transistors can be reduced.

(2) Memory cells in a memory mat can be segmented by means of the selective transistors, thereby improving the disturb resistance of the memory cells.

(3) An information rewriting system where electric charges are injected and released on the entire surfaces of the channels, so that a shallow junction impurity semiconductor region structure is enabled. As a result, a cell operation in a fine region becomes possible. In addition, the degradation of gate oxide films caused by rewriting can be reduced.

(4) The impurity semiconductor region of high withstand voltage MOS transistors is formed prior to the formation of an impurity semiconductor region of memory cells having fine gate structures, thereby preventing unnecessary heat diffusion to the memory cells to ensure the operation in the fine gate region.

(5) After formation of the first floating gate electrode, a buried layer consisting of a silicon oxide film, which is formed by a CVD process, in a substrate region between the gate electrodes, is planarized, so that fine processing without involving dimensional variations becomes possible in the processing of the second floating gate electrodes and in the processing of word lines intersecting at right angles with the floating gate electrodes.

(6) A flat element structure is realized by burying irregularities derived from the difference in height between elements, and an etching resistance of the insulating film realizing the planarization can be improved. As a result, all processing failures derived from the difference in height between the elements can be fully suppressed.

BRIEF DESCRIPTION OF THE DRAWINGS

FIG. 51 is a table showing control voltages applied to memory cells in read, write and erase operations of data conducted in Embodiment 5 along with schematic views of a memory cell;

FIGS. 55 to 77 are, respectively, sectional or plan views showing, in sequence, an example of a method for fabricating the AND flash memory of Embodiment 5;

FIGS. 80 and 81 are, respectively, sectional views showing an enlarged D portion in FIG. 79;

FIGS. 88 to 99 are, respectively, plan or sectional views showing, in sequence, an example of a method for fabricating an AND-type flash memory representing Embodiment 7;

BEST MODE FOR CARRYING OUT THE INVENTION

The embodiments of the invention will be described in detail with reference to the drawings.

(Embodiment 1)

Embodiment 1 of the invention, is an AND-type flash memory, which is one example of a non-volatile semiconductor device.

Figure 1:
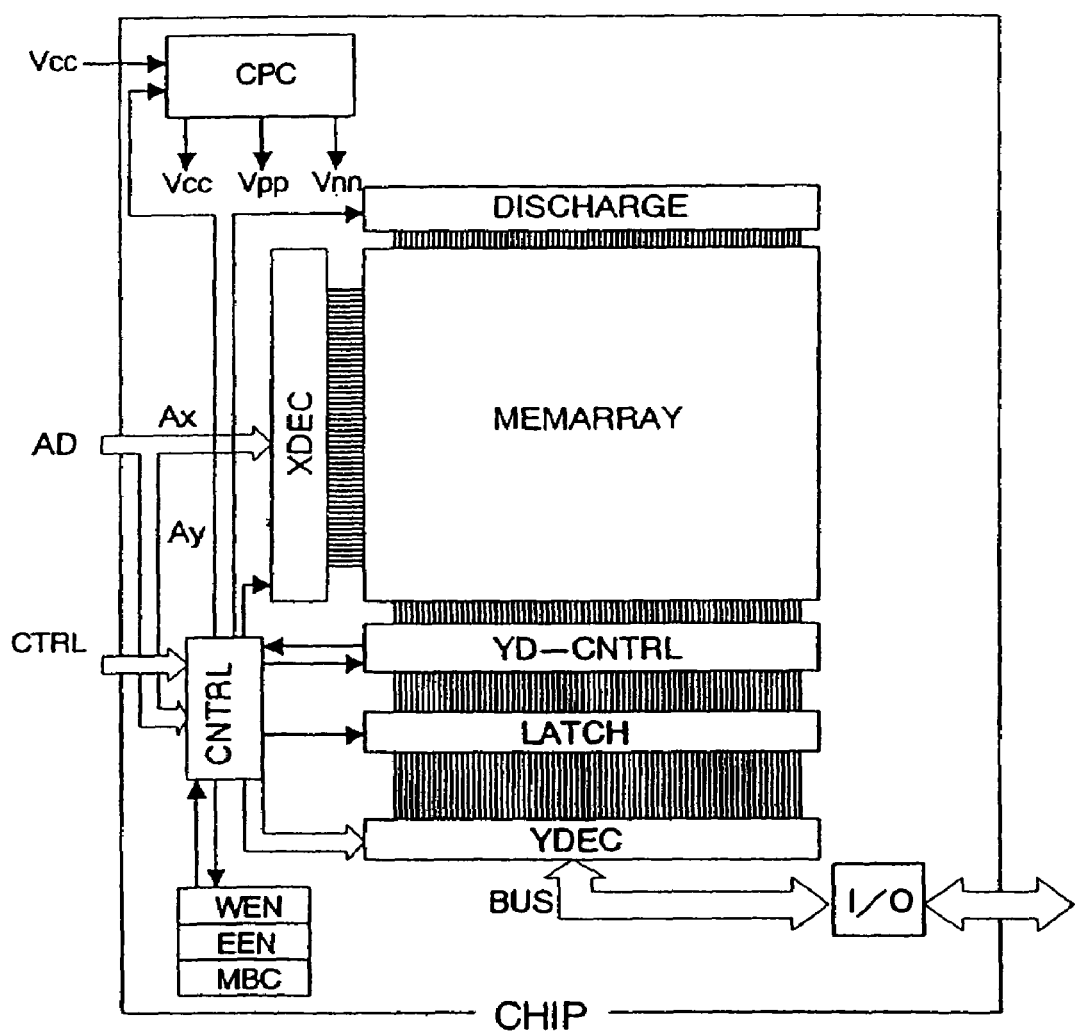
FIG. 1 is a schematic, diagram showing the entirety of an AND-type flash memory representing Embodiment 1.
Figure 2:
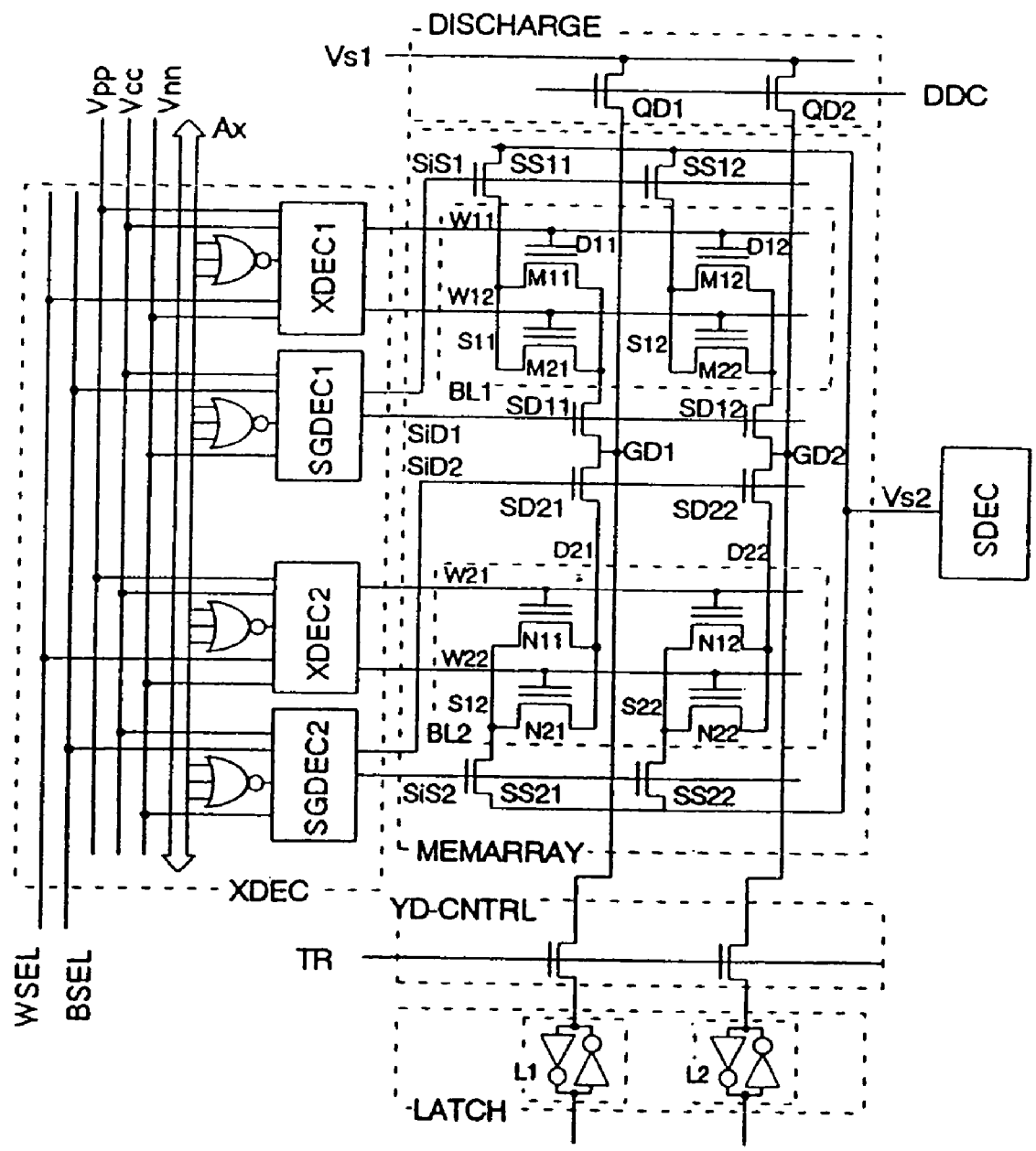
FIG. 2 is a schematic diagram showing an essential circuit of the AND-type flash memory of Embodiment 1.

FIG. 1 is a schematic block diagram showing the overall chip configuration of an AND-type flash memory representing Embodiment 1. FIG. 2 is a view showing an essential circuit of the AND flash memory of Embodiment 1.

The AND-type flash memory of this embodiment is provided with a memory array MEMARRAY, a latch circuit LATCH, and a column decoder XDEC. The memory array MEMARRAY has 4 kbits, i.e. 512 bytes, of memory cells connected to at least one word line selected by means of address input Ax, with 16 thousand addresses (usually, the number of word lines) along the column direction. The latch circuit LATCH has a length corresponding to 4 kbits (512 bytes)

In the memory chip, control signals including chip selective signals, write operation control signals, erase operation control signals and the like are inputted to a control circuit CNTRL (indicated as CNTRL as a whole), and addresses are inputted to column decoder XDEC and column decoder YDEC, including a word line voltage control circuit and a source line voltage control circuit, via an input buffer (not shown). The column address Ay is internally generated by use of a counter circuit in the control circuit CNTRL and may be passed to a column gate YDEC.

On the other hand, data is connected to a sense system including input-output circuit I/O and a data latch system. The sense system SESEAMP receives signals from the control circuit CNTRL and serves to transfer data to memory cells via a column gate YGATE or to recognize memory cell data or transmit data through an internal bus BUS.

On the other hand, data is inputted to a sense circuit via the input-output circuit I/O and a bus BUS. The sense circuit includes a latch circuit LATCH and a sense amplifier control circuit YD-CNTRL. The sense circuit receives signals from the control circuit CNTRL, and is provided with the functions of effecting data transfer to a memory cell via a column gate and also of recognition of memory cell data and effecting data transmission through the internal bus BUS.

Besides, the memory chip CHIP is further provided with a bit line voltage control circuit DISCHARGE for controlling the voltage of bit lines in the memory array MEMARRAY and an internal voltage generating circuit CPC for transmitting a voltage to the respective voltage control circuits.

Next, the circuit arrangement of the AND-type flash memory of this embodiment will be described with reference to FIG. 2. The memory array MEMARRAY has memory cells M11 to M22 and N11 to N22 arranged in the form of a matrix, and the gates (gate electrodes) of the respective memory cells are connected to word wires W11 to W12. The drains (drain regions) of the respective memory cells are connected to selective transistors SD11 to SD22 for selecting the same via data lines D11 to D22. The drains of the selective transistors SD11 to SD22 are respectively, connected to global data lines GD1 to GD2. The sources (source regions) of the memory cells are likewise connected to a common source line through source lines S11 to S22 and selective transistors SS11 to SS22. The gates of the respective selective transistors SD11 to SD22 and SS11 to SS22 are connected to gate wires SiD1 to SiD2 and SiS1 to SiS2. The selective transistors constitute a block BL1 or BL2 wherein 64 or 128 memory cells along the direction of a data line are collected in one block. In FIG. 2, the memory array MEMARRAY is constituted of two blocks, but the invention should not be construed as being limited thereto.

The column decoder XDEC includes a word line voltage control circuits XDEC1 and XDEC2 for applying a high voltage to the word wires W11 to W22 and selective transistor control circuits SGDEC1 and SGDEC2, and may include a source voltage control circuit SDEC to which the common source line is connected and which is illustrated in another region in the figure. A high potential voltage Vpp (Vww, Vwd, etc.), a low potential voltage Vcc (Vrw, Vec, etc.) and a negative potential voltage Vnn (–Vew, etc.), which are generated in the internal voltage generating circuit CPC, are supplied to the column decoder, and a word line select signal is applied to the decoder by means of a column address Ax. More particularly, the internal voltage generating circuit CPC acts to generate voltages (Vww and others) used for reading, writing and erasing operations described hereinafter by use of a power supply voltage Vcc (e.g. 3.3 V) and a reference voltage (ground at 0 volt) supplied from outside of the chip.

As for the direction of the bit line, charge-withdrawing MOS transistors QD1, QD2 having the function of withdrawing electrons of the bit lines (global data lines GD1, GD2) prior to the a operation are provided for each of the data lines D11 to D22. These are also provided with the function of supplying, to the bit lines, a voltage from the voltage generating circuit in the non-select bit lines at the time of a write operation. On the other hand, the bit lines (global data lines GD1, GD2) are connected to the latch circuit LATCH via the column gate control circuit YD-CNTRL.

The states of the various elements for read, write and erase operations of the memory mat in FIG. 2 are shown in Table 1. Table 1 represents the case where the memory cell M11 is selected.

|      | Read  | Write | Erase |
| ---- | ----- | ----- | ----- |
| W11  | Vread | Vww   | –Vew  |
| W12  | 0     | 0     | 0     |
| W21  | 0     | 0     | 0     |
| W22  | 0     | 0     | 0     |
| GD1  | 1     | 0     | 0     |
| GD2  | 1     | Vwd   | 0     |
| D11  | 1     | 0     | 0     |
| D12  | 1     | Vwd   | 0     |
| D21  | Open  | Open  | Open  |
| D22  | Open  | Open  | Open  |
| S11  | 0     | 0     | 0     |
| S12  | 0     | Open  | 0     |
| S21  | Open  | Open  | Open  |
| S22  | Open  | Open  | Open  |
| SiD1 | On    | On    | On    |
| SiD2 | Off   | Off   | Off   |
| SiS1 | On    | Off   | On    |
| SiS2 | Off   | Off   | Off   |

For the write operation in the memory cell M11 in FIG. 2. a voltage of Vww (e.g., 17V) is applied to the word line W11, and a voltage, for example, of 10 V is applied to the gate SiD1 of the selective transistor at the drain side to turn the selective transistors SD11, SD12 on. A voltage of 0 V is applied to the selected local bit line (data line D11) via the selective transistor SD11. On the other hand, a voltage of 0 V is applied to the non-selected word line W12, and a voltage of Vwd (e.g. 6 V) is applied to the non-selected local bit line (data line D12) from the bit line (global data line GD2) via the selective transistor SD12. The gate SiS1 of the selective transistor at the source side is supplied with a voltage of 0 V, thereby turning the selective transistors SS11, SS12 to an off state. In this way, electrons can be injected into a floating gate by a tunnel current through the entire surface of the channel region of the memory cell M11. On the other hand, no injection of electrons takes place in the non-selected memory cells M12 and M21, M22 because any high electric field is applied between the floating gate and the substrate.

In a write operation, an inversion layer is formed on the entire surface of the channel region and voltages at the source and drain terminals are set at the same level, thus not influencing the breakdown voltage between the source and drain terminals.

In an erase operation, a voltage of −Vew (e.g. −17 V0 is applied to the selected word line W11 and 3.3 V is applied to the gates SiS1 and SiD1 of the selective transistor, so that all the selective transistors connected thereto are turned on. A voltage of 0 V is supplied to the local bit and the local source line via the selective transistors. A voltage of 0 V is applied to the non-selected word line W12 In this manner, electrons of all memory cells connected to the selected word line W11 are released. The voltage values indicated above are absolute values relative to a well potential.

In the writing and erasing operations, when all of the selective transistors SD21, SD22 and SS21, SS22 in the non-selected block are turned off, the disturb phenomenon ascribed to the bit lines can be prevented.

Figure 3:
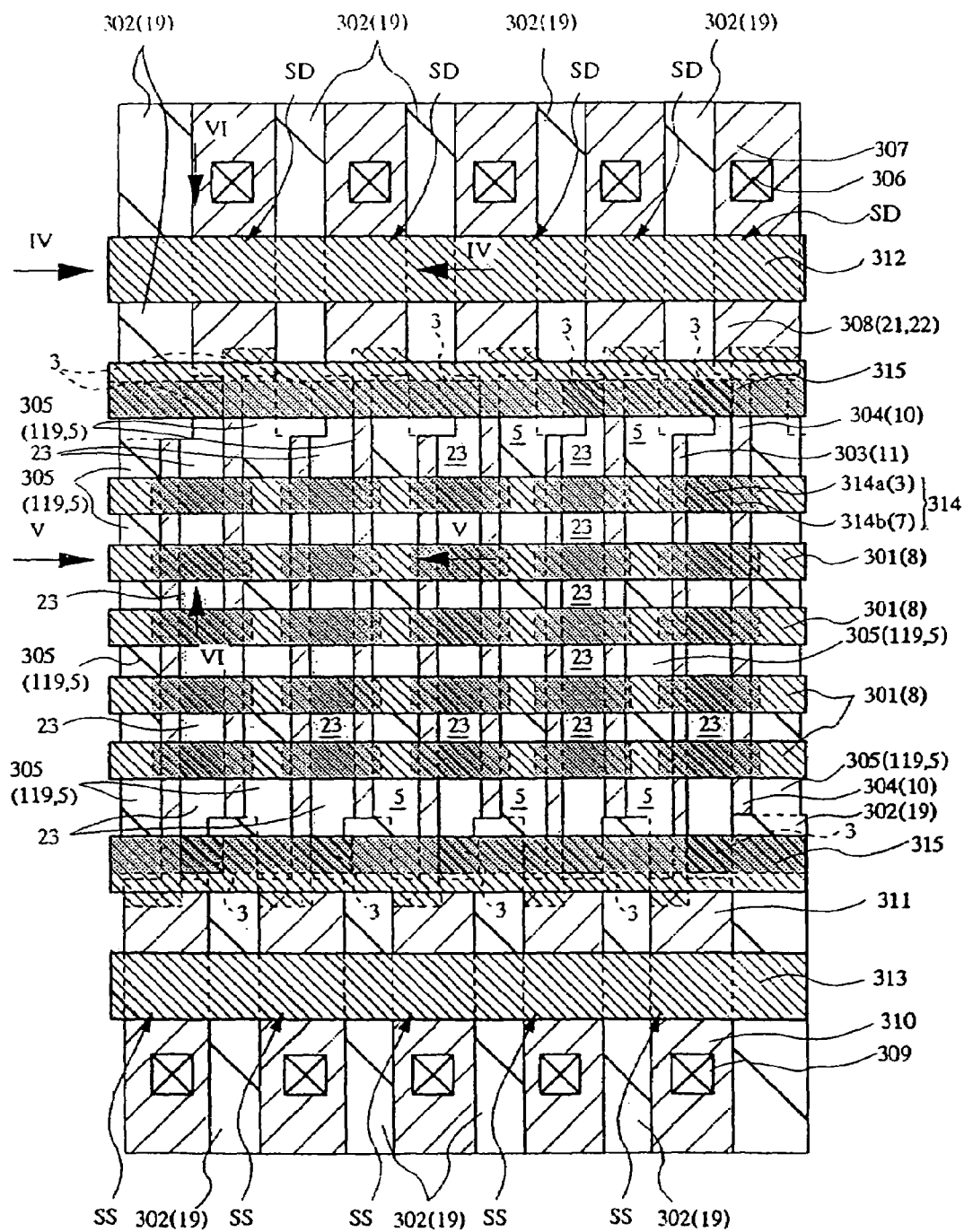
FIG. 3 is a schematic diagram showing an example of a planar layout of the AND-type flash memory of Embodiment 1.

Next, an arrangement of the AND-type flash memory of this embodiment will be described. FIG. 3 is a schematic view showing an example of a planar layout of the AND-type flash memory of Embodiment 1.

The AND-type flash memory has memory cells M (M11 to M22, N11 to N22) arranged in rows and columns to form memory cell blocks BL (BL1, BL2).

In the row direction (word line direction) of the respective memory cells, word lines 301(8), which function as control gate electrodes of the memory cells M (word lines W11 to W12), extend. At opposite ends of the respective memory cells H along the column direction (bit line direction), selective transistors SD (SD11, SD12) and selective transistors SS (SS11, SS12) are arranged. The selective transistors SD and the selective transistors SS are arranged such that individual transistors are isolated with an isolation region 302(19). The memory cells M are each constituted of a MISFET (metal-insulator-semiconductor field effect transistor).

The source and drain regions of the memory cells M are, respectively, constituted commonly of source regions 303 (11) which function as source lines S11, S12 and are provided in the form of an n-type semiconductor region, and drain regions 304(10), which function as data lines D11, D21 and are provided in the form of an n-type semiconductor region. Memory cells M adjoining in the column direction are isolated by isolation regions 305 (5).

Although not shown in FIG. 3, global data lines GD (GD1, GD2) made of a metal wire are electrically connected to n-type semiconductor regions 306, which serve as drain regions of the selective transistors SD, via contact holes 306, and n-type semiconductor regions 308(21), which serve as source regions of the selective transistors SD, are electrically connected to the drain regions 304(10). On the other hand, a metal wire constituting the common source line is so arranged as to intersect with the global data lines GD, although not shown, and this metal wire is electrically connected to n-type semiconductor regions 310 serving as source regions of the selective transistors SS via contact holes 309. n-Type semiconductor regions 311 serving as drain regions of the selective transistors 303 are electrically connected to the source regions 303(11) within the memory cell block. The gate electrodes 312, 313 of the selective transistors SD, SS are constituted of a wiring material for the word lines 301(8) above the floating gates.

The transistor region of the memory cell M is a region shown as a floating gate electrode 314 (3, 7). The floating gate electrode 314 (3, 7) is formed below the word line 301(8) and has a double-layered structure consisting of a first floating gate electrode 314a(3) and a second floating gate electrode 314b(7). The first floating gate electrode 314a(3) is formed on the main surface of the semiconductor substrate 1 through a tunnel oxide film 2 and is also formed on a channel region between the source region 303(11) and the drain region 304(10). The second floating gate electrode 314b(7) is placed on the first floating gate electrode 314a(3) to determine the capacitance values of the word line 301(8) and the floating gate electrode 314 (3, 7). A control gate electrode 8 is formed on the second floating gate electrode 314b through an interlayer insulating film 15, and the control gate electrode is formed integrally with the word line 301(8). More particularly, the channel region is arranged between the source region 303(11) and the drain region 304(10) in the row direction.

Buffering gates 315 are, respectively, formed between the memory cells M and the selective transistors SD, SS for separating the transistors.

Figure 4:
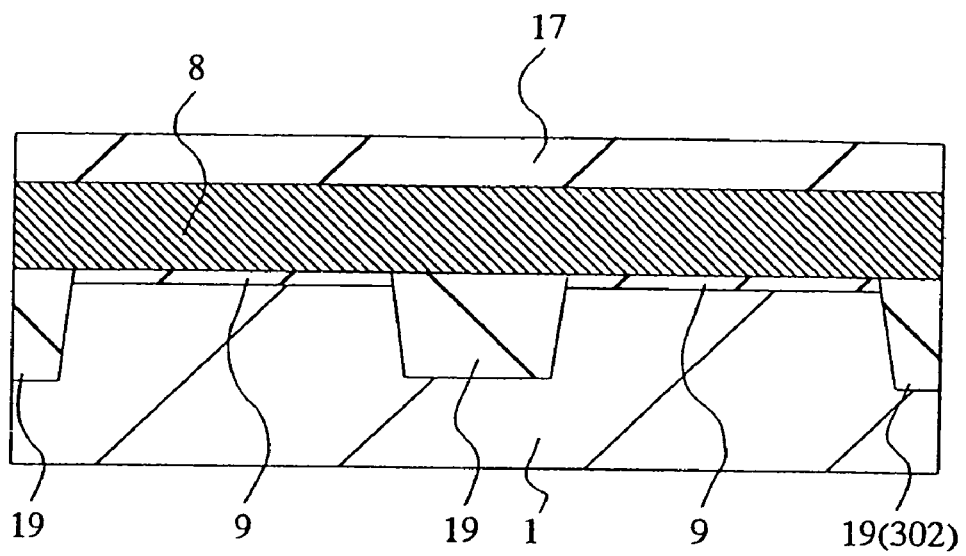
FIG. 4 is a sectional view taken along the line IV—IV of FIG. 3.
Figure 5:
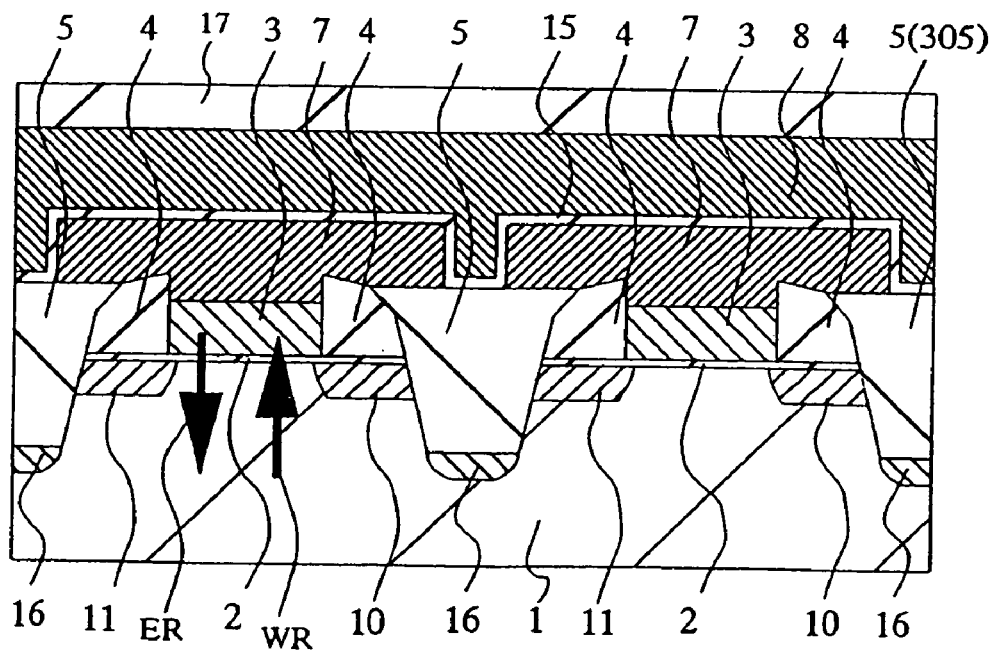
FIG. 5 is a sectional view taken along the line V—V of FIG. 3.
Figure 6:
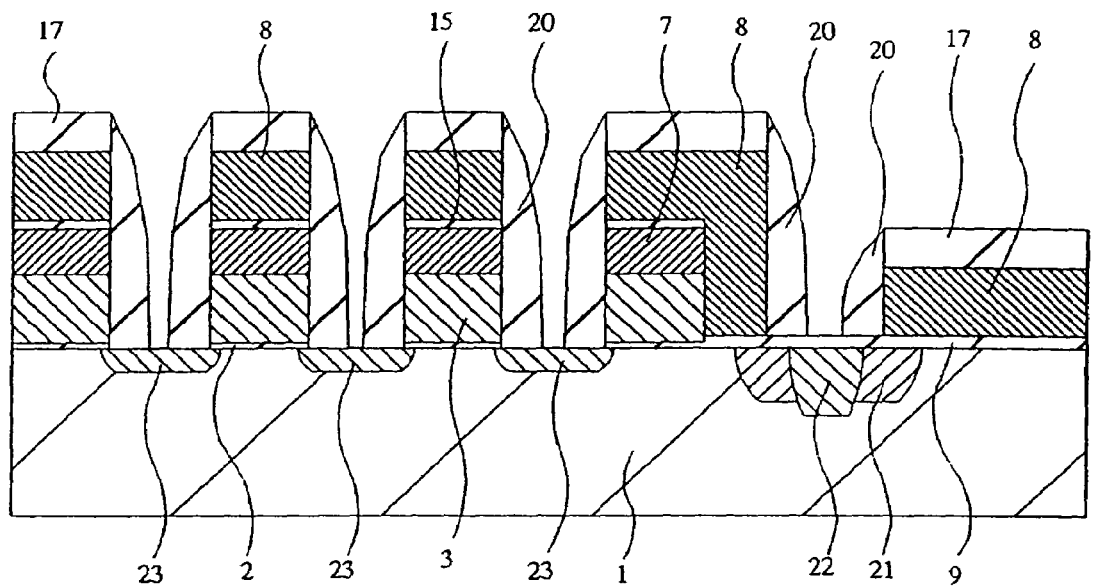
FIG. 6 is sectional view taken along the line VI—VI of FIG. 3.

Next, the sectional structure of the AND-type flash memory of this embodiment will be described. FIG. 4 is a sectional view taken along the line VI—VI of FIG. 3, and FIG. 5 is a sectional view taken along the line V—V of FIG. 3. FIG. 6 is a sectional view taken along the line VI—VI of FIG. 3.

Individual memory cells have such a structure that they are isolated from one another by shallow groove isolation (SGI: Sharrow Groove Isolation) and a p-channel stopper region 16, and the deposited oxide film 5 is formed at the groove portion of the silicon substrate. The p-type silicon substrate 1 is covered on the surface thereof with a tunnel oxide film 2 which is a gate insulating film having a thickness of about 9.5 nm, and a first floating gate electrode 3 (314a) formed of a polysilicon layer is formed on the tunnel oxide film 2. The first floating gate electrode 3 is covered at side surfaces thereof with an insulating film 4 serving as a side wall spacer, on which the second floating gate electrode 7 (314b) made of polysilicon is formed. The second floating gate electrode 7 and the first floating gate electrode 3 are electrically connected to each other. An interlayer insulating film 15 is formed on the second floating gate electrode 7 and an isolation region 5. Moreover, a control gate electrode 8 (301), which is made of a silicide layer, such as of polysilicon or tungsten, and an insulating film 7 are formed on the interlayer insulating film 15. Although not shown in FIG. 5, an insulating film 128 is formed on the control gate electrode 8, on which a metal wire serving as a word line. (global data line GD) is formed so as to intersect with the control gate electrode 8. A source region 11 (303) and a drain region 10 (304) of the memory cell are formed within the silicon substrate beneath the first floating gate electrode 3. The semiconductor regions (source region 11, and drain region 10) of the memory cell are electrically connected to semiconductor regions 308 (21) 311 of the selective transistors (SD, SS) (FIG. 5). As will be described hereinafter, the source region 11 (303) and the drain region 10 (304) are symmetrical in structure and are constituted as having a shallow junction.

MISFET's other than the memory cell M and the selective transistors SD, SS constitute a peripheral circuit, which is formed in a peripheral circuit-forming region (peripheral circuit portion). A MISFET, to which a high potential voltage Vp is applied, is formed as a high withstand voltage MISFET. Circuits including the high withstand voltage MISFET include, for example, the internal voltage generating circuit. CPC, the column decoder XDEC, and the like.

The gate electrodes (312, 313) of the selective transistor are made of the same material as that used for the cont gate electrode 8 of the memory cell. An element isolation 19 is formed in an isolation step of the peripheral circuit portion described hereinafter (FIG. 4).

A gate oxide film 9 of the selective transistor is formed to have a thickness larger than the gate insulating film 2 and has a thickness, for example, of approximately 25 nm.

In the section parallel to the data lines (FIG. 6), word lines (301, 8) are formed at equal intervals of a minimum processing size, with a built-up structure of the first and second floating gate electrodes 3, 7, the interlayer insulating film 15 and the control gate electrode 8 serving as a word line. The word lines are isolated from one another by means of p-type semiconductor regions 23 introduced through ion injection. A buffer gate (residual gate) 315 is formed between the selective transistor and the word line. The floating gate electrode 7 of the residual gate 315 and the control gate electrode 8 are internally connected, thus ensuring electric conduction.

Next, a method for fabricating the AND-type flash memory will be described with reference to FIGS. 7 to 19. FIGS. 7 to 19 are, respectively, sectional views showing, in sequence, an example of a method of fabricating the AND flash memory of Embodiment 1. It will be noted that, in FIGS. 7 to 19, the left-side region indicates a peripheral circuit-forming region (peripheral circuit portion) in which a transistor of a peripheral circuit is formed and the right-side region indicates a memory-forming region (memory cell portion) wherein memory cells are formed.

Figure 7:
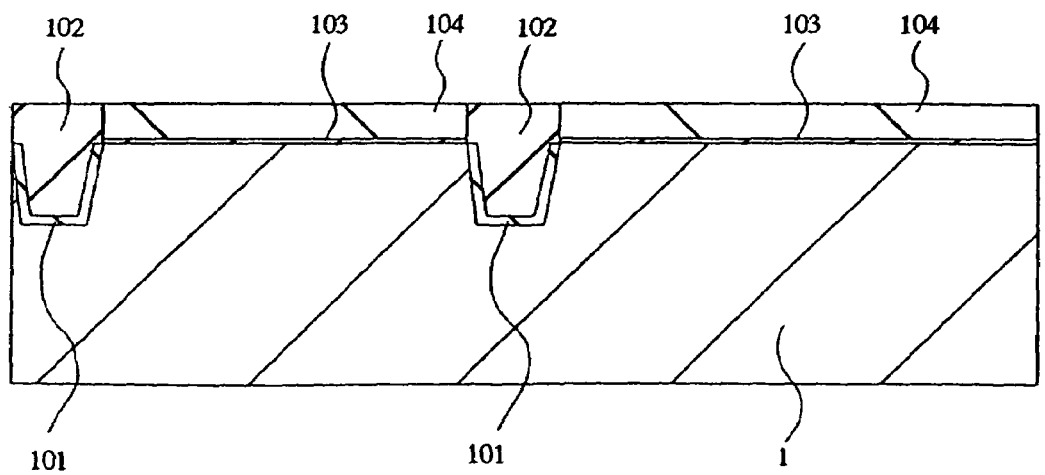
FIGS. 7 to 19 are, respectively, sectional views showing, in sequence, an example of a method for fabricating the AND-type flash memory of Embodiment 1.

Initially, a silicon oxide film 103 and a silicon nitride film 104 are attached (deposited) on a p-type semiconductor substrate 1, after which a photoresist is patterned so as to form an element isolation region of a peripheral circuit portion, followed by dry etching of the silicon nitride film 104 through the photoresist as a mask. Thereafter, the silicon oxide film 103 is removed, followed by further etching of the semiconductor substrate through the mask of the silicon nitride film 104 by dry etching so that about 0.35 μm thick grooves are formed in the semiconductor substrate 1. Next, the semiconductor substrate 1 is oxidized to form an approximately 30 nm thick silicon oxide film 101 inside the grooves formed by the etching. Subsequently, an insulating film (silicon oxide film) 102 is attached (deposited) to a thickness of approximately 0.5 μm according to the CVD method. The insulating film 102 is polished by the CMP (chemical mechanical polishing) method and planarized to the surface of the silicon nitride film 104. (FIG. 7)

Figure 8:
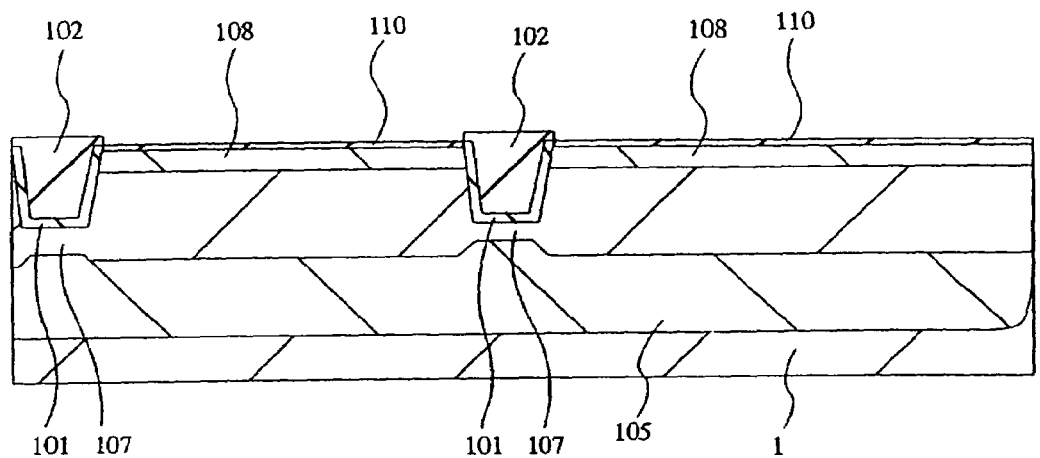

Next, the silicon nitride film 104 is removed by wet etching, such as with hot phosphoric acid or the like, thereby forming an element isolation region 302 (19) made of the insulating film 102. In this stage, isolation regions of selective transistors within a memory mat are simultaneously formed. Then, boron (B) is ion-injected into the semiconductor substrate 1 several times by divided steps. In the respective injection steps, the energy and dosage are controlled. In this way, there are formed a p-type well region 105, a channel stopper region 107 and a channel region 108. Next, the semiconductor substrate 1 is thermally oxidized on the surface thereof to form a 9.5 nm thick silicon oxide film 110 (FIG. 8). The silicon oxide film 110 serves as a tunnel oxide film 2.

Subsequently, a first polysilicon film (conductive film) 111, an insulating film (silicon oxide film) 112 and a silicon nitride (SiN) film 113 used as an insulating film are successively attached (deposited), for example, by the CVD method, thereby forming a built-up film 114 The first polysilicon film 111 may be either a phosphorus-doped polysilicon film wherein impurity phosphorus is doped at about $1 \times 10^{20}$ atoms/cm$^2$, or a non-doped polysilicon film. Thereafter, the polysilicon film 111, insulating film 112 and silicon nitride film 113 are, respectively, processed by dry etching using a photoetching process so that the polysilicon film 111 provides the first floating gate electrodes (3, 314a) in the memory cell portion and the surface of the semiconductor substrate 1 is protected in the peripheral circuit portion. By dry etching, the built-up film 114 in the memory cell portion is patterned in a line pattern extending in the column direction (i.e. a striped column pattern (column lines)). Thus, in the peripheral circuit portion and also in the region where selective transistors are formed, although not shown, the polysilicon film 111, insulating film 112 and silicon nitride film 113 are left so as to protect the surface of the semiconductor substrate 1. This permits grooves to be formed between the column patterns in the row direction.

Next, the photoresist is patterned so that a region, in which memory cells are to be formed, is exposed, and arsenic (As) ions are ion implanted into the substrate, for example, under conditions of a dosage of $5 \times 10^{15}$ atoms/cm$^2$ and an acceleration voltage of 50 KeV to form semiconductor regions (diffusion layers) 10, 11, 115, 303, 304 serving as source/drain regions. In this ion implantation, the built-up film 114 of the column pattern functions as a mask in addition to the photoresist. This allows the n-type semiconductor region 115 to be self-alignedly formed relative to the column pattern, so that the semiconductor regions 115 can be formed with high precision relative to the fine column pattern. More particularly, the source regions 11, 115 and 303 and the drain regions 10, 115 and 304 are formed at the same time or by the same ion implantation step, and are thus constituted with a symmetric structure. In other words, the source regions 11, 115 and 303 and the drain regions 10, 115 and 304 are so arranged as to have the same impurity profile.

Since the silicon nitride film 113 is formed on the upper layer of the built-up film 114 serving as a mask, the implanted impurity is stopped at the silicon nitride film, not influencing the characteristic properties of the polysilicon film 111 and the lower semiconductor substrate 1. As will be described hereinafter, the semiconductor regions 115, respectively, result in the source regions 303 (11) and the drain regions 304(10) functioning as source lines or data lines.

Figure 9:
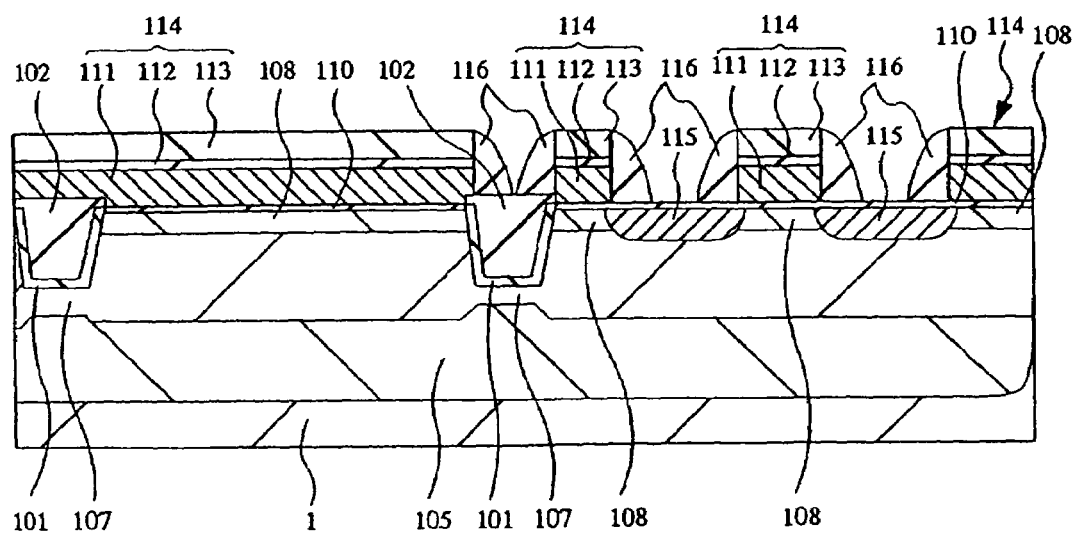

Next, a 200 nm thick silicon oxide film, which is an insulating film, is deposited according to the CVD method, and the silicon oxide film is subjected to anisotropic etching to form side wall spacers 116 at side surfaces of the built-up film 114 (FIG. 9)

Figure 10:
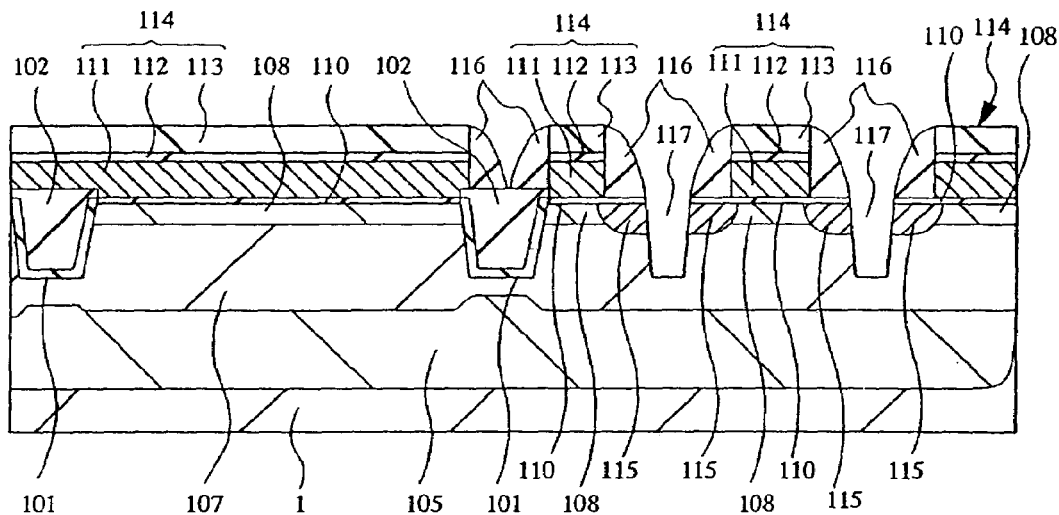

Thereafter, the built-up film 114 of the memory cell portion and the semiconductor substrate 2 in regions where no side wall spacer is formed are removed by anisotropic dry etching to form about 0.35 μm deep grooves 117 (FIG. 10). For the dry etching, the built-up film 114 and the side wall spacers 116 function as an etching mask in addition to the photoresist covering the peripheral circuit portion and the selective transistor portion, and thus, the grooves 117 can be self-alignedly processed relative to the built-up films 114 and the side wall spacers 116. Hence, the grooves 117 can be stably processed even in a fine column pattern thereby forming an element isolation region. This is effective in realizing a high degree of integration of the AND-type flash memory. It will be noted that at this stage, an impurity is ion implanted into the bottom of each groove 117 to form a channel stopper region 16.

Figure 11:
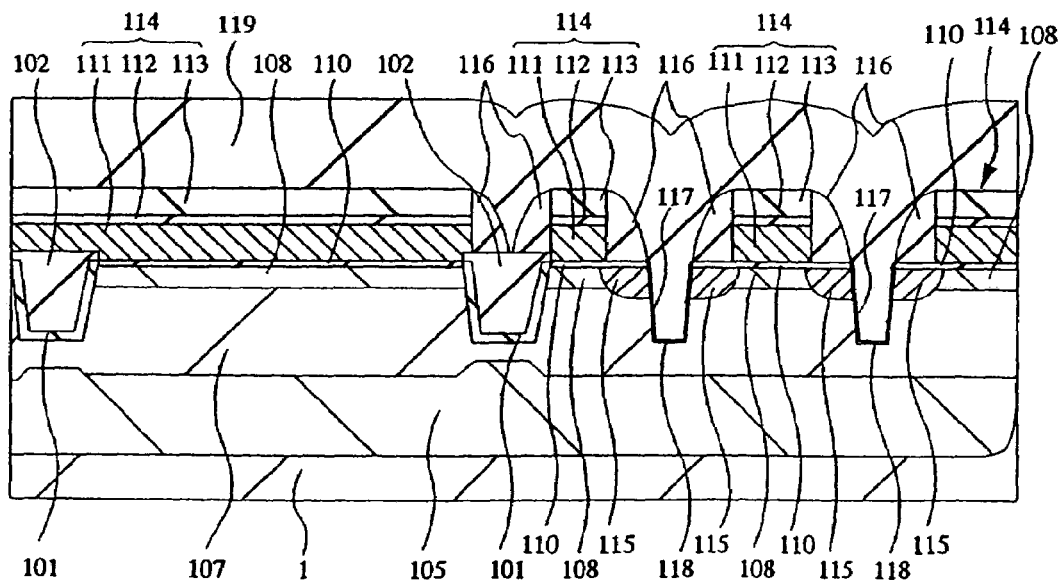

The groove 117 is oxidized at the inside thereof to form an approximately 40 nm thick silicon oxide film 118, followed by attaching (depositing) an about 400 nm thick silicon oxide film (silicon oxide film) 119 by the CVD method (FIG. 11).

Figure 12:
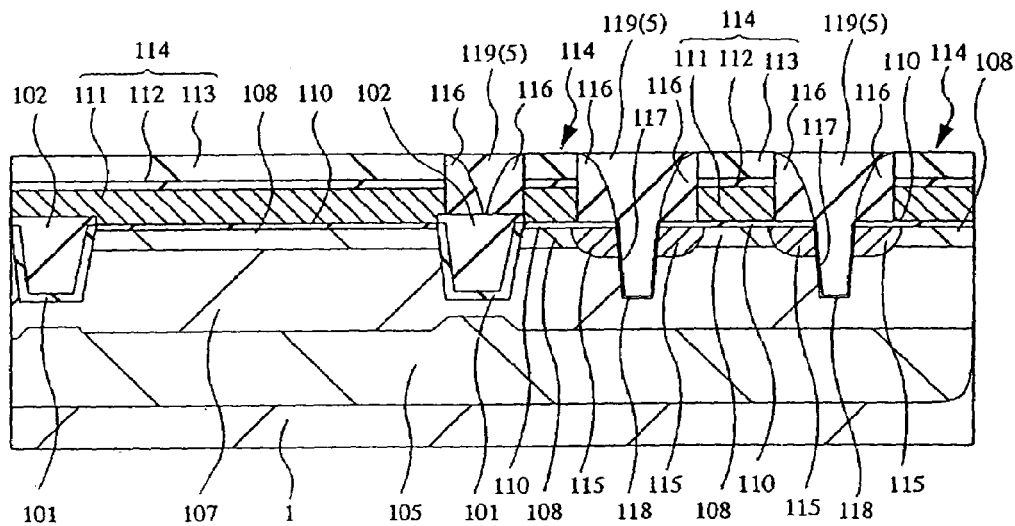

Subsequently, the insulating film 119 is polished according to the CMP technique for planarization to the silicon nitride film 113 which is the upper portion of the built-up film 114 (FIG. 12). In this way, the insulating film 119 is buried between the sidewall spacers 116, and its surface position becomes substantially equal to the level between the column patterns and also to the level of the memory cell portion and the element isolation region. In this manner, there can be formed a shallow groove isolation region made of the deposited oxide film 5. It should be noted that in the planarization by the CMP technique, the silicon nitride film 113 functions as a stopper for the CMP, thereby increasing the process margin of the planarization. Since the peripheral circuit portion and the like are covered with the built-up film 114, the surface of the semiconductor substrate 1 at the covered portion is not damaged or contaminated when undergoing the CMP step, and the formation of a recessed portion with a wide area can be prevented, thereby preventing dishing which impedes the planarization. Moreover, since the insulating film 119, which is buried only in the groove 117 which is formed in the memory cell portion, has uniform width and length, and is formed by repetitions of a regular pattern, the process margin can be increased at the time of polishing by the CMP method. It will be noted that the planarization also may be effected by the combination of the CMP method and the etching method.

Figure 13:
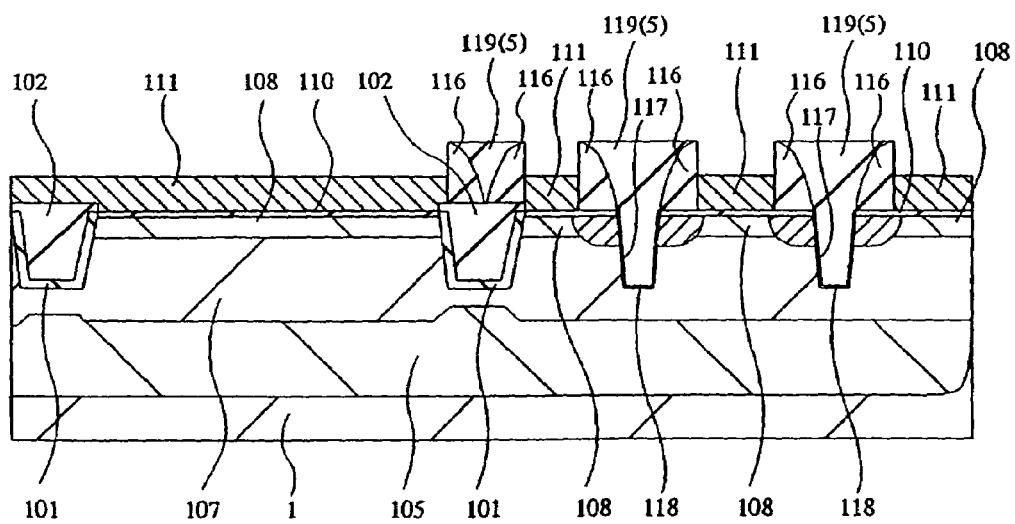

After removal of the silicon nitride film 113 with hot phosphoric acid, the silicon oxide film 112 is removed by dry etching (FIG. 13).

Figure 14:
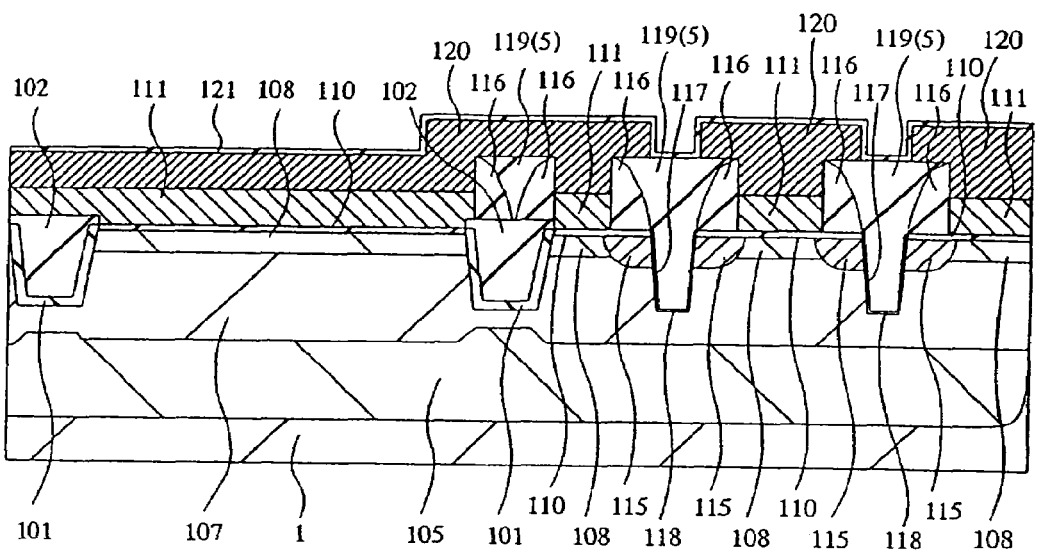

Next, a second polysilicon film 120 is attached (deposited) by the CVD method or the like, followed by processing (patterning) by a hot etching step to provide the second floating gate electrode 7. At that time, the peripheral circuit portion is protected. Thereafter, an interlayer insulating film 121 is formed (FIG. 14). The second polysilicon film 120 is doped, for example, with phosphorus (P) as an impurity.

Figure 15:
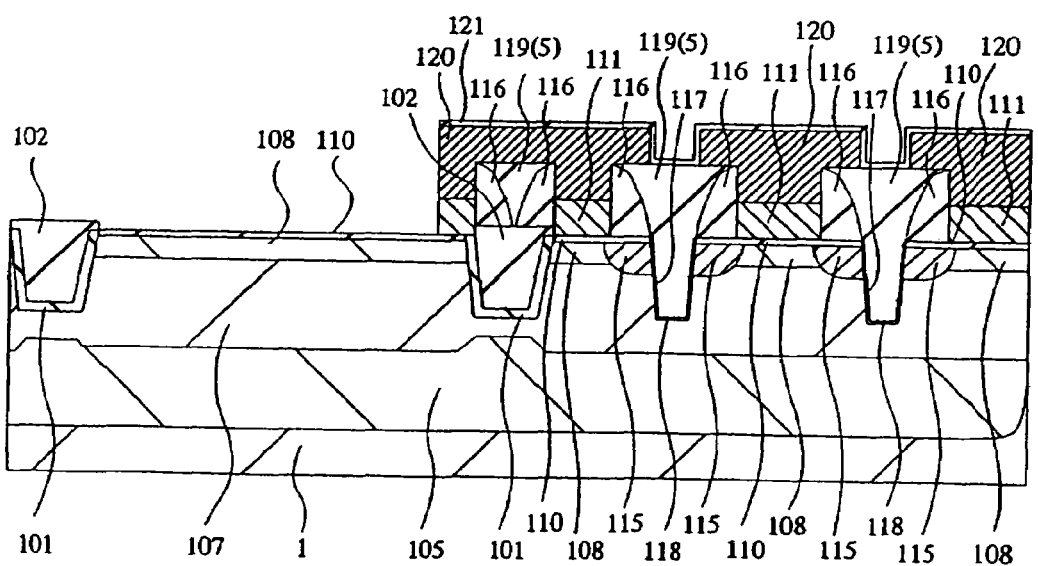

The interlayer insulating film 121, second polysilicon film 120 and polysilicon film 111 at the peripheral circuit portion and the selective transistor portion are removed by a photoetching step (FIG. 15).

The surface position of the insulating film 119 is so arranged as to be higher than the surface position of the first polysilicon film 111 which results in the first floating gate electrode 3. In this way, the second polysilicon film 120, which results in the second floating gate electrode 7, is formed as extending over the insulating film 119. As a result, the capacitance between the second floating gate electrode 7 and the source/drain region (semiconductor region 115) can be reduced thereby improving the characteristics of the memory cell M. More particularly, the surface position of the insulating film 119 beneath the second polysilicon film, which results in the second floating gate electrode 7, is so arranged as to be higher than the surface position of the first polysilicon film 111 which results in the first floating gate electrode 3. Moreover, the surface position of the insulating film 119 is so arranged as to be uniform in between the first polysilicon films 111. The surface position of the insulating film 119 is arranged so as to be higher than the surface position of the insulating film 102.

Figure 16:
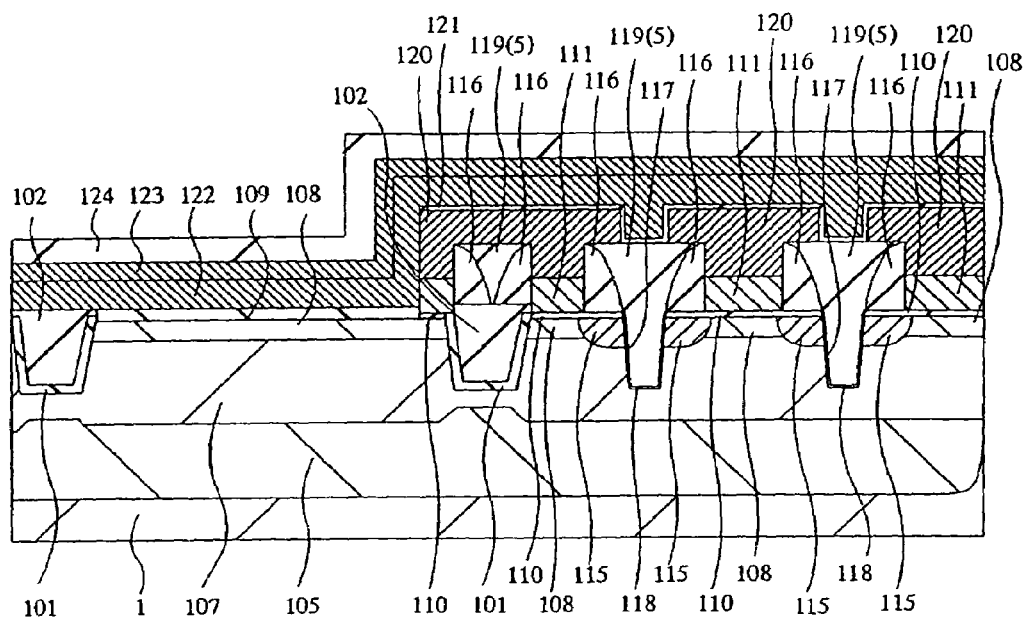

Then, the channel regions of the peripheral circuit portion and the selective transistor portion are formed on the main surface of the semiconductor substrate 1 by ion implantation, after which the silicon oxide film 110 is removed to expose the main surface of the semiconductor substrate 1, followed by oxidation of the exposed surface of the semiconductor substrate 1 thereby forming an approximately 25 nm thick silicon oxide film 109 which is thicker than the gate insulating film 2. Subsequently, a third polysilicon film 122 and a WSi$_2$ (tungsten silicide) film 123 and a silicon oxide film 124 (17), which is an insulating film and is formed by the CVD method, are successively formed (FIG. 16). The third polysilicon film 122 and the WSi$_2$ film 123 result in a control gate electrode 301 (8).

Next, the silicon oxide film 124 (17) is processed by a photoetching process so as to make a pattern of gate electrodes of the transistors of the peripheral circuit portion, gate electrodes of the selective transistors, and control gate electrodes of the memory cells. Thereafter, the WSi$_2$ film 123 and the third polysilicon film 122 are processed through a mask of the silicon oxide film 124 (17). Thus, patterning is effected in a direction vertical to the extending direction of the column pattern, thereby forming control gate electrodes 301(8) and word wires extending in the column direction. After a photoresist is patterned so as to open the memory cell portion, the interlayer insulating film 121 and the second and first polysilicon films 121, 111 are successively processed. The thus patterned WSi$_2$ film 123 and third polysilicon film 122 function as a gate electrode of the MOS transistor of the peripheral circuit. Moreover, the patterned interlayer insulating film 121, and the second and first polysilicon films 120, 111, respectively, become the interlayer insulating film 15, the second floating gate electrode 7 and the first floating gate electrode of the memory cell M.

Figure 17:
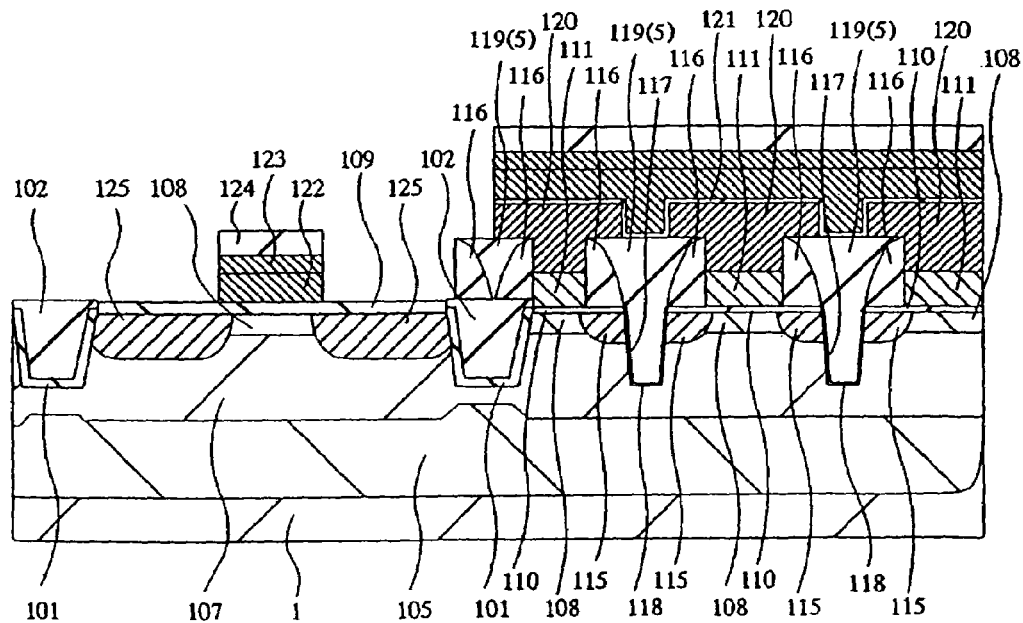
Figure 18:
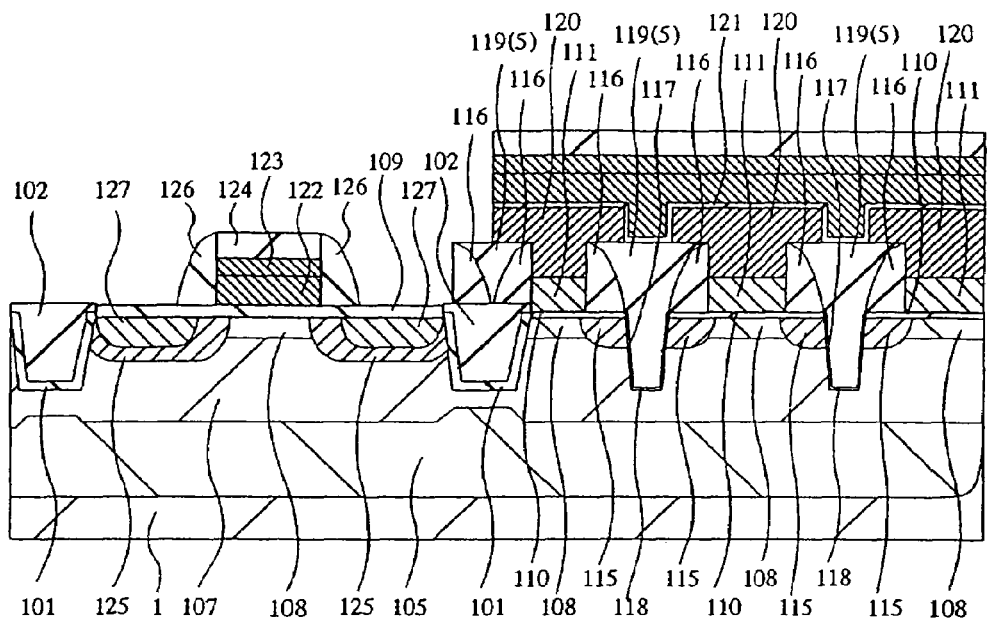
Figure 19:
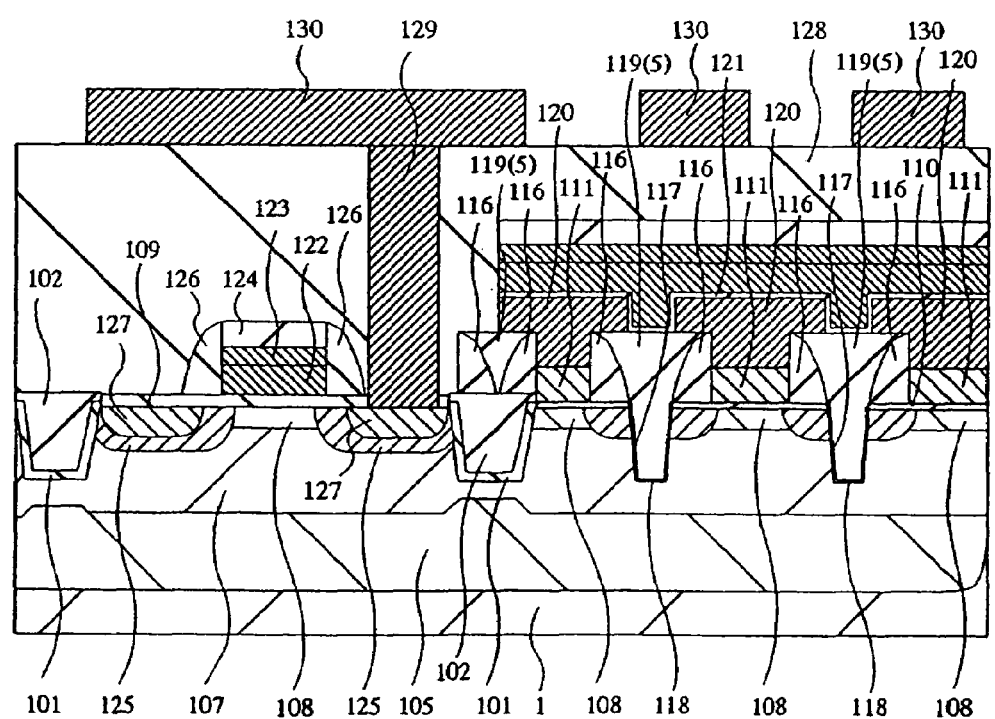

Next, the photoresist is so patterned as to open the MOS transistor of the peripheral circuit portion, and, for example, phosphorus (P) ions are implanted into the substrate under conditions of a dosage of $2 \times 10^{13}$ atoms/cm$^2$ and an acceleration voltage of 100 keV, followed by thermal diffusion at 850° C. to form an N-type low concentration semiconductor region 125 of the high withstand voltage MOS transistor of the peripheral circuit portion. Likewise, although not shown in the figures, the photoresist is patterned to form N-type low concentration semiconductor regions of the MOS transistor of the peripheral circuit portion and the selective transistor (FIG. 17).

Thereafter, an approximately 200 nm thick silicon oxide film serving as an insulating film is formed, for example, by the CVD method and subjected to anisotropic etching to form side wall spacers 126 on the side surfaces of the gate electrode of the MOS transistor of the peripheral circuit by anisotropic etching. The photoresist is so patterned as to open the peripheral circuit portion and the selective transistor portion, and arsenic (As) ions are, for example, implanted into the substrate under conditions of a dosage of $5 \times 10^{15}$ atoms/cm$^2$ and an acceleration voltage of 50 keV to form an, N-type high concentration semiconductor region 127 (FIG. 18), Next, a silicon oxide film and an interlayer insulating film 128 made of phosphate glass are formed according to the CVD method, and a plug electrode 129 is formed in a contact hole to form metal wires 130. In this way, the MOS transistor of the peripheral circuit portion and the MOS transistor constituting the memory cell of a fine gate are formed on the same substrate.

As described hereinabove, in the AND-type flash memory and fabrication method of this embodiment, a shallow groove isolation is applied to the memory cell and the selective transistor. When the rewriting system using an entire surface channel is adopted, the semiconductor regions 10, 11, 115, 303 and 304 of the memory cell can be formed in a shallow junction and can have a symmetric structure, enabling one to make a fine memory cell. When adopting the rewriting system using the entire surface channel, the degradation of a silicon oxide ascribed to the rewrite stress can be reduced. Moreover, the memory blocks are divided by means of the selective transistors, so that disturbance in a non-selected block at the time of rewriting can be reduced.

(Embodiment 2)

In Embodiment 1, the gate electrode of the selective transistors is made of the same material as the control gate electrode. In this Embodiment 2, an example where the gate electrodes of the selective transistors are constituted of a material for the floating gate electrode and the control gate electrode is provided. Moreover, an example where the formation of the isolation region of the selective transistors can be formed simultaneously with the formation of the isolation region of the memory cell portion will be considered.

The layout and the circuit arrangement in the entirety of the chip of the AND-type flash memory of this embodiment are similar to those of Embodiment 1 and their illustration is omitted.

Figure 20:
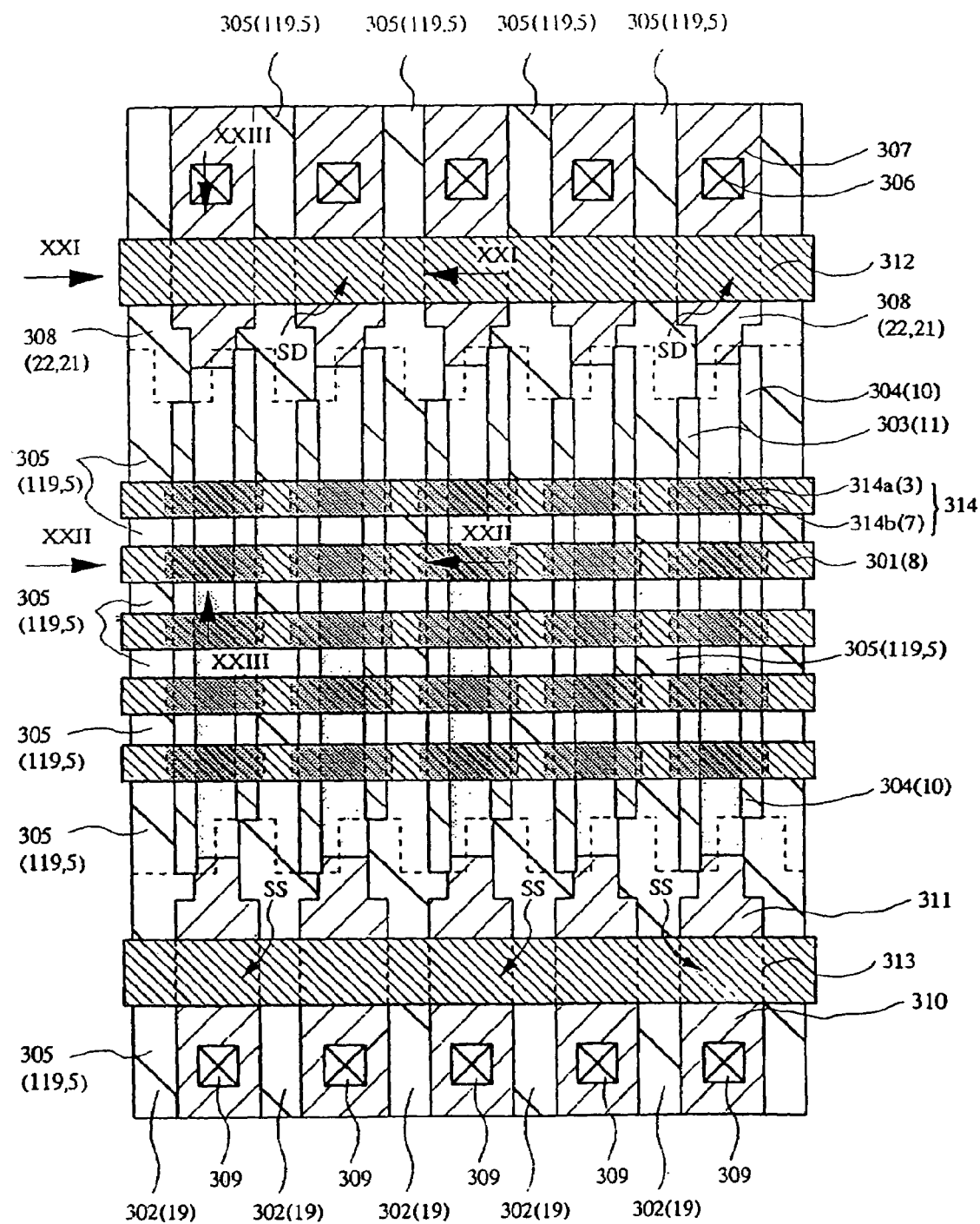
FIG. 20 is a schematic diagram showing an example of a planar layout of an AND-type flash memory representing Embodiment 2.
Figure 21:
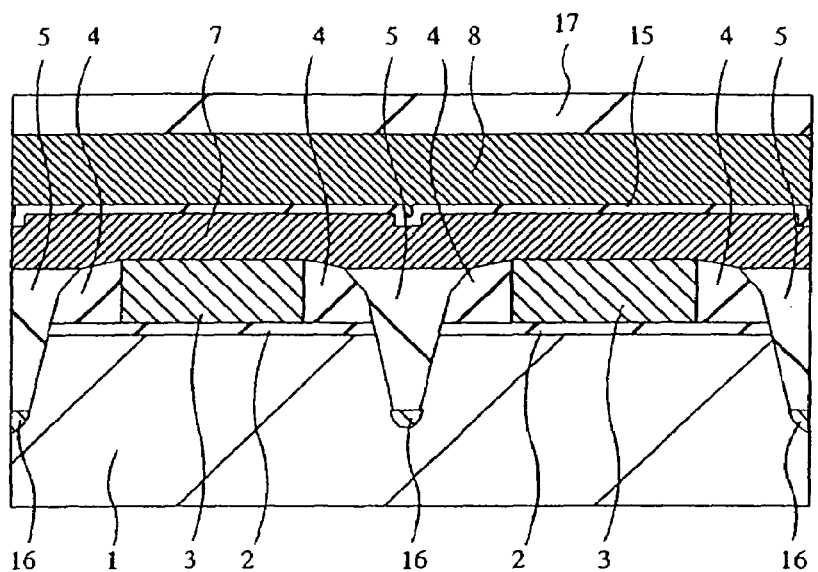
FIG. 21 is a sectional view taken along the line XXI—XXI of FIG. 20.

FIG. 20 is a diagram showing an example of a planar layout of an AND-type flash memory representing Embodiment 2. FIG. 21 is a sectional view taken along the line XXI—XXI of FIG. 20, FIG. 22 is a sectional view taken along the line XXII—XXII of FIG. 20, and FIG. 23 is a sectional view taken along the line XXIII—XXIII of FIG. 20.

As shown in FIG. 20, the buffer gate 315 is not formed in the AND-type flash memory of the present embodiment. As will be described later, this is made possible based on the fact that the gate electrodes of the selective transistors are constituted of a material for the floating gate electrode and the control gate electrode.

As shown in FIG. 21, the gate electrodes of the selective transistors SD, SS are made of a material for the first and second floating gate electrodes 3, 7 and the control gate electrode 8. The element isolation 5 has the same structure as the memory portion. As shown in FIG. 23, in a section parallel to the data line, the word lines are formed at equal intervals by a minimum processing size, and the first and second floating gate electrodes 3, 7, the interlayer insulating film 15 and the control gate electrode 8, which results in a word line, are arranged to provide a built-up structure. The word lines are isolated with a P-type semiconductor region 23 introduced by ion implantation. The interlayer insulating film 15 inside the selective transistor is partially removed so that the floating gate electrode 7 and the control gate electrode are rendered electrically conductive. The gate oxide film 9 of the selective transistor has a thickness of approximately 25 nm.

Figure 22:
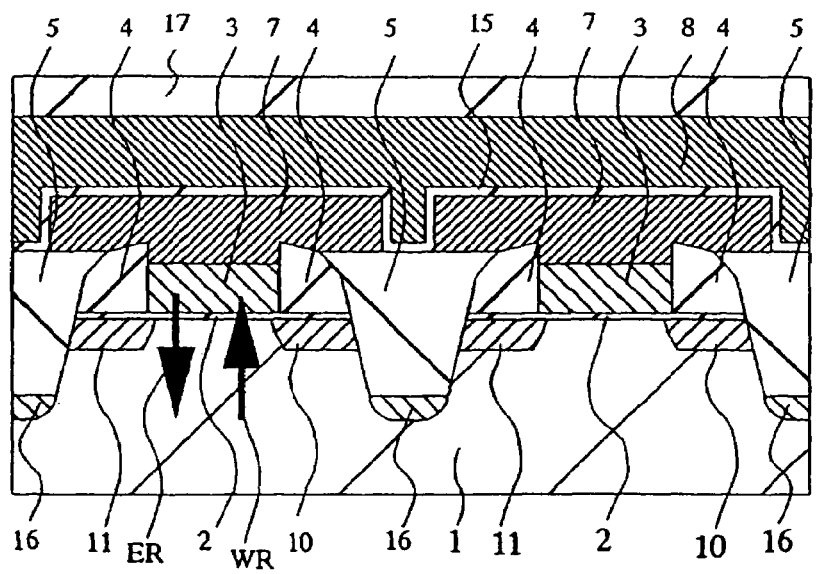
FIG. 22 is a sectional view taken along the line XXII—XXII of FIG. 20.
Figure 23:
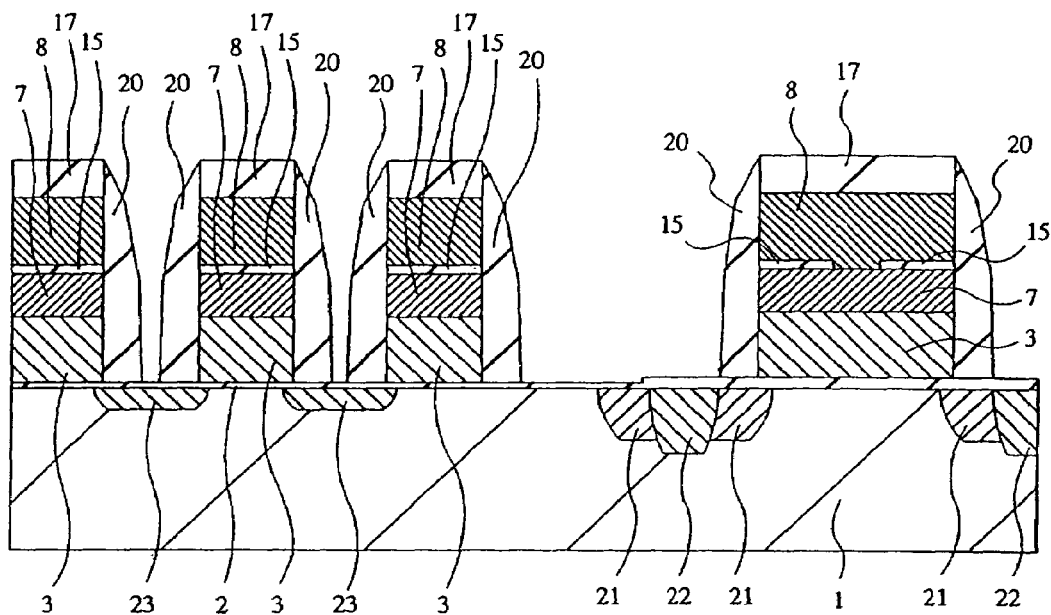
FIG. 23 is a sectional view taken along the line XXIII—XXIII of FIG. 20.
Figure 24:
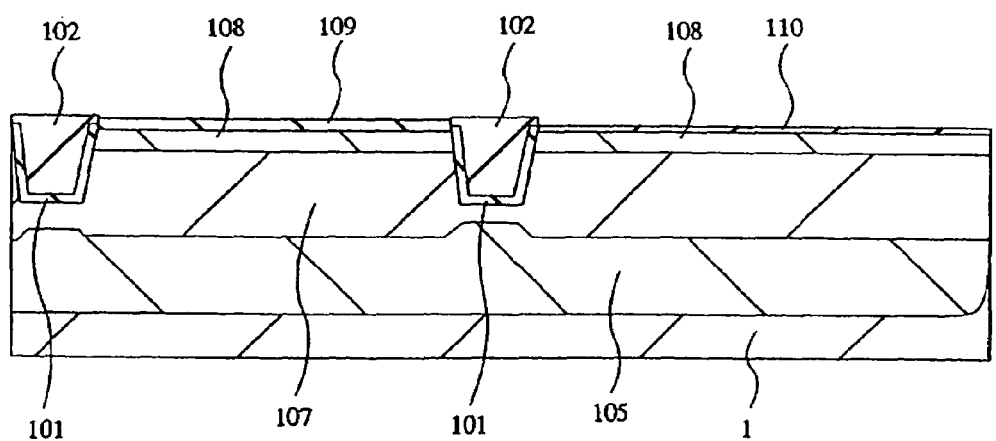
FIGS. 24 to 35 are, respectively, sectional views showing, in sequence, an example of a method for fabricating the AND-type flash memory of Embodiment 2.

The section shown in FIG. 22 is similar to that of Embodiment 1 with its illustration being omitted.

Next, the method of fabricating the AND-type flash memory of this embodiment will be described with reference to FIGS. 24 to 35. FIGS. 24 to 35 are, respectively, sectional views showing, in sequence, the method of fabricating the AND-type flash memory of Embodiment 2. It will be noted that in FIGS. 24 to 35, the left-side region indicates a peripheral circuit portion and the right-side region indicates a memory cell portion, like Embodiment 1.

In the fabrication method of this embodiment, the step prior to the formation of the silicon oxide film 11 shown in FIG. 8 in Embodiment 1 is similar to that of Embodiment 1 and its illustration is omitted. It should be noted here that an element isolation region formed prior to this step is formed only at the peripheral circuit portion and is not formed in a region where selective transistors are formed.

Next, the semiconductor substrate 1 is oxidized on the surface thereof to form an about 20 nm thick thermally oxidized film 109. The thermally oxidized film 109 at the memory cell portion is removed by a photoetching technique, and the resultant exposed substrate surface is oxidized to form a 9.5 nm thick silicon oxide film 110. At this time, the thermally oxidized film 109 of the peripheral MOS transistors and the selective transistors inside the memory mat, not shown in the figure, has a thickness of 25 nm. The silicon oxide film 110 becomes a tunnel oxide film 2, and the thermally oxidized film results in a gate insulating film of the transistor of the peripheral circuit and the selective transistor.

Next, a first polysilicon film 111, a silicon oxide film 112 formed by the CVD method and a silicon nitride film 113 are successively attached (deposited) to provide a built-up film 114. Thereafter, the built-up film 114 is subjected to dry etching by a photoetching process so that the polysilicon film 111 results in a first gate electrode in the memory cell and also in a gate electrode of the MOS transistor in the peripheral circuit portion.

Figure 25:
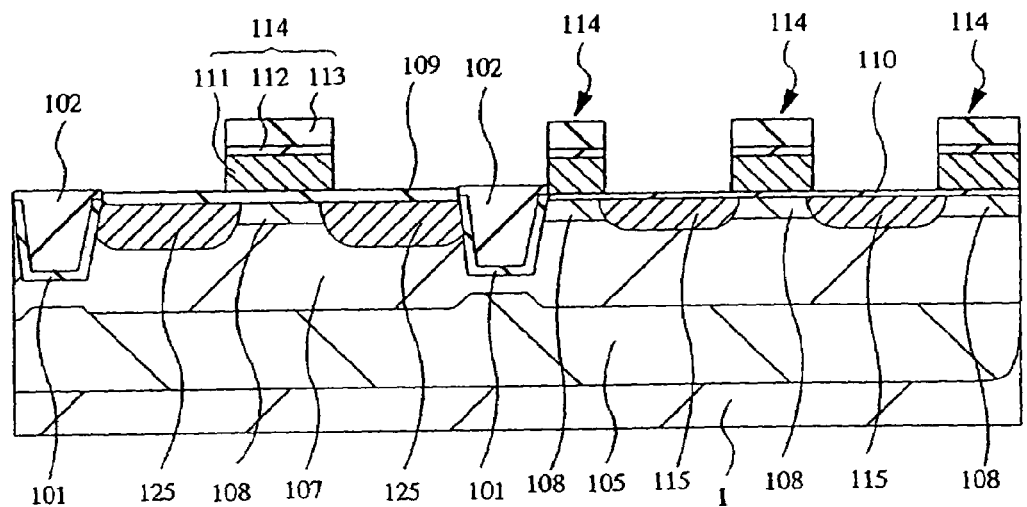

Then, a photoresist is patterned so that the MOS transistor of the peripheral circuit portion is opened, followed by ion implantation, for example, of phosphorus (P) ions under conditions of a dosage of $2 \times 10^{13}$ atoms/cm$^2$ and an acceleration voltage of 100 keV and thermal diffusion at 900° C. to form an N-type low concentration semiconductor region 125 of the high withstand voltage MOS transistor of the peripheral circuit portion. Although not shown in the figures, the photoresist is so patterned as to form an N-type low concentration semiconductor region of the selective transistor. Thereafter, the photoresist is patterned so as to open the memory cell portion, followed by ion implantation, for example, of arsenic (As) ions into the substrate under conditions of a dosage of $5 \times 10^{15}$ atoms/cm$^2$ and an acceleration voltage of 50 keV to form a semiconductor region 115 of the memory cell (FIG. 25).

Figure 26:
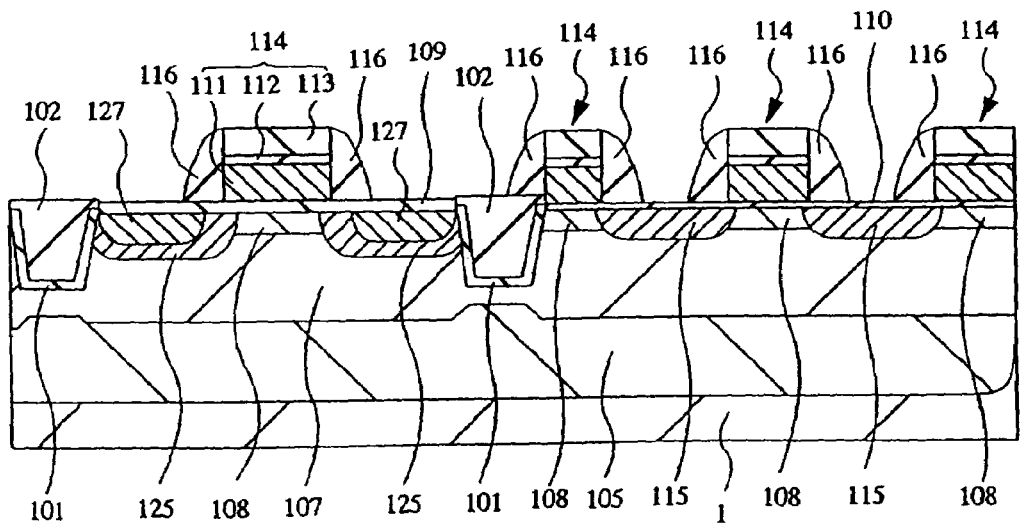

Subsequently, a silicon oxide film which is a 200 nm thick insulating film is formed by the CVD method, and is subjected to anisotropic etching to form side wall spacers 116 on the side surfaces of the patterned built-up film 114. Next, the photoresist is so patterned as to open the peripheral circuit portion, followed by ion implantation, for example, of arsenic (As) ions into the substrate under conditions of a dosage of $10^{15}$ atoms/cm$^2$ and an acceleration voltage of 500 keV to form N-type high concentration semiconductor regions 127 of the peripheral circuit and the selective MOS transistor portion (FIG. 26).

Figure 27:
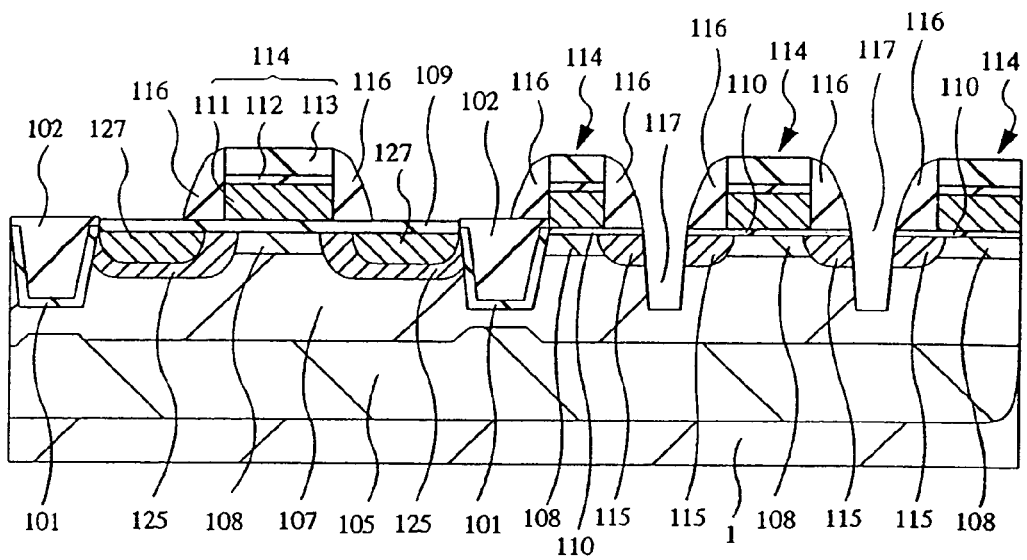
Figure 28:
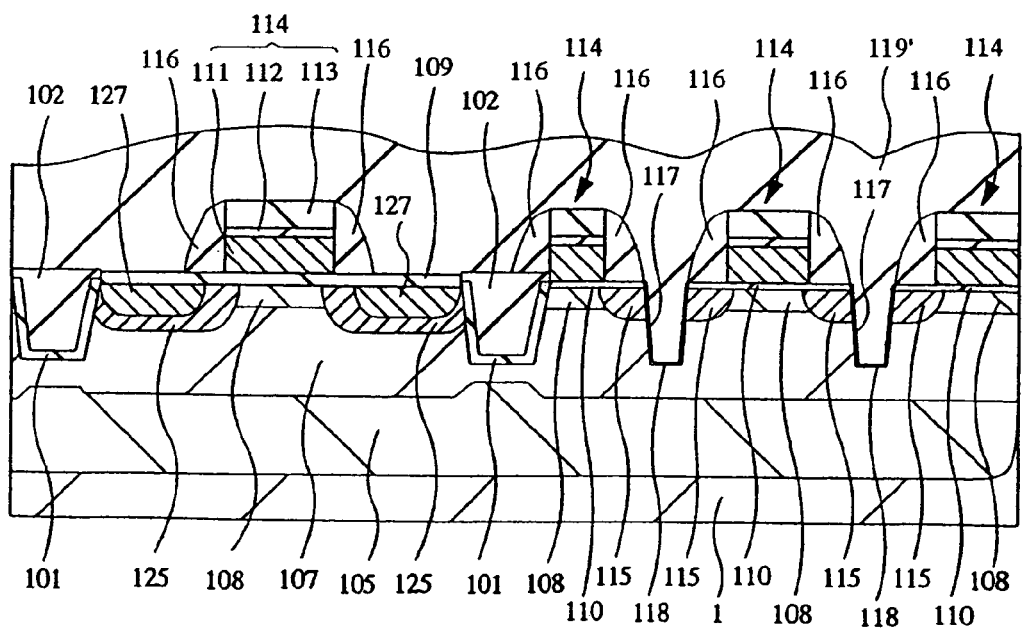

Next, the substrate regions between the gate electrodes of the memory cell portion and the selective transistor portion are scraped off by anisotropic dry etching to form about 0.35 µm deep grooves 117 self-alignedly relative to the side wall spacers 116 (FIG. 27). The grooves 117 are oxidized on the surfaces thereof to form an approximately 4 nm thick silicon oxide film 118, followed by forming (depositing) a silicon oxide film 119, which is a 400 nm thick insulating film, by the CVD method (FIG. 28). The formation of the grooves 117 and the formation of the silicon oxide film 118 and the silicon oxide film 119 are similar to the case of Embodiment 1 except that the grooves 117 are formed at the selective transistor portion.

Figure 29:
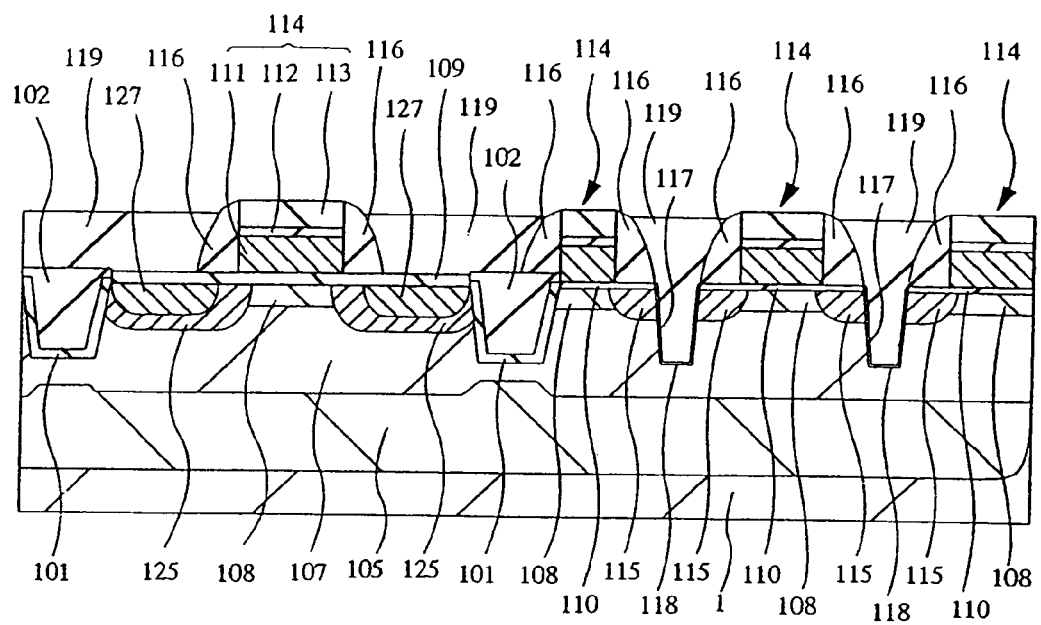
Figure 30:
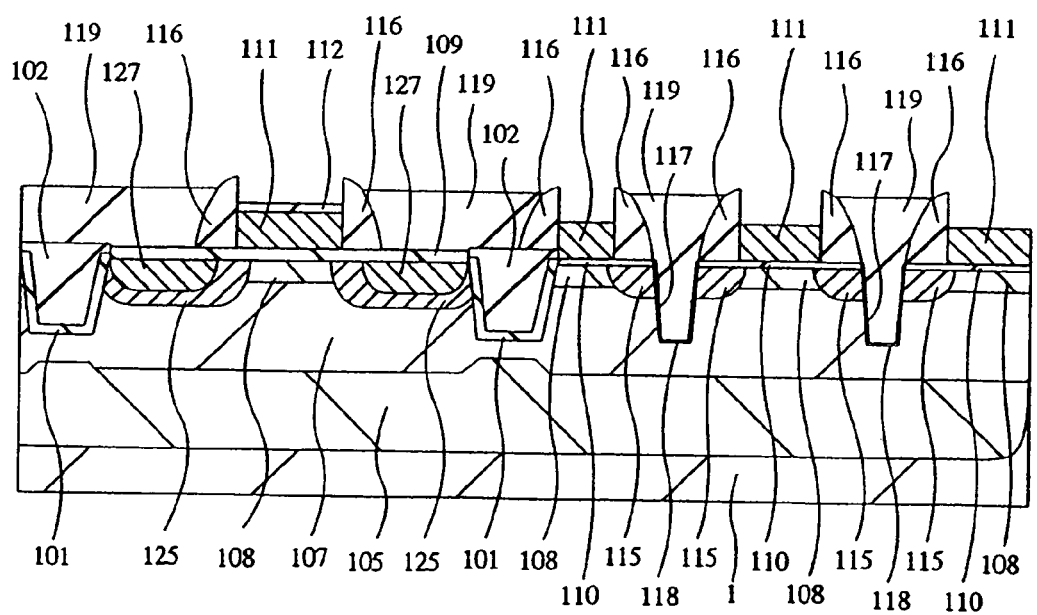

Next, like Embodiment 1, the silicon oxide film 119 is scraped off by the CMP technique for planarization to the silicon nitride film 113 above the gate electrode 111 to bury the silicon oxide film 119 between the side wall spacers 116 (FIG. 29). After removal of the silicon nitride film 113 with hot phosphoric acid, a photoresist is so patterned as to open the memory cell portion by a photoetching process, followed by removal of the silicon oxide film 112 by dry etching (FIG. 30). In this manner, the silicon oxide film 112 of the memory cell portion alone has been removed, so that the silicon oxide film 112 at the peripheral circuit portion can be left. Eventually, as will be described hereinafter, when a second polysilicon film 120 is etched, the polysilicon film 111 of the peripheral circuit portion can be protected.

Figure 31:
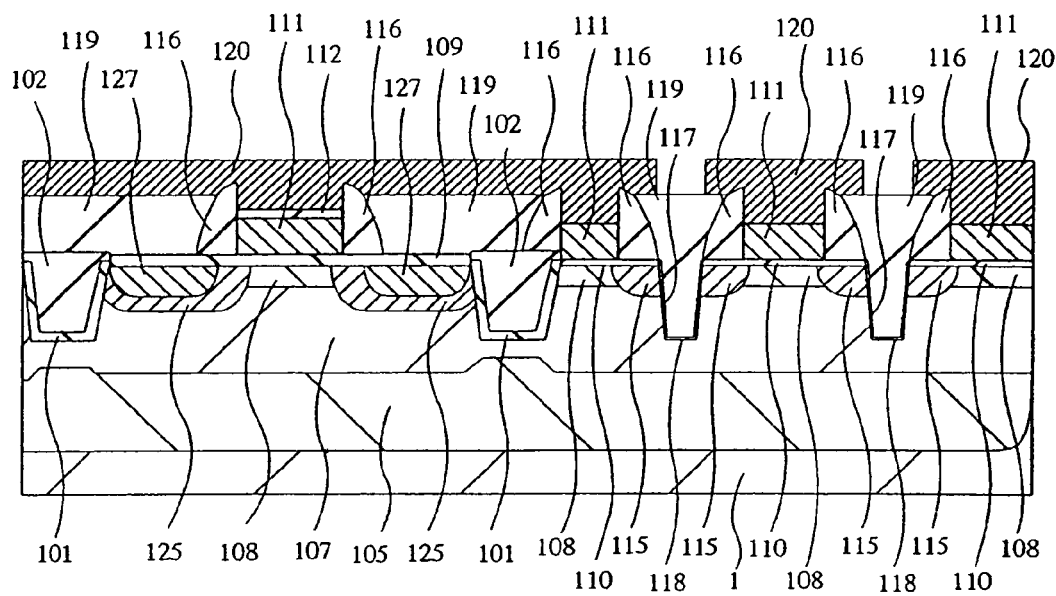
Figure 32:
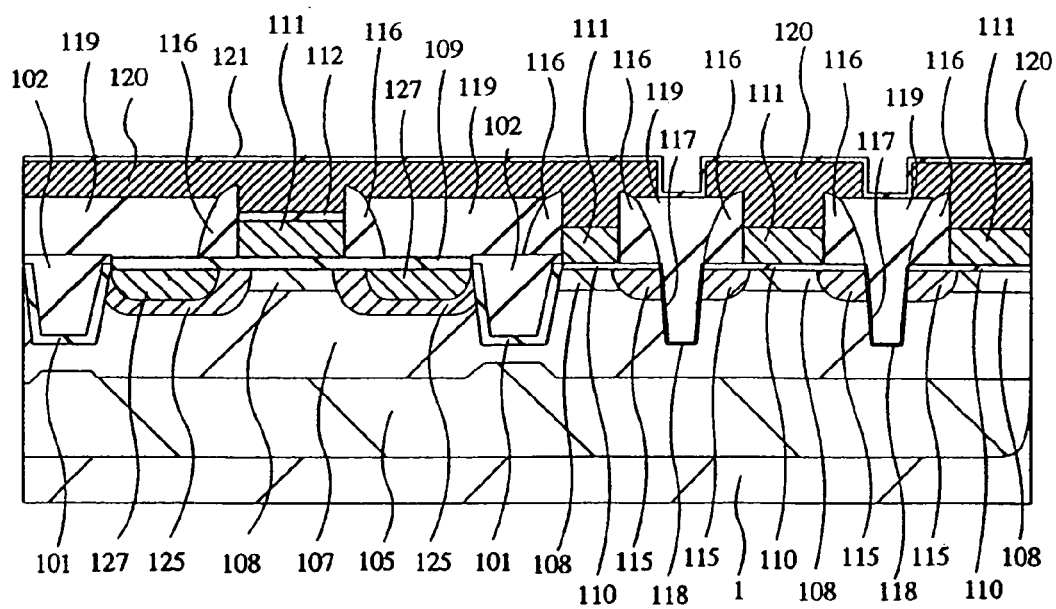

Next, the second polysilicon film 120 is attached (deposited) and so processed as to provide a second floating gate electrode 7 by a photoetching step (FIG. 31). At that time, the peripheral circuit portion is covered. Thereafter, after formation of an interlayer insulating film 121, part of the interlayer insulating film 121 of the selective transistor is removed by a photoetching step, although not shown in the figure (FIG. 32). By the partial removal of the interlayer insulating film 121 of the selective transistor, the control gate electrode 8 and the second floating electrode 7 can be electrically connected, as will be described hereinafter.

Figure 33:
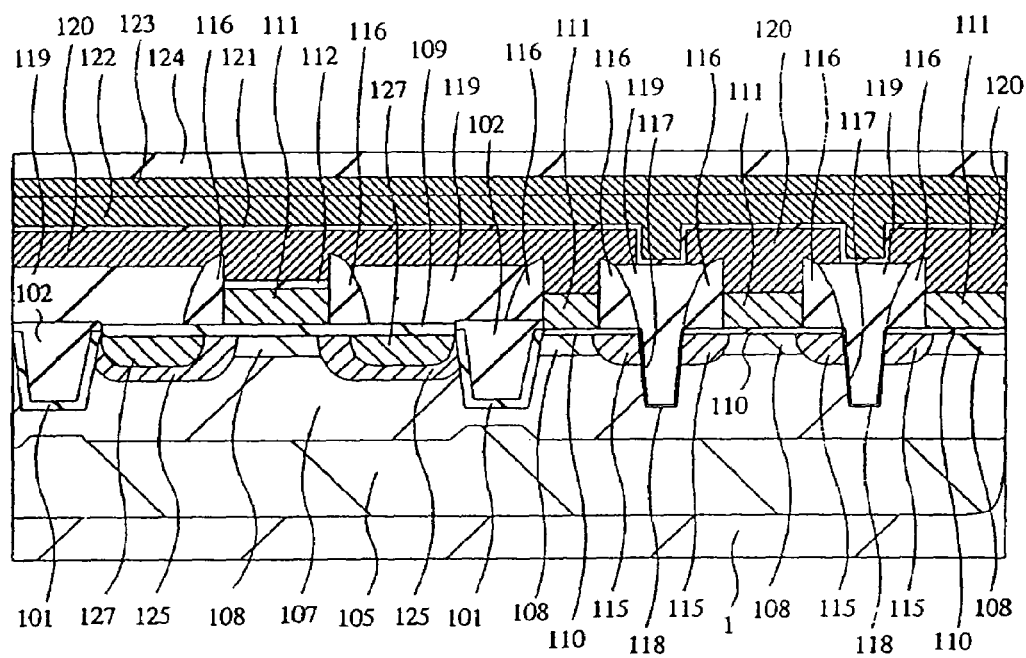

A third polysilicon film 122 and a $WSi_2$ film, and a silicon oxide film 124 formed by the CVD method are successively formed (FIG. 33).

Figure 34:
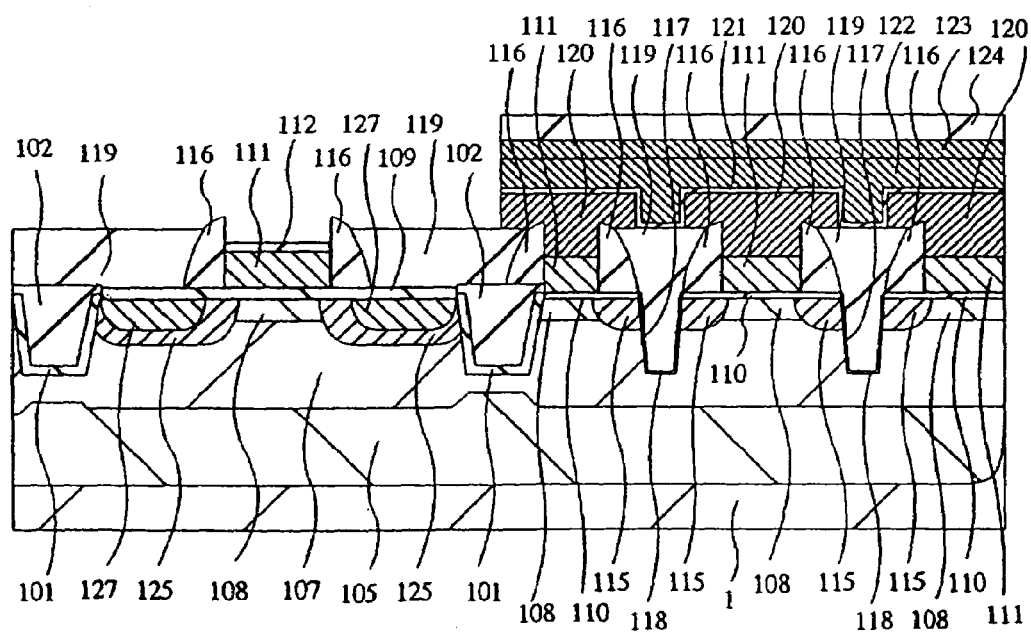

Thereafter, the silicon oxide film 124, which is an insulating film, is processed by a photoetching process to provide a control gate electrode of the memory cell, followed by successively processing, through a mask of the patterned silicon oxide film 124, the $WSi_2$ film 123, third polysilicon 122, interlayer insulating film 121, and the second and first polysilicon films 120, 111 (FIG. 34). At this time, since the peripheral circuit portion has the silicon oxide film 112 formed by the CVD method, the gate electrode 111 is not etched.

As shown in FIG. 23, a photoresist is patterned, after which phosphorus (P) ions are, for example, implanted into the substrate under conditions of a dosage of $2\times10^{13}$ atoms/$cm^2$ and an acceleration voltage of 50 keV to form an N-type low concentration semiconductor region 21 of the selective transistor. Further, boron (B) ions are, for example, implanted into the substrate under conditions of a dosage of $1\times10^{13}$ atoms/$cm^2$ to form a P-type low concentration semiconductor region in a substrate region between the word lines to form an element isolation in the column direction (in the direction of the bit line). Subsequently, a silicon oxide film is formed by the CVD method and sidewall spacers 20 are formed on the side surfaces of the gate electrode by anisotropic dry etching. The photoresist is patterned, followed by ion implantation, for example of arsenic (As) ions into the substrate under conditions of a dosage of $1\times10^{15}$ atoms/$cm^2$ and an acceleration voltage of 50 keV to form an N-type high concentration semiconductor region 22 of the selective transistor.

Figure 35:
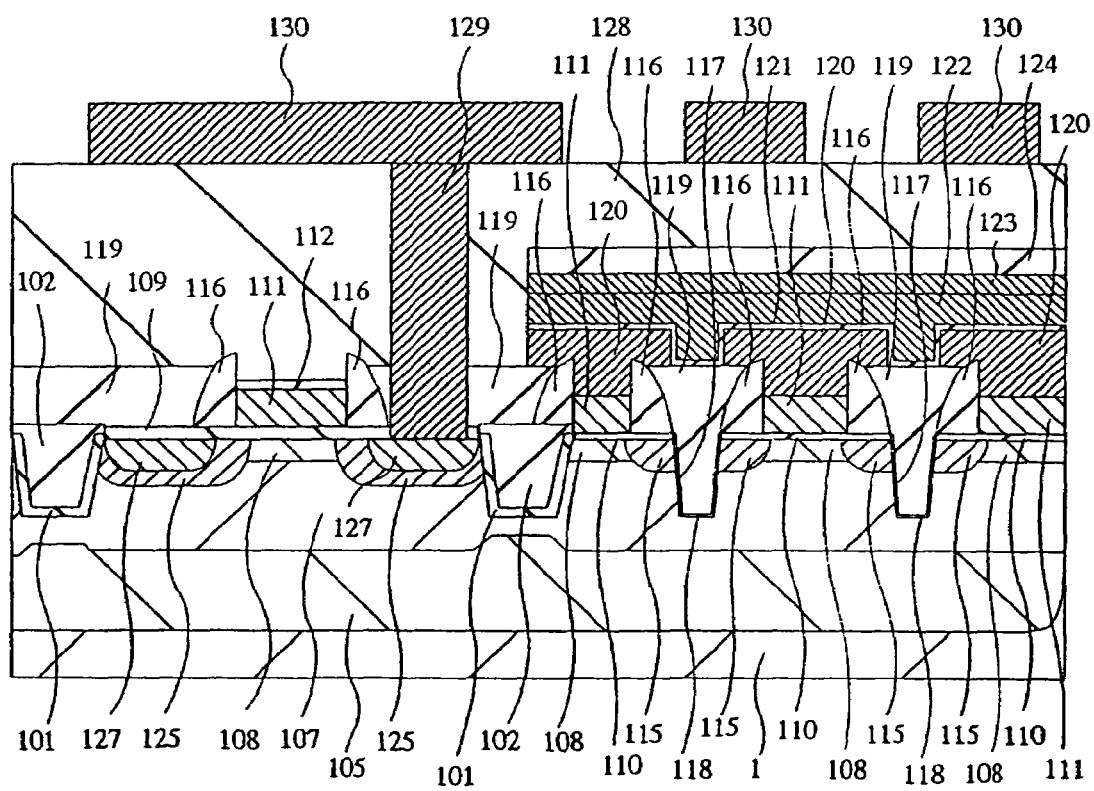

As shown in FIG. 35, an MOS transistor of the peripheral circuit portion and a fine gate MOS transistor are formed on the same substrate via the steps of formation of a silicon oxide film and an interlayer insulating film 128 made of phosphate glass by the CVD method, a plug electrode 129 within a contact hole, and metal wires 130.

In the above polysilicon gate processing, the channel width is defined by the processing of the lower polysilicon 3, and the channel length of the transistor is defined by the processing of the upper insulating film 17 and the transistor in the peripheral circuit portion is formed of the polysilicon film alone. As will become apparent from Embodiment 3, a second polysilicon film, a third polysilicon film and a $WSi_2$ film may be added as electrode wires.

As described above, this embodiment has not only the effects of Embodiment 1, but also has the effects of preventing unnecessary elongation of the impurity semiconductor region relative to the memory cell having a fine gate and thus stabilizing the operations in the fine gate region since the impurity semiconductor region of the memory is formed after the formation of the impurity semiconductor region of the high withstand voltage MOS transistor. In addition, the selective transistor is made of a material for the floating gate electrode and control gate electrode of the memory, so that the region for separate formation of the gates illustrated in the first example becomes unnecessary, thereby reducing the area.

(Embodiment 3)

A third embodiment of the invention is illustrated with reference to FIGS. 36 to 42. FIGS. 36 to 42 are, respectively, sectional views showing, in sequence, an example of a method of fabricating an AND-type flash memory of Embodiment 3. It will be noted that in FIGS. 36 to 42, the left side region indicates a peripheral circuit portion and the right side region indicates a memory portion, like Embodiment 1.

In Embodiment 2, the gate electrode of the MOS transistor in the peripheral circuit portion is formed of the polysilicon film alone. As will become apparent from Embodiment 3, a second polysilicon film, a third polysilicon film and a $WSi_2$ film may be added as electrode wires.

Figure 36:
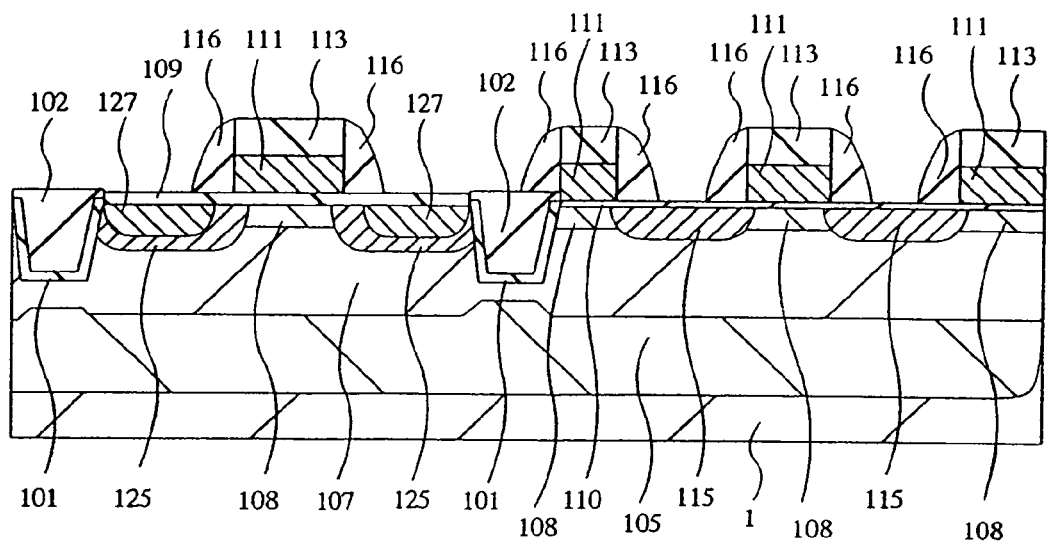
FIGS. 36 to 42 are, respectively, sectional views showing, in sequence, an example of a method for fabricating an AND-type flash memory of Embodiment 3.

As shown in FIG. 36, after the formation of an element isolation region 102, a well 105 and a gate oxide film 2 on the semiconductor substrate 1 as in Embodiment 2, a non-doped polysilicon film 111 and a silicon nitride film 113 are attached (deposited). Next, the polysilicon film 111 and the upper silicon nitride film 113 are so processed by a photoetching process as to provide a first gate electrode 3 in the memory cell portion and a gate electrode of the MOS transistor in the peripheral circuit portion. Like Embodiment 2, low concentration semiconductor regions 125 of the peripheral circuit, and semiconductor regions 125 of the peripheral circuit, and semiconductor regions 115 and side wall spacers 116 of the memory cell portion are, respectively, formed. Moreover, like Embodiment 2, high concentration semiconductor regions 127 of the peripheral portion are formed.

Figure 37:
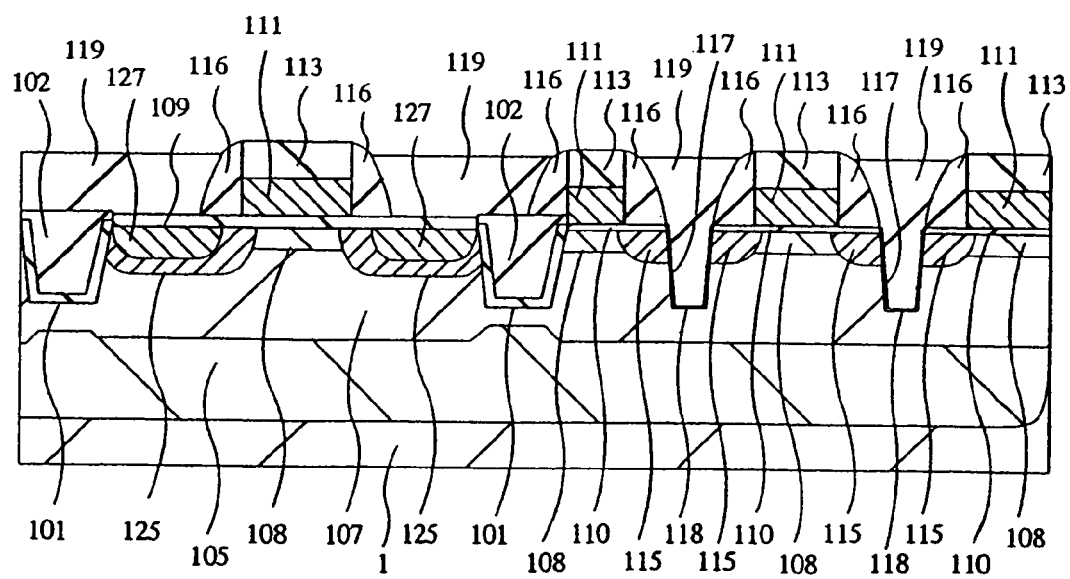

As shown in FIG. 37, the substrate is etched self-alignedly to the sidewall spacers 116 to form grooves 117 only in the memory cell portion, like Embodiment 2. Thereafter, a silicon oxide film 118 is formed and a silicon oxide film 119, which is a 400 nm thick insulating film formed by the CVD method, is attached (deposited) after which the silicon oxide film 119 is scraped off by the CMP technique for planarization to an extent of the silicon nitride film 113 on the gate electrode 111, thereby burying the silicon oxide film 119 in between the side wall spacers 116.

Figure 38:
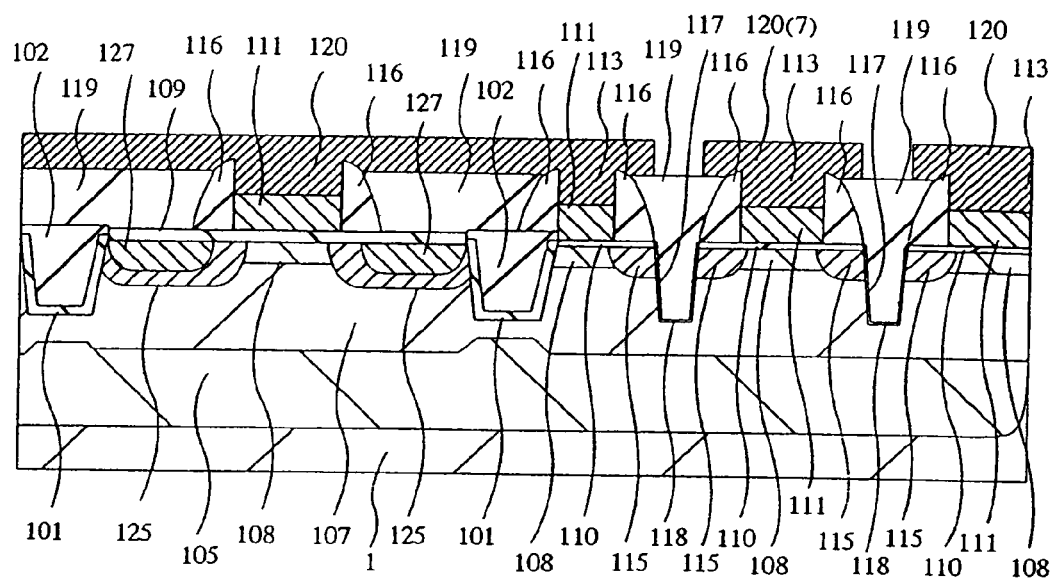
Figure 39:
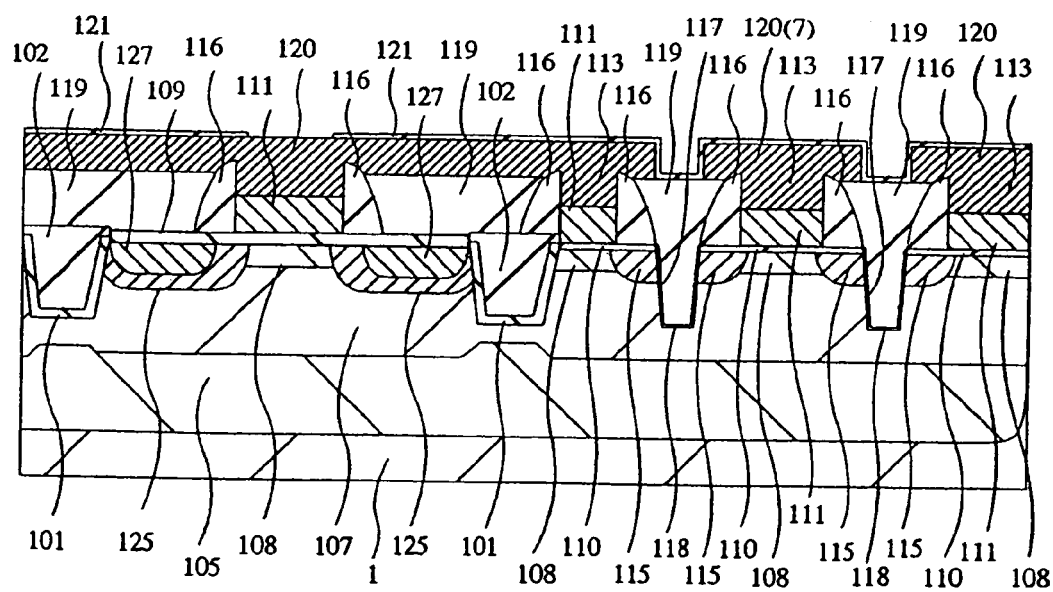
Figure 40:
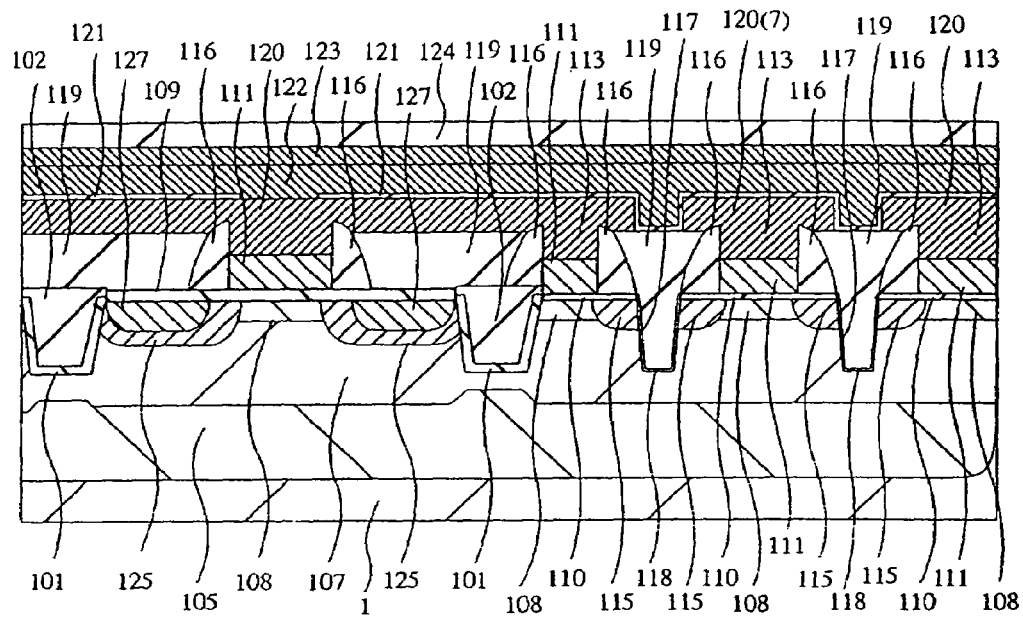

Next, the silicon nitride film 113 is removed by means of hot phosphoric acid, after which, as shown in FIG. 38, a second polysilicon film 120 is attached. (deposited) and processed to provide a second floating gate electrode 7 by a photoetching step. At this time, the peripheral circuit portion is covered. Thereafter, an interlayer insulating film 121 is attached (deposited), followed by forming a partial opening at the interlayer insulating film 121 on the gate electrodes of the transistors of the peripheral circuit portion and the selective transistor portion (FIG. 39). The opening may be formed, for example, by a photoetching technique. Moreover, a third polysilicon film 122 and a $WSi_2$ film 123, and a silicon oxide film 124 formed by the CVD method are successively formed (FIG. 40).

Figure 41:
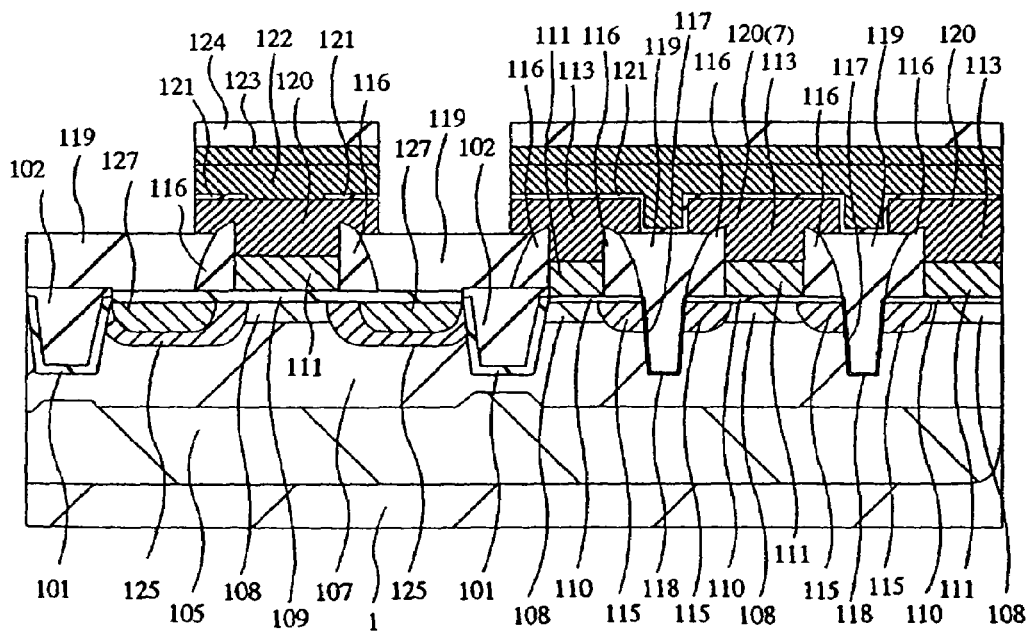

Then, the silicon oxide film 124 is so processed by a photoetching process to provide a control gate electrode of the memory and gate electrodes in the selective transistor portion and the peripheral circuit portion. In this processing, the gate electrodes 111 of the peripheral circuit are covered during the processing as shown in FIG. 41. Using a mask of the patterned silicon oxide film 124, WSi$_2$ film 123, third polysilicon 122, interlayer insulating film 121, and second and first polysilicon films 120, 111 are successively processed.

Figure 42:
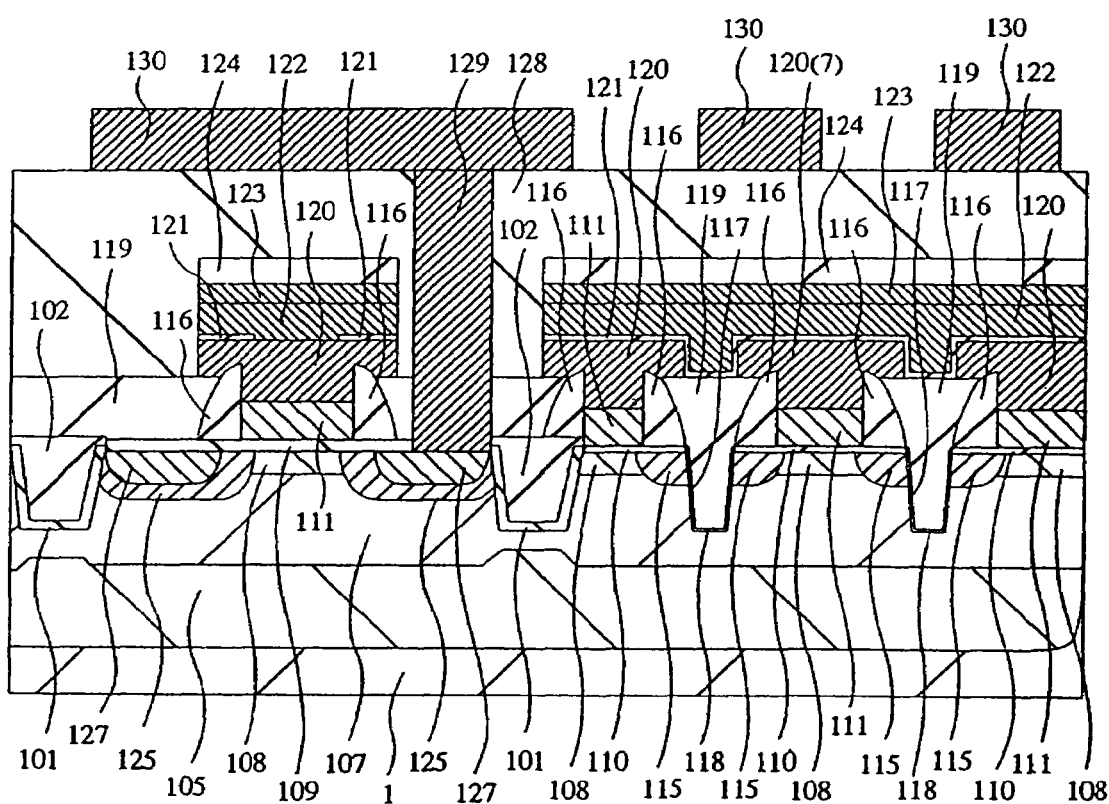

In subsequent steps, as shown in FIG. 42, impurity semiconductor regions of the selective transistor are formed, after which there are formed the MOS transistor of the peripheral circuit portion and the fine gate MOS transistor on the same substrate through the steps of formation of the silicon oxide film by the CVD method and the interlayer insulating film 128 made of phosphate glass, the plug electrode 129 in the contact hole, and the metal wires 130 as in Embodiment 2.

As described hereinabove, in this embodiment, the second and third polysilicon films and the WSi$_2$ film, which are electrically connected to one another, are arranged as a wiring material on the gate electrode of the MOS transistor of the peripheral circuit portion, thus realizing a low resistance gate wire.

(Embodiment 4)

A fourth embodiment of the invention will be described with reference to FIGS. 43 to 49. FIGS. 43 to 49 are, respectively, sectional views showing, in sequence, an example of a method of fabricating an AND flash memory of Embodiment 4. It will be noted that in FIGS. 43 to 49, the left side region indicates a peripheral circuit portion, and the right side region indicates a memory cell portion, like Embodiment 1.

In Embodiments 2 and 3, the gate electrodes of the memory cells and the selective transistors inside the memory mat have such a structure as to be offset relative to shallow element isolation, and the gate electrodes of the peripheral circuit have the structure in contact with the isolation region. In this embodiment 4, there is used a structure wherein the gate electrode of the peripheral circuit is offset relative to the isolation region.

Figure 43:
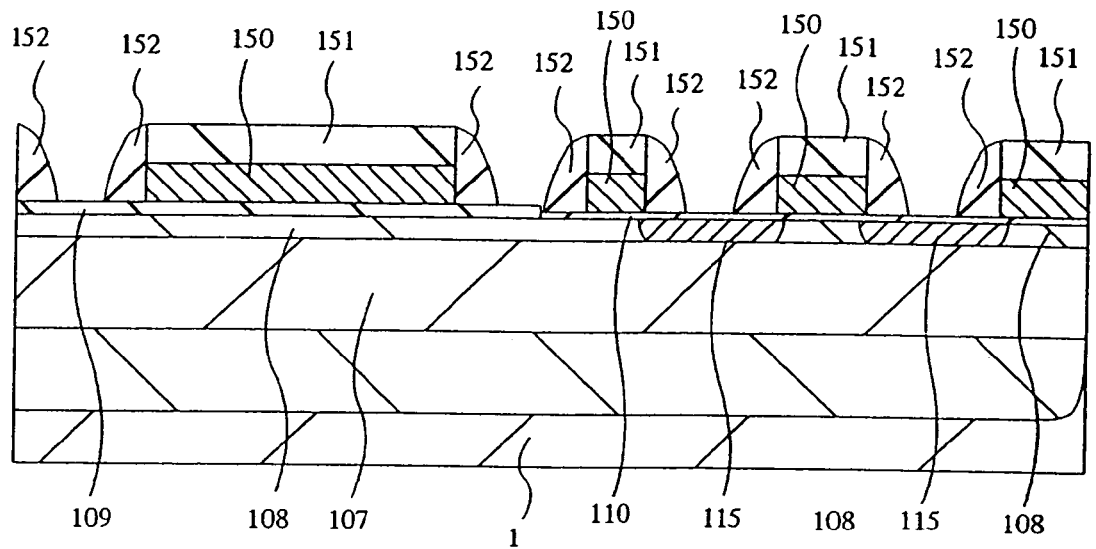
FIGS. 43 to 49 are, respectively, sectional views showing, in sequence, an example of a method for fabricating the AND-type flash memory of Embodiment 4.

As shown in FIG. 43, a P-type semiconductor substrate is oxidized to form a 20 nm thick silicon oxide film 109, after which the silicon oxide is removed only from the memory cell portion by a photoetching technique. Next, a 9.5 nm thick silicon oxide film 110 is formed by oxidation. In the peripheral circuit portion, the oxide film thickness is at 25 nm. A first polysilicon film 150 and a silicon nitride film 151 are successively attached (deposited) on the silicon oxide film surface, followed by patterning to provide a first floating gate electrode in the memory cell portion and to remove the electrode materials in an isolation region in the peripheral circuit portion. Then, a photoresist is so patterned as to open the memory cell portion, followed by ion implantation, for example, of As ions into the substrate under conditions of a dosage of 5×10$^{15}$ atoms/cm$^2$ and an acceleration voltage of 50 KeV to form a semiconductor region 115.

Thereafter, an approximately 6 nm thick silicon nitride film and a 200 nm thick silicon oxide film are formed, for example, by the CVD method, followed by anisotropic etching to form side wall spacers 152 on side surfaces of the gate electrode. In this way, when the approximately 6 nm thick silicon nitride film is formed at the side walls of the gate electrode, an increase in thickness of the gate insulating film at the end of the gate electrode can be prevented. Eventually, the processing of a fine gate length becomes possible, thus realizing a high degree of integration.

Figure 44:
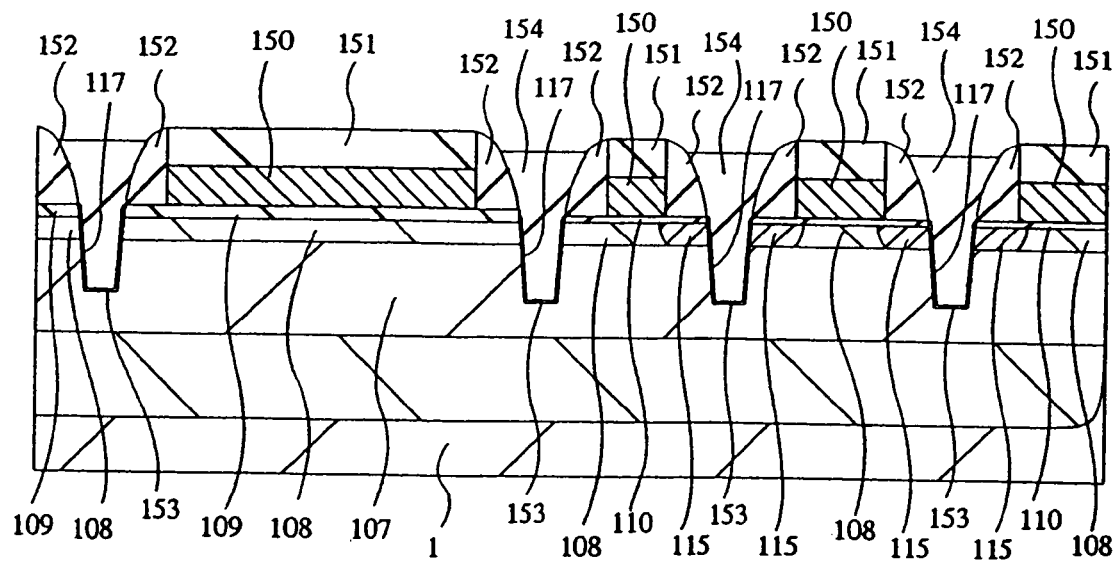

As shown in FIG. 44, the polysilicon film 150 and the silicon nitride film 151, and the semiconductor substrate 1 not covered with the side wall spacers 152 are scraped off by anisotropic dry etching, thereby forming about 0.35 μm deep grooves self-alignedly relative to the side wall spacers. Thereafter, a silicon oxide film 153 serving as an insulating film is formed by oxidation in the groove portions A silicon oxide film 154 serving as an insulating film is attached (deposited) by the CVD method, after which the silicon oxide film is scraped off by the CMP technique for planarization to an extent of the silicon nitride film 151 on the gate electrode. Thus, the silicon oxide film 154 which is buried between the side wall spacers is formed. In this manner, isolation regions made of the silicon oxide film can be formed. The isolation regions formed here are simultaneously formed in the peripheral circuit region, unlike Embodiments 1 to 3.

Figure 45:
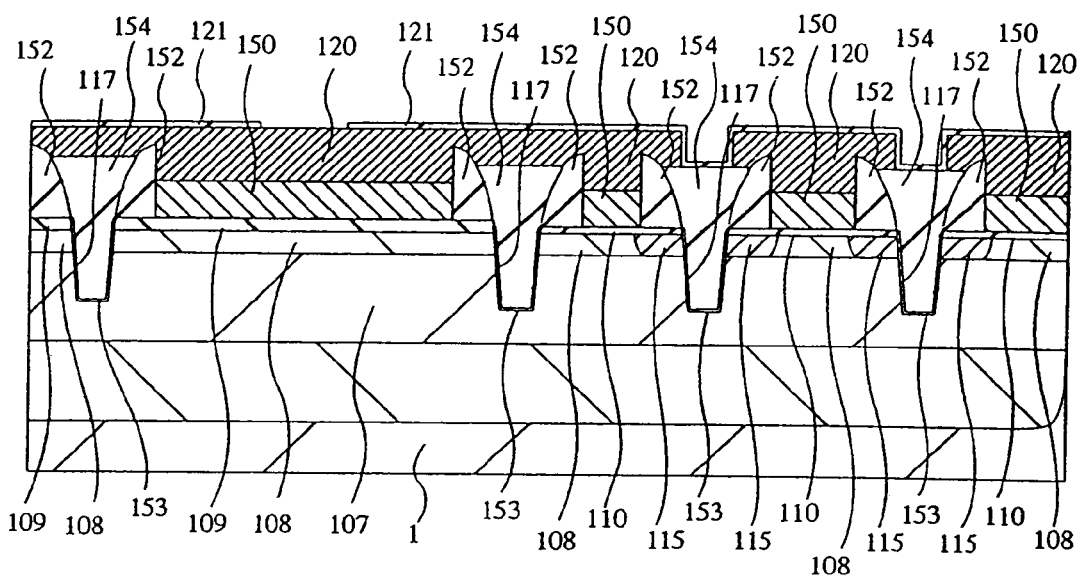

As shown in FIG. 45., the silicon nitride film is removed by means of hot phosphoric acid, after which a second polysilicon oxide film is attached (deposited) on the entire surface, for example, by the CVD method, followed by processing in a photoetching step to provide a second floating gate electrode in the memory cell portion while covering the peripheral circuit portion.

Thereafter, an interlayer insulating film 121 made of silicon oxide film/silicon nitride film/silicon oxide film/silicon nitride film is attached (deposited). The interlayer insulating film is removed, by a photoetching Step, partially at portions corresponding to the gate electrodes of the transistor of the peripheral circuit and the selective transistor, not shown.

Figure 46:
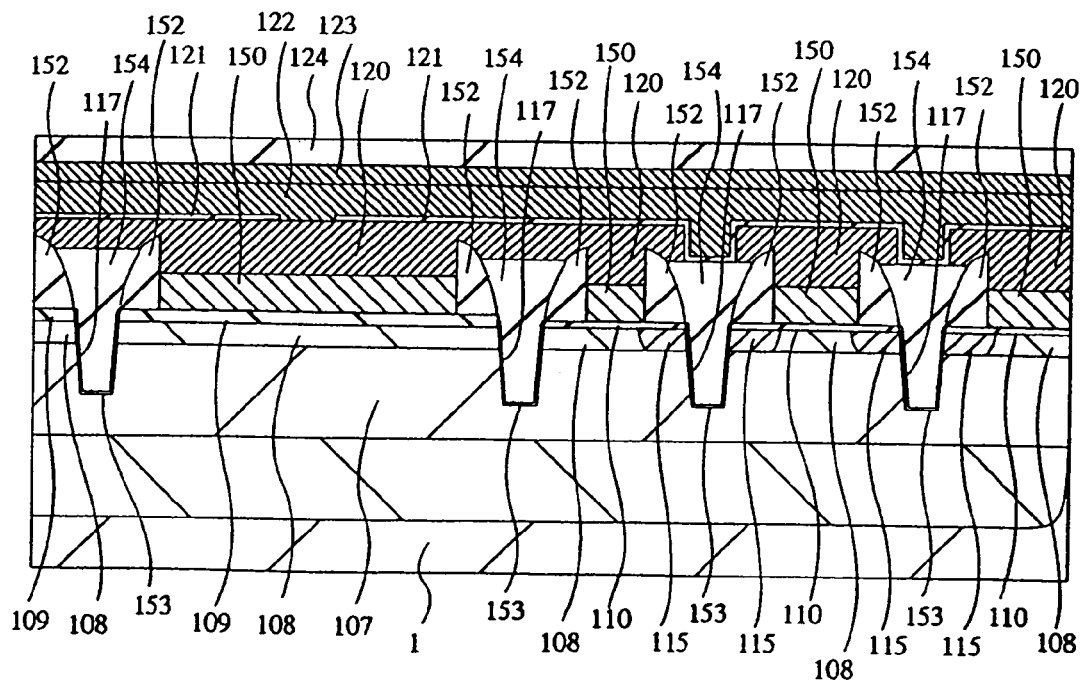

Next, as shown in FIG. 46 a third polysilicon film 122 and a WSi$_2$ film 123, and a silicon oxide film 124 formed by the CVD method are successively formed on the interlayer insulating film 121.

Figure 47:
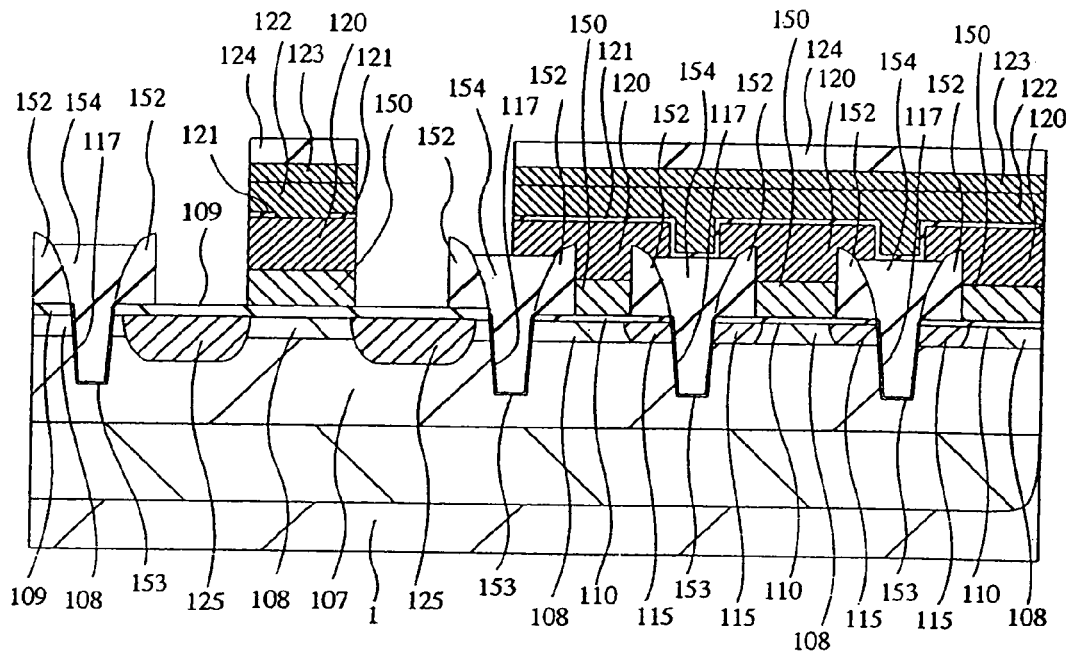

Next, as shown in FIG. 47, the silicon oxide film 124 is subjected to patterning by a photoetching step so as to provide a control gate electrode in the memory cell portion and gate electrodes in the peripheral circuit portion. Using a mask formed of the silicon oxide film, the WSi$_2$ film 123, third polysilicon film 122, interlayer insulating film 121 and first and second polysilicon films 111, 120 are successively removed by etching. The resultant gate electrodes form a floating gate electrode and a control gate electrode in the memory cell portion, and also gate electrodes in the peripheral circuit portions and selective transistor portion. The gate electrodes of the transistor in the peripheral circuit portion and the selective transistor are formed such that the third-polysilicon film 122 and the second polysilicon film 120 are electrically connected at the portion where the interlayer insulating film 121 is opened.

As shown in FIG. 47, a photoresist is so patterned as to open the MOS transistor portion of the peripheral circuit portion, followed by ion implantation, for example, of phosphorus (P) ions into the substrate under conditions of a dosage of 5×10$^{13}$ atoms/cm$^2$ and an acceleration voltage of 100 keV and thermal diffusion at 850° C. to form an N-type low concentration semiconductor region 125 of the peripheral high withstand voltage MOS transistor portion. Subsequently, the photoresist is so patterned as to form an N-type low concentration semiconductor region of a low withstand voltage type including the selective transistor.

Figure 48:
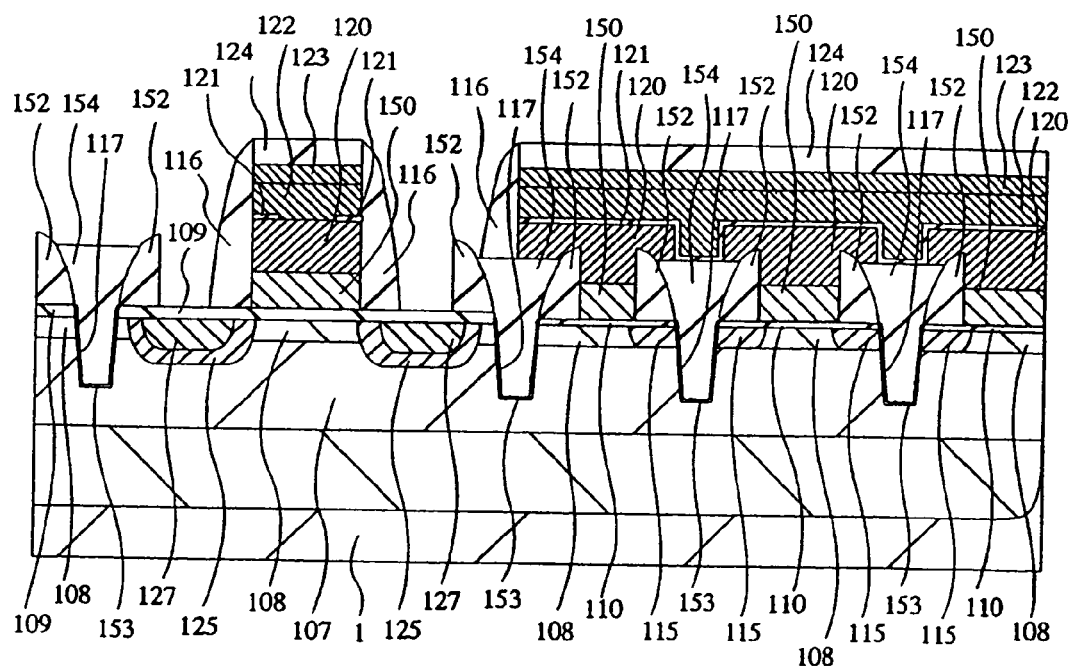

As shown in FIG. 48, a silicon oxide film serving as an insulting film is attached (deposited) by the CVD method and is subjected to anisotropic dry etching to form side wall spacers 116 on the side surfaces of the gate. Thereafter, a photoresist is so patterned as to open the peripheral circuit portion, followed by ion implantation, for example, of As ions into the substrate under conditions of a dosage of $5 \times 10^{13}$ atoms/cm$^2$ and an acceleration voltage of 50 keV to form N-type high concentration semiconductor regions 127 of the MOS transistor portion and the selective transistor.

Figure 49:
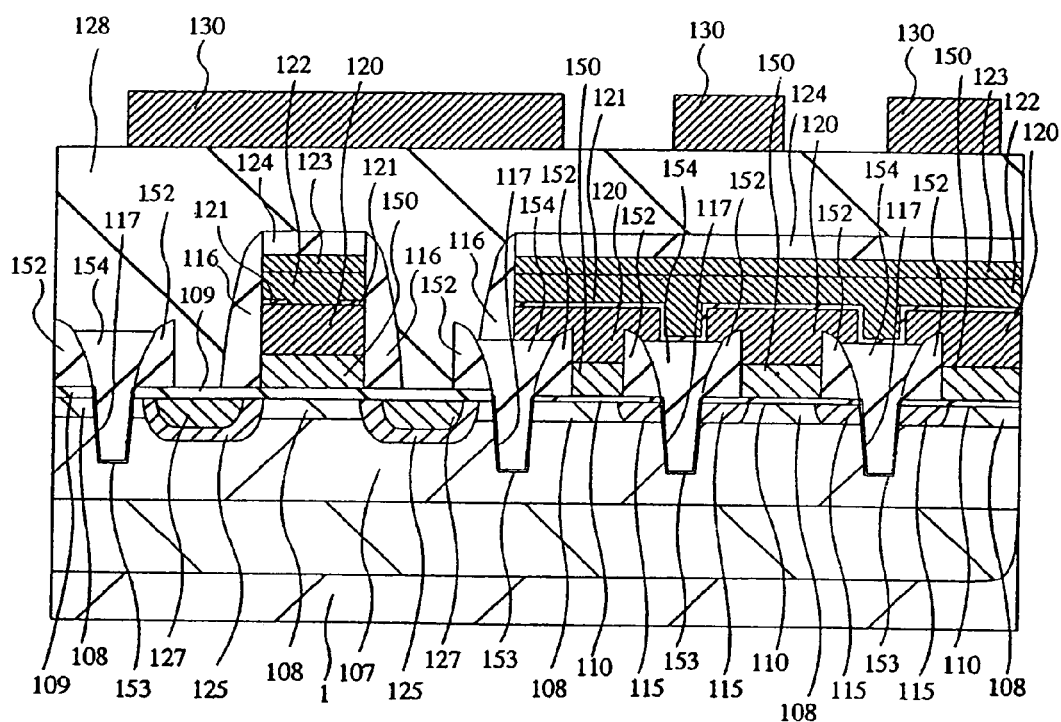

In subsequent steps, as shown in FIG. 49, there can be obtained a structure wherein the gate electrodes of all of the transistors are offset with the isolation regions through the formation of a silicon oxide film by the CVD method and the interlayer insulating film 128 made of phosphate glass, the plug electrode (not shown) within the contact hole, and the metal wires 130.

In this embodiment, after the formation of the impurity semiconductor region of the memory cell, the impurity semiconductor region of the peripheral circuit portion is formed.

(Embodiment 5)

In Embodiments 1 to 4, the isolation of the memory cells makes use of the structure which is self-alignedly formed after processing of the floating gate electrodes of the memory cells. The AND-type flash memory of Embodiment 5 differs from the foregoing embodiments in that the isolation region is formed prior to the formation of the gate electrodes of the memory cells. In Embodiments 1 to 4, binary (1 bit) information is memorized in the memory, whereas in Embodiment 5, there is adopted a circuit system of a so-called multiple state logic memory wherein quaternary (2 bits) information is memorized in one memory cell.

The planar structure of the AND-type flash memory, i.e. a multiple state logic memory-based AND-type flash memory, of this embodiment is illustrated with reference to FIG. 1 of Embodiment 1.

The AND-type flash memory of this embodiment is Provided with a memory array MEMARRAY, a latch circuit LATCH, and a column decoder XDEC, like Embodiment 1. The memory array MEMARRAY has memory cells located in a matrix of rows and columns. A plurality of word lines extend along the direction of the rows of the memory cells, and a plurality of data lines extend along the direction of columns. Eight thousand memory cells are connected to at least one word line. Since one memory cell has a memory capacity of 2 bits, and AND-type flash memory cell of this embodiment has a memory capacity corresponding to 2 kB per 8 thousand memory cells. At least one word line is selected from an address input Ax. An address along the column line, i.e. at least one data line, is connected with 16 k memory cells. More particularly, the number of word lines in this embodiment is 16 thousand. The memory capacity of the AND-type flash memory of this embodiment becomes: 2 k×16 k bytes=32 megabytes (256 MB). The latch circuit LATCH has a length corresponding to 8 thousand (2 kilobytes) cells.

Signals inputted from outside to the control circuit CNTRL, and address signals inputted to a column gate YGATE are similar to those of Embodiment 1. The data input and output circuit and the memory cell selection circuit in the column direction are also similar to those of Embodiment 1. Moreover, the bit line voltage control circuit DISCHARGE and the internal voltage generating circuit CPC are also similar to those of Embodiment 1. Accordingly, these are not described again.

The circuit arrangement of the AND-type flash memory cell of this embodiment is similar to that shown in FIG. 2 of Embodiment 1, the connections of the respective members are similar to those of Embodiment 1. Accordingly, their illustration is omitted.

Next, the multiple state logic memory system of the AND-type flash memory of this embodiment will be described.

In the AND-type flash memory of the embodiment, threshold values after write and erase operations are altered from those of known AND-type systems. Recording of information is performed, in the same manner as in the prior art, by the presence or absence of electrons injected from the semiconductor substrate via the tunnel oxide film. However, with a system where information is written by release of electrons, a threshold voltage of the transistor after the release varies significantly, which is not appropriate for the multiple state system whose threshold width is narrow. In the AND-type flash memory of this embodiment, there is used a system where information is written by injection of electrons from the substrate and threshold levels are made uniform, thus being suitable for a multiple state system whose threshold width is narrow. Accordingly, where information is written or where electrons are injected into the floating gate electrode, a subsequent threshold voltage of the transistor becomes high. On the other hand, when information is erased or where electrons are released, a subsequent threshold voltage becomes low.

Figure 50:
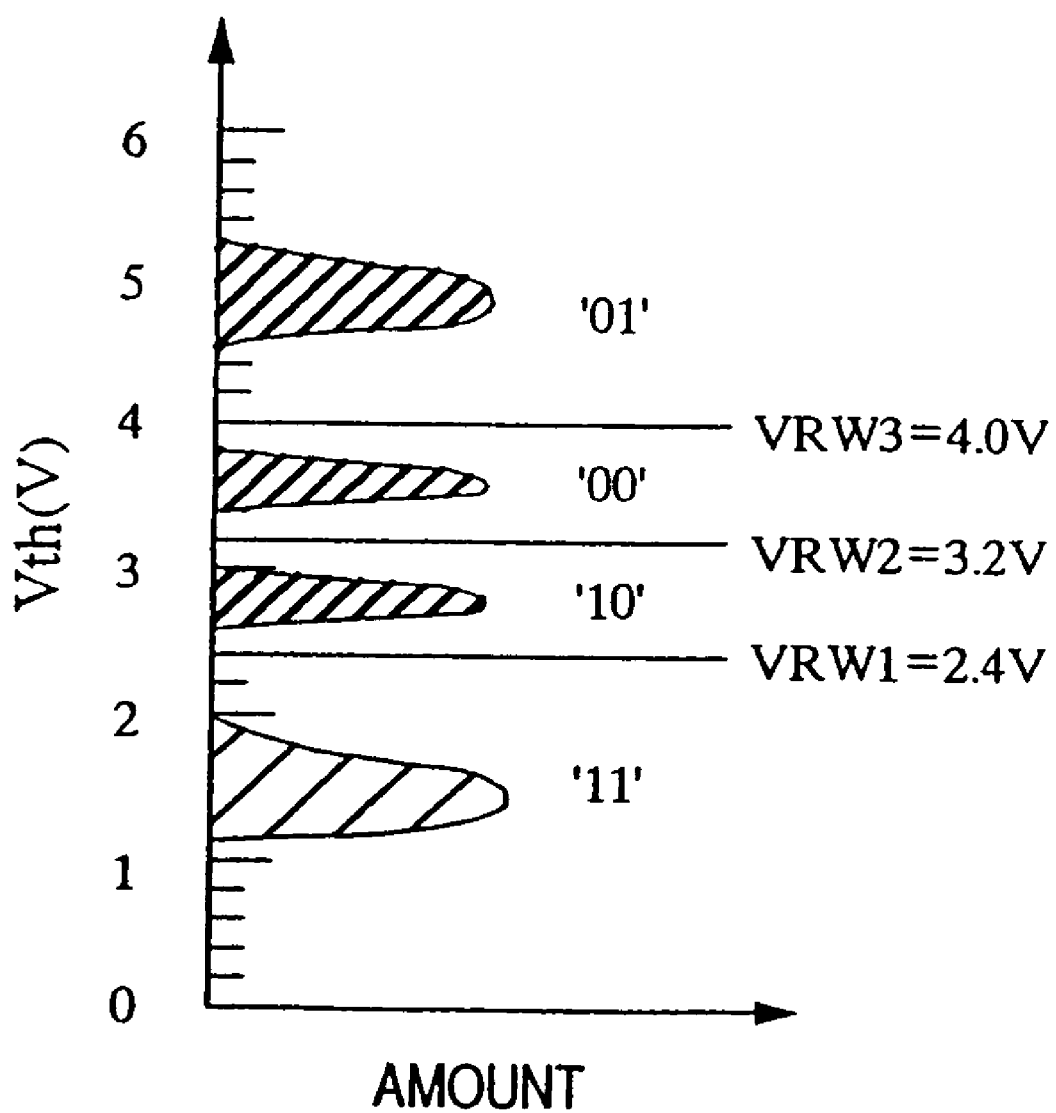
FIG. 50 is a diagram showing how a threshold value differs depending on the injected amount of electrons.

FIG. 50 is a schematic view showing how the threshold level differs depending on the quantity of injected electrons, in which the ordinate indicates a threshold level and the abscissa indicates an amount. If three voltages, for example, of 15, 16 and 17 V are applied to the control gate electrode over a given time as a write control voltage, electrons which are charged depending on the voltage are injected into the floating gate electrode from the substrate. This is shown in FIG. 50. In FIG. 50, the respective threshold voltages depending on the amount of charges are exemplified as distributions having peaks at 2.8 V, 3.4 V and 5V. On the other hand, a threshold level in the case where electrons are released is distributed as having a peak at 1.5 V. Accordingly, the states of electrons stored in the floating gate electrode, i.e, the states where threshold levels differ from one another, are clearly distinguishable. More particularly, the respective states can be logically distinguished from one another by finding ON/OFF states of the transistor of a memory cell wherein reference voltages are set at 2.4V, 3.2 V and 4.0V, respectively. Such distinguishable states correspond to four states of 2 bits (00, 01, 10, 11), respectively, enabling two bit memories in one memory cell. In this case, the state where electrons are released (wherein a threshold level has a peak at 1.5 V) can correspond to "11", the state where the peak of a threshold level is at 2.8 V corresponds to "10", the state where the peak of a threshold level is at 3.4 V corresponds to "00", and the state where the peak of a threshold level is at 5 V corresponds to "01", respectively.

Next, read, write and erase operations of data—memorized in a memory cell will be described. FIG. 51 is a table of control voltages applied to a memory cell at the time of read, write and erase operations of data performed in this embodiment along with schematic views of a memory cell. Table 2 shows the states of operations of the respective members in FIG. 2 at the time of read, write and erase operations of data performed in this embodiment.

TABLE 2

|  | Read | Write | Erase |
|---|---|---|---|
| W11 | 4/2 V | 15/16/17 V | −16 V |
| W12 | 0 V | 4.5 V | 0 V |
| W21 | 0 V | 0 V | 0 V |
| W22 | 0 V | 0 V | 0 V |
| GD1 | 1 V | 0 V | 2 V |
| GD2 | 1 V | 6.5 V | 2 V |
| D11 | 1 V | 0 V | 2 V |
| D12 | 1 V | 6.5 V | 2 V |
| D21 | OPEN | OPEN | OPEN |
| D22 | OPEN | OPEN | OPEN |
| SiD1 | 3.3 V | 10 V | 3.3 V |
| SiD2 | 0 V | 0 V | 0 V |
| SiS1 | 3.3 V | 0 V | 3.3 V |
| SiS2 | 0 V | 0 V | 0 V |
| DPW | 0 V | 0 V | 2 V |

The erase operation of data memorized in memory cells will be described first. In the following example of the erase operation, the operations in a selected block (e.g. BL1 in FIG. 2) will be described.

As shown in the Erase section of FIG. 51, 2.0 V is applied to the source and drain regions and the substrate, and −16V is applied to the control gate electrode which is a selected word line (selected word). On the other hand, a non-selected word line (non-selected word) is supplied with Vss (0 V). In this state, if the selected word line is taken as W11 in FIG. 2 and the non-selected word line is taken as W12 in FIG. 2, the erase operation can be realized by keeping the voltages of the respective members as indicated in the Erase column in Table 2.

More particularly, the gates SiS1 and SiD1 of the selective transistors SS11, SS12, SD11 and SD12 are, respectively, supplied with 3.3V to cause all the selective transistors connected thereto to be turned on. At the same time, the potential of the global data lines GD1, GD2 and the common source line Vs2 is kept at 2V to set the voltage of the local data lines D11, D12 and the local source lines S11, S12 at 2V. Moreover, the word line W11 selected by means of XDEC1 and the non-selected word line W12 are, respectively, supplied with voltages of −16V and 0V for a given time. At that time, voltages of 2V and 3V or over are applied to the P-type well region and the N-type well region thereneath, respectively.

The electrons stored in the floating gate electrodes of the memory cells placed in this condition behave in the following manner. More particularly, the electrons stored in the floating gate electrodes of all the memory cells connected to the word line W11 suffer the action of an electric field depending on the difference in potential (18 V) between the substrate and the control gate electrode, and are released from the floating gate electrodes to the substrate. On the other hand, with the memory cells connected to the non-selected word line W12 wherein W12 is, at 0 V, an electric field sufficient for the release to the substrate is not applied to the electrons of the floating gate electrodes, permitting the electrons to remain as they are. That is, the erase operation is performed on all the memory cells connected to W11, and information is not rewritten with respect to all the memory cells connected to W12. The threshold voltage of the memory cells on the selected word line W11 becomes low owing to the erase operation, and the threshold voltage has such a distribution that its peak is in the vicinity of 1.5 V.

It will be noted that 0 V may be applied to SiS1 and SiS2 to turn all the selective transistors connected thereto to an off state, under which D11, D12 and S11, S12 are set in a floating state simultaneously with the substrate potential being set at 2V. In such a state as mentioned above, all the memory cells connected to W11 are subject to the erase operation, and information is not rewritten with respect to all the memory cells connected to W12.

In this erase operation, the electrons are released from the floating gate electrodes throughout the entire surface of the tunnel oxide film as will be described later. This makes the provision of a local path of a tunnel current unnecessary, enabling one to make fine memory cells and a high degree of integration of the AND flash memory. In addition, the degradation of the tunnel oxide film caused by the tunnel current can be suppressed to a minimum, thereby improving the reliability of the AND-type flash memory.

With regard to the non-selected memory block (e.g. BL2), 0 V is applied to SiS2 and SiD2 to turn all the selective transistors connected thereto off, so that D21, D22 and S21, S22 are turned to floating state, and at the same time, 0 V is applied to the word lines W21, W22, disenabling information to be rewritten.

Next, the operation of writing data in memory cells will described. In the following illustration of the write operation, operations of a selected block (e.g. BL1 in FIG. 2) will be described.

As shown in the write column in FIG. 51, while three voltages ranging from 14.9 V to 17 V are applied to a selected word line, a voltage of 4.5 V is applied to a non-selected line. The source regions of the memory cells connected to the selected word line are opened, and the source regions of the memory cells connected to the non-selected word line are kept at Vss (0 V), under which a data line (write data) connected to memory cells to be written is kept at Vss (0 V), and a voltage of 6.5 V is applied to a data line (non-write data) connected to memory cells not to be written. If the selected memory cell is taken as M11 and non-selected memory cells are taken as the other memory cells M12, M21 and M22, such a state can be realized while keeping the respective members at the voltages indicated in the write column in Table 2.

More particularly, the gates SiD1 of the selective transistors SD11, SD12 are supplied with 10V to turn SD11 and SD12 on, and, at the same time, the voltages of the global data lines GD1, GD2 are kept at 6.5 V, respectively. In this way, the voltage of the data line D11 (write data line) of the selected memory cell M11 is set at a voltage of GD1 via SD1, i.e. at 0 V, and the voltage of the data line D12 (non-write data line) connected to the non-selected memory cells is set at a voltage of GD2 via SD12, i.e. at 6.5 V. The gates SiS1 of the selective transistors SS11, SS12 are supplied with 0 V to turn SS11 and SS12 off, so that the source lines S11 and S12 are turned to a floating state (open). It will be noted that S11 and S12 maybe kept at Vss (0 V). Further, while three voltages within a range of 14.9 V to 17 V are successively applied to the word line W11 selected by XDEC1 for given times, a voltage of 4.5 V is applied to the non-selected word line. At this stage, a voltage of 0 V is applied to the P-type well region.

The floating gate electrode of the selected memory cell M11 in such a state as set out above is injected with electrons in an amount of charges corresponding to the voltage of the word line W11, and information to be memorized is divided into four states including the three voltages of W11 and a state not written. At the time when electrons are injected into the floating gate electrode by application of voltages of 14.9 V to 17V to W11, the source region is in an OPEN state and the drain region (data line) is at 0 V, so that an electron channel is formed on the entire surface beneath the tunnel oxide film, and, thus, a tunnel current passes through the entire surface of the tunnel oxide film. As can be seen, it is not necessary to provide a local region for injecting the tunnel current, thus enabling one to make fine memory cells and realize a high degree of integration of the AND-type flash memory. Moreover, the tunnel current density can be made small to suppress the degradation of the tunnel oxide film, thereby improving the reliability of the AND-type flash memory.

On the other hand, in the non-selected memory cells, a great voltage is not applied between the word line (control gate electrode) and the substrate, under which condition no tunnel current passes to inject electrons. In this way, information of the non-selected memory cells is held. It should be noted that when the selective transistors SS11, SS12 at the side of the source region are turned to an off state, 6.5 V which is applied to the drain region (diffused layer) (D12) of the non-selective transistors charges the source region (diffused region) (S12) within a short time, thereby forming an inverted layer throughout the channel region surface. Accordingly, no high electric field is applied to the tunnel oxide film at that portion. This prevents an unnecessary write operation to the non-selected memory cells, and the voltages of the source and drain regions are at the same level, making it unnecessary to secure the high withstand voltage of the drain. In this system, memory operations are possible in fine gates wherein the withstand voltage between the source/drain becomes low, thus making it unnecessary to secure the drain withstand voltage at this portion. More particularly, it is not necessary to separately form the source region and the drain region and it is possible to arrange a shallow junction and symmetric structure. This makes for easy processes, such as ion implantation, thermal treatment and the like, and the process margin can be reduced, while the memory cell size can be made small.

It will be noted that there arises a difference in potential of 6.5 V between the semiconductor region (source region or drain region) of the selected memory cell and the semiconductor region of the adjacent non-selected memory cell, whereupon the word line is supplied with a voltage of 17V at a maximum, so that the isolation withstand voltage of the memory cells should be at 18 V or over. Moreover, there arises a difference in potential of about 6.5 V between the selected cells and the non-selected cells in the selective transistor, and 10 V is applied to the gate of the selective transistor. This makes it necessary for the isolation withstand voltage of the, selective transistors to be 12 V or over. However, in the AND-type flash memory of this embodiment, the memory cells are isolated from one another by shallow groove isolations buried with an insulating film in a manner described hereinafter, thus securing a necessary withstand voltage.

Figure 52:
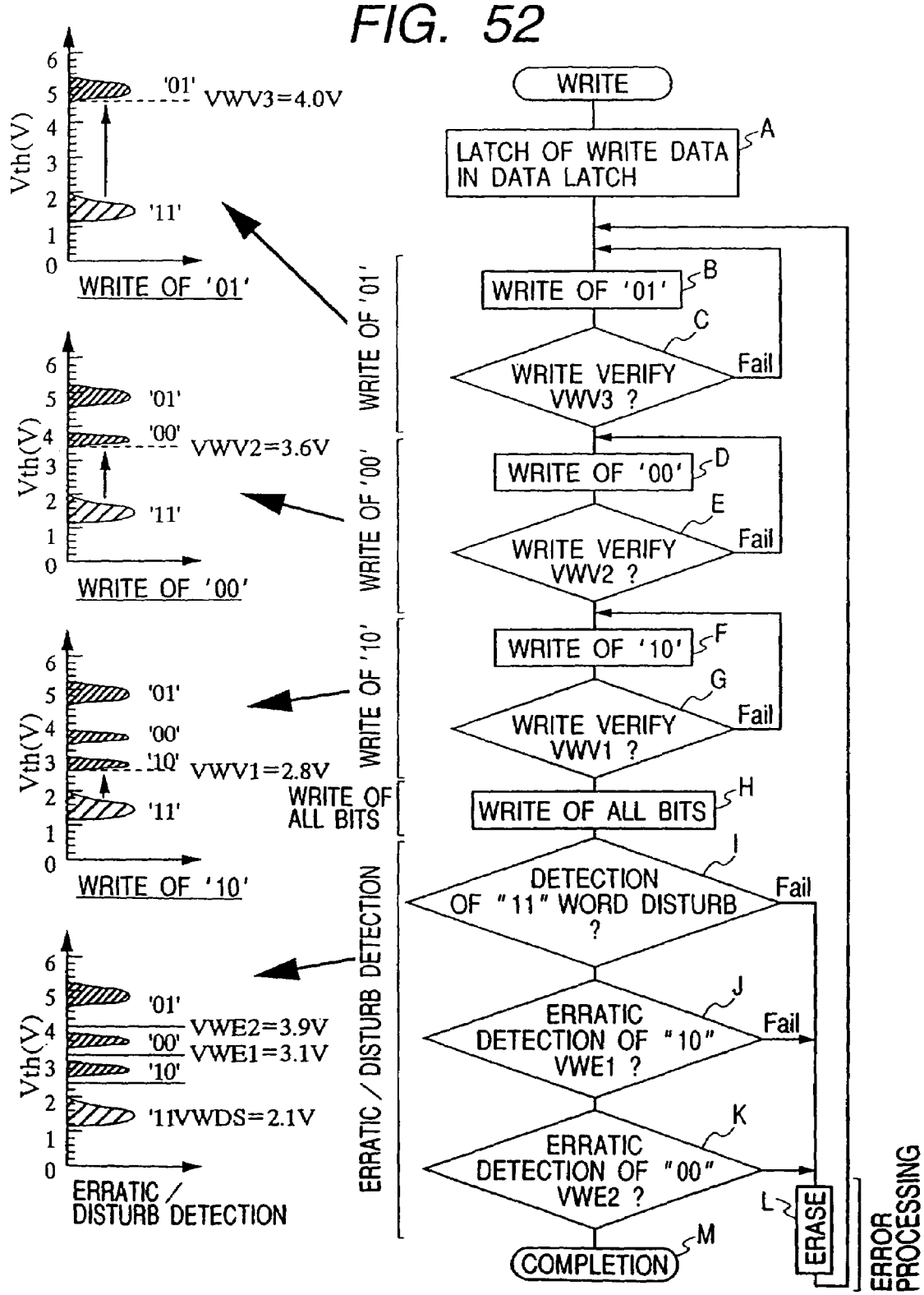
FIG. 52 is a flow chart showing an example of a write sequence.

Next, a sequence of write operations will be described. FIG. 52 is a flow chart showing an example a write sequence.

Initially, write data is latched in a latch circuit LATCH (step A). Next, "01" data is written (step B). "01" data is recorded as a threshold distribution having a peak in the vicinity of 5 V as described before, and because there is some distribution, whether or not it is normally written is verified (step C). The verify voltage is set at 4.5 V. With the case where data is not normally written (fail), the "01" data is again written by returning to step B.

If it is verified that "01" data is normally written, "00" data is then written (step D). "00" data is recorded as a threshold distribution having a peak in the vicinity of 3.6 V as mentioned before. However, if there is some distribution, it is verified whether or not it is normally written (step E). The verify voltage is set at 3.6 V. With the case where data is not normally written (fail), the "00" data is again written by returning to the step D.

If it is verified that the "00" data is normally written in the step E, "10" data is written (step F). "10" data is recorded as a threshold distribution having a peak in the vicinity of 2.8 V. Since there is some distribution, it is verified whether or not data is normally written (step G). The verify voltage is set at 2.8 V. If data is not normally written, the "10" data is again written by returning to the step F.

Next, all bits are weakly written (step H), by which all the bits are written.

Erratic and disturb conditions are detected. First, the disturb detection of the "11" word is performed (step I), followed by erratic detection of the "10" word (step J) and erratic detection of the "00" word (step K). The respective detection voltages are at 2.1 V, 3.1 V and 3.9 V. If an erratic or disturb condition has been detected in the steps I to K (fail), the written data is erased (step L), and the writing of "01" data is started over again after returning to the step B. If all the detections are passed, the write operation is completed (step M).

In this manner, when a write operation is performed in the order of higher threshold distributions, a word disturb condition in the states of "00" and "11" can be mitigated.

Next, a readout operation for the data memorized in the memory cells will be described. In the following readout operation, the operation of a selected block (e.g. BL1 in FIG. 2) will be considered.

As shown in the read column in FIG. 51, while three voltages within a range of 2.4 V to 4.0 V are applied to a word line, a voltage of Vss (0 V) is applied to a non-selected line. The source regions of memory cells are kept at a voltage of Vss (0 V), and the drain regions are held at 1.0 V. The potential of the substrate is set at Vss (0 V). Such states can be realized by keeping the voltages of the respective members at levels indicated in the read column of Table 2 when the selected cell is taken as M11 and the non-selected memory cells are taken as the other memory cells M12, M21, M22 in FIG. 2.

More particularly, the voltage of selected word lines is controlled by means of XDEC1 at three levels within a range of 2.4 V to 4.0 V, and the gates SiS1 and SiD1 of the selective transistors are supplied with 3.3 V to turn all the transistors connected thereto to an ON state. The voltage of the global data line is set at 1 V, and the voltage of the common source line is set at 0 V. As a result, voltages of 1 V and 0 V are, respectively, supplied to the local data line and the local source line via the selective transistors. Readout is performed by use of a channel current corresponding to the threshold voltage of the memory cells on the selected word line, and a similar detection is performed by application of 2 V to the selected word line. In this way, quaternary threshold voltages can be detected. It will be noted that readout is effected in the order of the lower threshold voltages.

In the write, erase and read operations, when the selective transistors SD21, SD22 and SS21, SS22 in the non-selected block are all turned off, the disturb phenomenon ascribed to the bit lines in the respective operations can be prevented.

Next, the plan layout of the AND-type flash memory of this embodiment will be described.

Figure 53:
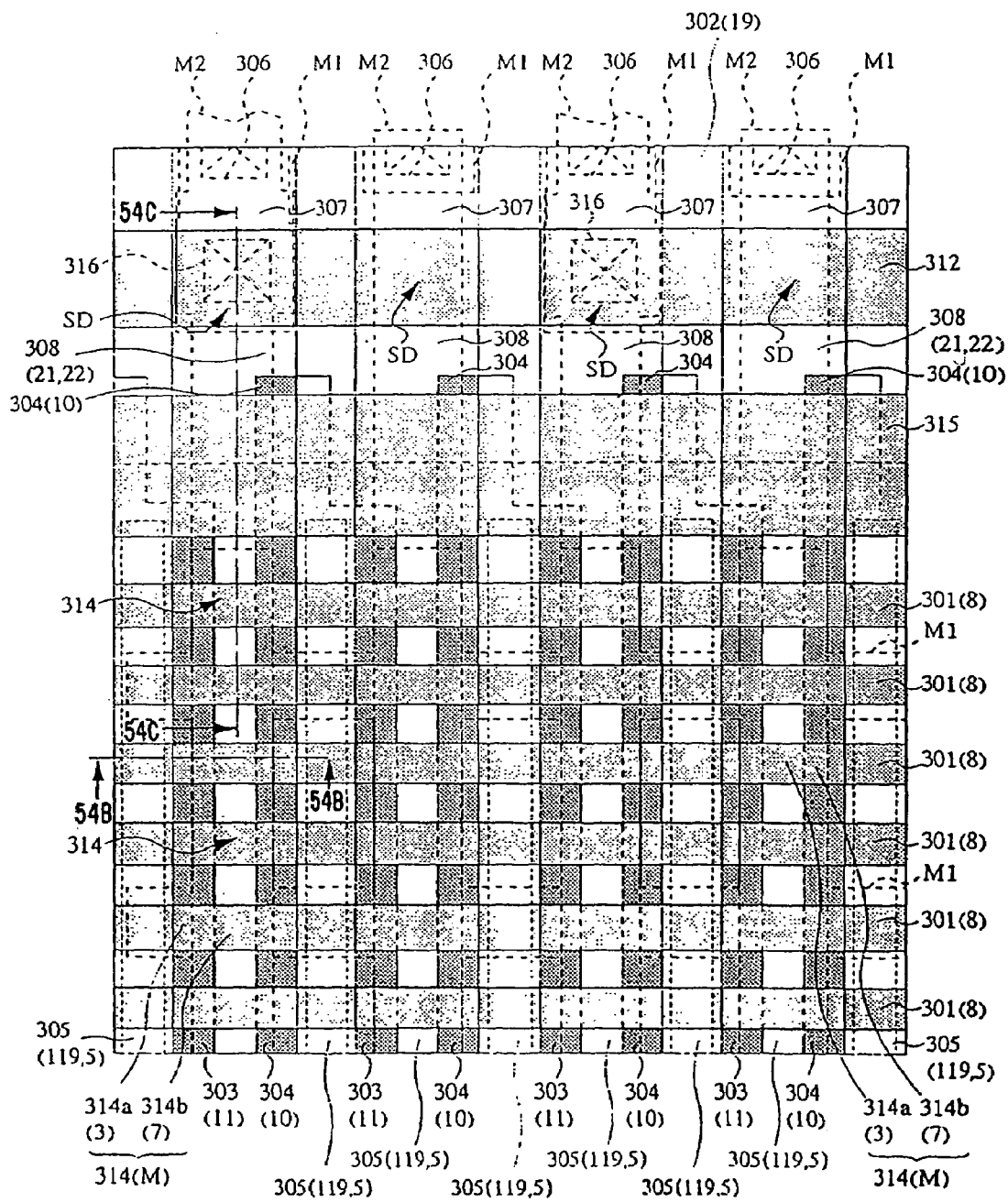
FIG. 53 is a plan view showing part of a structure of memory cells and selective transistors of an AND-type flash memory representing Embodiment 5.

FIG. 53 is a plan view showing part of the structure of memory cells and selective transistors of the AND-type memory flash of this embodiment. In FIG. 53, there are shown a portion of the selective transistors SD11, SD12 at the side of the drain region (the side of the data lines D11, D12) and a portion of the memory cell array MEMARRAY shown in FIG. 2 while omitting the structure at the side of SS11, SS12.

The AND-type flash memory of this embodiment has memory cells M (MM11 to M22, N11 to N22), selective transistors SD (SD11, SD12), and selective transistors SS (SS11, SS12) (not shown), like Embodiment 1. Moreover, like Embodiment 1, the memory has word lines 301 (8) (word wires W11 to W22) serving as control gate electrodes of the memory cells M, element isolation regions 302 (19) source regions 303 (11), drain regions 304 (10), and element isolation regions 305 (5). Accordingly, the illustration of these is omitted. It should be noted here that the element isolation regions 302 (19), 305(5) are, respectively, formed prior to the processing of the floating gate electrodes of the memory. The source regions 11, 303 and the drain regions 10, 304, respectively, have a shallow junction and a symmetric structure, like the foregoing Embodiments 1 to 4.

In FIG. 53, second-layer metal wires M2 serving as global data lines GD (GD1, GD2) indicated by the broken line are connected to the drain regions 307 of the selective transistors SD via contact holes 306, and the source regions 308 (21) of the selective transistors SD are connected to the drain regions 304 (10). On the other hand, the second-layer metal wires M2 serving as common source lines indicated by the broken line in the figure are connected to first-layer metal wires M1 via through-holes 316 at intervals equal to those of 128 memory local source lines. The first-layer metal wire M1 is connected via a contact hole (not shown) to the source region 303(11) of the selective transistor SS (not shown) and the drain region (not shown) of the selective transistor SS (not shown) is connected to the source region 303(11) in the memory cell block. Such a connection arrangement as mentioned above is similar to that of Embodiment 1 wherein the source regions 308 (212) of the selective transistors SD are connected to the drain regions 304(10). The common source lines are led in the direction of the data line by means of the second metal wire M2, but may be led in the direction of the word line by means of the first metal wire.

The gate electrode 312 of each selective transistor SD is constituted of a wiring material of the word line 301(8) above the floating gate. This is true of the gate electrode material of the selective transistor SS (not shown).

Further, buffer gates 31 are formed between the selective transistors SD, SS and the memory cell M in order to separate the transistors. The buffer gate 315 is constituted of the floating gate electrode and the word line as described hereinafter. The respective electrode materials are connected to the metal wires via contact holes, and are electrically connected to p-type wells 208, with which memory cells are formed, and are fixed at the same potential. The local bit lines 304(10) at the side of the selective transistors SD pass below the region of the buffer gates 315 and are connected to the source regions 308 (21) of the selective transistors SD, and the local source lines 303(11) terminate at the lower portion of the buffer gate 315 regions. Like Embodiment 1, the selective transistor SS side is also arranged so that the local bit lines and the local source lines are reversed.

The transistor regions of the memory cell M are those regions indicated_by the floating gate electrodes 314 (3, 7). Each floating gate electrode 314 (3, 7) is formed beneath the word line 301(8), and has a double-layered structure including a first-layer floating gate electrode 314a(3) and a second-layer floating gate electrode 314b(7). The first-layer floating gate electrode 314a(3) is defined between the source region 303(11) and the drain region 304(10) of a memory cell. The second-layer floating gate electrode 314b(7) is arranged above the first-layer floating gate electrode 314a(3) and defines capacitance values of the word line 301(8) and the floating gate electrode 314(3, 7).

Although not shown in the figure, the word line 301(8) is connected to an X decoder via a contact hole and the first-layer metal wire M1. The X decoder is provided at opposite sides of the memory mat, and the word lines are alternately connected to these X-decoders.

Figure 54:
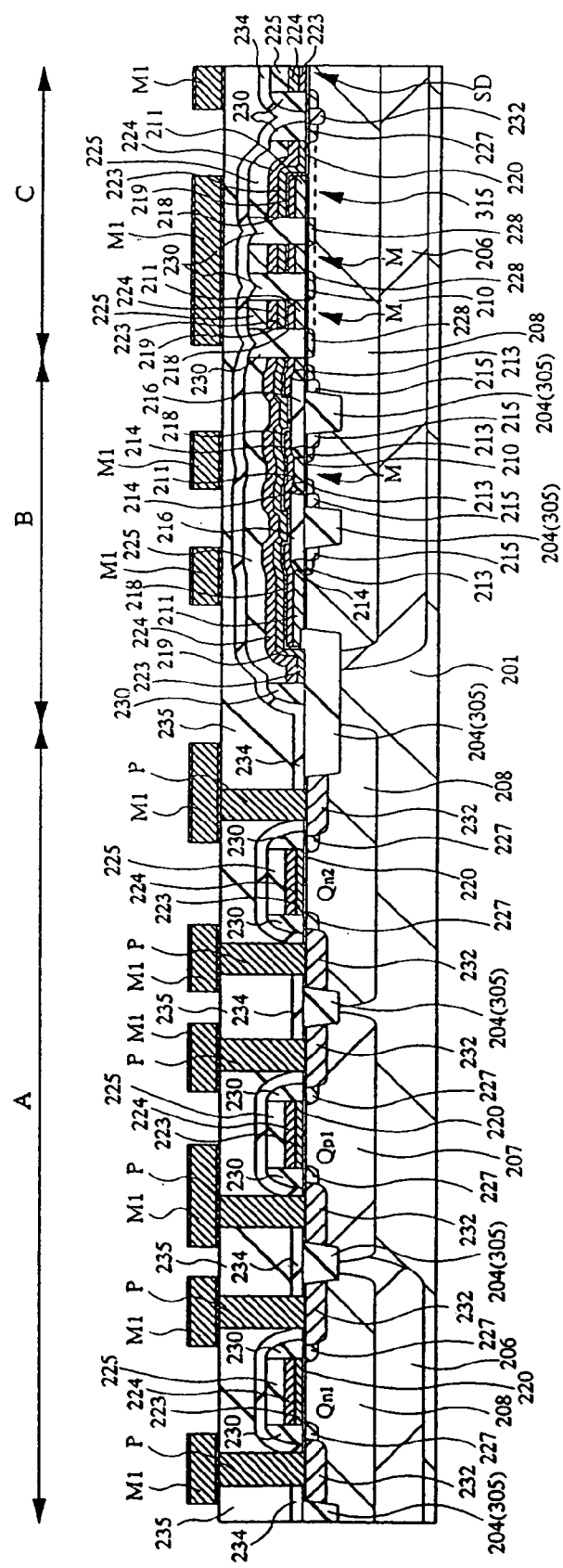
FIG. 54 is a sectional view showing an example of the AND-type flash memory of Embodiment 5.

The sectional structure of the AND-type flash memory of this embodiment will be described. FIG. 54 is a sectional view showing an example of the AND-type flash memory of the embodiment. In FIG. 54, a region A indicates a peripheral circuit-forming region (peripheral circuit portion), and regions B and C indicate a memory cell-forming region (memory cell portion) which is a memory cell array region. The memory cells indicated in the region B are in section taken along the line B—B in FIG. 53 or in a direction parallel to the word line –301 (8), and the memory cells indicated in the region C are in section taken along the line C—C indicated in FIG. 53 or in a direction parallel to the data lines (drain diffusion region 304(10)). In the following description of the sectional structure, a main part is illustrated, and a more detailed description is provided in the illustration of a fabrication process to be described later.

Element isolation regions 204 (305(5)) having a shallow groove isolation structure are formed on a main surface of a semiconductor substrate 201. In the vicinity of the main surface, there are formed p-type well regions 208 and n-type well regions 207. Part of the p-type well regions (especially, the p-type well region 208 of the memory cell region) is isolated from the p-type semiconductor substrate 201 by means of n-type well regions 206 formed in a deeper region to surround the p-type well region 208 therewith.

The element isolation regions 201 isolate memory cells and MISFET's of a peripheral circuit from each other as will be described later. Although not shown in the figure, a channel stopper region made of a p-type impurity may be formed therebeneath to more effectively isolate the elements. The minimum width of the element isolation region 204 is, for example, 0.35 μm.

A memory cell M and a selective transistor SD are formed on the main surface of the p-type well region 208 of the memory cell-forming region (regions B and C), with a buffer gate 315 being formed on the main surface.

The memory cell M has a floating gate electrode formed on a tunnel oxide film 210, which consists of an about 9.5 μm thick gate insulating film, and including a first floating gate electrode 211 and a second floating gate electrode 218. The first floating gate electrode 211 is made of an about 100 nm thick polysilicon layer with its gate length being at 0.25 μm, for example. The first floating gate electrode 211 is covered at the side surfaces thereof with a side wall spacer 214 made of an insulating film. An insulating film 216 is formed on the isolation region 204 at the side surface of the insulating film (side wall spacer) 214. The second floating gate electrode 218 is formed on the first floating gate electrode and is made of an about 40 nm thick polysilicon layer. The second floating gate electrode 218 and the first floating gate electrode 211 are electrically connected. The second floating gate electrode has a width, for example, of 0.85 μm.

An interlayer insulating film 219 composed of a composite film of silicon oxide film/silicon nitride/silicon oxide film/silicon nitride film having thicknesses of 5/7/3/11 nm, respectively, is formed on the second floating gate electrode 218 and the insulating film 216. A control gate electrode (word line 301(8))) made of a polysilicon layer 223 and a WSi$_2$ layer 224 having, for example, thickness of 50 and 120 nm, respectively, is formed on the interlayer insulating film 219. Above the control gate electrode, there is formed an insulating film 225 having a thickness of about 50 nm by the CVD method.

A source region (source line 303(11)) and a drain region (data line 304(10)) of the memory cell are formed in the p-type well region beneath the first floating gate electrode 211. The semiconductor regions 303(11), 304(10) of the memory cell are electrically connected to the selective transistor SD or SS as described before.

The selective transistor SD has a gate electrode formed on the gate insulating film 220 and is made of the polysilicon layer 223 and the WSi$_2$ layer 224. As described hereinafter, the isolation region 302(19) of the selective transistor SD or SS is formed in the same step as the isolation region 305 of the memory cell, with the isolation width being at 0.35 μm. The gate oxide film 220 has a thickness of 25 nm and is formed in the same step as the gate oxide film 220 of the peripheral circuit region. The gate width of the selective transistors is, for example, 0.75 μm.

A buffer gate electrode 315 is formed between the memory cell M and the selective transistor SD. The buffer gate electrode 315 has such a structure that the materials made of the first gate electrode 211 and the second floating gate electrode 218 and the materials of the word line made of the polysilicon layer 223 and the WSi$_2$ layer 224 are partially superposed, and is constituted of the tunnel oxide film 210 below the material of the first floating gate electrode 211 and the gate insulating film between the word line material and the p-type well region 208. The buffer gate electrode 315 is electrically connected to the p-type well region 208 and is fixed at a well region potential (or substrate potential).

A p-type semiconductor region 228 is formed between the memory cells M, so that the memory cells are isolated in the column direction. There are formed a low concentration n-type impurity semiconductor region 227 and a high concentration n-type impurity semiconductor region 232 between the buffer gate electrode 315 and the selective transistor SD. The respective gate sizes are such that the word line width of the memory cells is, for example, at 0.25 μm with pitches being, for example, at 0.9 μm.

In the peripheral circuit region (region A), there are formed n channel MISFET's Qn1, Qn2 and a p channel MISFET Qp. The gate electrodes of the channel MISFET's Qn1, Qn2 and a p channel MISFET Qp are formed on the gate insulating film 220 and made of the polysilicon layer 223 and the WSi$_2$ layer 224.

An insulating film 230 is formed over the memory cell M, buffer gate electrode 315, selective transistor SD, n-channel MISFET's Qn1, Qn2, and p channel MISFET Qp8, on which there are further formed metal wires M2 (not shown) which result in data lines arranged at right angles relative to the first-layer wire M1 and the control gate electrode.

Next, the fabrication method of the AND-type flash memory of this embodiment is described with reference to FIGS. 55 to 77. FIGS. 55 to 77 are sectional or plan views showing in sequence an example of the fabrication steps of the AND-type flash memory of Embodiment 5. It will be noted that in plan view, the memory cell region (B, C regions) alone is shown.

Figure 55:
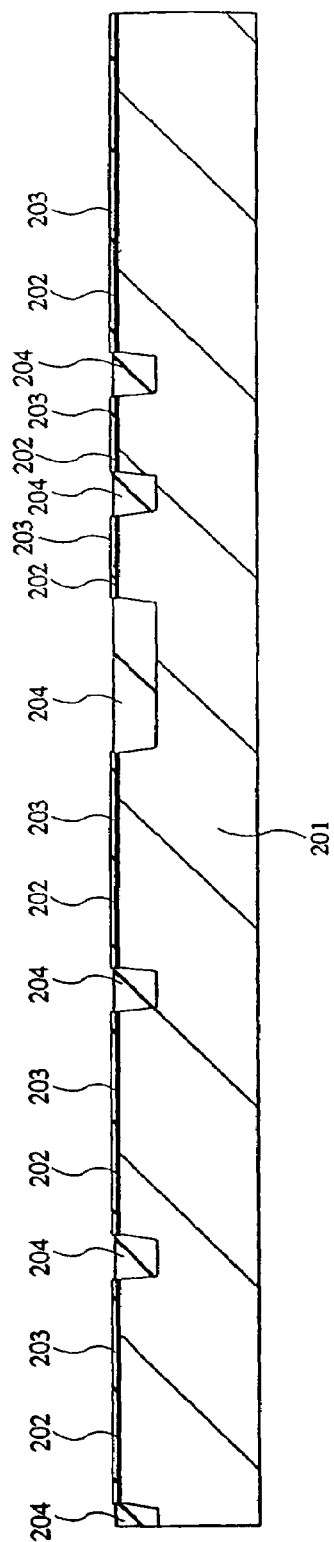

Initially, as shown in FIG. 55, the silicon oxide film 202 and the silicon nitride film 203 are attached (deposited) on the p-type semiconductor substrate 201, after which a photoresist is so patterned as to open a region which results in the element isolation region 204, followed by removal of the silicon nitride film 203 by dry etching using the photoresist pattern. After removal of the silicon oxide film 202, the semiconductor substrate 201 is dry etched to a depth of about 0.35 μm to form a shallow groove in a region which results in the element isolation region 204.

Next, the inside of the shallow groove of the semiconductor substrate 201 is oxidized, although not shown in the figures, to form an approximately 30 nm thick silicon oxide film, followed by attachment (deposition) of an insulating film (silicon oxide film) to a thickness of approximately 0.4 μm by the CVD method. After thermal oxidation, a silicon nitride film is formed, by the CVD method, over the entire surface of the insulating film to a thickness of approximately 200 nm, although not shown in the figures, and is so patterned by photoetching that the silicon nitride film is left only on a portion which becomes the wide element isolation region 204. Thereafter, the silicon nitride film and the insulating film are polished and planarized by the CMP (Chemical Mechanical Polishing) method to bury the shallow groove with the insulating film. The polishing is continued until the silicon nitride film 203 is exposed. At this time, the silicon nitride film 203 functions as a stopper for the polishing by CMP.

Figure 56:
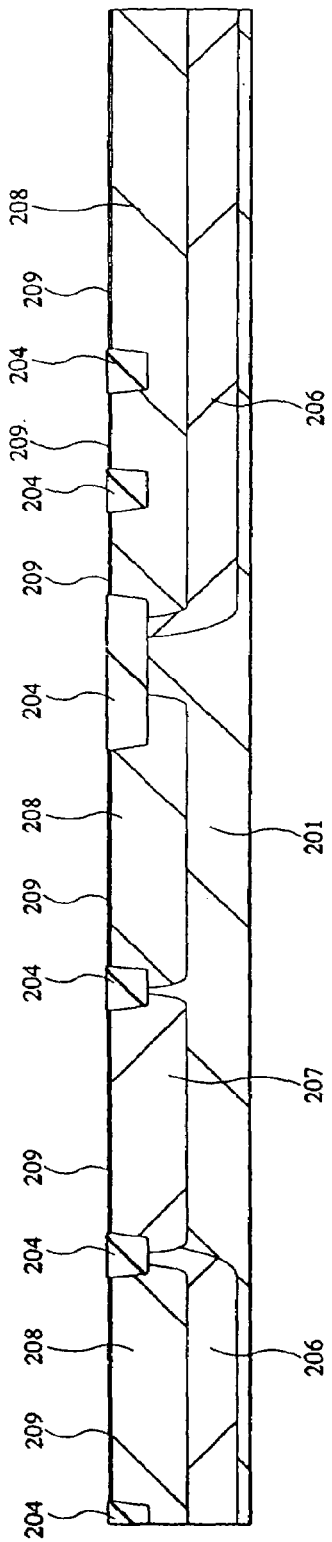
Figure 57:
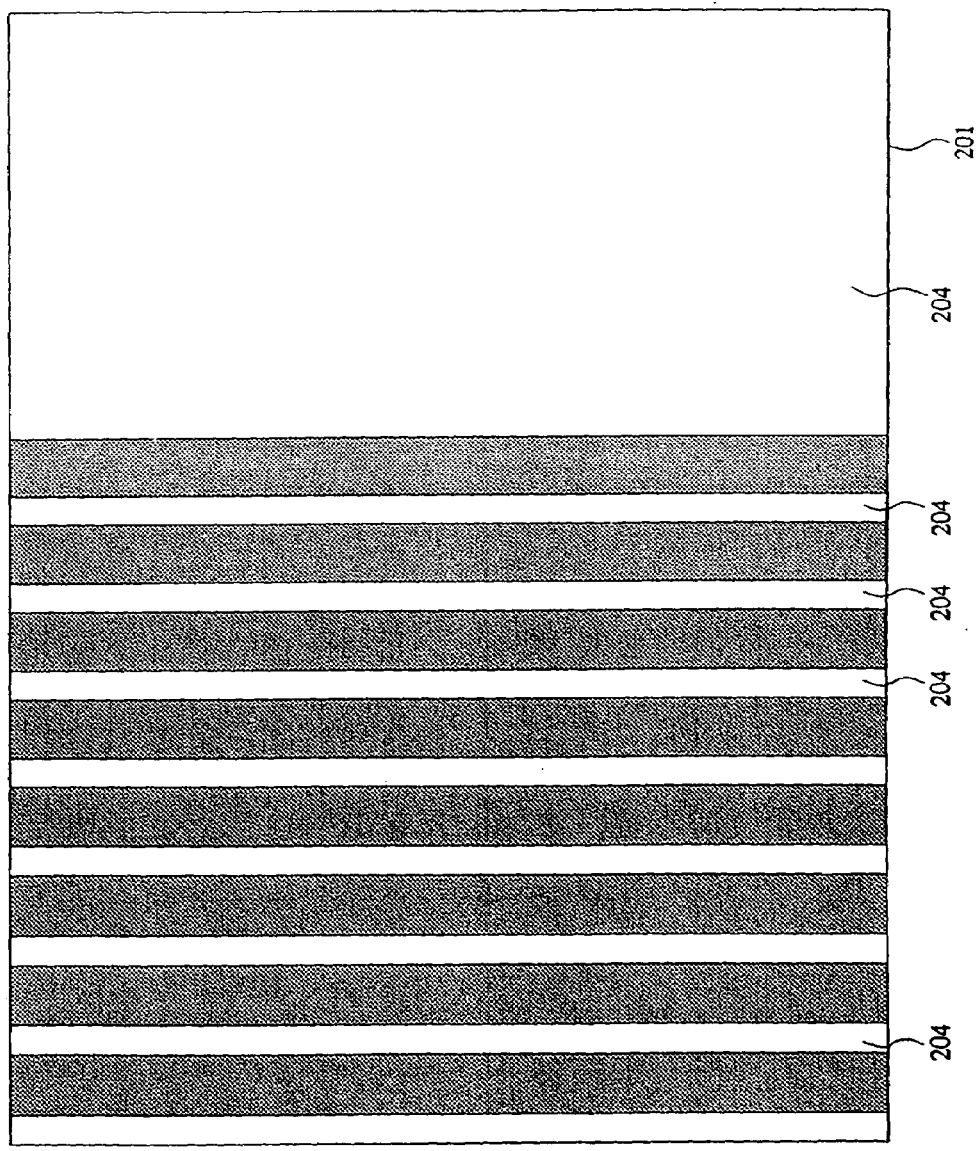

As shown in FIG. 56, the silicon nitride film 203 is removed by wet etching, for example, with hot phosphoric acid. In this way, the isolation regions 204 of the peripheral circuit region (A region) and memory cell and selective transistor regions (regions A and B) are simultaneously formed. Thus, the isolation regions 204 wherein the insulating film (silicon oxide film) is buried in the shallow grooves are formed. The plan view of the semiconductor substrate 201 wherein the element isolation regions 204 are formed is shown in FIG. 57 with respect to the memory cell regions (regions B, C). The width of the active regions sandwiched between the isolation regions 204 is, for example, 0.75 μm, and the width of the isolation region 204 is, for example, 0.35 μm. As will become clear hereinafter, the isolation regions 204 of the memory cell portion and the selective transistor portion are formed simultaneously in this step.

Subsequently, a sacrificial oxide film 209 is formed on the surface of the semiconductor substrate 201, followed by ion implantation of phosphorus (P) into the semi-conductor substrate 201 by a high energy through a photoresist mask to form n-type well regions in a deep region. Next, phosphorus is ion implanted through the photoresist mask several times by dividing the energy and dosage into portions to form an n-type well region 207. Thereafter, boron (B) is ion implanted through the photoresist mask several times with an energy and a dosage being divided into portions to form p-type well regions 208. Although not shown in the figure, boron may be ion implanted into the memory cell and selective transistor portions to form channel stopper regions. Likewise, boron may be ion implanted into the memory cell portion to form a channel region.

Figure 58:
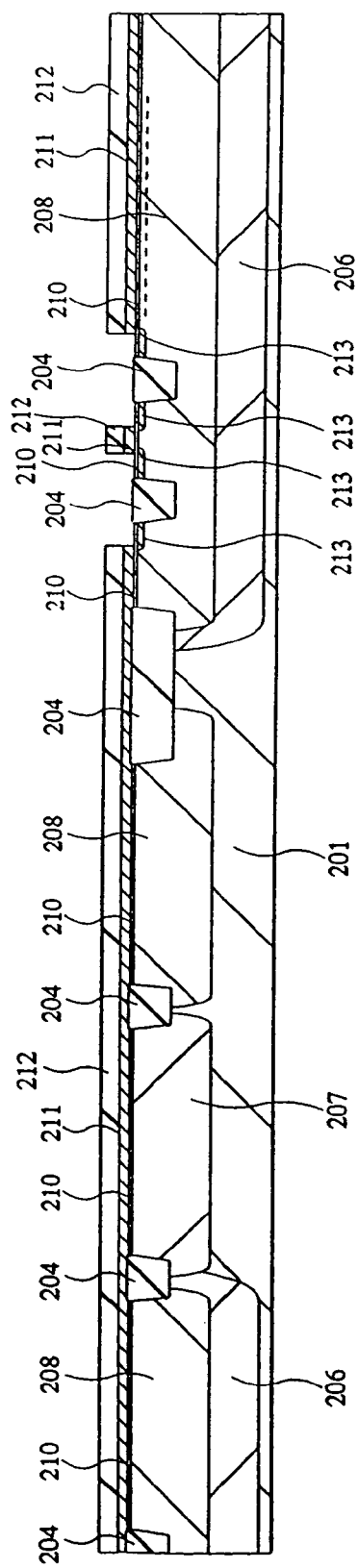

Next, as shown in FIG. 58, the sacrificial oxide film 209 is removed, followed by thermal oxidation to form a silicon oxide film 210 having a thickness, for example, of 9.5 nm. Thereafter, a non-doped polysilicon film (conductive film) 211 having a thickness, for example, of 100 nm and a silicon nitride film (insulating film) 212 having a thickness, for example, of 200 nm are successively attached (deposited) by the CVD method. The polysilicon film 211 in the regions B, C subsequently results in first floating gate electrodes.

A photoresist is patterned by a photoetching process so that the gate length of the first floating gate electrode is regulated in the memory cells and the semiconductor substrate 201 is protected on the surface thereof in the selective transistor portion (part of the region C) and the peripheral circuit portion (region A), followed by dry etching of the silicon nitride film 212. Thereafter, the resist is removed, and the polysilicon film 211 is dry etched through the mask of the silicon nitride film 212. Since, the selective transistor portion and the peripheral circuit portion are covered with the polysilicon film 211 and the silicon nitride film 212, the impurity concentration and distribution of the semiconductor substrate 201 are not influenced by the impurity implanted in the ion implantation step described below. Moreover, the surface of the semiconductor substrate 210 at the selective transistor portion and the peripheral circuit portion is not damaged in the CMP step described hereinafter. Eventually, the performance of the AND-type flash memory is enhanced, with the steps being stabilized.

Next, arsenic (As) ions are subjected to ion implantation into the substrate under conditions of a dosage of $1\times10^{14}$ atoms/cm$^2$ and an acceleration voltage of 40 KeV to form semiconductor regions 213 of memory cells.

Figure 59:
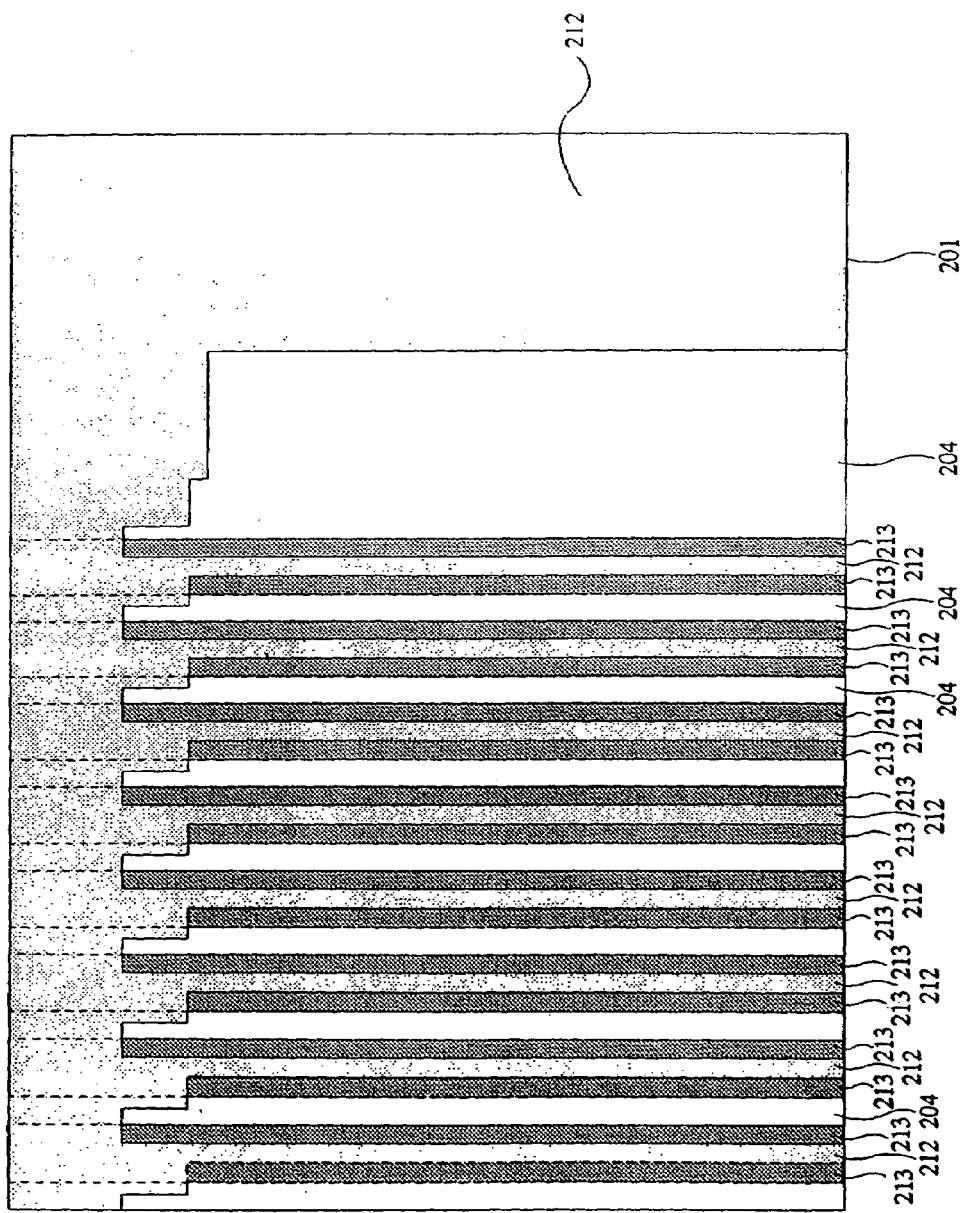

A plan view of the thus formed polysilicon film 211 and the silicon nitride film 212 and the memory cell semiconductor regions 213 is shown in FIG. 59. The polysilicon film 211 and the upper silicon nitride film 212 serving as the first floating gate electrode are so arranged in the form of a striped column pattern (a line pattern in the column direction) in the memory cell portion as to protect (cover) the selective transistor portion. Thus, recesses are formed in the column direction between the column patterns. The line width of the silicon nitride film 212 in the memory mat is, for example, at 0.25 µm, with its intervals being, for example, at 0.85 µm. The polysilicon film 211 and the silicon nitride film 212 and the memory cell semiconductor regions 213 are formed in the active region between the isolation regions 204. The semiconductor regions 213 of the memory cells serve as the source region 303(11) and the drain region 308(10) where the side (drain region 304(10)) which is subsequently connected to the drain region 308(21) of the selective semiconductor SD is formed to be long, and the side not connected (source region 303(11)) is formed to be short.

Figure 60:
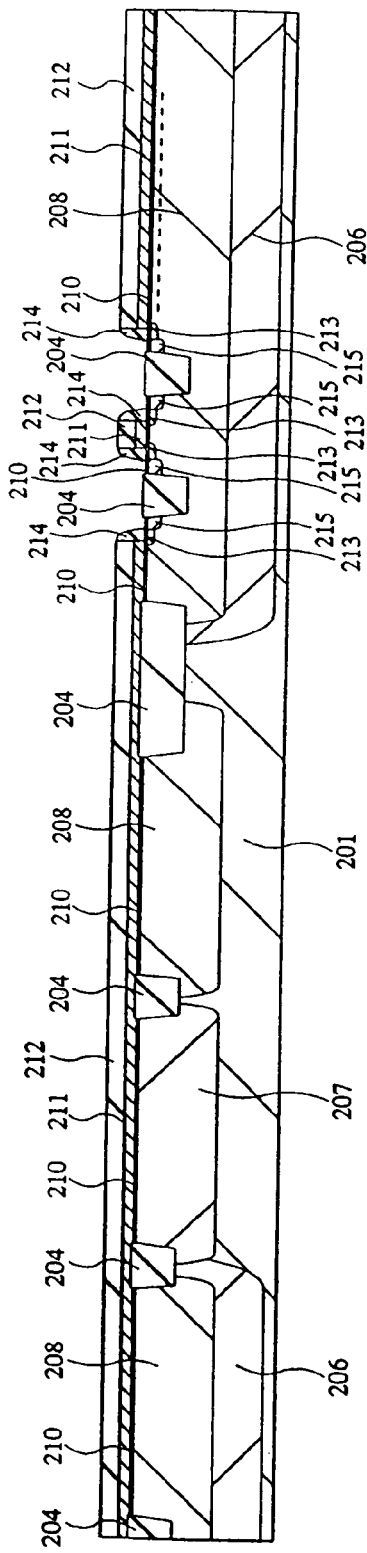

Next, as shown in FIG. 60, a silicon oxide film, which consists of an about 150 nm thick insulating film, is formed by the CVD method, and is subjected to anisotropic etching to form a side wall spacer 214 on the side surfaces (side walls) of the polysilicon film 211 and the silicon nitride film 212.

Thereafter, arsenic (As) ions are, for example, implanted into the substrate under conditions of a dosage of $1\times10^{15}$ atoms/cm$^2$ and an acceleration voltage of 40 keV to form, semiconductor regions 215 of memory cells In these ion implantation steps, the silicon nitride film 212 serves as a mask, so that unnecessary implantation into the floating gate and the peripheral circuit portion does not take place. Thus, the source and drain regions 213, 215 are formed in the same ion implantation step and are formed in the form of a symmetric structure and a shallow junction.

Figure 61:
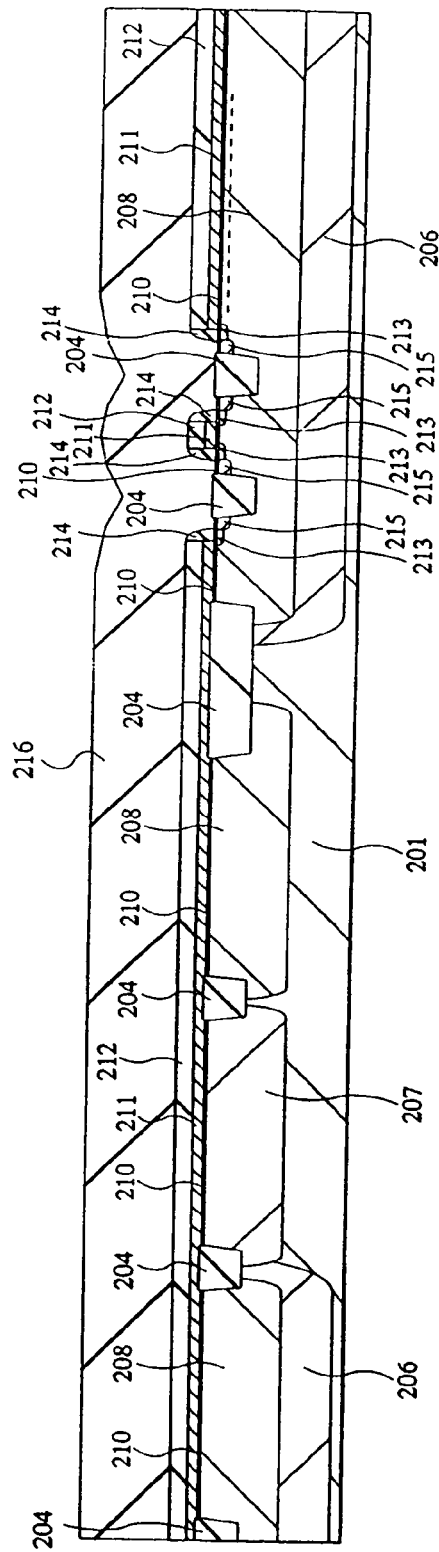

Next, as shown in FIG. 61, a silicon oxide film 216, which consists, for example, of a 500 nm thick insulating film, is attached (deposited) by the CVD method. By the deposition, the irregularities formed by the polysilicon film 211 and the silicon nitride film 212, which have been processed in the striped column pattern in the memory cell region, are filled up.

Figure 62:
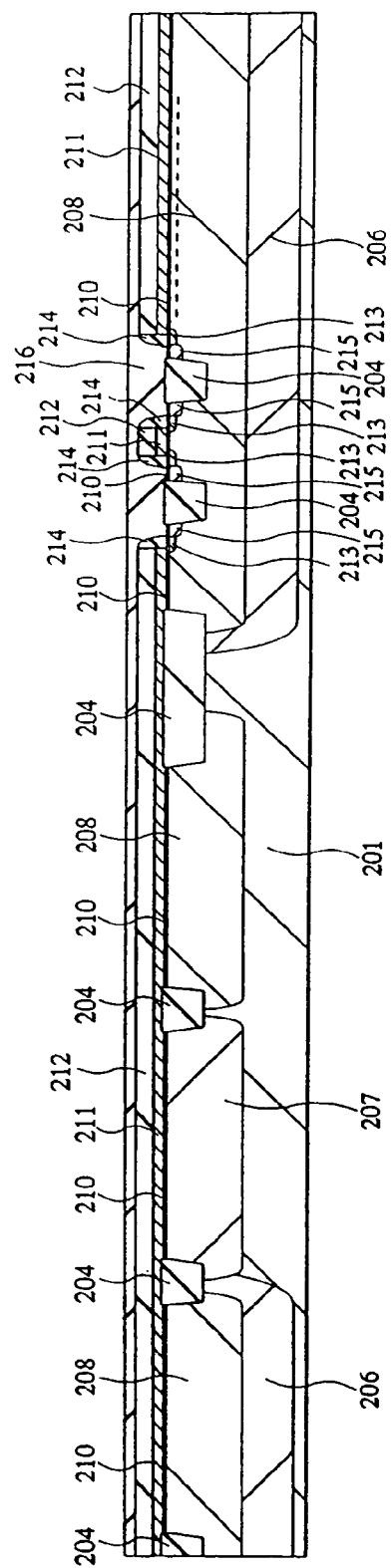

As shown in FIG. 62, the silicon oxide film 216 is polished to a level of 380 nm according to the CMP technique, to form the silicon oxide film 216 in such a way that the surface positions of the silicon oxide film 216 between the column patterns, wherein the film becomes a first gate electrode, and on the isolation regions 204 become substantially at the same level. That is, the surface positions of the silicon oxide film 216 are formed so as to be substantially uniform.

Figure 63:
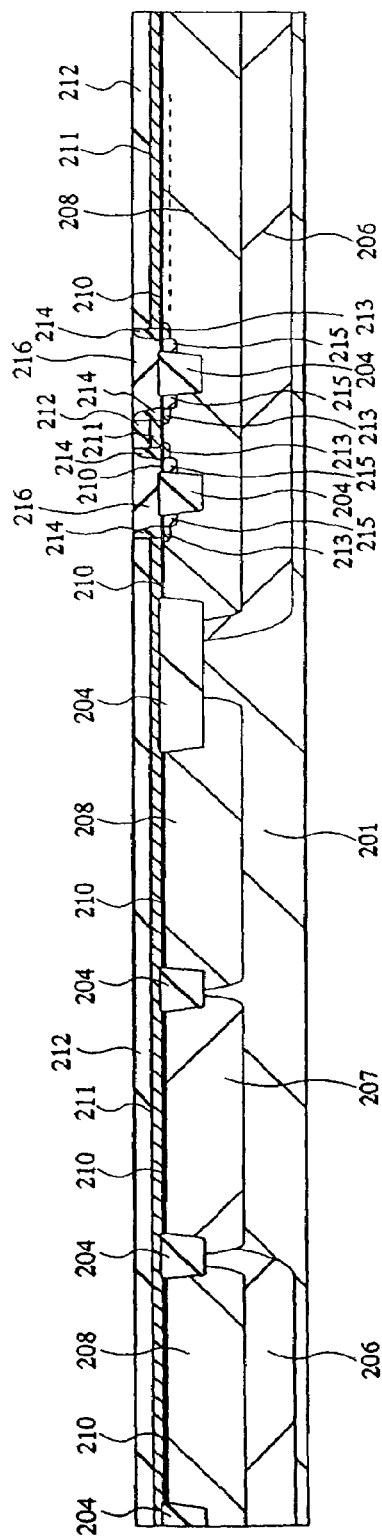

Thereafter, as shown in FIG. 63, the silicon oxide film 216 is etched by dry etching the silicon nitride film 212 while keeping the surface uniformity. It will be noted that the dry etching is effected under conditions where the etching rates of the silicon oxide film 216 and the silicon nitride film 212 are almost the same. Although not critically limited, the silicon nitride film is etched to half the thickness thereof by the dry etching. This is because if the thickness of the silicon nitride film prior to the etching is so great as to bring about too great a difference (step difference) between the surface positions of the polysilicon film 211 and the silicon oxide film 216, as will be described hereinafter, a difficulty is involved in processing of the polysilicon film 216. Like Embodiments 1 to 4, the above-mentioned irregularities are filled up so that the silicon oxide film (insulating film) 216 has surface positions in the memory cell portion which are at the same level. The silicon nitride film 212 is used for the detection of etching termination at the time of the dry etching of the upper silicon oxide film. The silicon nitride film plays the role of protecting the floating gate electrodes from CMP and dry etching. Moreover, the peripheral circuit portion is also covered with the silicon nitride film 212, so that scraping or dishing of the underlying film caused by the etching does not occur. It will be noted that the etching is not limited to dry etching, but wet etching may be used. However, wet etching brings about a greater difference in etching rate than dry etching depending on the film quality, and thus, dry etching ensures more uniformity in surface position of the silicon oxide film 216 between the floating gate electrodes.

Figure 64:
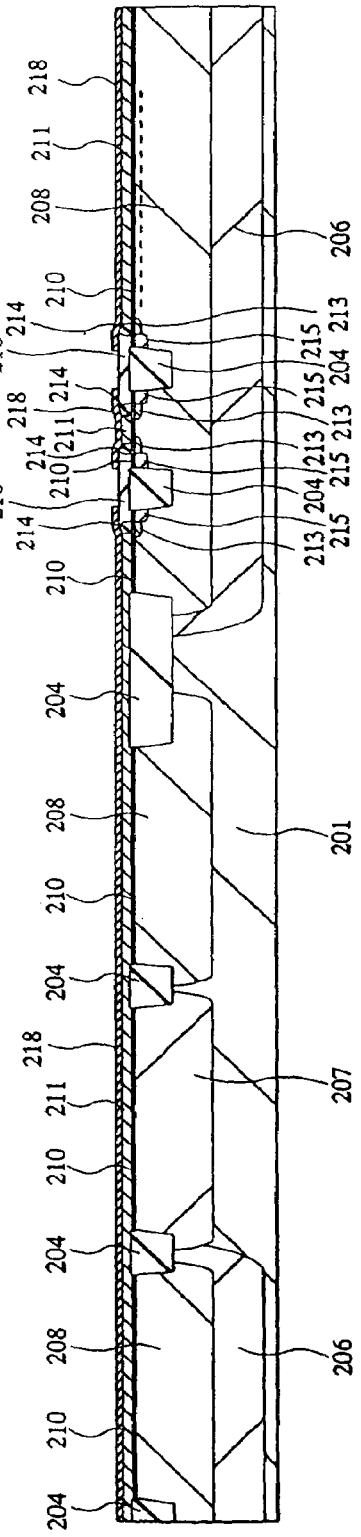

Next, as shown in FIG. 64, the silicon nitride film 212 is removed with hot phosphoric acid to expose the underlying polysilicon film. Thereafter, an approximately 40 nm thick phosphorus-doped polysilicon film 218 having an impurity concentration of about $4.7\times10^{20}$ atoms/cm$^3$ is attached (deposited), for example, by the CVD method, followed by processing into a second floating gate electrode by a photoetching step. At this stage, the peripheral circuit portion and the selective transistor portions are covered and protected with the second floating gate electrode. The surface position of the silicon oxide film 216 below the second floating gate electrode (polysilicon film 218) is so arranged as to be higher than the surface position of the first floating gate electrode (polysilicon film 211). In this way, the capacitances between the second floating gate electrode and the source/drain regions 213, 215, 10, 11 can be reduced, thereby improving the memory cell characteristics in flash memories having a plurality of threshold voltages as in this embodiment.

Figure 65:
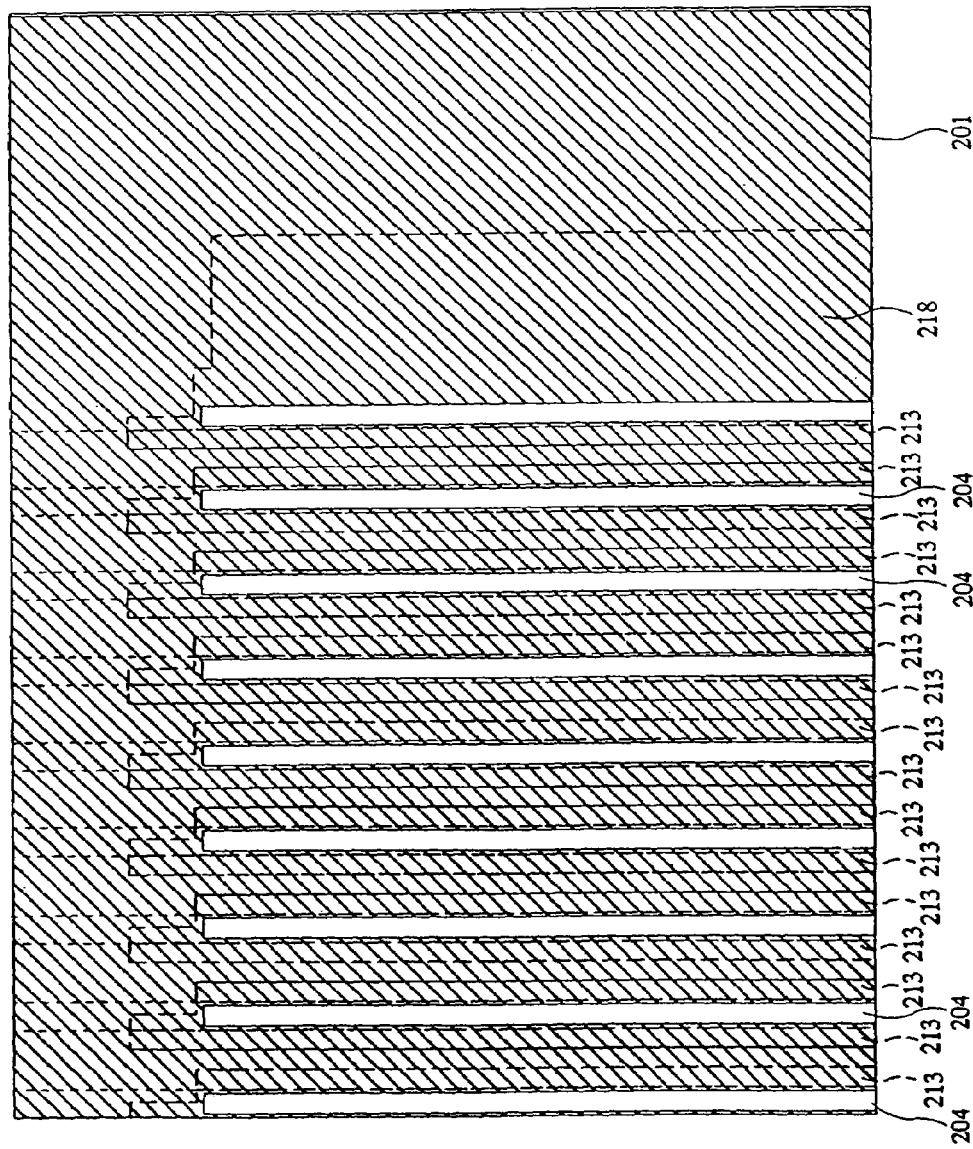

In this step, as shown in FIG. 65, the polysilicon film 218 covers, in the memory cell portion, the polysilicon film 211 which results in the first floating gate electrode, and is arranged in the form of stripes extending over the silicon oxide film 216 and is arranged to protect (cover) the selective transistor portion. Within the memory mat, the width of the stripes, or the line width of the second floating gate electrode is, for example, 0.85 µm, with their intervals being, for example, 0.25 µm.

It is to be noted that at the time of the photoetching in this step, the surface in which the phosphorus-doped polysilicon film 218 has been deposited is buried with the silicon oxide film 216, ensuring high flatness. This makes it difficult to scatter exposed light during photolithography, thereby improving the processing accuracy with ease in fineness As a result, the degree of integration of the AND-type flash memory can be improved The capacitance between the floating gate electrode 218 and the source/drain regions (semiconductor regions 213, 215) can be reduced, with improved memory cell characteristics.

Figure 66:
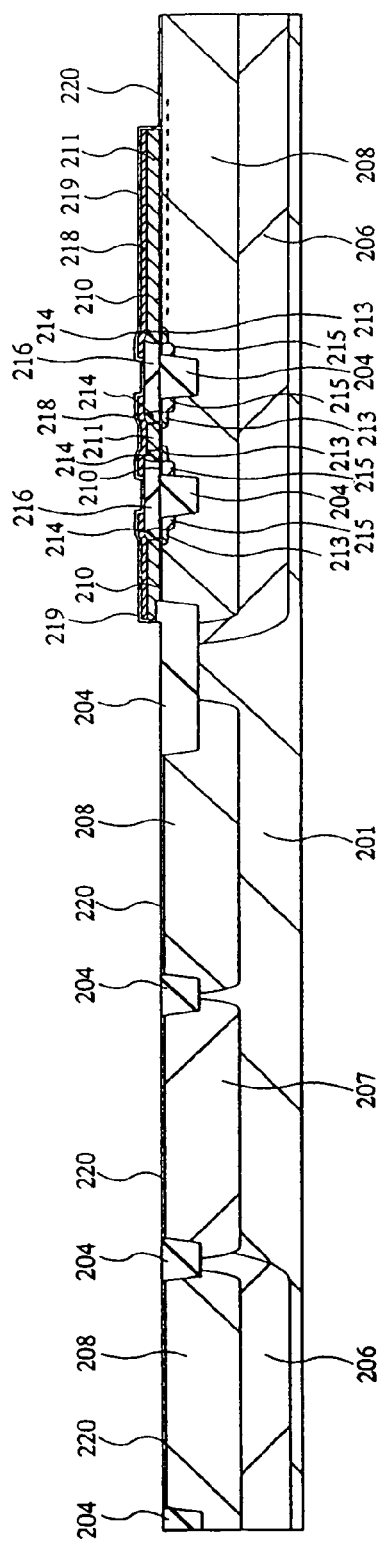

Next, as shown in FIG. 66, an interlayer insulating film 219 made, for example, of silicon oxide film/silicon nitride film/silicon oxide film/silicon nitride film having thicknesses of 5/7/3/11 nm, respectively, is formed by the CVD method or the like, after which the interlayer insulating film 219 of the peripheral circuit portion and the selective transistors are removed by a photoetching process.

At this stage, as shown in FIG. 67, the pattern 255 is arranged to protect (cover) the memory mat therewith while taking, as a boundary, the vicinity of the central portion of the region, in which the buffer gate electrode 315, existing between the region where there is formed the memory cell portion, in which the first and second floating gate electrodes are formed in the form of stripes, and the region where there is formed the selective transistor SD, is formed.

Subsequently, a sacrificial oxide film is formed by thermal oxidation, although not shown in the figure, and ions are, respectively, implanted into the region where there are formed n-channel MISFET's Qn1, Qn2 and p-channel MISFET Qp and the region where the selective transistor SD is formed to form channel regions, after which the sacrificial oxide film is removed and a 25 nm thick oxide film 220 is formed by thermal oxidation. The oxide film 220 serves as a gate insulating film for the n-channel MISFET's Qn1, Qn2 and p-channel MISFET Qp and the selective transistor SD.

Next, as shown in FIG. 68, there are successively formed by the CVD method an approximately 50 nm thick phosphorus-doped polysilicon film 223 having an impurity concentration of about $4.7 \times 10^{20}$ atoms/cm$^3$, an approximately 100 nm thick WSi$_2$, film 224 and an approximately 150 nm thick silicon oxide film 225.

Figure 70:
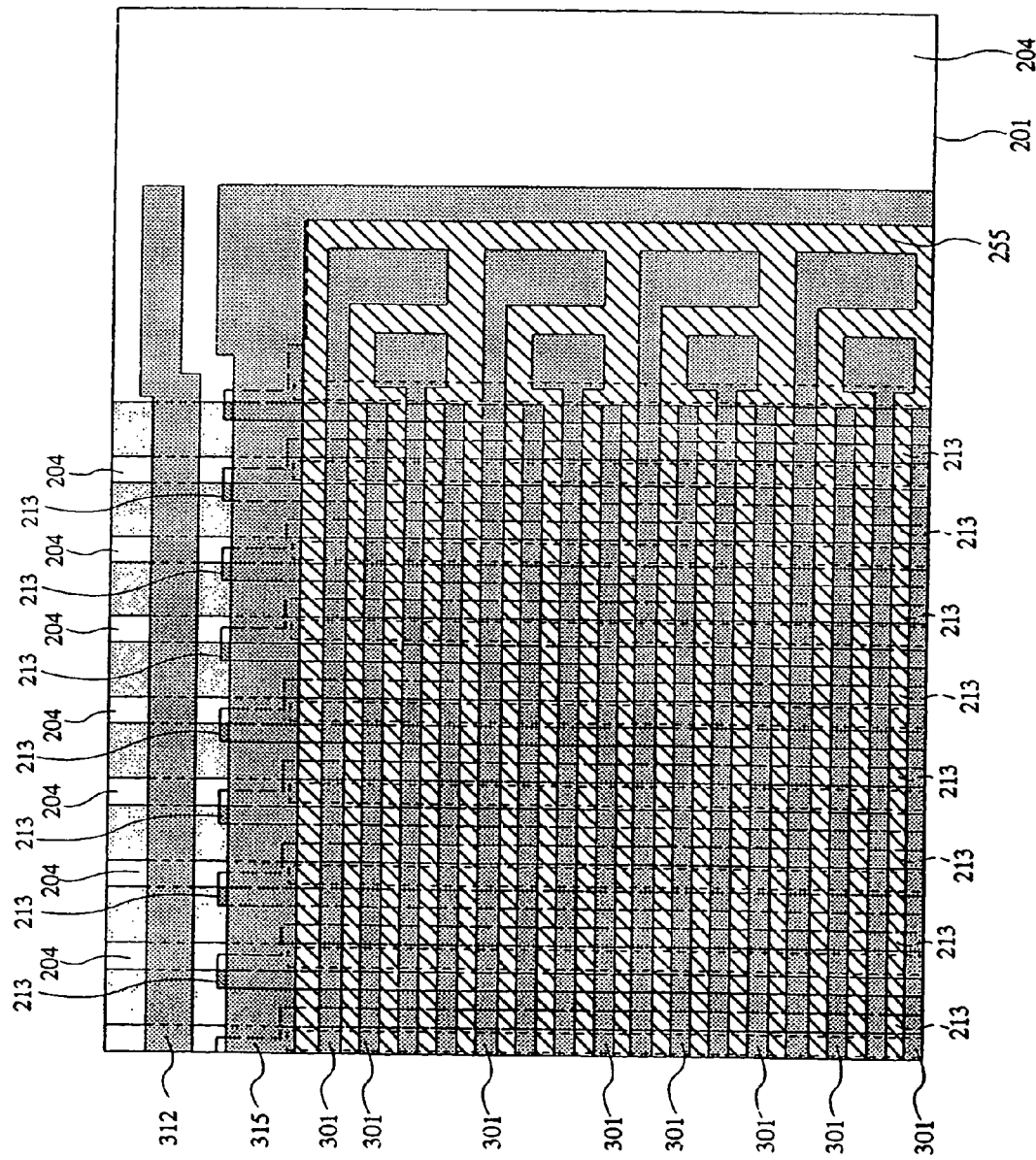

Then, a photoresist is patterned, through which the silicon oxide film 225 is processed to obtain gate electrodes of the n-channel MISFET's Qn1, Qn2 and p-channel MISFET Qp, gate electrodes (312) of the selective transistors SD, and word lines (301(8)) of memory cells. The plan view after the processing is shown in FIG. 70. The n-Channel MISFET's Qn1, Qn2 have a minimum gate length, for example, of 1 μm, and the p-channel MISFET Qp has a minimum gate length, for example, of 1.1 μm. The selective transistor SD has a gate length, for example, of 0.9 μm, and the word line width (gate width) of the memory cells is, for example, 0.25 μm. After removal of the resist, the WSi$_2$ film 224 and the third polysilicon film 223 are successively processed through the mask of the silicon oxide film 225. In this manner, the WSi$_2$ film 224 and the third polysilicon film 223 result in gate electrodes of the n-channel MISFET's Qn1, Qn2 and p-channel MISFET Qp in the peripheral circuit region (region A), and also in the gate electrode (312) of the selective transistor SD and the word line (305(5), control gate electrode) of each memory cell. The gate length of the buffer gate electrode (315) the n-channel MISFET's Qn1, Qn2 and p-channel MISFET Qp is determined in this step Thus, there are formed control gate electrodes (word lines) 305(5) extending along the row direction while being patterned in a direction vertical to the direction of extension of the column pattern.

Figure 73:
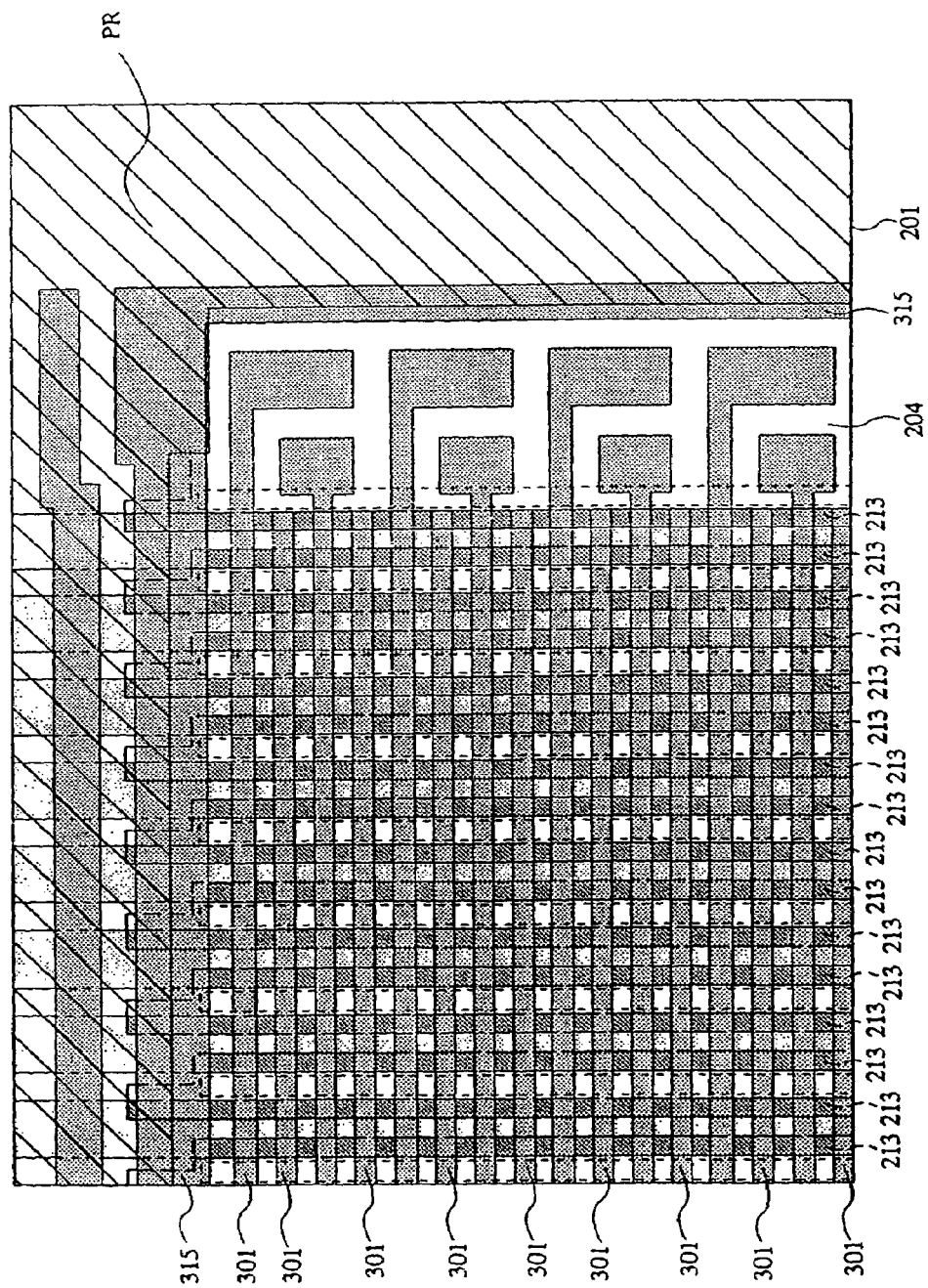

Next, as shown in FIGS. 71 and 73, a photoresist PR is so patterned as to open the memory cell portion, after which the interlayer insulating film 219, and the first and second polysilicon films 211, 218 are successively processed through the mask of the photoresist PR and the silicon oxide film 225 (FIG. 72). In this step, word lines 301, selective transistors SD and buffer gate electrodes 315 are formed. As shown in FIG. 73, the patterning of the second photoresist is arranged to open the memory cell portion on the buffer gate electrodes 315. The patterning is effected such that at the upper right portion of the buffer gate electrode 315, the second floating electrode surface is exposed.

Thereafter, as shown in FIG. 72, a silicon oxide film having a thickness of 10 nm is formed over the entire surface by the CVD method, after which the photoresist is so patterned as to open the regions where the n-channel MISFET's Qn1, Qn2 of the peripheral circuit portion are formed. Thereafter, for example, phosphorus (P) ions are implanted into the substrate under conditions of a dosage of $2 \times 10^{13}$ atoms/cm$^2$ and an acceleration voltage of 60 keV to form n-type low concentration impurity semiconductor regions 227 of the n-channel MISFET's Qn1, Qn2 of the peripheral circuit portion and the selective transistor portion inside the memory mat. Subsequently, BF$_2$ ions are, for example, implanted into the substrate over the entire surface under conditions of a dosage of $2 \times 10^{12}$ atoms/cm$^2$ and an acceleration voltage of 50 keV to form p-type low concentration semiconductor regions 228 of the p-channel MISFET Qp of the peripheral circuit portion. At the same time, there are formed, by the implantation of the BF$_2$ ions, punch-through stopper regions (p-type semiconductor regions) 228 in the substrate regions sandwiched between the word lines of the memory cells and the source/drain regions.

Figure 74:
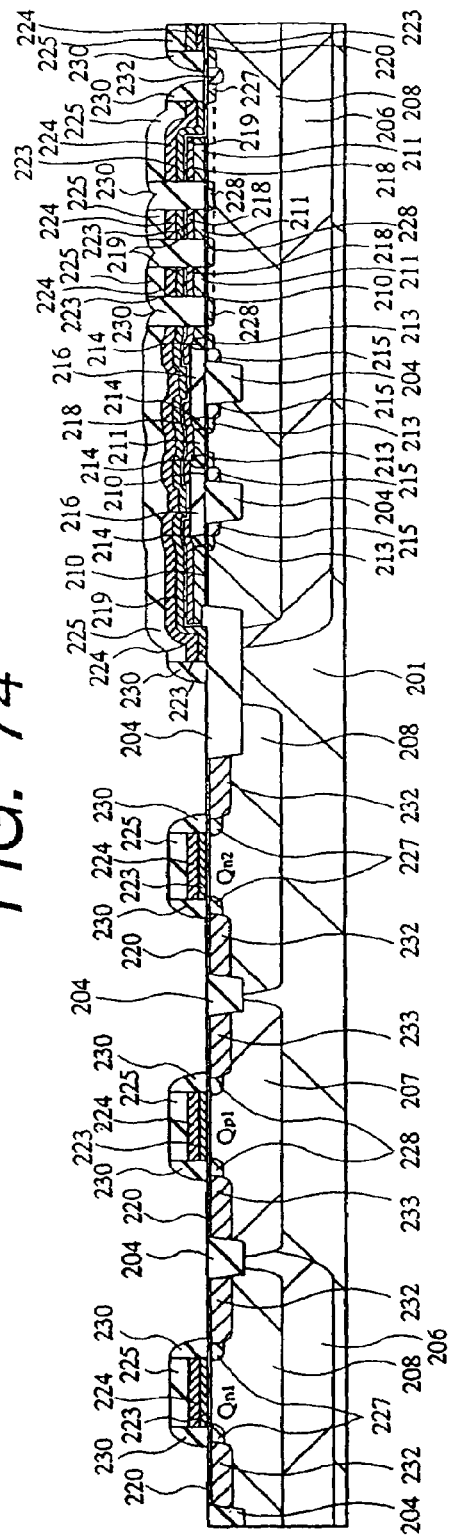

Thereafter, as shown in FIG. 74, the substrate surface is oxidized to a thickness of approximately 6 nm, after which an insulating film 230 made of an approximately 20 nm thick silicon nitride film and an approximately 200 nm thick silicon oxide film is formed by the CVD method, followed by anisotropic etching to form side wall spacers 230 on the side surfaces of the gate electrodes. After attachment (deposition) of a 10 nm thick silicon oxide film by the CVD method, a photoresist is so patterned as to open the n-channel MISFET's Qn1, Qn2 of the peripheral circuit portion and the selective transistor SD, followed by implantation, for example, of arsenic (As) ions into the substrate under conditions of a dosage of $5 \times 10^{15}$ atoms/cm$^2$ and an acceleration voltage of 50 keV to form n-type high concentration semiconductor regions 232. Thus, the photoresist is so patterned as to open the p-channel MISFET Qp of the peripheral circuit portion, followed by implantation, for example, of BF$_2$ ions into the substrate under conditions of a dosage of $3 \times 10^{15}$ atoms/cm$^2$ and an acceleration voltage of 50 keV to form a p-type high concentration semiconductor region 233.

Figure 75:
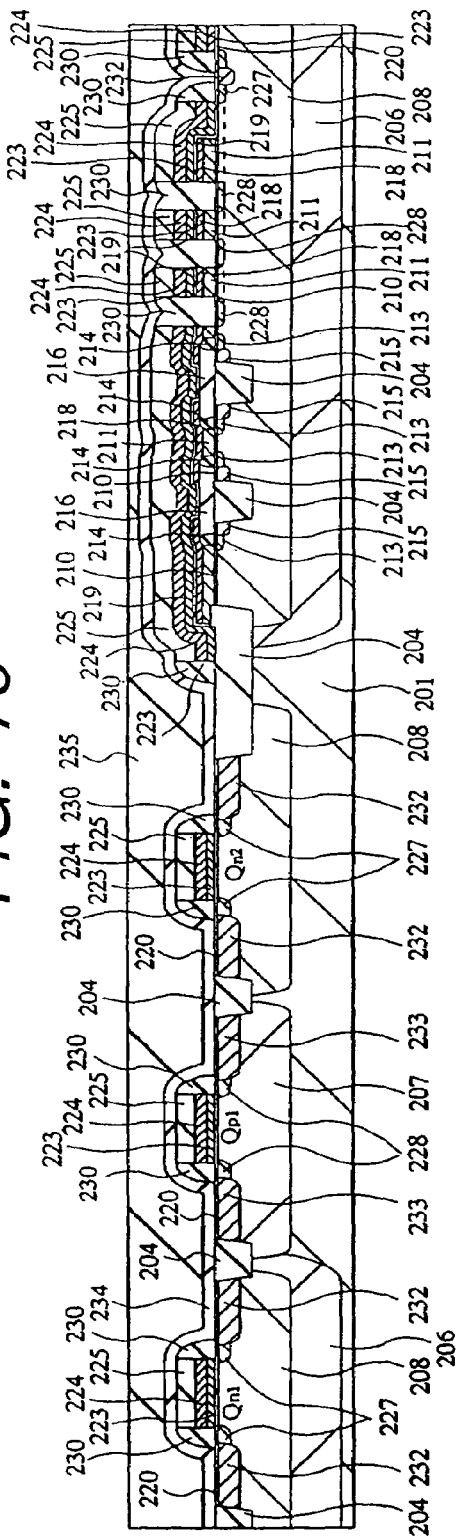

As shown in FIG. 75, a 100 nm thick silicon oxide film 234 and phosphate glass (PSG) are formed by the CVD method and thermally treated at a temperature of 850° C. in an atmosphere of 1% of O$_2$ for 20 minutes, followed by formation of a 800 nm thick PTEOS film (i.e. a silicon oxide film by a plasma CVD method using TEOS (tetramethoxysilane) as a starting material) and polishing by CMP. As a result, there can be formed an interlayer insulating film 235 made of the phosphate glass and the PTEOS film.

A photoresist is subsequently patterned so that contact holes of a square pattern are formed with a size of 0.38 μm in one side by dry etching. After irradiation with UV light, Ti (titanium)/TiN (titanium nitride) films having thicknesses of 40 nm and 100 nm are formed by sputtering, followed by further formation of a 500 nm thick W (tungsten) film by the CVD method. Thereafter, the W film in the surface portion is removed by dry etching. Eventually, there can be formed plug electrodes P shown in FIG. 54. Next, a metal layer made, for example, of films of Ti/Al—Cu/Ti/TiN is formed with thicknesses for example, of 10/200/10/75 nm, respectively, followed by patterning to complete first-layer wires M1. Hence, the AND-type flash memory of FIG. 54 is substantially completed.

Figure 76:
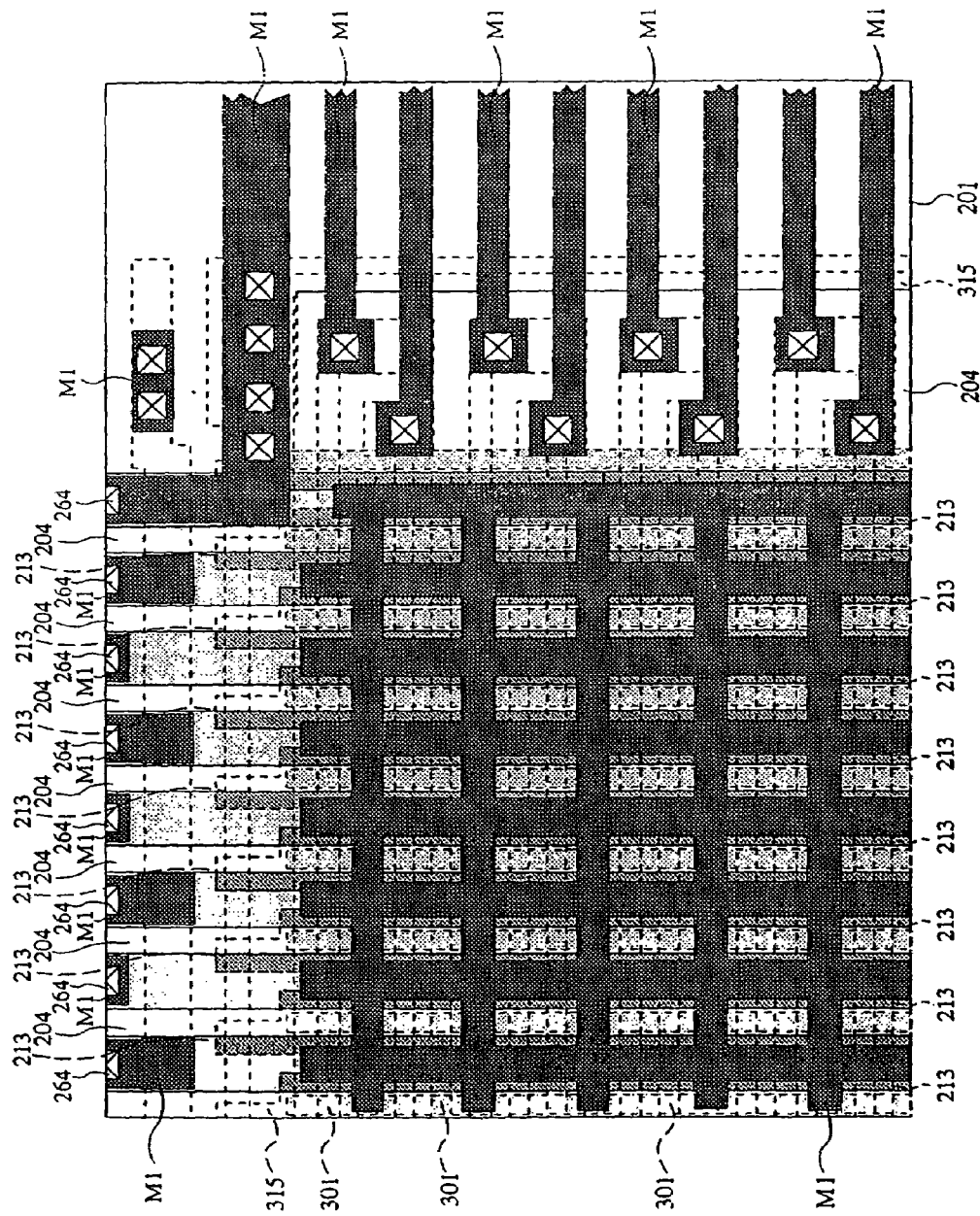

It will be noted that the above metal layer is not only patterned as wires for the peripheral circuit, but also is patterned so that the global data lines and the semiconductor regions of the selective transistors are rendered electrically conductive in the memory mat portion. Also, lead wires are formed from the word lines of the memory mat portion to the decoder portions. As shown in FIG. 76, the contact holes 264 of the selective transistor portions have a pitch, for example, of 1.1 μm, and the intervals of the first-layer wires M1 is, for example, 0.4 μm in the dock bone portion, and the pitch of the first-layer wires M1 is, for example, 1.1 μm. The intervals of the first-layer wires M1 at the word line-leading portions is, for example, at 0.42 μm in the dock bone portion, with a wire pitch being, for example, 1.0 μm.

The first-layer wires may be provided in the form of lattices, as shown, on the memory cells. The formation of the lattices simplifies the CMP step used in the step of forming the interlayer insulating film formed between the first-layer wires and the second-layer wires. More particularly, the formation of the lattice-shaped wires (M1) on the memory cells contributes to the uniformity in irregularity of the interlayer insulating film prior to CMP and can prevent dishing. If the lattice-shaped wires are not formed, it is unavoidable to form a recess of a wide area in this portion, thereby causing dishing to be formed in the region. As set out above, the provision of the lattice-shaped wires can avoid the formation of such a recess as mentioned above.

Figure 77:
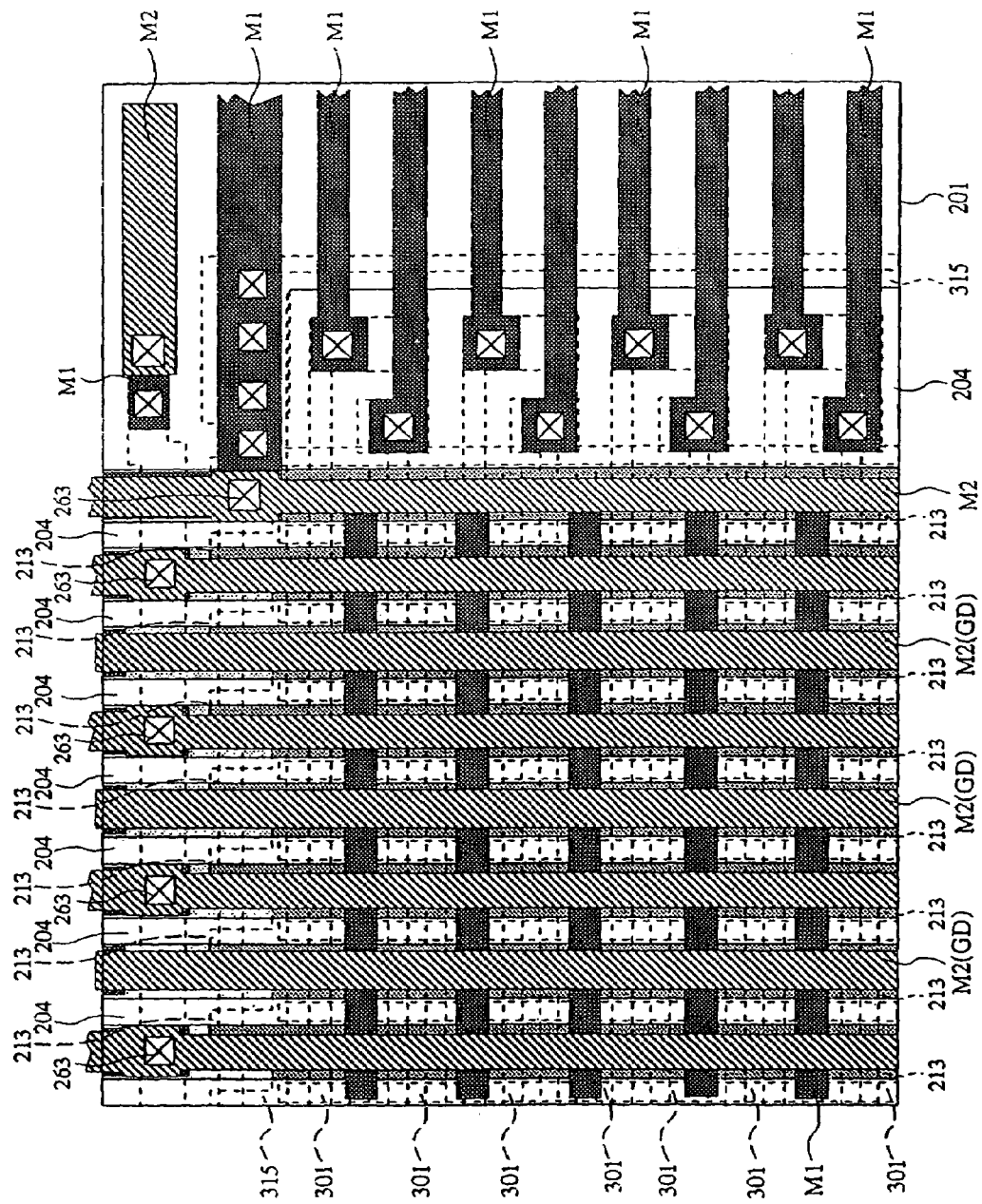

The second-layer wires can be formed in the following manner. After formation of an approximately 1000 nm thick silicon oxide film by the CVD method, the surface is polished by CMP, followed by attachment (deposition) of a 400 nm thick silicon oxide film by the CVD method. Thereafter, a photoresist is patterned, followed by dry etching to form through-holes which are 0.44 μm square. Next, after irradiation with UV Light, a composite film made of Ti/TiN films having thicknesses of 40/100 nm, respectively, and a 500 nm thick W film is formed. The W film in the surface portion is subjected to dry etching to form plug electrodes inside the through-holes. Moreover, a metal layer made of Ti/Al—Cu/Ti/TiN films with thicknesses, for example, of 10/400/10/75 nm, respectively, is formed. The metal layer is patterned by a photoetching process to form a second-layer wire M2. The second-layer wire M2 is patterned to provide wires of the peripheral circuit portion and are patterned, as shown in FIG. 77, in the memory mat portion to provide global data lines GD. The wire intervals of the selective transistor portions is, for example, 0.48 μm in the dock bone portion, and the wire pitch is, for example, 1.1 μm. In addition, the first through-holes 263 at the selective transistor portion are alternately arranged.

Although the subsequent steps are not shown in the figures, there are formed an approximately 30 nm thick silicon oxide film, an about 300 nm thick SOG (spin-on-glass) film by the CVD method, followed by further formation of an approximately 300 nm thick silicon oxide film by the CVD method. Subsequently, there can be formed second through-holes which are about 0.52 μm square, plug electrodes as formed before; and a third-layer wire M3, which is made of films of Ti/Al—Cu/Ti/TIN with thicknesses, for example, of 120/600/10/75 nm, respectively. The third-layer wire M3 is patterned to provide wires of the peripheral circuit portion. The wire width is, for example, 0.7 μm, and the interval is, for example, 0.8 μm.

As stated hereinabove, the AND-type flash memory of this embodiment is a 256 MB flash memory adopting the multiple state logic memory system, enabling one to realize a large capacitance without increasing the physical bit capacitance within the memory chip. Moreover, since a shallow element is adopted, the reliability of the AND-type flash memory can be improved. In addition, tunnel currents for write and erase operations pass through the entire surfaces of the channel regions of the memory cells, with a prolonged element life and also with a structure suited for fineness. Additionally, in the fabrication steps, scattering of the exposed light is suppressed to improve the processing accuracy. When ion implantation into and CMP of the memory cells are performed, the peripheral circuit and the selective transistor portions are covered with the built-up film including a silicon nitride film, so that implant of an unnecessary impurity and damage to them by CPM is prevented, thus making it possible to fabricate a high-performance AND-type flash memory and reduce the processing load with an increasing process margin.

(Embodiment 6)

Figure 78:
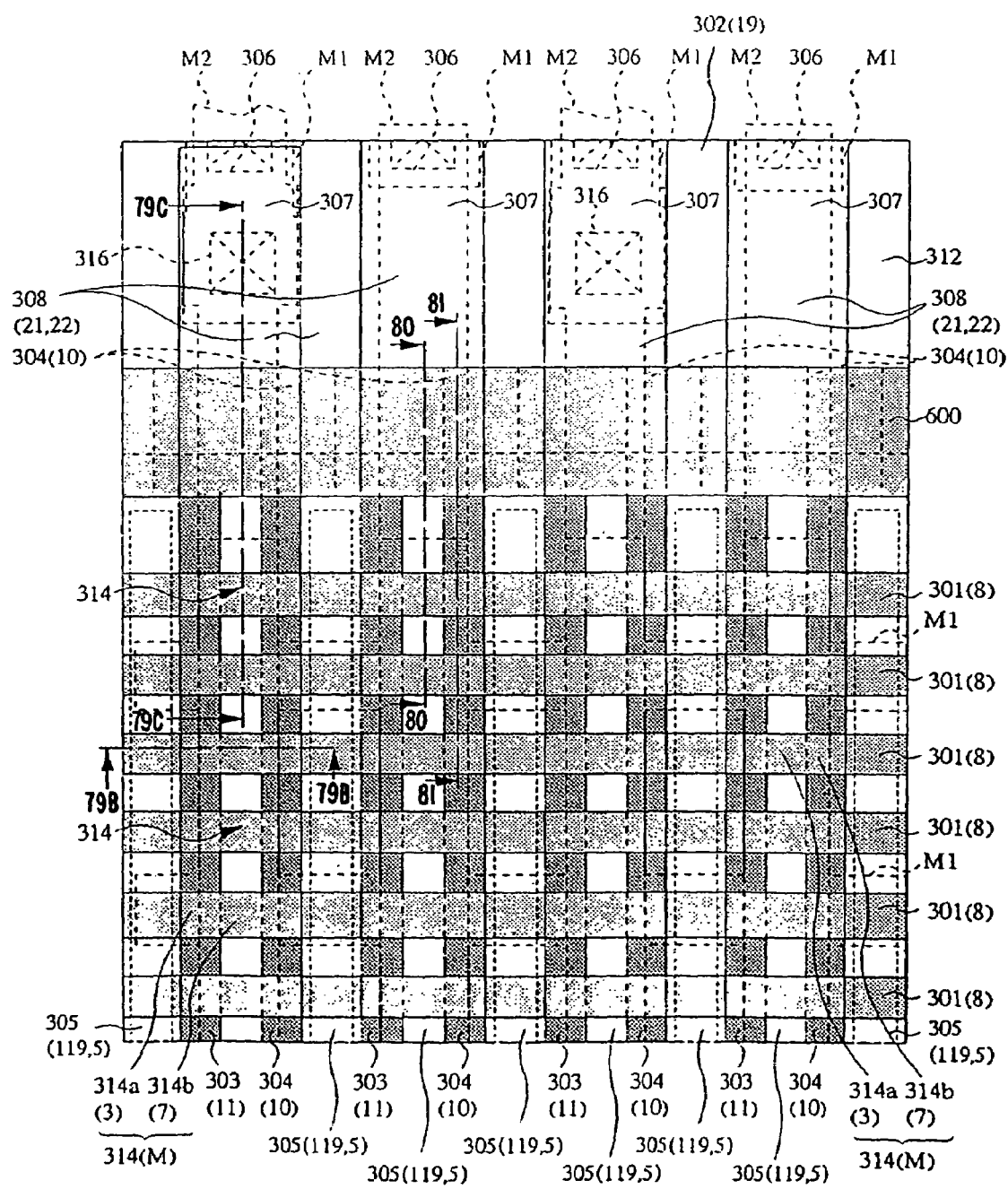
FIG. 78 is a plan view showing a memory cell region of an example of an AND-type flash memory representing Embodiment 6.

FIG. 78 is a plan view showing an example of an AND-type flash memory of Embodiment 6 with respect to its memory cell region. The AND-type flash memory of this embodiment includes buffer gate electrodes and selective transistors which are integrally formed together. Other arrangements are similar to those of Embodiment 5. Accordingly, only portions which are different from those of Embodiment 5 will be described.

The AND-type flash memory of the embodiment has gate electrodes 600 wherein a buffer gate electrode and a selective transistor are integrally formed. In other words, the gate electrode 600 has a structure which is the same as the structure of a buffer gate electrode from the standpoint of a gate electrode structure, and simultaneously functions as a selective transistor.

Figure 79:
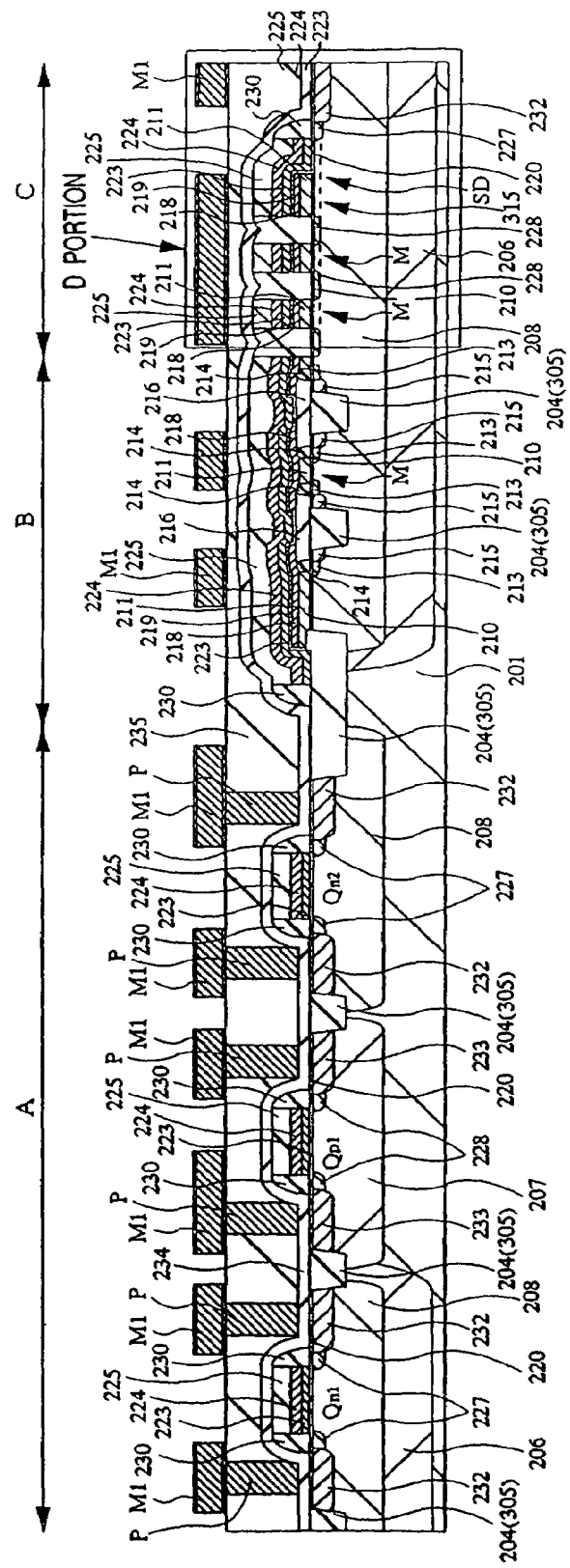
FIG. 79 is a sectional view of an AND-type flash memory of Embodiment 7.

FIG. 79 is a sectional view of the AND-type flash memory of this embodiment. Since this memory is similar to that of Embodiment 5 except for the portion having selective transistors SD, this feature is not illustrated herein.

FIGS. 80 and 81 are, respectively, sectional enlarged views of portion D of FIG. 79. FIG. 80 is a sectional view taken along the line E—E of FIG. 78, and FIG. 81 is a sectional view taken along the line F—F of FIG. 78.

As shown in FIG. 80, a gate electrode 600 having a similar arrangement as the buffer gate electrode 315 of Embodiment 5 is provided. However, as shown in FIG. 81, with the AND-type flash memory of the embodiment, a drain region extends below the gate electrode 600 and arrives at the lower portion of a gate insulating film 220 and a polysilicon film 223 Accordingly, where an appropriate voltage is applied to the polysilicon film 223 and a $WSi_2$ film 224, a channel is formed between the drain region 213 and an n-type low concentration semiconductor region 227, thus making it possible to function as a transistor. More particularly, there is formed a selective transistor SD wherein the lower region of the gate insulting film 220 and the polysilicon film 223 of the gate electrode 600 is used as a channel region.

Next, the method of fabrication of the AND-type flash memory of this embodiment will be described with reference to FIGS. 82 to 87. FIGS. 82 to 87 are, respectively, plan or sectional views showing, in sequence, an example of the method of fabrication of the AND-type flash memory of Embodiment 6.

The method of fabrication of the AND-type flash memory of this embodiment comprises steps similar to those steps up to FIG. 65 in Embodiment 5.

Figure 82:
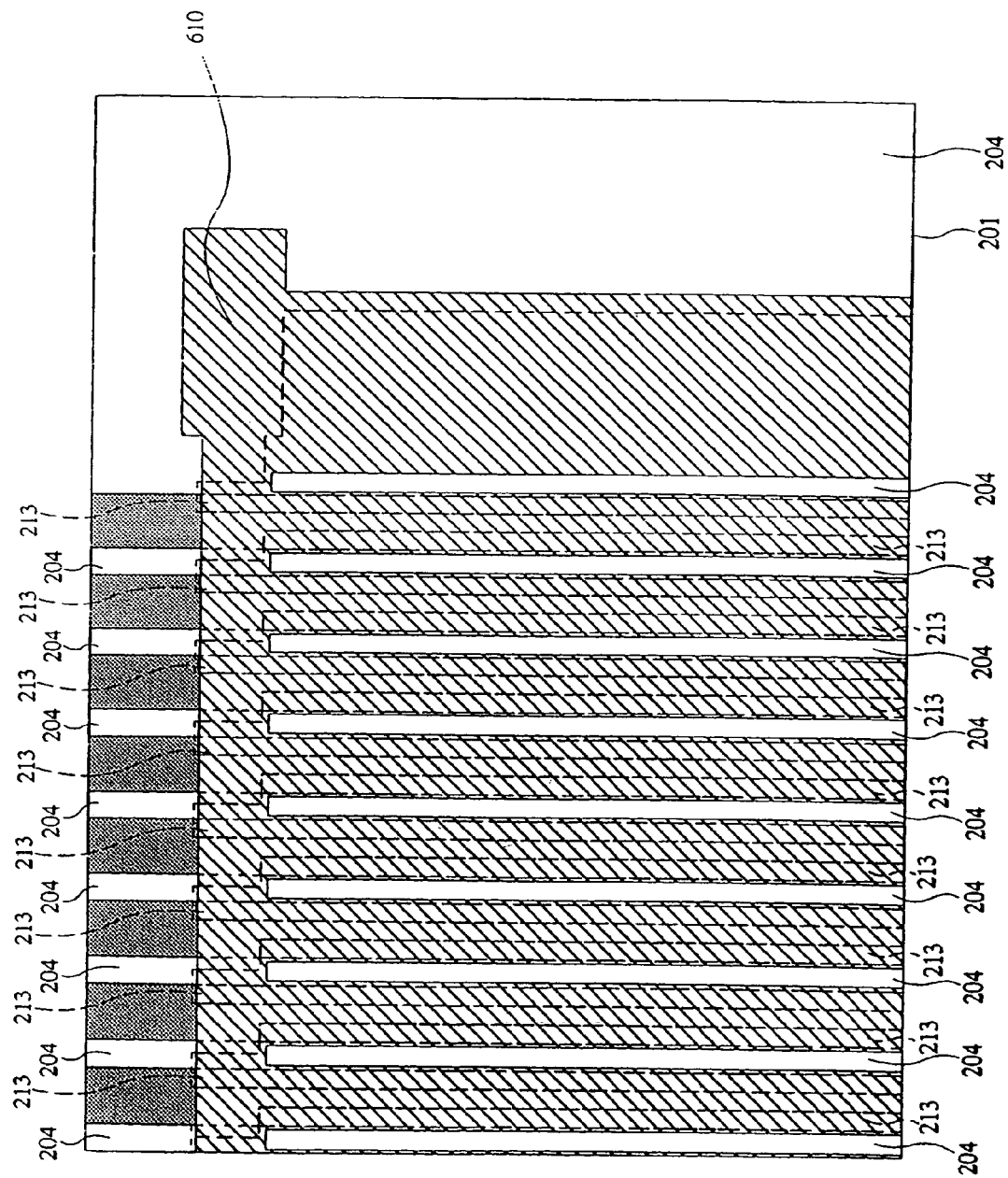
FIGS. 82 to 87 are, respectively, plan or sectional views showing, in sequence, an example of a method for fabricating an AND-type flash memory of Embodiment 6.

Subsequently, although the removal of the interlayer insulating film 219, and the second polysilicon film 218 and the first polysilicon film 211 by a photoetching process is similar to that of Embodiment 5, as shown in FIG. 82, there is formed a pattern 610 at a lower side from the end of the drain region 213 which serves as a local data line 304(10). Thus, the end portion of the drain region 213 is formed in an entire low region of a floating gate electrode portion of the gate electrode.

Figure 83:
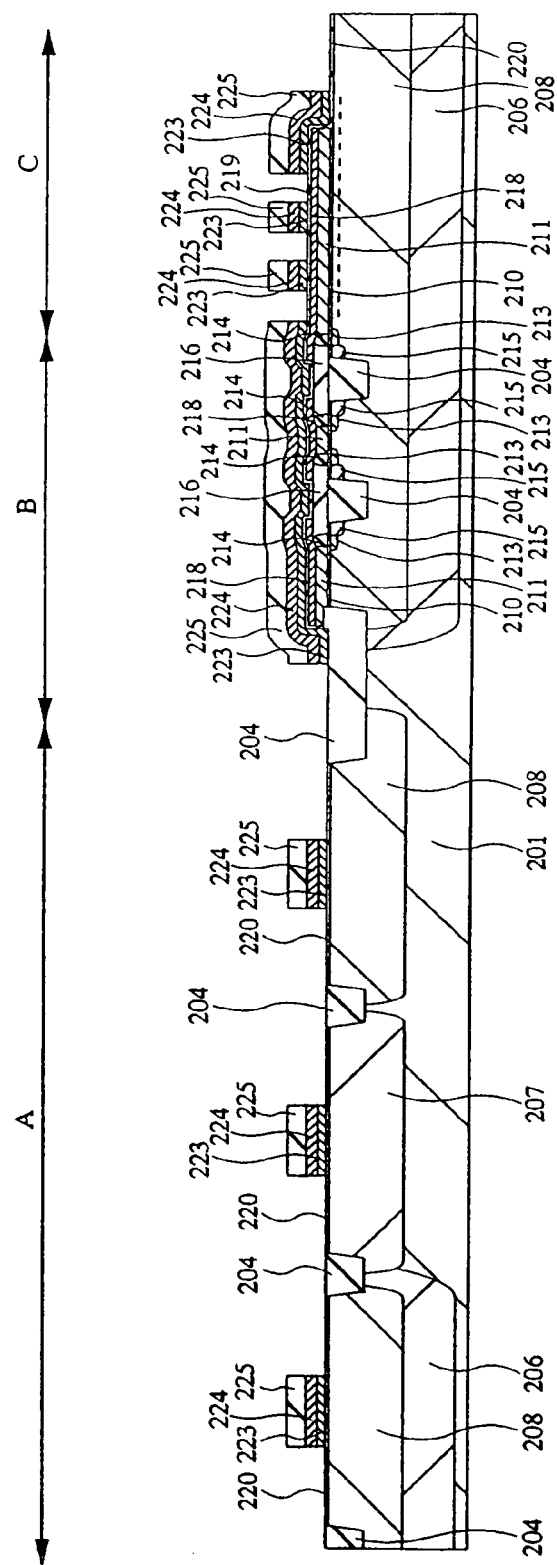
Figure 84:
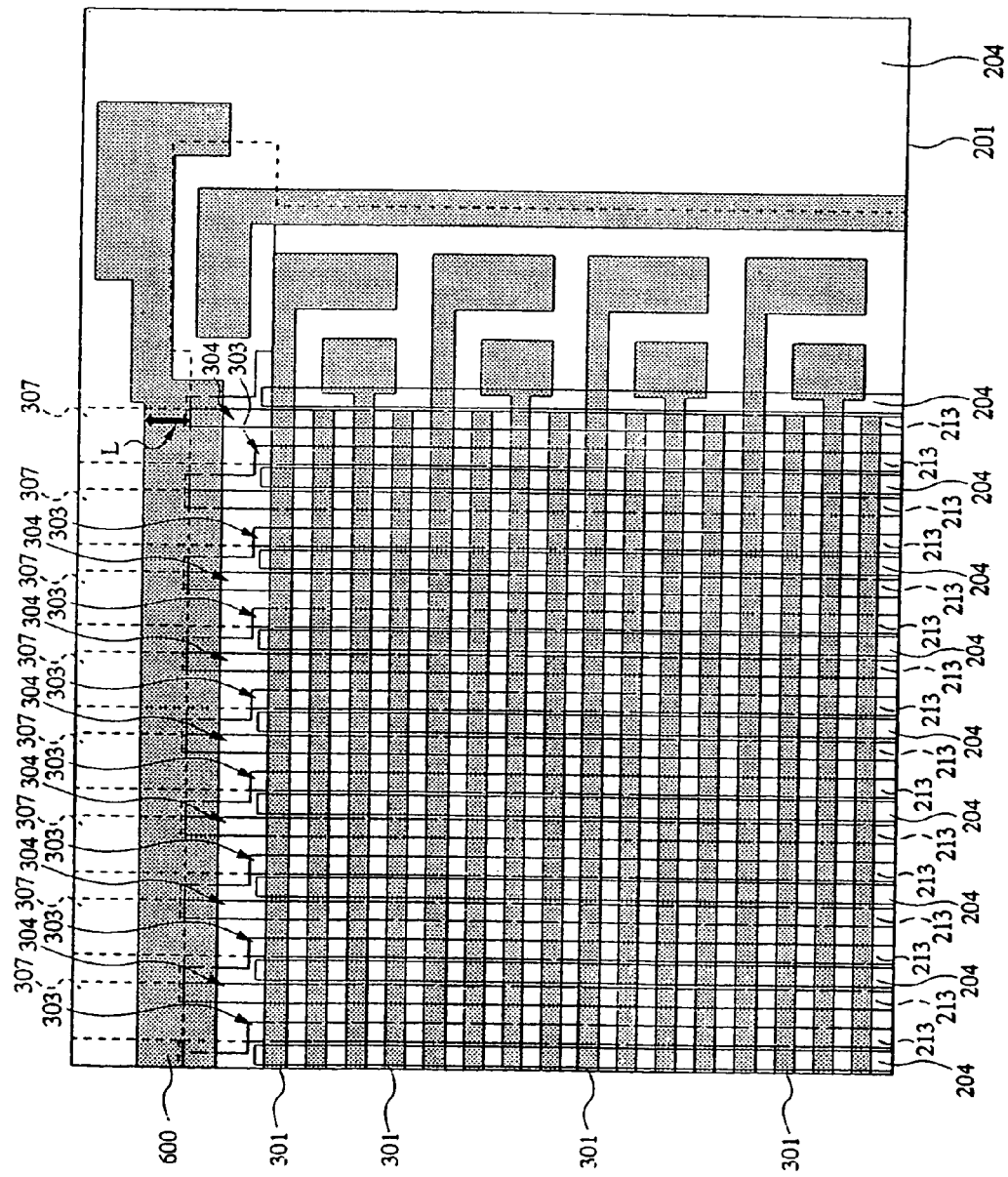

As shown in FIG. 83, as illustrated with respect to Embodiment 5, a gate insulating film 220, a polysilicon film 223, a WSi$_2$ film 224 and a silicon oxide film 225 are formed by the CVD method, followed by patterning of the silicon oxide film 225, WSi$_2$ film 223 and silicon oxide film 225 in such a way as to form, like Embodiment 5, word lines 301 (8) and a gate electrode 600 in the memory cell region and n-channel MISFET's Qn1, Qn2 and p-channel MISFET Qp in the peripheral circuit region. In this patterning, as shown in FIG. 84, the pattern of the gate electrode 600 is so formed as to be offset by a distance L from the end of the drain portions 304(10). In this arrangement, a channel length corresponding to the distance L is formed.

Figure 85:
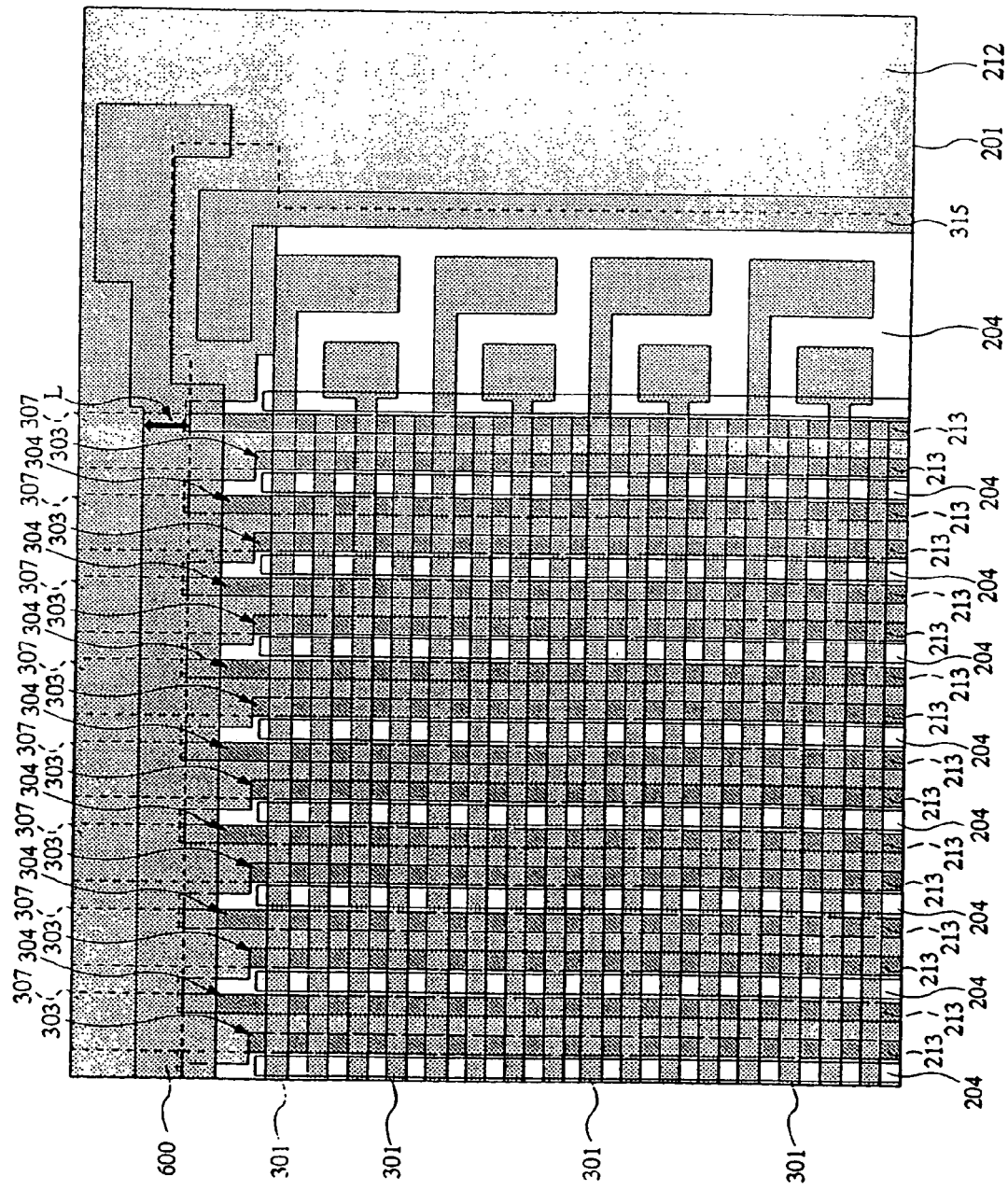

As shown in FIG. 85, like the step of FIG. 73 of Embodiment 5, a silicon oxide film 225 is used as a mask, through which an interlayer insulating film 219 and first and second polysilicon films are successively formed. In this step, there are formed selective transistors SD having the word lines 301(8) and the gate electrodes 600.

Figure 86:
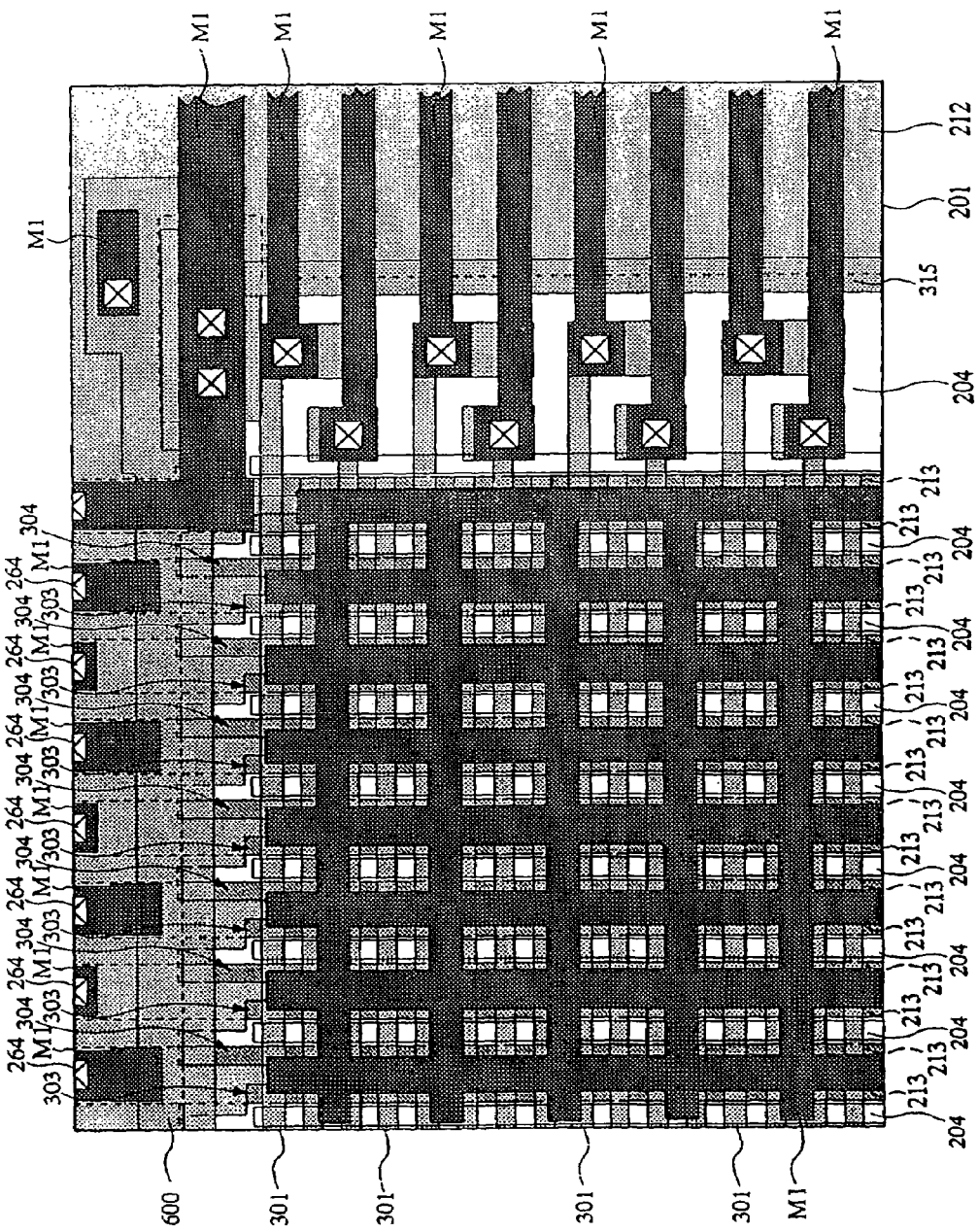
Figure 87:
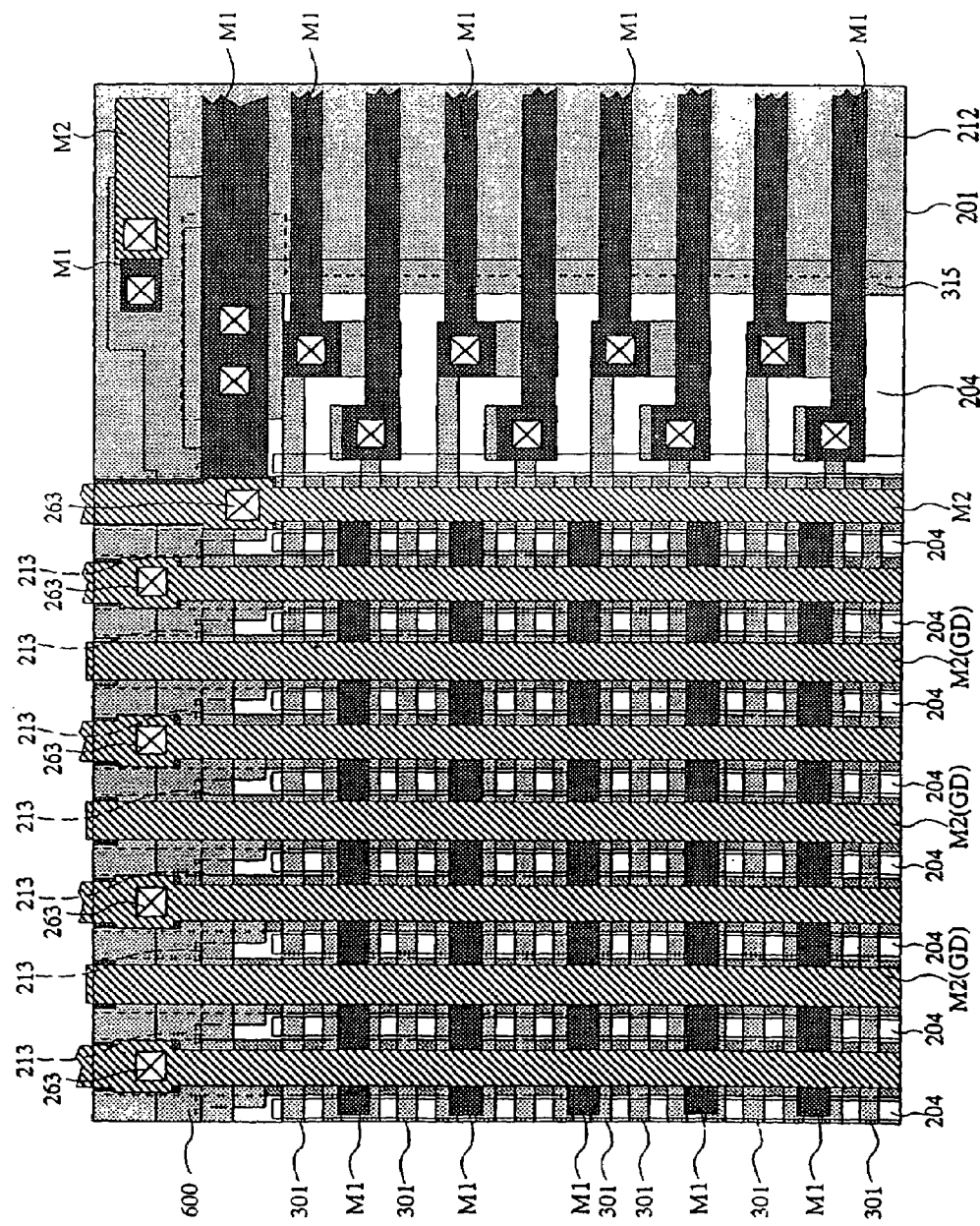

Thereafter, as shown in FIG. 86, first-layer wires M1 are formed, like the embodiment 5, and as shown in FIG. 87, second-layer wires M2 are formed like Embodiment 5. It will be noted that third-layer wires M3 may also be formed as in Embodiment 5.

According to the AND-type flash memory of this embodiment, the buffer electrode cannot be formed individually, and thus, a corresponding area can be saved, resulting in a high degree of integration of the AND-type flash memory.

(Embodiment 7)

FIGS. 88 to 99 are, respectively, sectional or plan views showing, in sequence, an example of a method of fabricating an AND flash memory according to Embodiment 7 of the invention.

Figure 88:
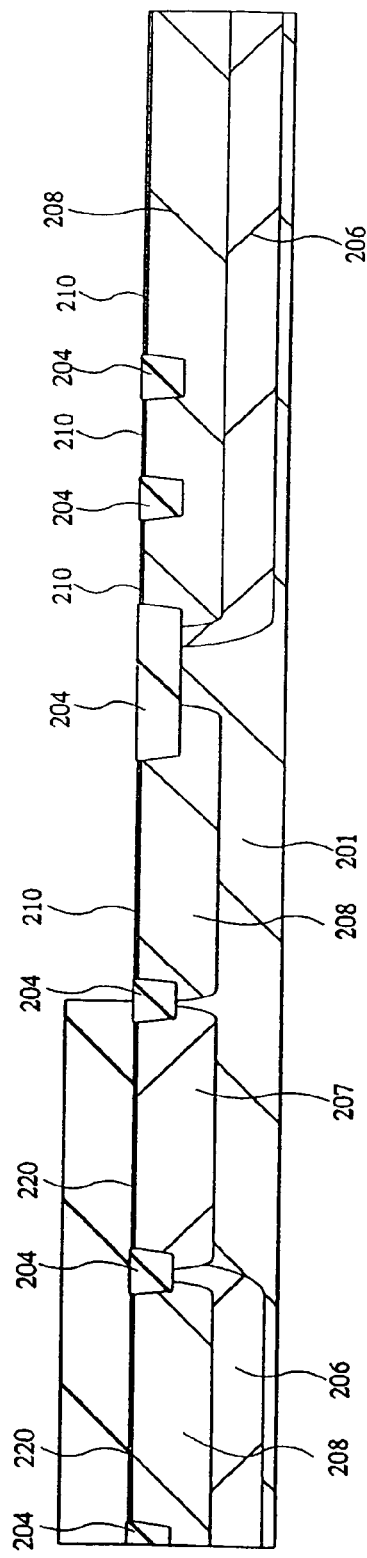

Like Embodiment 5, element isolation regions 204 are formed in the main surface of a semiconductor substrate 201, and p-type and n-type well regions 206 to 208 are formed. Thereafter, the main surface of the semiconductor substrate 1 is oxidized to form an about 25 nm thick gate insulating film 224, after which, as shown in FIG. 88, regions where an n-channel MISFET Qn1 and p-channel MISFET TQp are to be formed are covered with a photomask 205, followed by removal of the gate insulating film 220 on the main surface of the semiconductor substrate 1 by etching. Next, a gate insulating film 210, whose thickness is smaller than that of the gate insulating film 220, is formed on the main surface of the semiconductor substrate 201.

Figure 89:
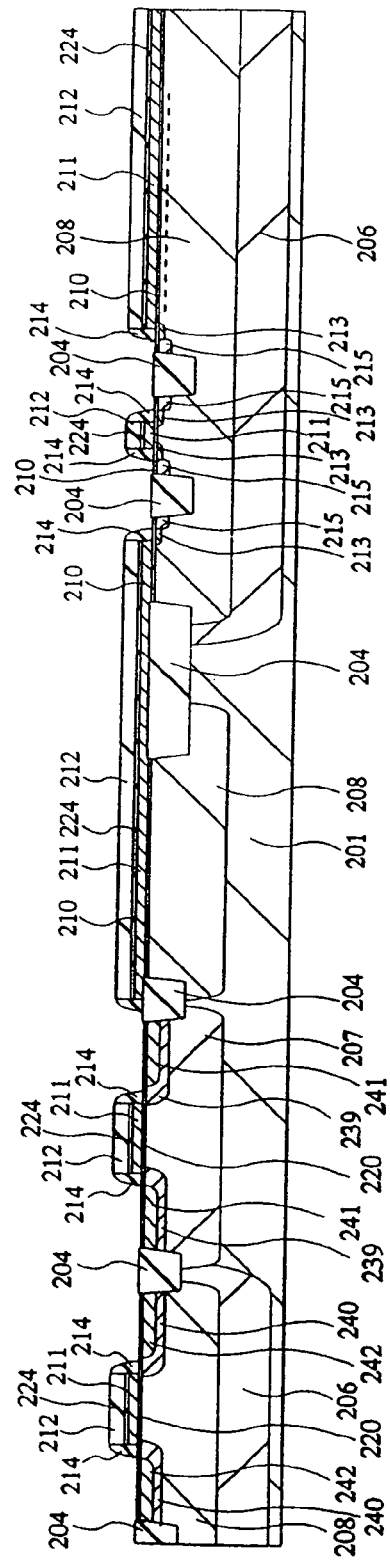

As shown in FIG. 89, the photomask 205 is removed, followed by formation of a polysilicon film 211 and a silicon oxide film 700 as in Embodiment 5 and also a silicon nitride film 212 in the same manner as in Embodiment 5. Thereafter, the silicon nitride film 212, silicon oxide film 700 and polysilicon film 211 are so patterned as to provide gate electrodes of the n-channel MISFET Qn1 and the p-channel MISFET TQp. Using the photoresist film and the silicon nitride film 212 as a mask, there are formed low concentration semiconductor regions 239, 240 of the n-channel MISFET Qn1 and the p-channel MISFET TQp by an ion implantation method. After removal of the photoresist film, an impurity is extensively diffused at high temperatures. With the thermal treatment of the low concentration semiconductor regions 239, 240 at high temperatures, there can be formed a high withstand voltage MISFET. Then, the silicon nitride film 212, silicon oxide film 700 and polysilicon film 211 are so patterned as to provide first floating gate electrodes of the memory cell region, followed by formation of low concentration semiconductor regions 213 of the memory cells by an ion implantation method using the photoresist film and the silicon nitride film 212 as a mask. Thereafter, side wall spacers 214 are formed on the side surfaces of the silicon nitride film 212, silicon oxide film 700 and polysilicon film 211. Using the photoresist film, silicon nitride film 212 and the side wall spacers 214 as a mask, high concentration semiconductor regions 241, 242 of the n-channel MISFET Qn1 and the p-channel MISFET TQp and a high concentration semiconductor region 215 of the memory cells are formed by an ion implantation method.

Figure 90:
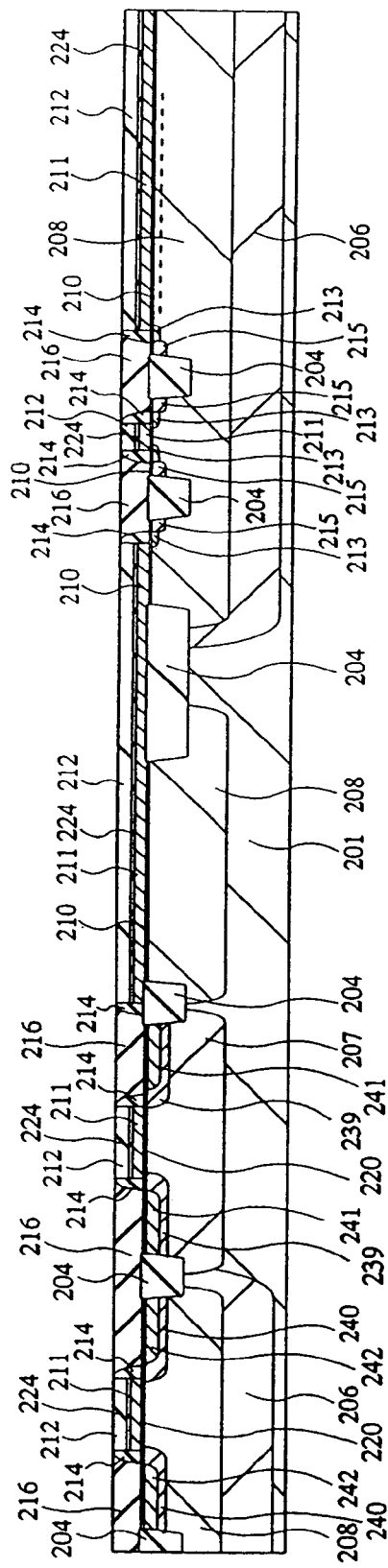
Figure 91:
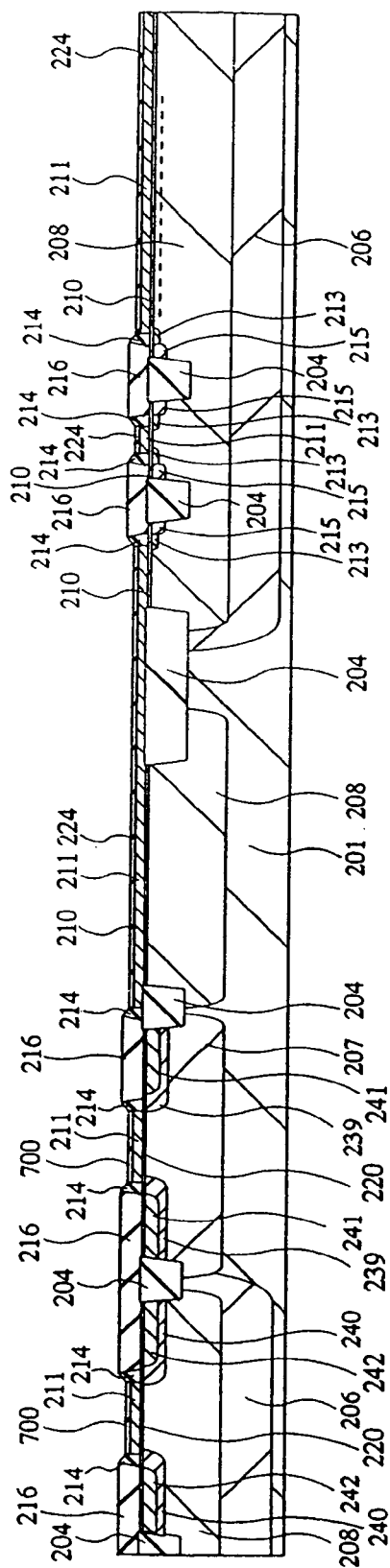
Figure 92:
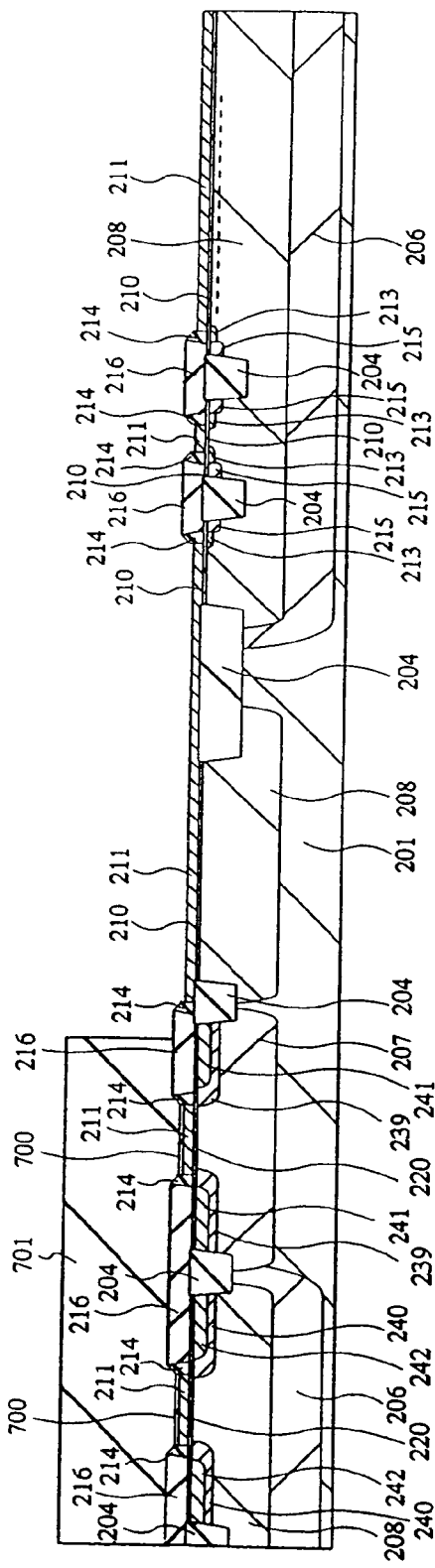
Figure 93:
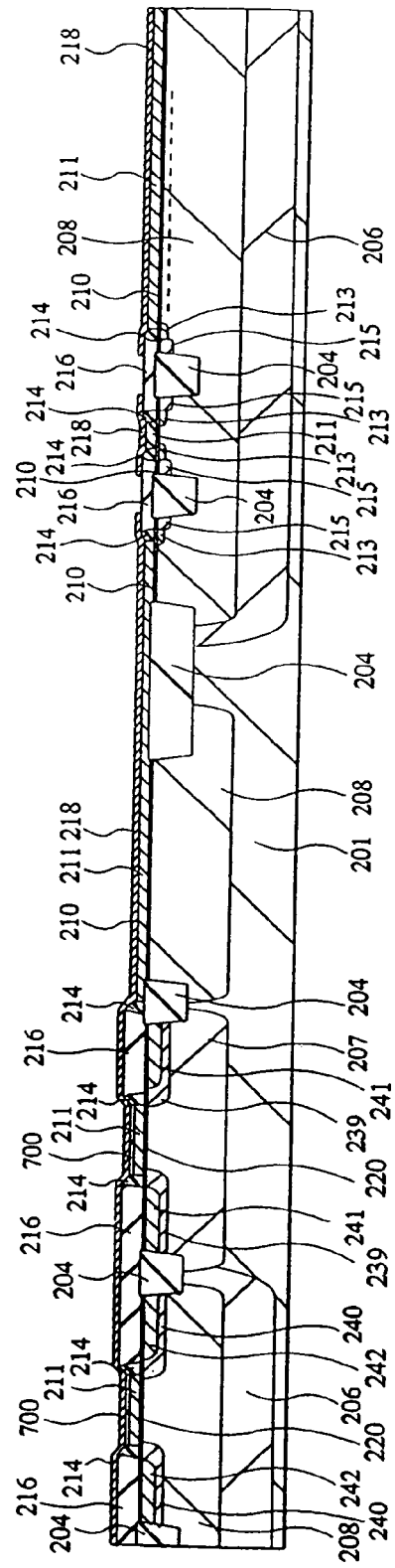
Figure 94:
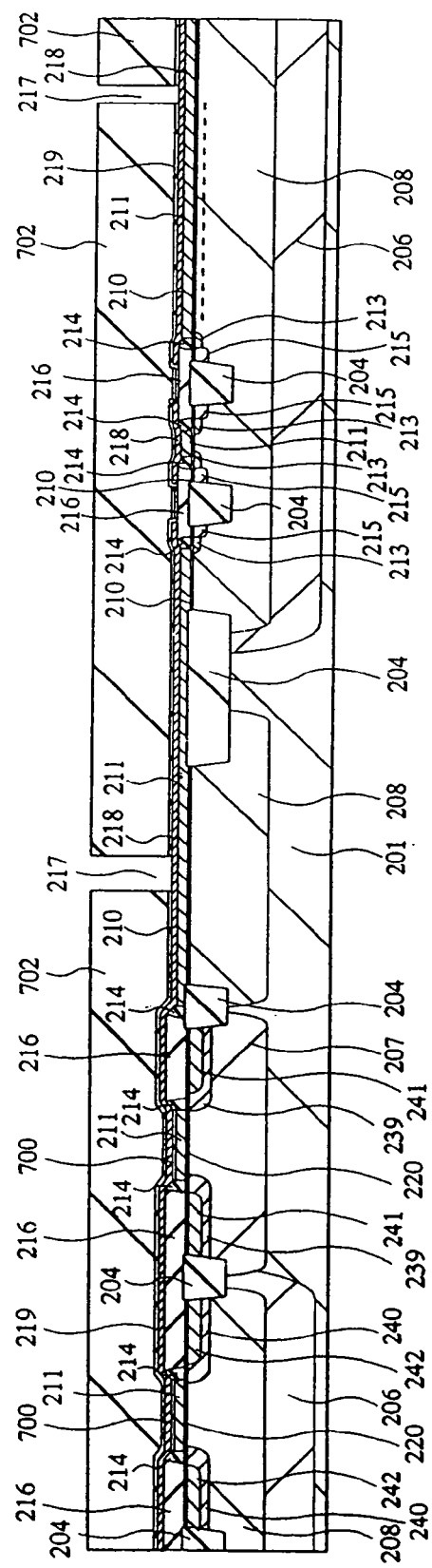
Figure 95:
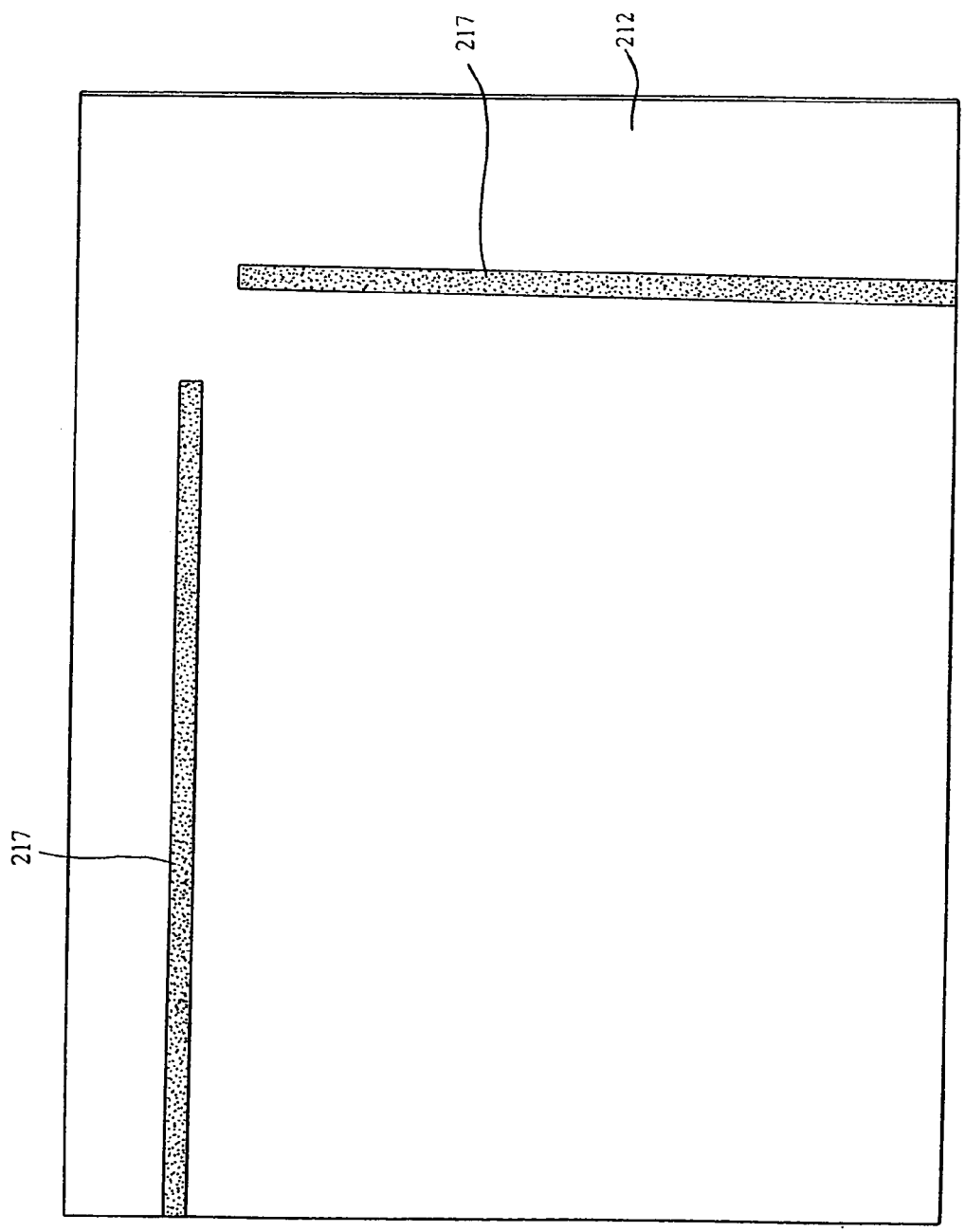

Next, as shown in FIG. 90, a silicon oxide film 216 is formed in the same manner as in Embodiment 5. As shown in FIG. 91, the silicon nitride film 212 is removed as in Embodiment 5. At this time, the silicon nitride film 212 is removed with hot phosphoric acid, so that the silicon oxide film 700 is left on the polysilicon film 211, Next, as shown in FIG. 92, a photoresist film 701 is formed on the n-channel MISFET Qn1 and the p-channel MISFET TQp, and the silicon oxide film on the other region is removed by etching. Moreover, as shown in FIG. 93, a polysilicon film 218 is formed as in Embodiment 5, and is so patterned as to provide second floating gate electrodes, like Embodiment 5.

An interlayer insulating film 219 is formed as in Embodiment 5, and a photoresist film 702 is formed. Using this film as a mask, openings 217 are formed in the interlayer insulating film 219 in regions where a gate electrode of the n-channel MISFET Qn2 is to be formed and a gate electrode of the selective transistor SD is to be formed. The shape of the thus formed openings, which is exemplified as an opening on the selective transistor SD, is as shown in the plan view of FIG. 95. In this case, the opening is made in the form of a slit; however, the invention is not limited to this, but may provide an opening in the form of a bole or in a form where holes are aligned.

Figure 98:
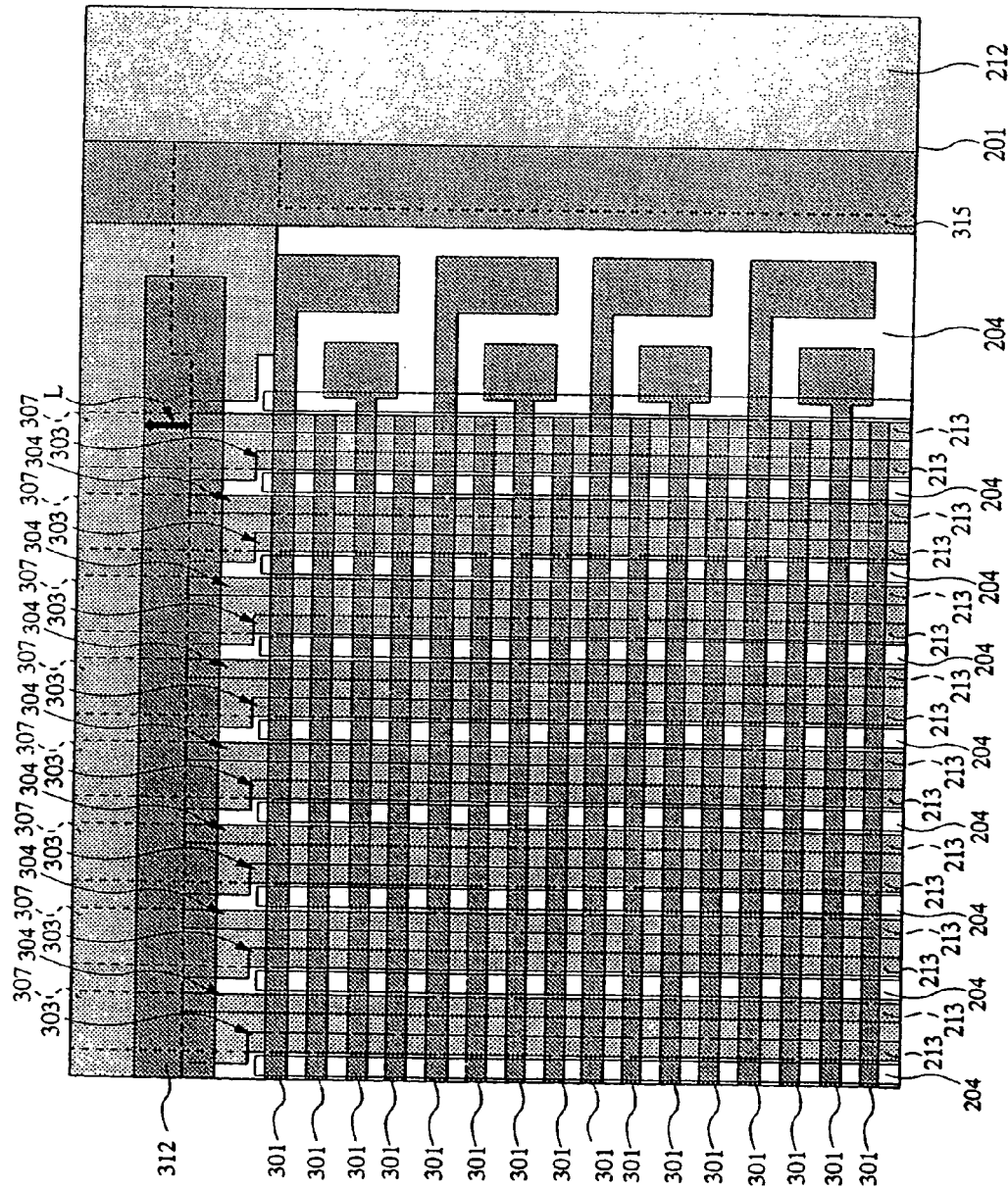

Next, as shown in FIG. 96, a polysilicon film 223 and WSi$_2$ film 224, and a silicon oxide film 225 as in Embodiment 5 are successively formed. Further, as shown in FIG. 97, the silicon oxide film 225, WSi$_2$ film 224, polysilicon film 223, interlayer insulating film 219, polysilicon film 218 and polysilicon film 211 are patterned in the same manner as in Embodiment 5. The plan view of the word lines 301(8) and the gate electrode 312 of the selective transistor SD after the patterning is shown in FIG. 98. At this stage, the peripheral circuit region is so patterned as to form a gate electrode of the n-channel MISFET Qn2, and no resist pattern is formed on the n-channel MISFET Qn1, and no resist pattern is formed on the n-channel MISFET Qn1 and the p-channel MISFET TQp. However, since the silicon oxide film 700 is formed on the gate electrodes of the n-channel MISFET Qn1 and the p-channel MISFET TQp, this serves as a mask and the gate electrodes are not etched. In addition, no buffer gate electrode is formed between the selective transistors SD and the memory cells. This is because the gate electrode of the selective transistor SD is constituted of the silicon oxide film 225, WSi$_2$ film, 224, polysilicon film 223, interlayer insulating film 219, polysilicon film 218 and polysilicon film 211, and it is not necessary to provide a buffer gate electrode. This enables one to save an area of memory cells and realize a high degree of integration. In this manner, the gate electrodes of the memory cells, the selective transistors SD and the n-channel MISFET Qn2 are formed. The gate electrodes of the selective transistors SD and the n-channel MISFET Qn2 are constituted of the WSi$_2$ film 224, polysilicon film 223, polysilicon film 218 and polysilicon film 211 wherein the polysilicon film 223 and the polysilicon film 218 are connected through the opening 217 formed in the interlayer insulating film 219. Thus, since the gate electrode is made of multiple layers and is provided with the SiW$_2$ film of low resistivity, so that the resistance of the gate electrode is reduced with an improved response speed, the performance of the AND-type flash memory is improved.

Figure 99:
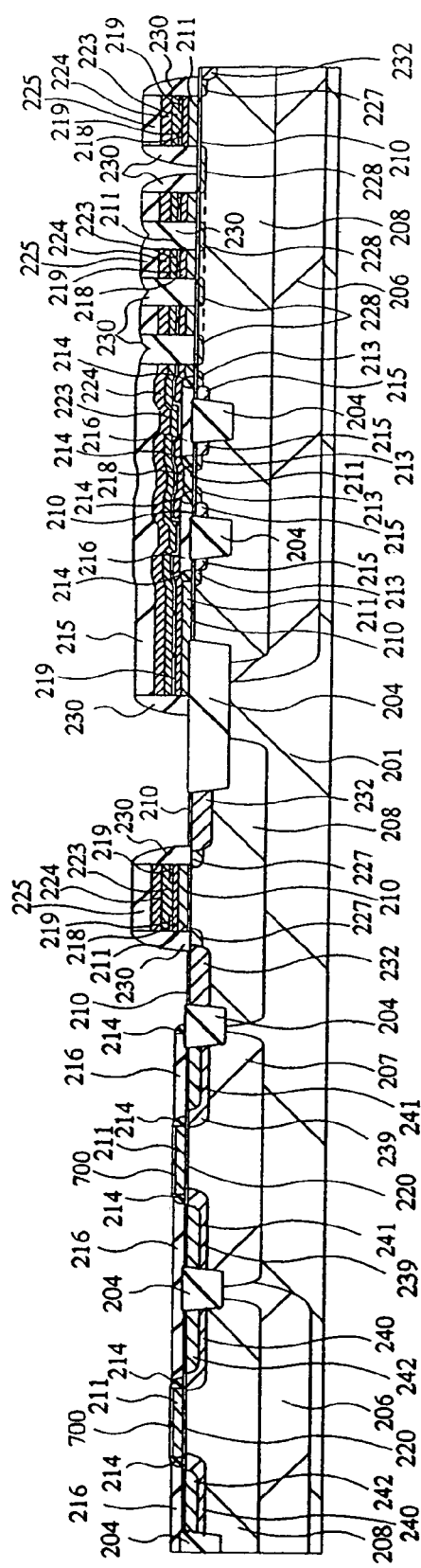

Next, as shown in FIG. 99, an n-type low concentration semiconductor region 227 and punch-through stopper regions 228 are formed, like Embodiment 5, and side wall spacers 230 are formed, after which an n-type high concentration semiconductor region 232 is formed.

The subsequent steps are substantially similar to those of Embodiments 5 and 6 and their illustration is omitted.

According to the method of fabricating the AND-type flash memory of this embodiment, the semiconductor regions, which are source/drain regions of the n-channel MISFET Qn1 and the p-channel MISFET TQp of the peripheral circuit, are formed prior to the formation of memory cells, so that high temperature thermal treatment is possible. Thus, the n-channel MISFET Qn1 and the p-channel MISFET TQp can be applied to the high withstand voltage transistors. On the other hand, high temperature thermal treatment is not carried out on the memory cells after the formation of the semiconductor regions for the source/drain regions, and the semiconductor regions are formed in a shallow junction, thereby providing a MISFET having an excellent punch-through resistance. In the AND-type flash memory of the embodiment, it is not necessary to provide a buffer gate electrode, so that the area occupied by the memory cells can be reduced with a high degree of integration. Moreover, the resistance values of the gate electrodes of the n-channel MISFET Qn2 and the selective transistor SD can be reduced to improve the performance of the AND-type flash memory.

(Embodiment 8)

FIGS. 100 to 104 are, respectively, sectional views showing an example of an embodiment of the invention, in which a non-volatile memory element alone is shown. The MOS transistor used in a peripheral circuit is omitted in order to prevent the drawings from being too complicated.

Figure 100:
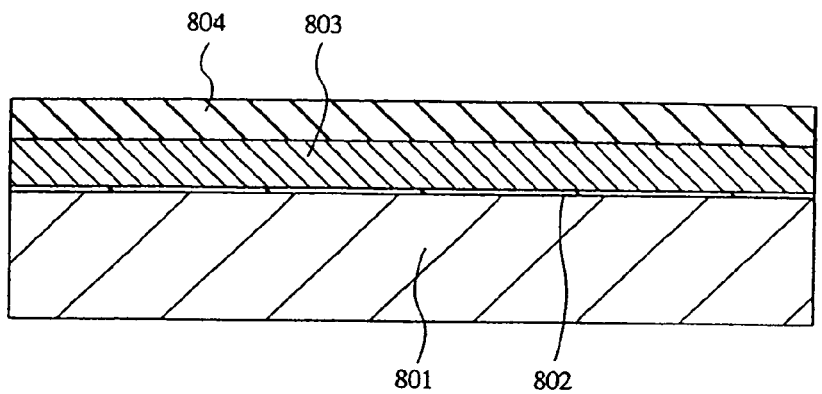
FIGS. 100 to 104 are, respectively, sectional views showing an example of a semiconductor device representing Embodiment 8.

As shown in FIG. 100, a 100 nm thick thermally oxidized film 802 is formed on a p-type silicon substrate 801, followed by successive deposition of a 100 nm thick, n-type or non-doped polysilicon film 803 and a 150 nm thick, non-doped silicon oxide film 804. It will be noted that the p-type silicon substrate may be replaced by an n-type silicon substrate which is formed with a p-type well region in the region shown in this section view.

Figure 101:
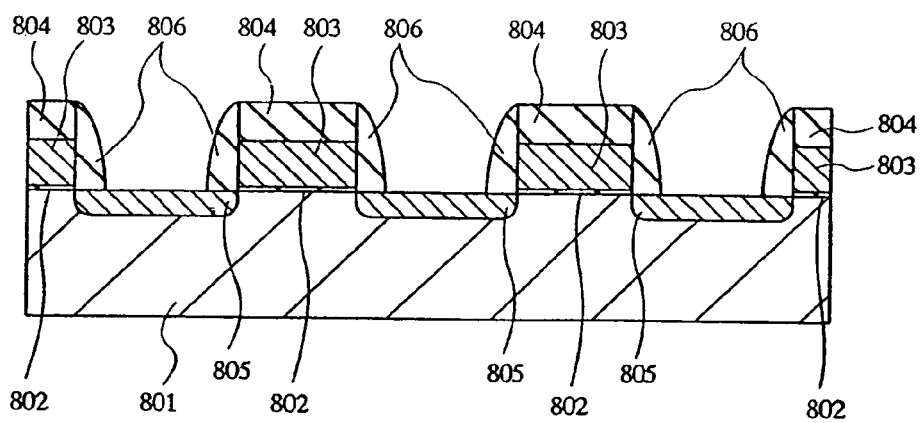

FIG. 101 shows the next step in the fabrication from the step of FIG. 100. The polysilicon film 803 and the silicon oxide film 804 are divided into sections as shown in FIG. 101 by use of photolithographic and dry etching techniques to provide first floating gate electrodes. After the separation, n-type ions are implanted through the mask of the first floating gates to form n-type semiconductor regions 805 in the surface of the p-type silicon substrate 801. The implantation is performed at about $1\times10^{15}$ atoms/cm$^2$ at an acceleration energy of 40 keV, and may be changed depending on the desired element structure and element characteristics. A 150 nm thick silicon oxide film is deposited over the entire surface, and side wall spacers 806 are formed on the side walls of the floating gate electrodes by use of anisotropic dry etching.

Figure 102:
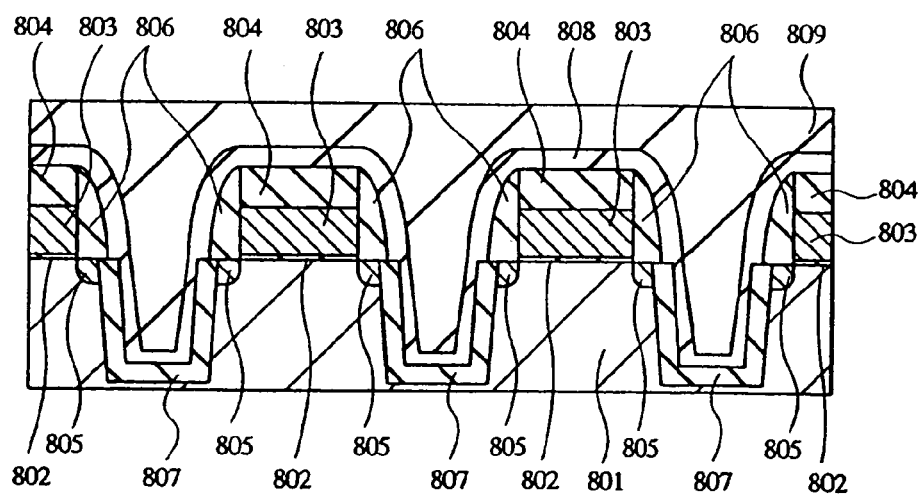

FIG. 102 shows further processing subsequent to the step of FIG. 101. Using an anistropic dry etching technique, grooves are formed in the p-type semiconductor substrate 801 through a mask of the first floating gate electrodes made of the polysilicon film 803 and the silicon oxide film 804 and the side wall spacers 806. In this embodiment, the depth is 300 nm and may be changed depending on the element isolation characteristic. A 5 nm thick thermally oxidized film 807 formed at approximately 800° C. is formed on the silicon surfaces exposed in the grooves, and a non-doped silicon oxide film 808 is deposited over the entire surface to a thickness of 10 nm. This silicon oxide film 808 serves as a barrier for preventing diffusion of an impurity contained in BPSG into the p-type silicon substrate 801 and the n-type semiconductor regions 805. After the deposition of the silicon oxide film 808, a BPSG film 809 is deposited on the entire surface to a thickness of 500 nm. The spaces between the elements are filled by use of the fluidity of the BPSG, followed by treatment in an atmosphere of nitrogen at 850° C. in order to planarize the surface and remove the line of junctures and cavities FIG. 102 is a view after the thermal treatment for planarization.

Figure 103:
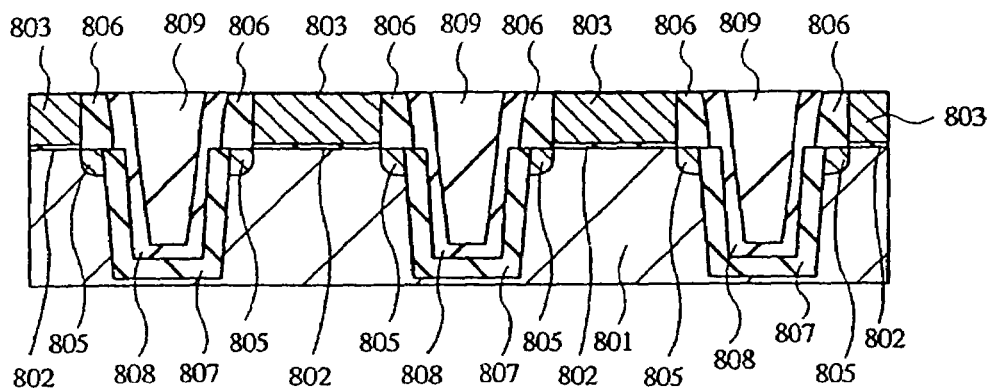
Figure 110:
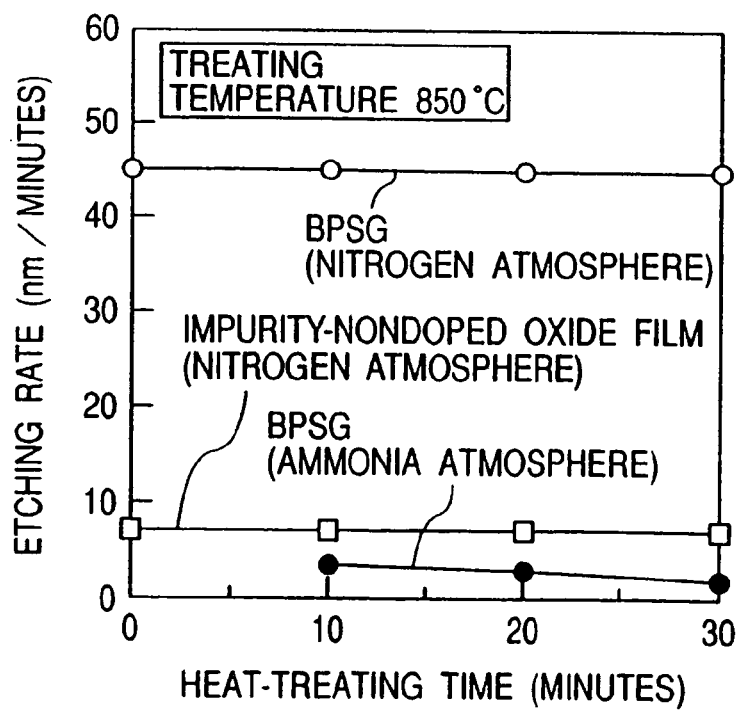
FIG. 110 is a graph showing an effect of improving the dissolution velocity of BPSG in hydrofluoric acid (diluted with water at 1:100)
Figure 111:
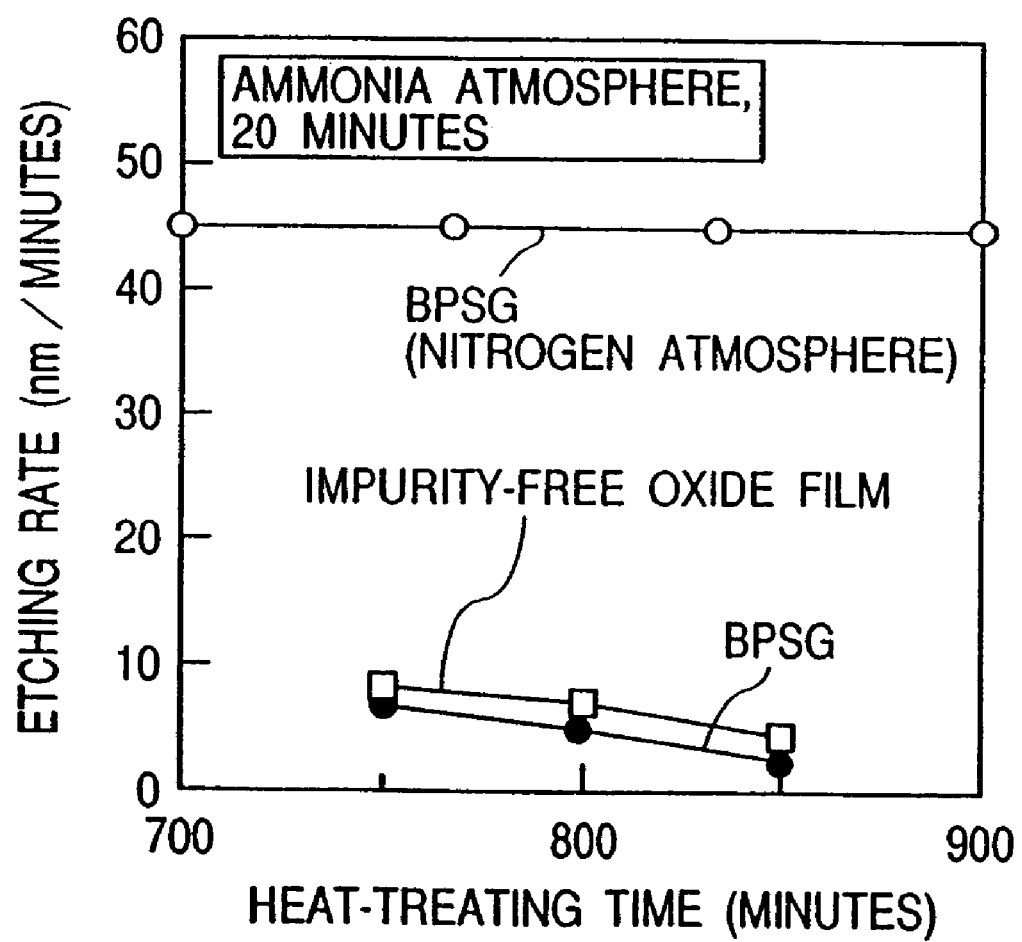
FIG. 111 is a graph showing an effect of a heat treating temperature in case where heat treatment is effected in an atmosphere of ammonia for 20 minutes.

FIG. 103 is a view showing processing which further proceeds from the stage of FIG. 102. The BPSG film 809 deposited on the entire surface is uniformly retarded by dry etching until the polysilicon film 803 is exposed. Immediately after this, treatment in an atmosphere of ammonia at 800° C. for 20 minutes is performed in order to obtain the effects described with reference to FIGS. 110 and 111.

Figure 104:
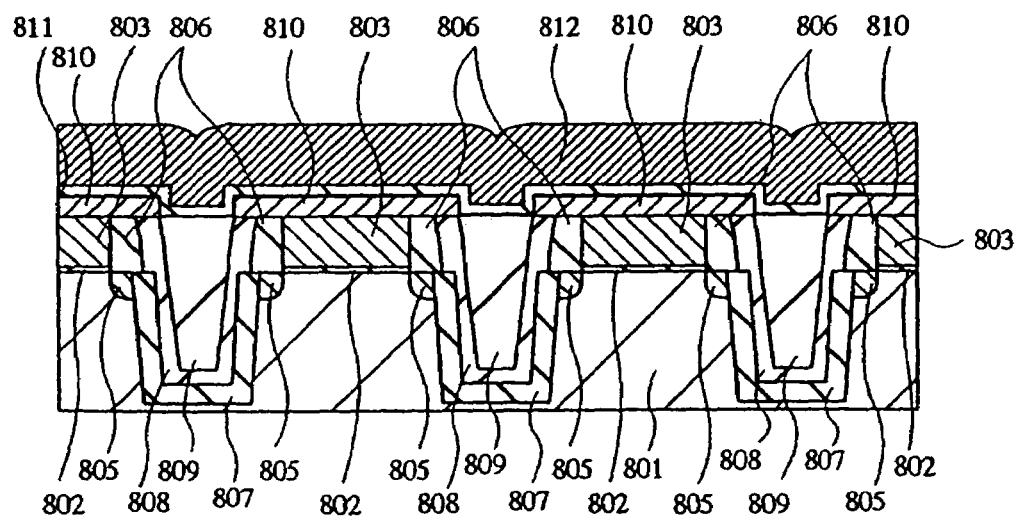

Next, as shown in FIG. 104, the exposed surface is cleansed with hydrofluoric acid, and a 50 nm thick n-type polysilicon film 810 is deposited, followed by processing into the shape of a second floating gate electrode by use of photolithographic and dry etching techniques. It will be noted that the polysilicon film 810 is formed for the purpose of increasing the surface area of the floating gate electrode. The polysilicon film 810 is in contact with the polysilicon film 803 serving as the first floating gate electrode without interposing an insulating film therebetween. After the formation of the polysilicon film 810, a 20 nm thick silicon oxide film 811 is deposited. Further, a 100 nm thick n-type polysilicon 812 is further deposited. This polysilicon film 812 is patterned to provide control gate electrodes. When a voltage is applied to the polysilicon film 812 serving as a control gate electrode, the voltage is also applied to the first floating gate electrode 103 via the polysilicon film 810 serving as the second floating gate electrode. It will be noted the principle of operation of this element is, for example, similar to that of Embodiments 1 to 7. The BPSG film 809 of this embodiment may be, of course, used as an insulating film polished by the CMP method in Embodiments 1 to 7.

(Embodiment 9)

Figure 105:
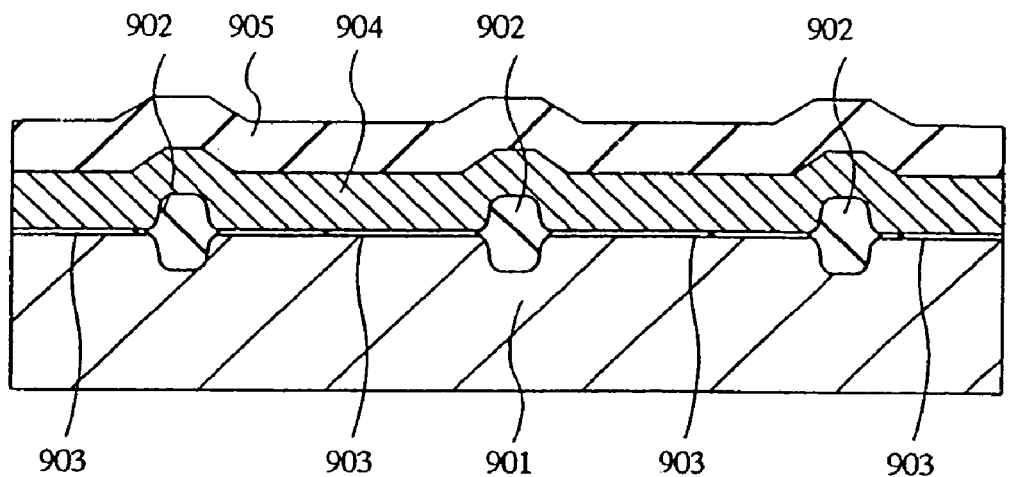
FIGS. 105 to 109 are, respectively, sectional views showing an example of a semiconductor device representing Embodiment 9.

FIGS. 105 to 109 are, respectively, sectional views showing an example of another embodiment of the invention wherein a non-volatile memory element alone is shown. As shown in FIG. 105, 300 nm thick element isolation regions 902 are formed on a p-type silicon substrate 901 by thermal oxidation A 10 nm thick thermally oxidized film 903 is then formed, followed by successive deposition of a 100 nm thick, n-type or non-doped polysilicon film 904 and a 150 nm thick non-doped silicon oxide film 905. It will be noted that the silicon substrate 901 may be replaced by an n-type silicon substrate wherein a p-type well region is formed in the region shown in this sectional view.

Figure 106:
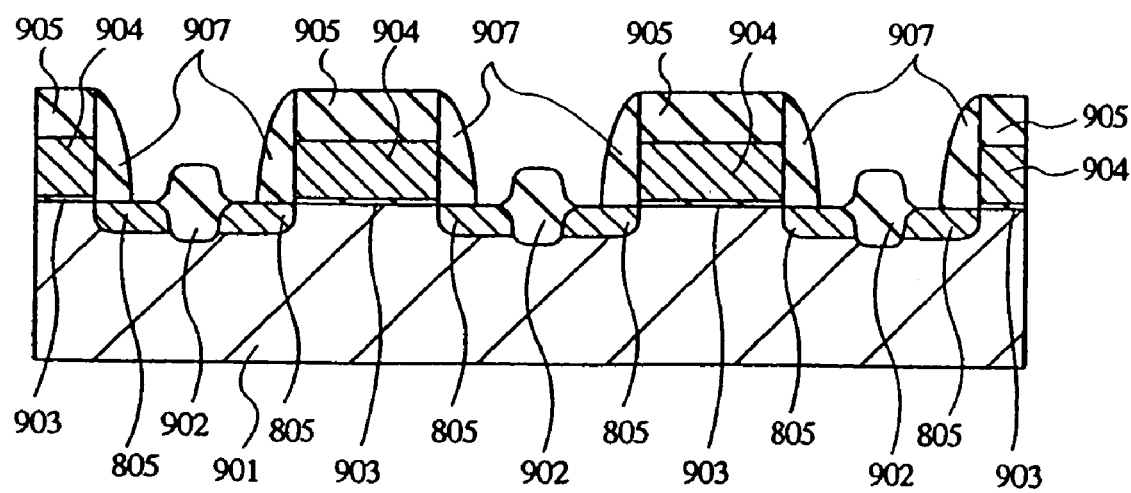

FIG. 106 is a view showing the fabrication which proceeds from FIG. 105. The polysilicon film 904 and the silicon oxide film 905 are divided into sections, as shown in FIG. 106, by photolithographic and dry etching techniques to provide first floating gate electrodes After the division, n-type ions are implanted through the mask of the first floating gate electrodes to form n-type semiconductor regions 906 in the surface of the silicon substrate 901. The implantation is carried out at approximately $1\times10^{15}$ atoms/cm$^2$ under an acceleration energy of 40 keV and may be changed depending on the intended element structure and characteristics. A 150 nm thick silicon oxide film is deposited over the entire surface and is subjected to anistropic dry etching to form side wall spacers 907 on side walls of the first floating gate electrodes.

Figure 107:
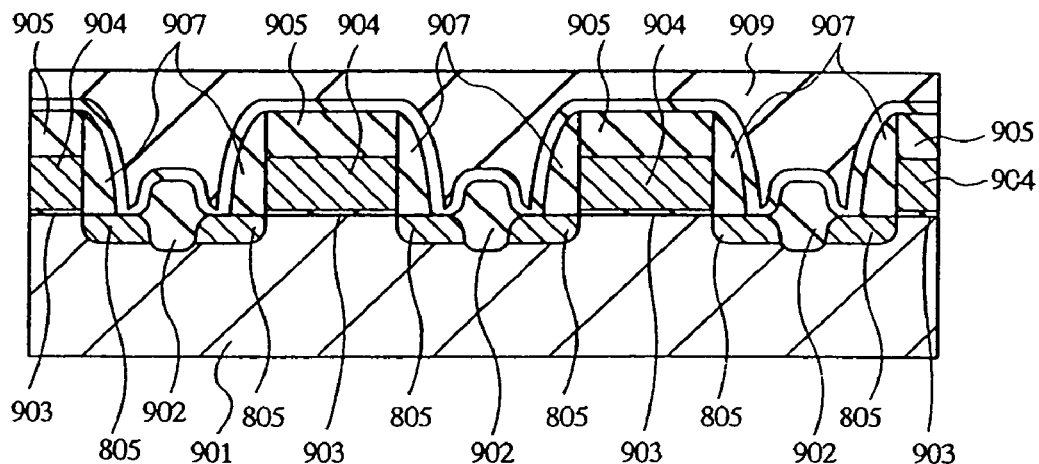

FIG. 107 is a view showing a processing which proceeds from the state of FIG. 106. A non-doped silicon oxide film 908 is deposited over the entire surface to a thickness of 100 nm. The silicon oxide film 908 serves as a barrier for preventing diffusion of an impurity contained BPSG into the n-type semiconductor regions 906 and the silicon substrate 901. After the deposition of the silicon oxide film 908, a BPSG film 909 is deposited over the entire surface to a thickness of 500 nm. Spaces between the elements are filled by use of the fluidity of BPSG, and treatment in an atmosphere of nitrogen at 850° C. is carried out in order to planarize the surface and remove the lines of juncture and cavities. FIG. 107 is a view after the thermal treatment for planarization.

Figure 108:
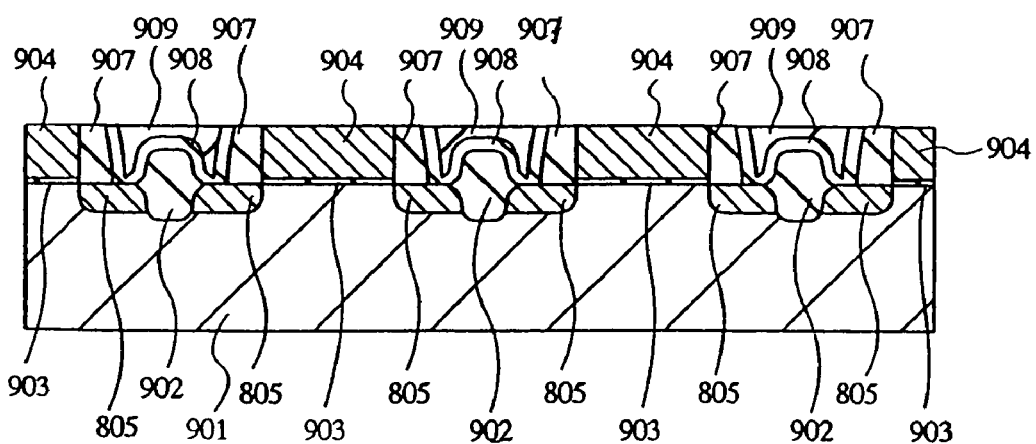

FIG. 108 is a view showing processing which further proceeds from the state of FIG. 107. The BPSG film 909 deposited over the entire surface is uniformly retarded by dry etching until the polysilicon 904 is exposed. Immediately after this, nitriding treatment in an atmosphere of ammonia at 800° C. for 20 minutes is performed in order to obtain the effects described with reference to FIGS. 110 and 111.

Figure 109:
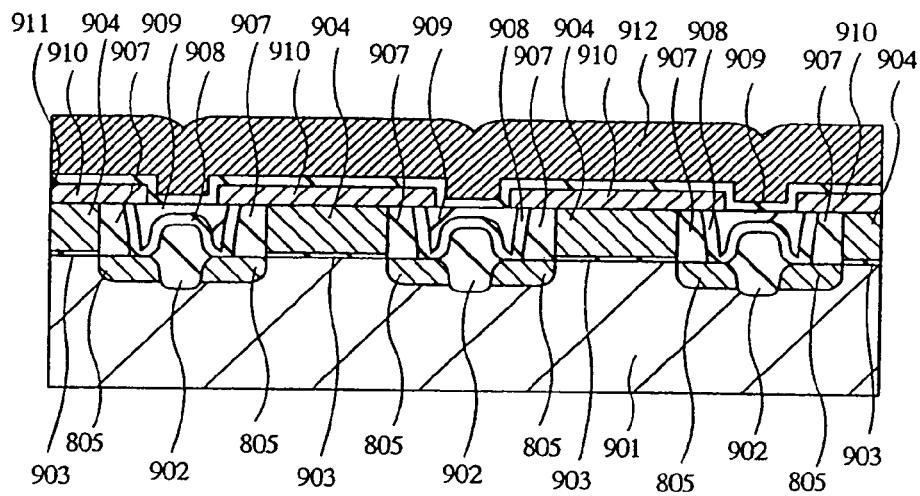

FIG. 109 is a view showing processing which further proceeds from the state of FIG. 108. After the entire surface is cleansed with hydrofluoric acid, a 50 nm thick n-type polysilicon film 910 is deposited, followed by processing the film into the shape of a second floating gate electrode by use of photolithographic and dry etching techniques. It will be noted that the polysilicon film 910 is formed for the purpose of increasing the surface area of the floating gate electrode. The polysilicon film 910 is in contact with the polysilicon film 904 without interposing an insulating film therebetween. After the formation of the polysilicon film 910, a 20 nm thick silicon oxide film 911 is deposited. Further, a 100 nm thick n-type polysilicon 912 is further deposited. This polysilicon film 912 is patterned to provide control gate electrodes. When a voltage is applied to the polysilicon film 912, the voltage is also applied to the polysilicon film 904 via the silicon oxide film 911. It will be noted the operation principle of this element is, for example, similar to that of Embodiments 1 to 7.

(Embodiment 10)

In Embodiments 1 to 9, various applications of the invention to AND-type flash memories has been described. In this embodiment 10, a case where the invention is applied to a NOR-type flash memory is considered. It should be noted that a NOR-type flash memory is described, for example, in U.S. Pat. No. 5,472,891.

As for the fabrication method, Embodiment 1 calls for forming a source/drain region into which an impurity is introduced self-alignedly relative to a column pattern. Embodiment 10 differs from this technique in that the source/drain regions are formed after the formation of control gate electrodes (word lines), and subsequently, source lines and data lines are formed which are electrically connected to the source/drain line regions.

Figure 112:
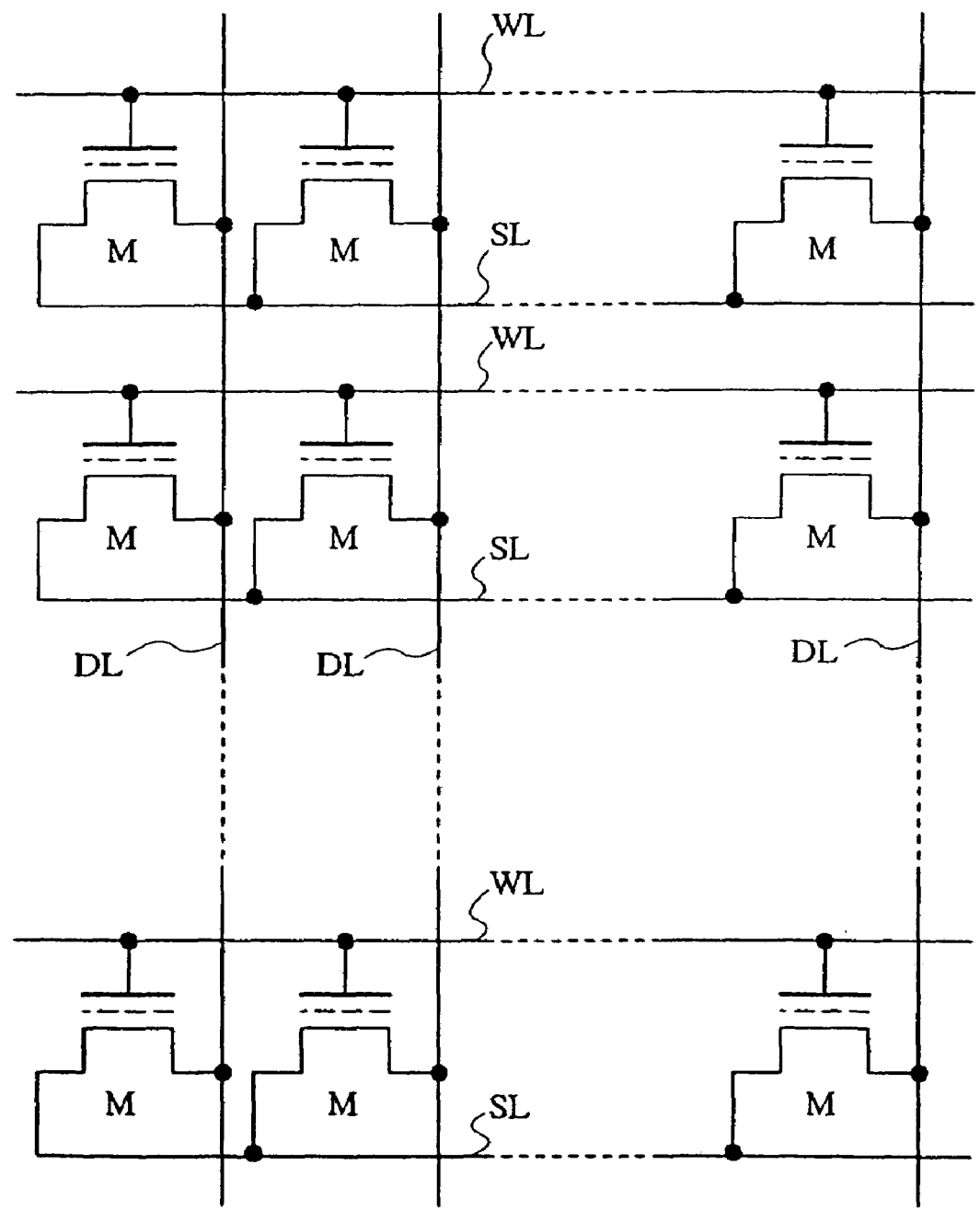
FIGS. 112 to 120 are, respectively, plan or sectional views showing a NOR flash memory representing Embodiment 10 or sectional or plan views showing, in sequence, an example of its fabrication method.
Figure 113:
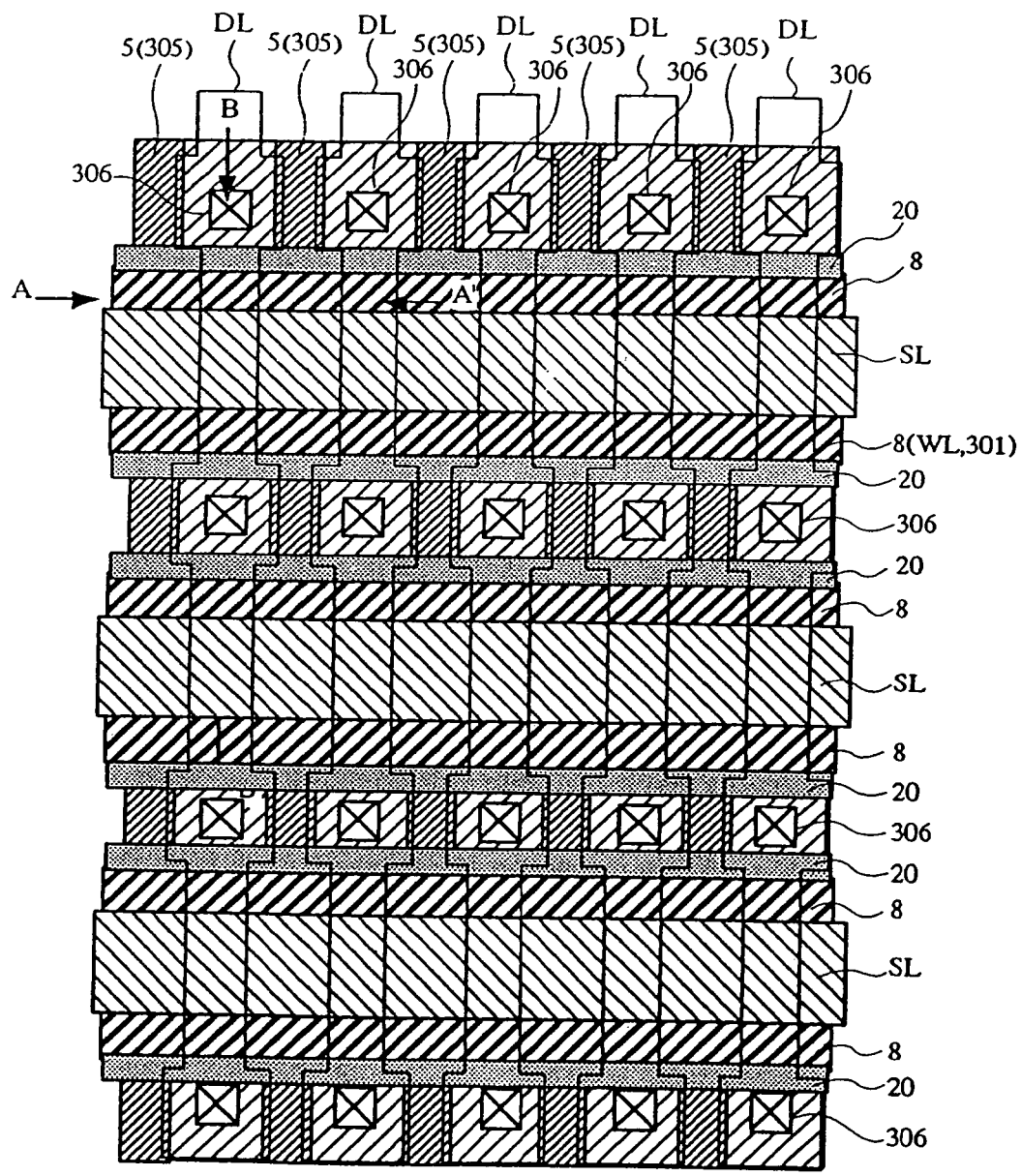
Figure 114A:
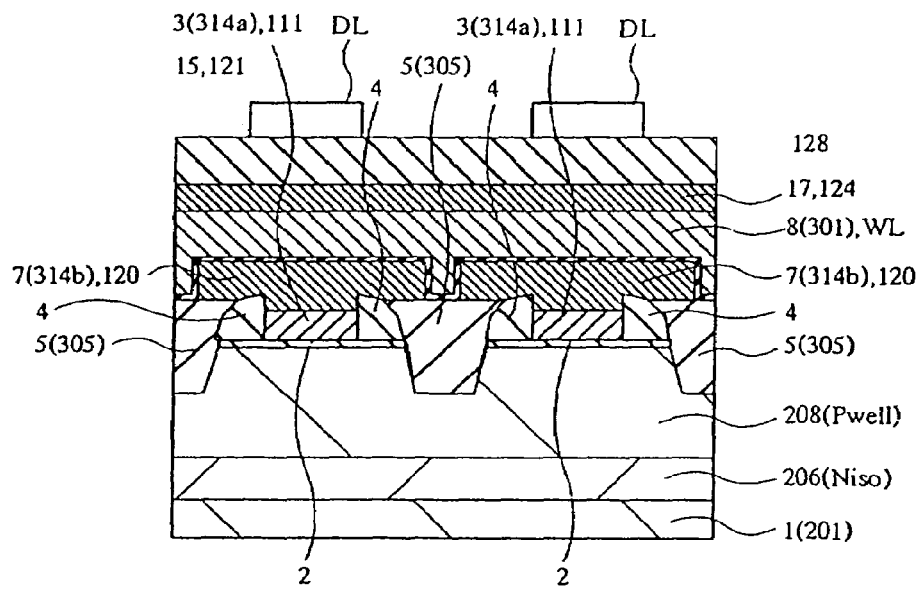
Figure 114B:
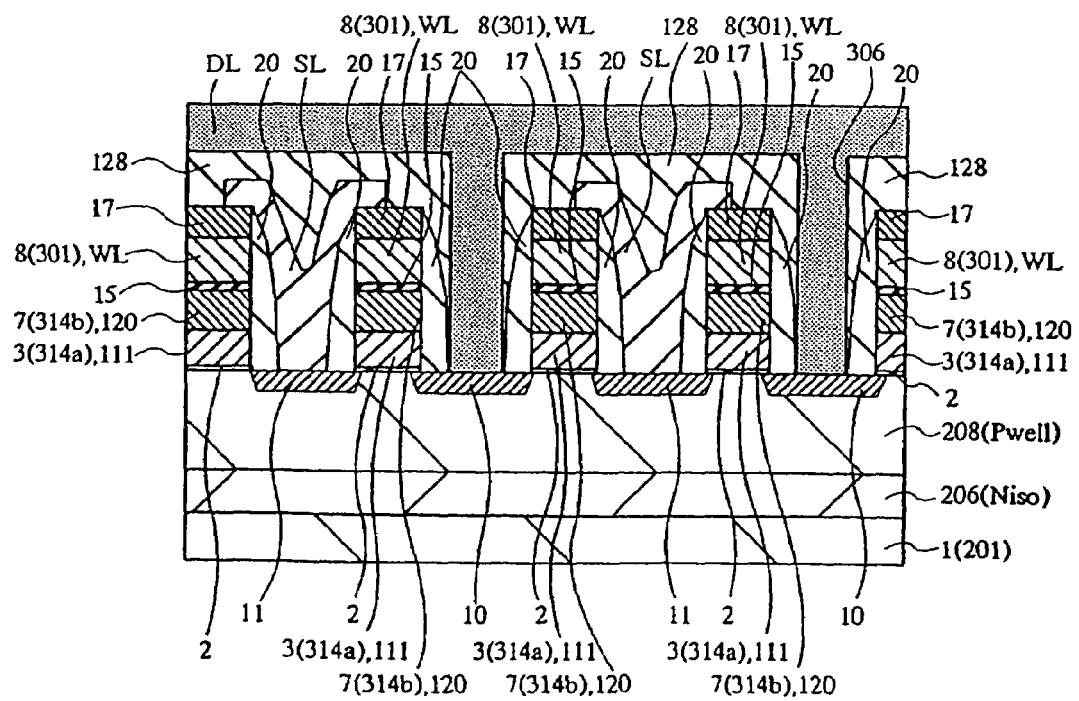

FIG. 112 is a circuit diagram showing an essential part of the NOR-type flash memory of this embodiment, and FIG. 113 is a plan layout of the NOR-type flash memory of this embodiment, while FIG. 114A is a sectional view taken along the taken along the line A—A of FIG. 113, and FIG. 114(B) is a sectional view taken along the line B—B of FIG. 113.

MISFET constituting the peripheral circuit is similar to that of Embodiments 1 to 9 and its illustration is omitted.

Word lines WL, which are formed integrally with control gates 8, 301 of memory cells M, and source lines are arranged to extend in the column direction (a direction of the word lines), and data lines DL and element isolation regions 5, 305 are arranged to extend in the column direction (a direction of data lines) vertical to the row line.

Memory cells M are positioned at intersections between the word lines, and source lines SL and the data lines DL are formed on the upper portion of the memory cells M. The data lines DL are electrically connected to the drain regions 10 of the memory cells M, and the source lines SL are electrically connected to the source regions of the memory cells M.

The memory cell M is constituted of a MISFET, and the memory cells M adjacent in the row direct-ion are isolated with isolation regions 5, 305. The isolation regions 5, 305 have a shallow isolation structure as in Embodiment 1. The memory cell M is formed in a p-type well region 208 formed in a p-type semiconductor substrate 1, 201, and the p-type well region 208 is surrounded by an N-type well and isolated from the p-type semiconductor substrate 1, 201.

The memory cell M is constituted of a gate insulating film 2 formed on the main surface of the semiconductor substrate 1, 201, a first floating gate electrode 3 formed on the gate insulating film 2, a second floating gate electrode 7 formed on the first floating gate electrode 3, an interlayer insulating film 15 formed on the second floating gate electrode 7, a control gate electrode 8 formed on the interlayer insulating film 15, a pair of N-type semiconductor regions 10, 11 formed within the semiconductor substrate 1, 201 and serving as source/drain regions, and a p-type well region 8 which consists of a channel region located between the drain region 10 and the source region 11 and below the first floating gate electrode 3. More particularly, the channel region is arranged between the drain region 10 and the source region 11 in the column direction.

The source line SL is formed self-alignedly relative to the side wall spacer 20 formed on side walls of the first and second floating gate electrode 3, 7, control gate electrode 8 and insulating film 17 and is electrically connected to the source region 11 of the memory cell M.

The interlayer insulating film 128 is formed on the upper portion of the source line SL, and the data line DL formed on the upper portion of the interlayer insulating film 128 is electrically connected to the drain region 10 of the memory cell M via a contact hole formed in the interlayer insulating film 128.

The side wall spacers 3 are formed on the side walls of the first floating gate electrodes 3, and grooves 117 are formed self-alignedly to the side wall spacers 3

An insulating film 5, 305 is buried in the groove 117, and the surface positions of the insulating film 5, 305 are so planarized as to be substantially uniform between the first floating gate electrodes 3 and within the memory cell portion.

The grooves 117 and the insulating film 5, 305 buried in the grooves 117 permit shallow isolation regions to be formed.

The second floating gate electrode 7 is formed to extend on the insulating film 5, 305, thereby increasing the capacitance between the control gate electrode 8 and the second floating gate electrode 7.

In this manner, the grooves 117 are formed self-alignedly to the side wall spacers 3, so that the distance of the memory cells in the row direction can be reduced with a reduction in cell size, thus ensuring a high degree of integration.

Like Embodiment 1, a p-type semiconductor region acting as a channel stopper may be formed below the groove 117.

Figure 115A:
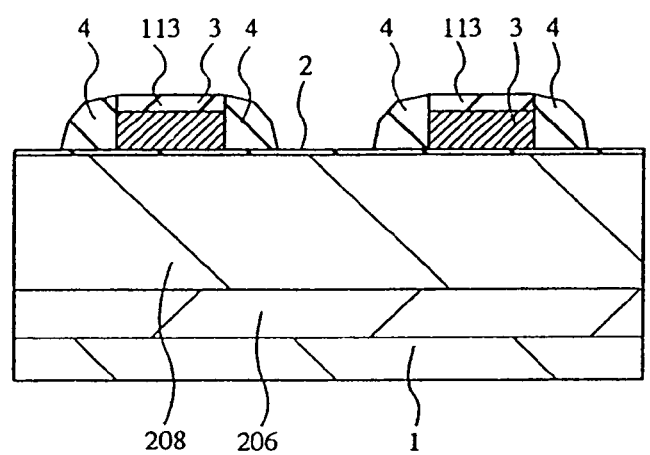
Figure 115B:
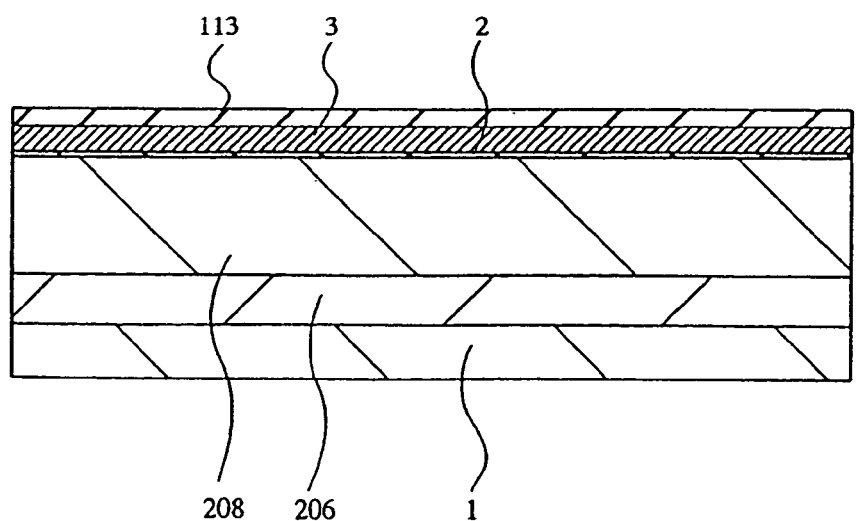
Figure 116:
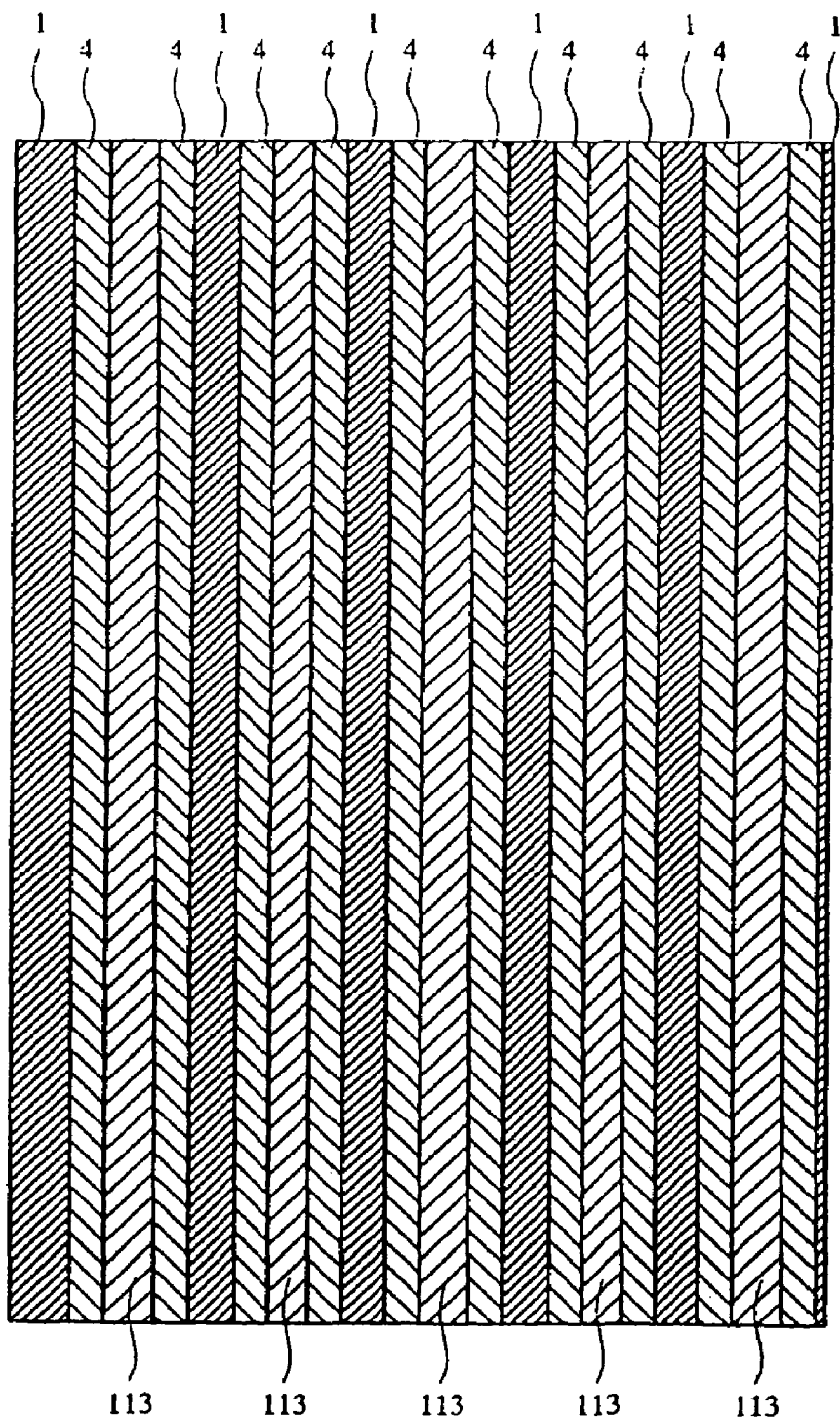
Figure 117A:
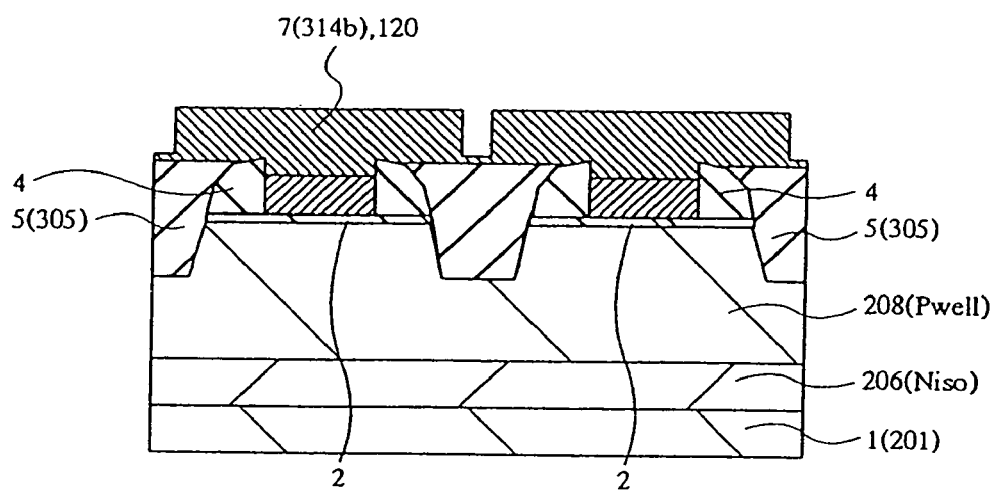
Figure 117B:
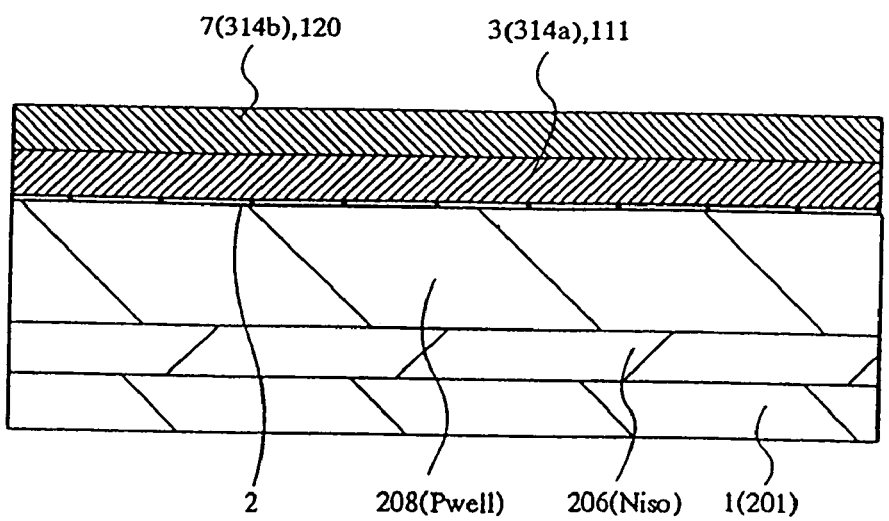
Figure 118:
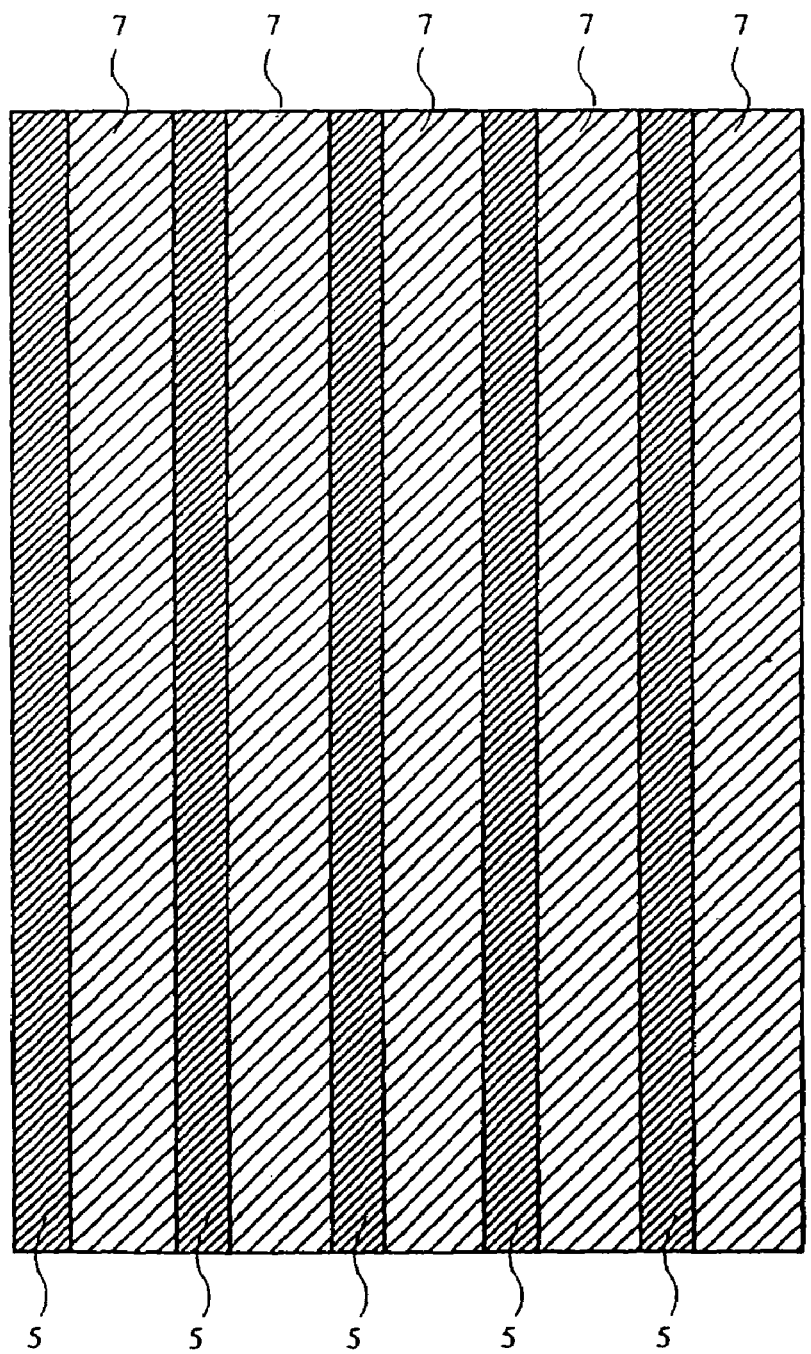
Figure 119A:
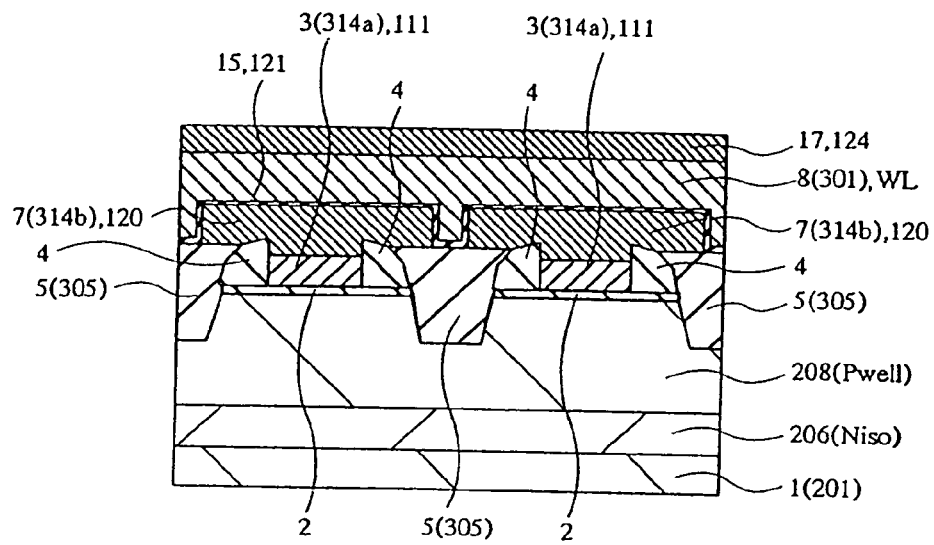
Figure 119B:
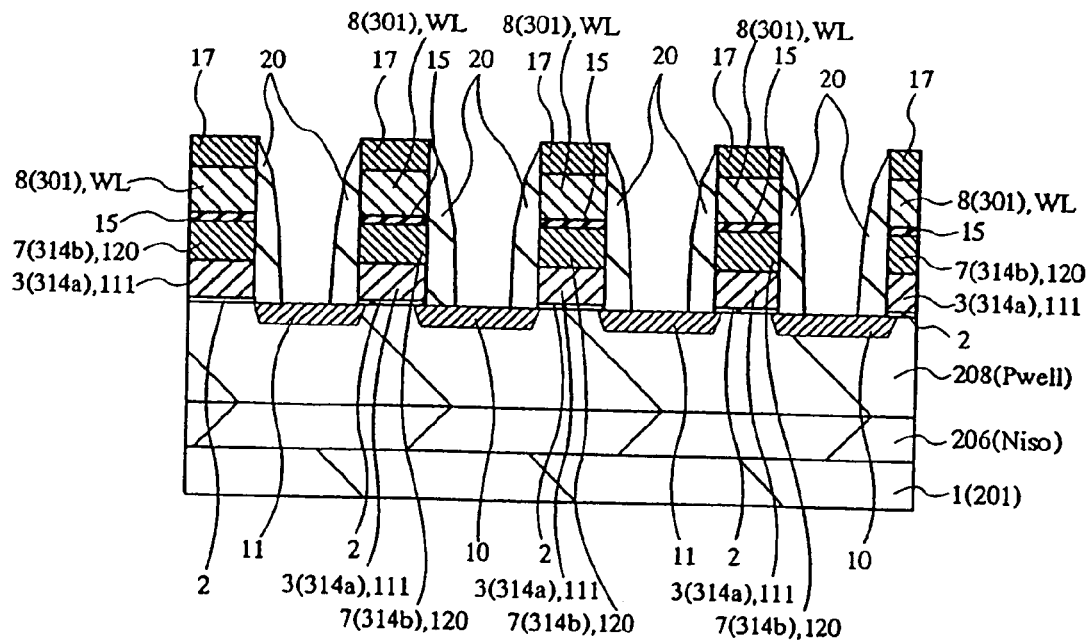
Figure 120:
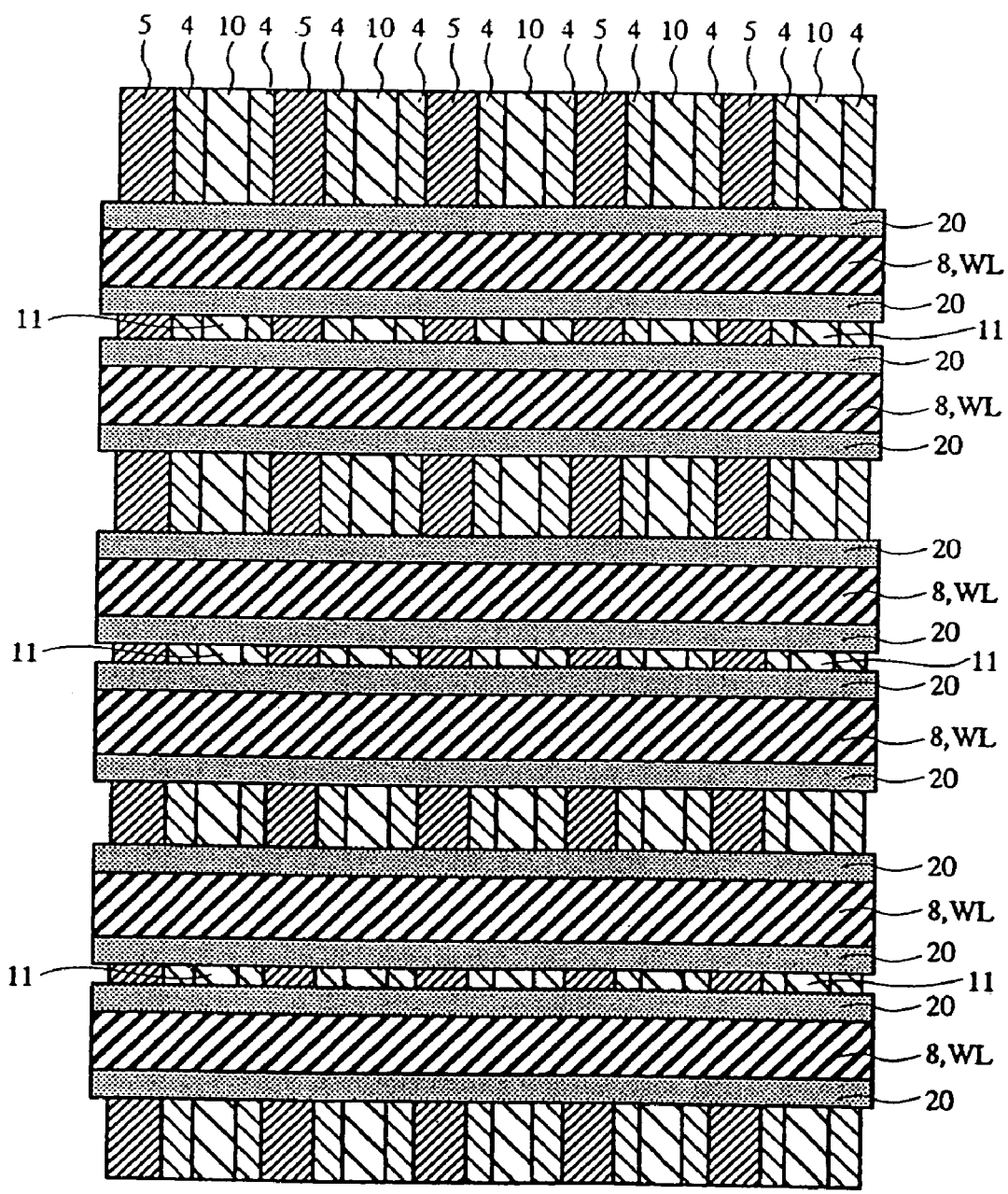

Referring now to FIGS. 115A to 121, the method of fabricating the NOR-type flash memory will be briefly described. FIGS. 115A, 115B, 117A, 117B, 119A and 119B are, respectively, sectional views showing, in sequence, an example of the method of fabrication of the NOR-type flash memory, wherein FIGS. 115A, 117A and 119A are sectional views taken along the line A—A of FIG. 113 and FIGS. 115B, 117B and 119B are sectional views taken along the line B—B of FIG. 113. FIGS. 116, 118 and 120 are, respectively, plan views showing, in sequence, an example of the method of fabrication of the NOR flash memory.

As shown in FIGS. 115A, 115B and 116, like Embodiment 1, there are formed a gate insulating film 2 on the main surface of a semiconductor substrate 1, 201, a first polysilicon film 111 on the first gate insulating film 2, and a silicon nitride film 113, which is an insulating film, on the first polysilicon film 111. Thereafter, the first polysilicon film 111 and the insulating film 113 are patterned by etching to form a striped column pattern extending in the column direction. The patterning defines a gate width of the memory cell M (first floating gate electrode 3). Although not shown in the figures, like Embodiment 1, the peripheral circuit portion is covered with the first polysilicon film 11 and the silicon nitride film 113.

Next, side wall spacers 4, 116 are formed.

As shown in FIGS. 117A, 117B and 118, grooves 117 are formed self-alignedly relative to the side wall spacers 4, 116 by etching, after which an insulating film 119' deposited over the entire surface of the substrate is polished by the CMP method to form an insulating film 5, 305, 119 planarized to the insulating film 113.

Next, after the removal of the insulating film 113, a second polysilicon film 120 is deposited. The second polysilicon film 120 is subsequently patterned by etching to form a second pattern extending in the column direction. The length of the second floating gate electrode along the row direction is defined by this patterning.

Next, as shown in FIGS. 119A, 119B and 120, after formation of an interlayer insulating film 14, 121 like Embodiment 1, a third polysilicon film 122, a WSi film 123 and an insulating film 124 are successively deposited.

The insulating film 124, WSi film 123, third polysilicon film 122, interlayer insulating film 15, 121, second polysilicon film 120 and first polysilicon film 111 are patterned by etching to form word lines (control gate electrodes) 8, 301 made of the WSi film 123 and the third polysilicon film 122 and floating gate electrodes 3, 7 made of the first polysilicon film 111 and the second polysilicon film 120. The first floating gate electrode 3 is constituted of the first polysilicon film 111, and the second floating gate electrode 7 is constituted of the second polysilicon film 120. The word lines control gate electrodes) 8, 301 are so patterned as to extend in the row direction and are integrally formed with control gate electrodes 8 of the memory cells arranged in the row direction.

Thereafter, an impurity is introduced self-alignedly to the insulating film 124 to form a pair of N-type semiconductor regions which result in a drain region 10 and a source region 11. A side wall spacer 20 is formed on side walls of the insulating film 124, WSi film 123, third polysilicon film 122, interlayer insulating film 15, 121, second polysilicon film 120 and first polysilicon film 111.

Then, as shown in FIGS. 114 and 120, a conductive film is deposited, after which the conductive film is patterned by etching to form source lines electrically connected to the source regions of the memory cells M. The conductive film is constituted, for example, of an impurity-introduced polysilicon film or a metal film such as a W film or the like.

After the formation of an interlayer insulating film 128, contact holes 306 are formed, and data lines DL electrically connected to the drain regions 10 of the memory cells M via the contact holes 306 are formed. The data lines are constituted, for example, of a metal film such as an Al film.

In Embodiment 10, the planarization of the insulating films 5, 305, 119 is effected by CMP, but CMP and etching may be used as described in Embodiment 5.

Moreover, in Embodiment 10, the planarized insulating films 5, 305, 119 are formed in the grooves 117, which have been formed self-alignedly to the side wall spacers 4, 116, which should not be construed as limiting thereto. It is a matter of course to arrange this as set out in Embodiment 5.

Figure 121:
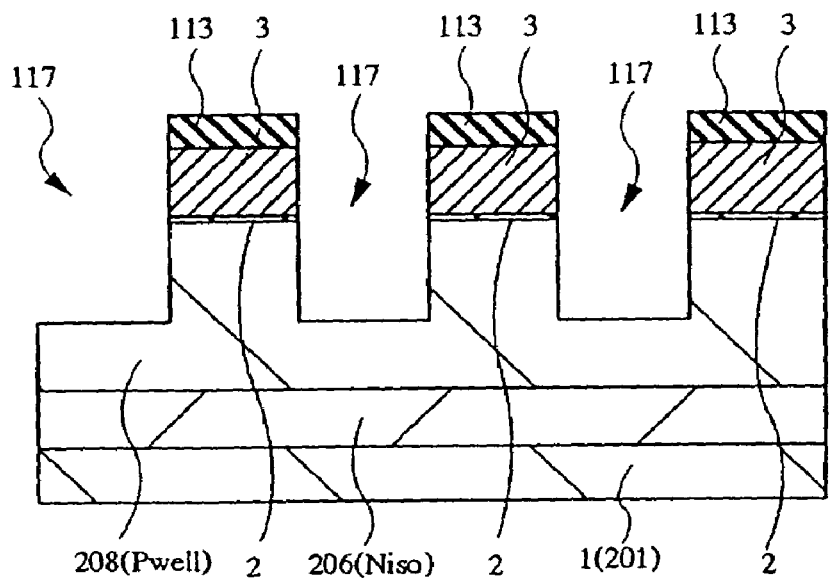
FIGS. 121 and 122 are, respectively, sectional views showing another type of NOR flash memory.
Figure 122:
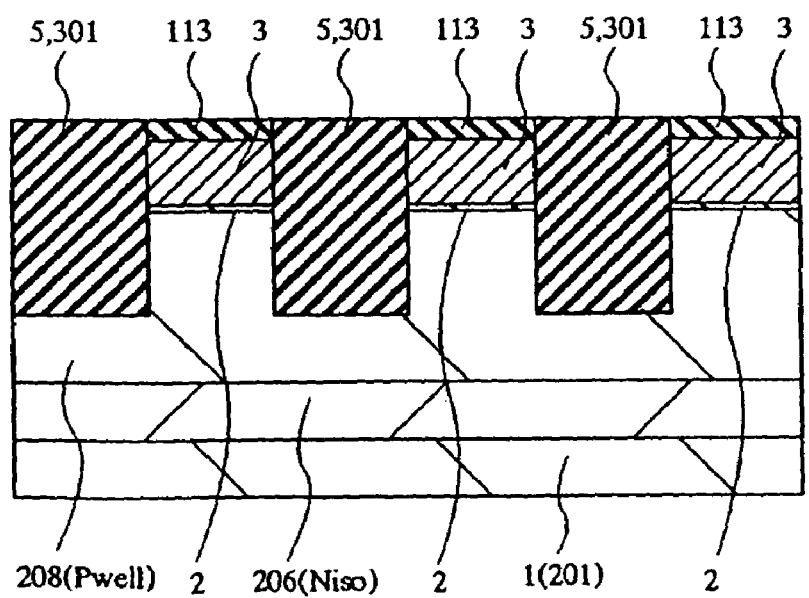

In Embodiment 10, the grooves 117 are formed self-alignedly to the side wall spacers 4, 11. In this connection, as shown in FIG. 121, the groove 117 is formed by etching by use of a mask of the insulating film made of a silicon nitride film, after which, as shown in FIG. 122, the planarized insulating film 5, 305, 119 may be filled in the groove 117. Of course, the second floating gate electrode 7 is formed as extending over the insulating film 5, 305, 119.

In this arrangement, the intervals of the memory cells M along the row direction can be reduced, and since the size can be reduced, a higher degree of integration is possible.

In Embodiment 10, if source lines SL and data lines DL are not provided, the source regions and the drain regions of the memory cells M are connected in series, so that there can be formed a so-called NAND-type memory. In this case, it is sufficient to provide a selective MISFET, like Embodiments 1 to 9.

The invention has been particularly described based on embodiments of the invention, and the invention should not be construed as being limited to these embodiments. Many variations and alterations without departing from the spirit of the invention may be possible.

As stated hereinbefore, the non-volatile semiconductor memory and its fabrication method, and the semiconductor device and its fabrication method, according to the invention, are suited for fine processing and a high degree of integration and have high reliability, and are particularly suitable for application to an AND-type flash memory.

What is claimed is:

1. A method of manufacturing a semiconductor device, comprising steps of:
- (a) providing a semiconductor substrate with a first insulating film over a memory cell forming region, with a second insulating film formed over a peripheral circuit region, with first conductor patterns formed over said first insulating film and said second insulating film, and with grooves formed into said semiconductor substrate, in self-alignment with said first conductor patterns, at said memory cell forming region and at said peripheral circuit region, such that said grooves serve as an element isolation region in said memory cell forming region and in said peripheral circuit region, wherein said second insulating film has a thickness greater than that of said first insulating film;
- (b) filling third insulating films in said grooves at said memory cell forming region and at said peripheral circuit region by polishing an insulating film deposited over said memory cell forming region and said peripheral circuit region;
- (c) after said step (b), forming second conductor patterns over said first conductor patterns;
- (d) forming a fourth insulating film over said first conductor patterns;
- (e) forming a conductive film over said fourth insulating film; and
- (f) patterning said conductive film, said second conductor patterns and said first conductor patterns in said memory cell forming region and in said peripheral circuit region,
  wherein, in said step (f), said conductive film in said memory cell forming region is patterned to form a control gate electrode of a memory cell,
  wherein, in said step (f), said first conductor patterns and said second conductor patterns in said memory cell forming region are patterned to form a floating gate electrode of said memory cell, and
  wherein, in said step (f), said conductive film, said first conductor patterns and said second conductor patterns in said peripheral circuit region are patterned to form a gate electrode of a MISFET of said peripheral circuit region.

2. A method of manufacturing a semiconductor device according to claim 1, wherein said second conductor patterns are formed to extend over said third insulating films.

3. A method of manufacturing a semiconductor device, comprising steps of:
- (a) providing a semiconductor substrate with a first insulating film over a memory cell forming region, with a second insulating film formed over a peripheral circuit region, and with first conductor patterns formed over said first insulating film and said second insulating film, wherein said second insulating film has a thickness greater than that of said first insulating film;
- (b) forming grooves into said semiconductor substrate, in self-alignment with said first conductor patterns, at said memory cell forming region and at said peripheral circuit region, such that said grooves serve as an element isolation region in said memory cell forming region and in said peripheral circuit region;
- (c) filling third insulating films in said grooves at said memory cell forming region and at said peripheral circuit region by polishing an insulating film deposited over said memory cell forming region and said peripheral circuit region;
- (d) after said step (c), forming second conductor patterns over said first conductor patterns;
- (e) forming a fourth insulating film over said first conductor patterns;
- (f) forming a conductive film over said fourth insulating film; and
- (g) patterning said conductive film, said second conductor patterns and said first conductor patterns in said memory cell forming region and in said peripheral circuit region,
  wherein, in said step (g), said conductive film in said memory cell forming region is patterned to form a control gate electrode of a memory cell,
  wherein, in said step (g), said first conductor patterns and said second conductor patterns in said memory cell forming region are patterned to form a floating gate electrode of said memory cell, and
  wherein, in said step (g), said conductive film, said first conductor patterns and said second conductor patterns in said peripheral circuit region are patterned to form a gate electrode of a MISFET of said peripheral circuit region.

4. A method of manufacturing a semiconductor device according to claim 3, wherein said second conductor patterns are formed to extend over said third insulating films.

5. A method of manufacturing a semiconductor device, comprising steps of:
- (a) providing a semiconductor substrate with a first insulating film over a memory cell forming region, with a second insulating film formed over a peripheral circuit region, with first conductor patterns formed over said first insulating film and said second insulating film, and with grooves formed into said semiconductor substrate, in self-alignment with said first conductor patterns, at said memory cell forming region and at said peripheral circuit region, such that said grooves serve as an element isolation region in said memory cell forming region and in said peripheral circuit region, wherein said second insulating film has a thickness greater than that of said first insulating film;
- (b) filling third insulating films in said grooves at said memory cell forming region and at said peripheral circuit region by polishing an insulating film deposited over said memory cell forming region and said peripheral circuit region;
- (c) after said step (b), forming second conductor patterns at said memory cell forming region and at said peripheral circuit region;
- (d) forming a fourth insulating film over said first conductor patterns;
- (e) forming a conductive film over said fourth insulating film; and
- (f) patterning said conductive film, and said second conductor patterns in said memory cell forming region and in said peripheral circuit region,
  wherein, in said step (f), said conductive film in said memory cell forming region is patterned to form a control gate electrode of a memory cell,
  wherein, in said step (f), said second conductor patterns in said memory cell forming region are patterned to form a floating gate electrode of said memory cell, and
  wherein, in said step (f), said conductive film and said second conductor patterns in said peripheral circuit region are patterned to form a gate electrode of a MISFET of said peripheral circuit region.

6. A method of manufacturing a semiconductor device according to claim 5, wherein said second conductor patterns are formed to extend over said third insulating films.

7. A method of manufacturing a semiconductor device according to claim 1, wherein, in said step (a), a silicon nitride film is formed over each of said first conductor patterns, wherein, in said step (b), said silicon nitride film serves as a stopper layer in said polishing, and wherein, before said step (c), said silicon nitride film is removed.

8. A method of manufacturing a semiconductor device according to claim 3, wherein, in said step (a), a silicon nitride film is formed over each of said first conductor patterns, wherein in said step (c), said silicon nitride film serves as a stopper layer in said polishing, and wherein, before said step (d), said silicon nitride film is removed.

9. A method of manufacturing a semiconductor device according to claim 5, wherein, in step (a), a silicon nitride film is formed over each of said first conductor patterns, wherein, in said step (b), said silicon nitride film serves as a stopper layer in said polishing, and wherein, before said step (c), said silicon nitride film is removed.

* * * * *